US012772519B2

(12) United States Patent
Mori et al.

(10) Patent No.: US 12,772,519 B2
(45) Date of Patent: Oct. 20, 2026

(54) SiC SEMICONDUCTOR DEVICE

(71) Applicant: ROHM CO., LTD., Kyoto (JP)

(72) Inventors: Seigo Mori, Kyoto (JP); Kenji Yamamoto, Kyoto (JP); Hiroaki Shiraga, Kyoto (JP); Yuki Nakano, Kyoto (JP); Keigo Minode, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 671 days.

(21) Appl. No.: 17/921,993

(22) PCT Filed: Jul. 16, 2021

(86) PCT No.: PCT/JP2021/026791
§ 371 (c)(1),
(2) Date: Oct. 28, 2022

(87) PCT Pub. No.: WO2022/024813
PCT Pub. Date: Feb. 3, 2022

(65) Prior Publication Data

US 2023/0197786 A1 Jun. 22, 2023

(30) Foreign Application Priority Data

Jul. 31, 2020 (JP) ................................ 2020-131044

(51) Int. Cl.
*H10D 30/66* (2025.01)
*H10D 12/01* (2025.01)
(Continued)

(52) U.S. Cl.
CPC ......... *H10D 62/155* (2025.01); *H10D 12/031* (2025.01); *H10D 30/665* (2025.01);
(Continued)

(58) Field of Classification Search
CPC ............. H10D 12/481; H10D 30/0297; H10D 30/665; H10D 30/668; H10D 64/256; H10D 64/2565; H10D 64/512; H10D 64/513
See application file for complete search history.

(56) References Cited

U.S. PATENT DOCUMENTS 8,017,494 B2 * 9/2011 Ma ....................... H10D 30/668
438/270
8,614,482 B2 * 12/2013 Hsieh .................. H10D 62/104
438/270
(Continued)

FOREIGN PATENT DOCUMENTS

| | | | |
|---|---|---|---|
| DE | 202019005382 | U1 | 6/2020 |
| JP | 2019-9428 | A | 1/2019 |
| JP | 2020-27856 | A | 2/2020 |

OTHER PUBLICATIONS

German Office Action issued Aug. 23, 2024 in corresponding German Patent Application No. 112021002150.8, 6 pages.
(Continued)

*Primary Examiner* — Eric A. Ward
(74) *Attorney, Agent, or Firm* — XSENSUS LLP

(57) ABSTRACT

A SiC semiconductor device includes a SiC chip having a main surface, a trench gate structure formed at the main surface, a trench source structure formed at the main surface away from the trench gate structure in one direction, an insulating film covering the trench gate structure and the trench source structure above the main surface, a gate main surface electrode formed on the insulating film and a gate wiring that is led out from the gate main surface electrode onto the insulating film such as to cross the trench gate structure and the trench source structure in the one direction, and that is electrically connected to the trench gate structure through the insulating film, and that faces the trench source
(Continued)

structure with the insulating film between the trench source structure and the gate wiring.

24 Claims, 65 Drawing Sheets

(51) Int. Cl.
*H10D 62/10* (2025.01)
*H10D 62/13* (2025.01)
*H10D 62/832* (2025.01)
*H10D 64/23* (2025.01)

(52) U.S. Cl.
CPC ......... *H10D 30/668* (2025.01); *H10D 62/109* (2025.01); *H10D 62/8325* (2025.01); *H10D 64/252* (2025.01)

(56) References Cited

U.S. PATENT DOCUMENTS

2004/0195620 A1* 10/2004 Chuang ................ H10D 64/111 257/335
2010/0140689 A1 6/2010 Yedinak et al.
2015/0145028 A1* 5/2015 Laven .................. H10D 62/153 438/270
2017/0040423 A1 2/2017 Inoue et al.
2017/0365665 A1* 12/2017 Hoshi ................ H10D 62/8325
2018/0342605 A1 11/2018 Dainese et al.
2019/0237577 A1* 8/2019 Okamoto ............. H10D 62/393
2019/0259845 A1* 8/2019 Oritsuki ................. H10D 64/01
2019/0273155 A1 9/2019 Dainese et al.
2020/0091338 A1* 3/2020 Nishiwaki ............ H10D 64/256

OTHER PUBLICATIONS

International Search Report and Written Opinion mailed on Oct. 19, 2021, received for PCT Application PCT/JP2021/026791, filed on Jul. 16, 2021, 11 pages including English Translation.

Office Action issued on Jun. 5, 2023, in corresponding German patent Application No. 112021002150.8, 17 pages.

Notice of Reasons for Refusal dated Apr. 10, 2025 issued in corresponding Japanese patent application No. 2022-540187 (8 pages; with English translation).

* cited by examiner

SiC SEMICONDUCTOR DEVICE

CROSS-REFERENCE TO RELATED APPLICATIONS

This application is based on PCT filing PCT/JP2021/026791, filed Jul. 16, 2021, which claims priority to Japanese Patent Application No. 2020-131044, filed in the Japan Patent Office on Jul. 31, 2020, the entire disclosure of each of which is incorporated herein by reference.

The present invention relates to a SiC semiconductor device.

TECHNICAL FIELD

Patent Literature 1 discloses a semiconductor device that includes a semiconductor substrate, a trench gate structure formed at the semiconductor substrate, and a trench source structure formed such as to adjoin the trench gate structure.

BACKGROUND ART

Citation List

Patent Literature

Patent Literature 1: United States Patent Application Publication No. 2017/0040423

SUMMARY OF INVENTION

Technical Problem

A preferred embodiment of the present invention provides a SiC semiconductor device capable of improving reliability.

Solution to Problem

One embodiment of the present invention provides a SiC semiconductor device including a SiC chip having a main surface, a trench gate structure formed at the main surface, a trench source structure formed at the main surface away from the trench gate structure in one direction, an insulating film covering the trench gate structure and the trench source structure above the main surface, a gate main surface electrode formed on the insulating film, and a gate wiring that is led out from the gate main surface electrode onto the insulating film such as to cross the trench gate structure and the trench source structure in the one direction, and that is electrically connected to the trench gate structure through the insulating film, and that faces the trench source structure with the insulating film between the trench source structure and the gate wiring.

One embodiment of the present invention provides a SiC semiconductor device including a SiC chip having a main surface, a trench gate structure that is formed at the main surface and that extends in one direction in plan view, an intermediate trench source structure that is formed at the main surface at a distance from the trench gate structure in the one direction and that extends in the one direction in plan view, an insulating film covering the trench gate structure and the intermediate trench source structure, a gate wiring that is formed on the insulating film and that is electrically connected to the trench gate structure through the insulating film, and a source wiring that is formed on the insulating film at a distance from the gate wiring and that is electrically connected to the intermediate trench source structure through the insulating film.

The aforementioned or still other objects, features, and effects of the present invention will be clarified by the following description of preferred embodiments given below with reference to the accompanying drawings.

DESCRIPTION OF EMBODIMENTS

Figure 1:
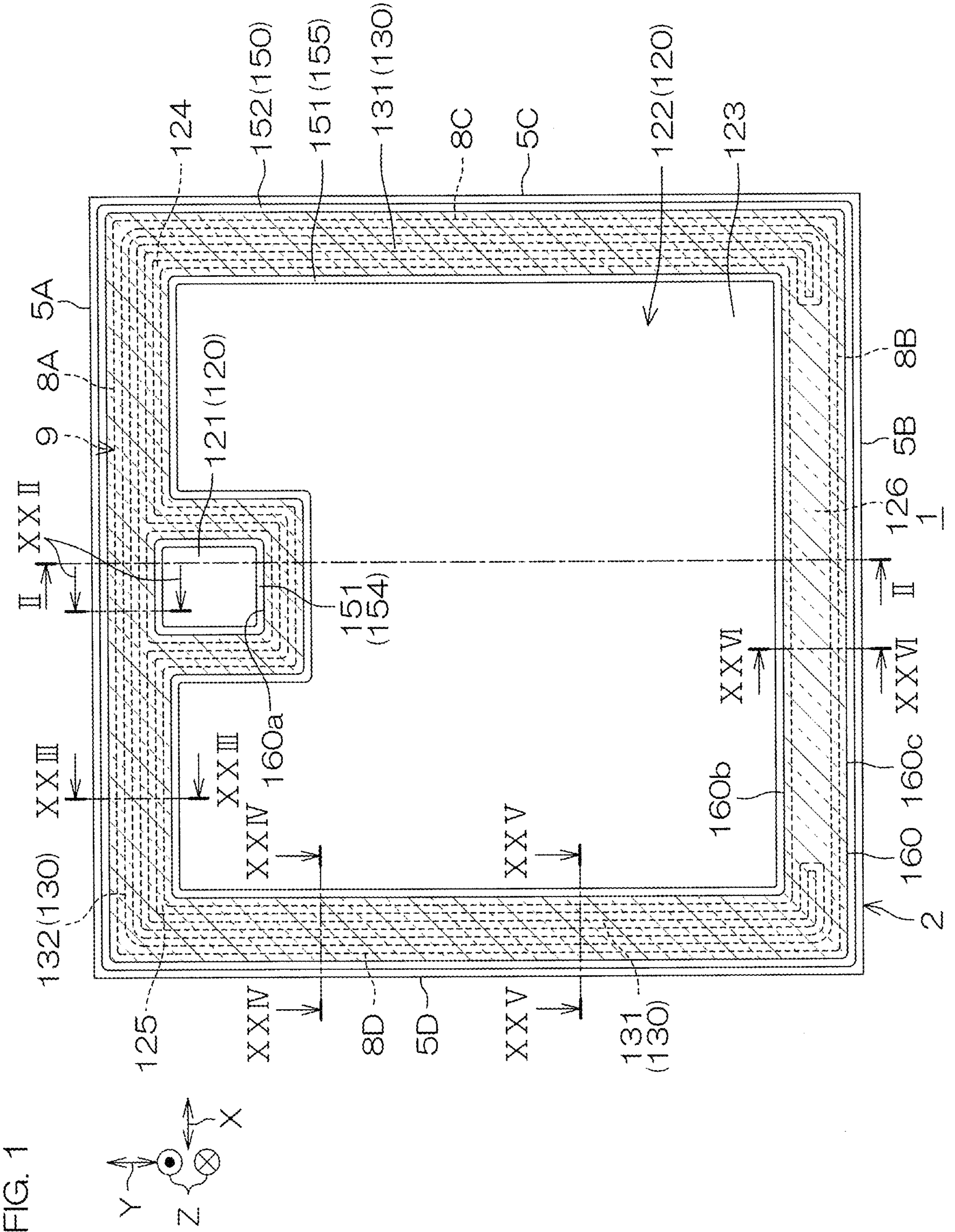
FIG. 1 is a plan view showing a SiC semiconductor device according to a first preferred embodiment of the present invention.
Figure 2:
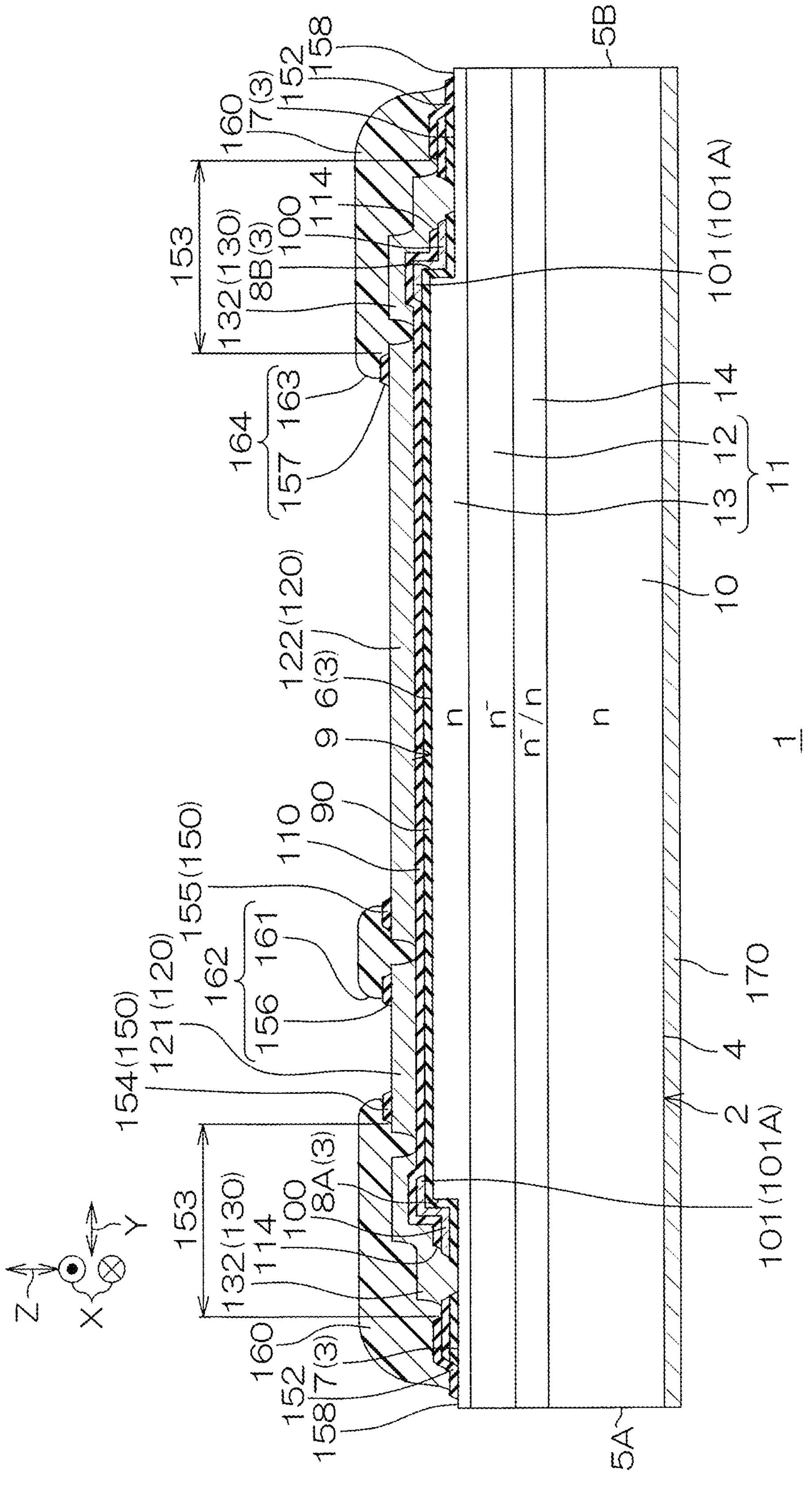
FIG. 2 is a cross-sectional view that shows a cross section along line II-II shown in FIG. 1 and in which a structure inside a SiC chip is omitted.
Figure 3:
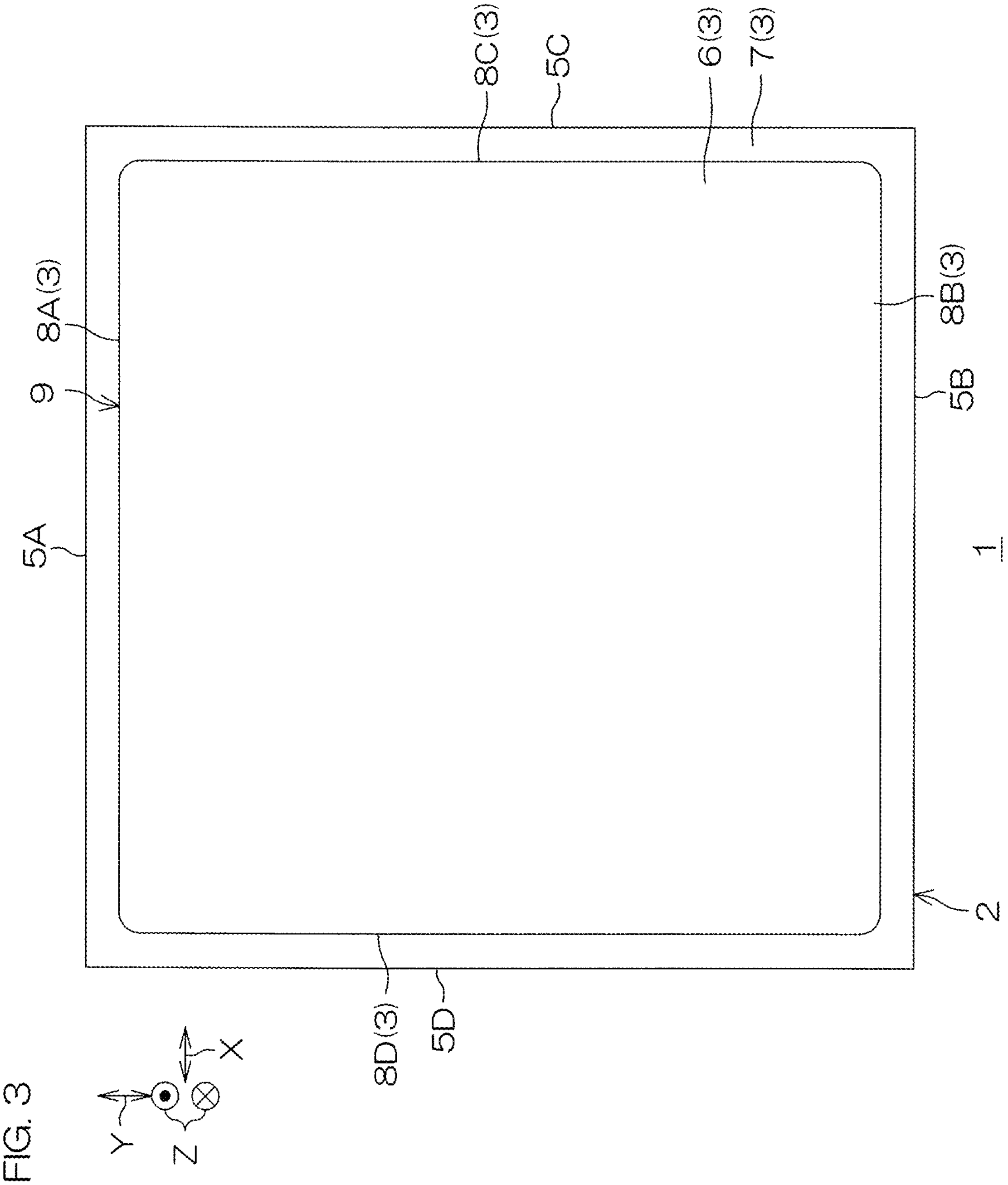
FIG. 3 is a plan view that shows a first main surface of the SiC chip shown in FIG. 1 and in which the structure inside the SiC chip is omitted.

FIG. 1 is a plan view showing a SiC semiconductor device 1 according to a first preferred embodiment of the present invention. FIG. 2 is a cross-sectional view that shows a cross section along line II-II shown in FIG. 1 and in which a structure inside a SiC chip 2 is omitted. FIG. 3 is a plan view that shows a first main surface 3 of the SiC chip 2 shown in FIG. 1 and in which the structure inside the SiC chip 2 is omitted.

Referring to FIG. 1 to FIG. 3, the SiC semiconductor device 1 is an electronic component that includes the SiC chip 2 constituted of a hexagonal SiC (silicon carbide) monocrystal in this preferred embodiment. In this embodiment, the SiC semiconductor device 1 is also a semiconductor switching device that includes a SiC-MISFET (Metal Insulator Semiconductor Field Effect Transistor). The hexagonal SiC monocrystal has a plurality of kinds of polytypes that include a 2H (Hexagonal)-SiC monocrystal, a 4H-SiC monocrystal, a 6H-SiC monocrystal, etc. In this embodiment, an example is shown in which the SiC chip 2 is constituted of a 4H-SiC monocrystal, and yet other polytypes are not excluded.

The SiC chip 2 is formed in a rectangular parallelepiped shape. The SiC chip 2 has a first main surface 3 on one side, a second main surface 4 on the other side, and first to fourth side surfaces 5A to 5D that connect the first main surface 3 and the second main surface 4. The first main surface 3 is a device surface in which a functional device is formed. The second main surface 4 is a non-device surface in which a functional device is not formed. The first main surface 3 and the second main surface 4 are each formed in a quadrangular shape as viewed in plan seen from their normal directions Z (hereinafter, referred to simply as "in plan view"). The first main surface 3 and the second main surface 4 may be each formed in a square shape or a rectangular shape in plan view.

The first main surface 3 and the second main surface 4 are formed by c-planes of the SiC monocrystal. The c-planes include a silicon plane ((0001) plane) of the SiC-monocrystal and a carbon plane ((000-1) plane) of the SiC-monocrystal. Preferably, the first main surface 3 is formed by the silicon plane, and the second main surface 4 is formed by the carbon plane. The first main surface 3 and the second main surface 4 may have an off angle in which these surfaces are inclined at a predetermined angle in a predetermined off direction with respect to the c-planes. Preferably, the off direction is an a-axis direction ([11-20] direction) of the SiC monocrystal. The off angle may exceed 0° and may be equal to or less than 10°. Preferably, the off angle is equal to or less than 5°, Particularly preferably, the off angle is not less than 2° and not more than 4.59.

The second main surface 4 may be a rough surface having either one or both of grinding marks and annealed marks (concretely, laser irradiation marks). The annealing marks may include amorphous SiC and/or SiC silicided (alloyed) with a metal (concretely, Si). Preferably, the second main surface 4 is an ohmic surface that has, at least, annealing marks.

The first side surface 5A and the second side surface 5B extend in a first direction X along the first main surface 3, and face a second direction Y that intersects the first direction X (concretely, that perpendicularly intersects the first direction X). The third side surface 5C and the fourth side surface 5D extend in the second direction Y, and face the first direction X. In this embodiment, the first direction X is an m-axis direction ([1-100] direction) of the SiC monocrystal, and the second direction Y is an a-axis direction of the SiC monocrystal. In other words, the first side surface 5A and the second side surface 5B are formed by an a-plane of the SiC monocrystal, and the third side surface 5C and the fourth side surface 5D are formed by an m-plane of the SiC monocrystal. The first to fourth side surfaces 5A to 5D each define a peripheral edge of the first main surface 3 and a peripheral edge of the second main surface 4.

The first to fourth side surfaces 5A to 5D may be ground-surfaces each of which has grounding marks formed by being cut by a dicing blade, or may be cleavage surfaces each of which has a modified layer formed by laser irradiation. In detail, the modified layer is formed of a region in which a part of the crystal structure of the SiC chip 2 has been modified into another property. In other words, the modified layer is formed of a region in which density, refractive index, or mechanical strength (crystal strength) has been modified into or other physical characteristics have been modified into a property differing from that of the SiC chip 2. The modified layer may include at least one layer among an amorphous layer, a melt/re-hardened layer, a defect layer, a dielectric breakdown layer, and a refractive-index change layer.

If the first to fourth side surfaces 5A to 5D are cleavage surfaces, the first side surface 5A and the second side surface 5B may form an inclined surface that has an inclination angle due to the off angle. When the normal direction Z is set at 0°, the inclination angle due to the off angle is an angle with respect to this normal direction Z. The first side surface 5A and the second side surface 5B may form an inclined surface extending along the c-axis direction (direction) of the SiC monocrystal with respect to the normal direction Z.

The inclination angle due to the off angle is substantially equal to the off angle. The inclination angle due to the off angle may exceed 0° and may be equal to or less than 10° (preferably, not less than 2° and not more than 4.59). The third side surface 5C and the fourth side surface 5D extend in the off direction (a-axis direction), and therefore do not have an inclination angle due to off angle. The third side surface 5C and the fourth side surface 5D planarly extend in the second direction Y (a-axis direction) and in the normal direction Z. In detail, the third side surface 5C and the fourth side surface 5D are formed such as to be substantially perpendicular to the first main surface 3 and to the second main surface 4.

The first main surface 3 has an active surface 6, an outer surface 7, and first to fourth connecting surfaces 8A to 8D. The active surface 6, the outer surface 7, and the first to fourth connecting surfaces 8A to 8D define an active mesa 9 in the first main surface 3. The active surface 6 may be referred to as a first surface, and the outer surface 7 may be referred to as a second surface, and the active mesa 9 may be referred to as a mesa.

The active surface 6 is a surface in which a trench insulated-gate type MISFET is formed. The active surface 6 is formed at a distance inwardly from the peripheral edge of the first main surface 3 (first to fourth side surfaces 5A to 5D). The active surface 6 has a flat surface extending in the first direction X and in the second direction Y. The active surface 6 is formed in a quadrangular shape having four sides parallel to the peripheral edge of the first main surface 3 in plan view. In this embodiment, a corner portion of the active surface 6 is chamfered (concretely, R-chamfered) in a curved shape toward the outer-surface-7 side. Therefore, in this embodiment, the active surface 6 is formed in a quadrangular shape whose four corners are curved in plan view.

The outer surface 7 is positioned outside the active surface 6, and is hollowed with a first depth D1 in the thickness direction of the SiC chip 2 (on the second-main surface-4 side) from the active surface 6. In other words, the outer surface 7 is positioned at the second-main surface-4 side with respect to the active surface 6. The outer surface 7 is formed in a belt shape extending along the active surface 6 in plan view. In detail, the outer surface 7 is formed in an annular shape (concretely, quadrangular annular shape) surrounding the active surface 6 in plan view.

The outer surface 7 has a flat surface extending in the first direction X and in the second direction Y, and is formed in substantially parallel with the active surface 6. The outer surface 7 communicates with the first to fourth side surfaces 5A to 5D. The first depth D1 of the outer surface 7 may be not less than 0.5 μm and not more than 10 μm. Preferably, the first depth D1 is 5 μm or less. Particularly preferably, the first depth D1 is 2.5 μm or less.

The first to fourth connecting surfaces 8A to 8D extend in the normal direction Z, and connect the active surface 6 and the outer surface 7. The first connecting surface 8A is positioned at the first-side-surface-5A side, and the second connecting surface 8B is positioned at the second-side-surface-5B side, and the third connecting surface 8C is positioned at the third-side-surface-50 side, and the fourth connecting surface 8D is positioned at the fourth-side-surface-5D side. The first connecting surface 8A and the second connecting surface 8B extend in the first direction X, and face the second direction Y. The third connecting surface 8C and the fourth connecting surface 8D extend in the second direction Y, and face the first direction X. The first connecting surface 8A and the second connecting surface 8B face the a-planes of the Sic monocrystal, and the third connecting surface 8C and the fourth connecting surface 8D face the m-planes of the SiC monocrystal, The first to fourth connecting surfaces 8A to 8D may be formed substantially perpendicularly to the active surface 6 and to the outer surface 7. In this case, a quadrangular-prism-shaped active mesa 9 is defined in the first main surface 3. The first to fourth connecting surfaces 8A to 8D may be inclined obliquely downward from the active surface 6 toward the outer surface 7. In this case, quadrangular-pyramid-shaped active mesa 9 is defined in the first main surface 3. The inclination angle of each of the first to fourth connecting surfaces 8A to 8D may be not less than 90° and not more than 135°. The inclination angle of each of the first to fourth connecting surfaces 8A to 8D is an angle made between each of the first to fourth connecting surfaces 8A to 8D and the active surface 6 in the SiC chip 2. Preferably, the inclination angle of each of the first to fourth connecting surfaces 8A to 8D is 95° or less.

The SiC semiconductor device 1 includes an n-type (first-conductivity-type) first semiconductor region 10 formed at a surface layer portion of the second main surface 4 of the SiC chip 2. The first semiconductor region 10 forms a drain of the MISFET. The first semiconductor region 10 may be referred to as a drain region. The first semiconductor region 10 has an n-type impurity concentration that is substantially uniform in the thickness direction. The n-type impurity concentration of the first semiconductor region 10 may be not less than $1\times10^{18}$ $cm^{-3}$ and not more than $1\times10^{21}$ $cm^{-3}$.

The first semiconductor region 10 is formed at the surface layer portion of the second main surface 4 at a distance from the outer surface 7 toward the second-main surface-4 side. The first semiconductor region 10 is formed in the whole area of the surface layer portion of the second main surface 4, and is exposed from the second main surface 4 and from the first to fourth side surfaces 5A to 5D. In other words, the first semiconductor region 10 has the second main surface 4 and parts of the first to fourth side surfaces 5A to 5D.

The thickness of the first semiconductor region 10 may be not less than 5 μm and not more than 300 μm. Typically, the thickness of the first semiconductor region 10 is not less than 50 μm and not more than 250 μm. The thickness of the first semiconductor region 10 is adjusted by grinding the second main surface 4. In this embodiment, the first semiconductor region is formed by an n-type semiconductor substrate (SiC substrate).

The SiC semiconductor device 1 includes an n-type second semiconductor region 11 formed at a surface layer portion of the first main surface 3 of the SiC chip 2. The second semiconductor region 11 is electrically connected to the first semiconductor region 10, and forms a drain of the MISFET together with the first semiconductor region 10. The second semiconductor region 11 may be referred to as a drift region. The second semiconductor region 11 has an n-type impurity concentration less than the n-type impurity concentration of the first semiconductor region 10. The n-type impurity concentration of the second semiconductor region 11 may be not less than $1\times10^{15}$ $cm^{-3}$ and not more than $1\times10^{18}$ $cm^{-3}$.

The second semiconductor region 11 is formed in the whole area of the surface layer portion of the first main surface 3, and is exposed from the first main surface 3 and from the first to fourth side surfaces 5A to 5D. In detail, the second semiconductor region 11 is exposed from the active surface 6, from the outer surface 7, and from the first to fourth connecting surfaces 8A to 8D. The second semiconductor region 11 has the first main surface 3 and parts of the first to fourth side surfaces 5A to 5D. The thickness of the second semiconductor region 11 may be not less than 5 μm and not more than 20 μm. The thickness of the second semiconductor region 11 is a thickness based on the active surface 6. In this embodiment, the second semiconductor region 11 is formed by an n-type epitaxial layer (SiC epitaxial layer).

Preferably, the second semiconductor region 11 has a concentration gradient in which the n-type impurity concentration increases (concretely, increases gradually) from the first-semiconductor-region-10 side toward the first main surface 3. In other words, preferably, the second semiconductor region 11 has a first concentration region 12 (low concentration region) that is positioned at the first-semiconductor-region-10 side and that is comparatively low in concentration and a second concentration region 13 (high concentration region) that is positioned at the first-main surface-3 side and that is higher in concentration than the first concentration region 12.

The first concentration region 12 is positioned at the first-semiconductor-region-10 side with respect to the outer surface 7, and is exposed from the first to fourth side surfaces 5A to 5D. The second concentration region 13 is positioned at the first-main surface-3 side with respect to the first concentration region 12, and is exposed from the active surface 6, from the outer surface 7, and from the first to fourth connecting surfaces 8A to 8D. The n-type impurity concentration of the first concentration region 12 may be not less than $1\times10^{15}$ $cm^{-3}$ and not more than $1\times10^{17}$ $cm^{-3}$. The n-type impurity concentration of the second concentration region 13 may be not less than $1\times10^{16}$ $cm^{-3}$ and not more than $1\times10^{18}$ $cm^{-3}$. In the SiC chip 2, the SiC semiconductor device 1 includes an n-type third semiconductor region 14 (concentration transition region) that is interposed between the first semiconductor region 10 and the second semiconductor region 11. The third semiconductor region 14 is electrically connected to the first semiconductor region 10 and to the second semiconductor region 11, and forms a drain of the MISFET together with the first and second semiconductor regions 10 and 11. The third semiconductor region 14 may be referred to as a buffer region. The third semiconductor region 14 has a concentration gradient in which the n-type impurity concentration decreases (concretely, decreases gradually) from the n-type impurity concentration of the first semiconductor region 10 toward the n-type impurity concentration of the second semiconductor region 11.

The third semiconductor region 14 is interposed in the whole area between the first semiconductor region 10 and the second semiconductor region 11, and is exposed from the first to fourth side surfaces 5A to 5D. In other words, the third semiconductor region 14 has parts of the first to fourth side surfaces 5A to 5D. The thickness of the third semiconductor region 14 may be not less than 1 μm and not more than 10 μm. In this embodiment, the third semiconductor region 14 is formed by an n-type epitaxial layer (SiC epitaxial layer).

Figure 4:
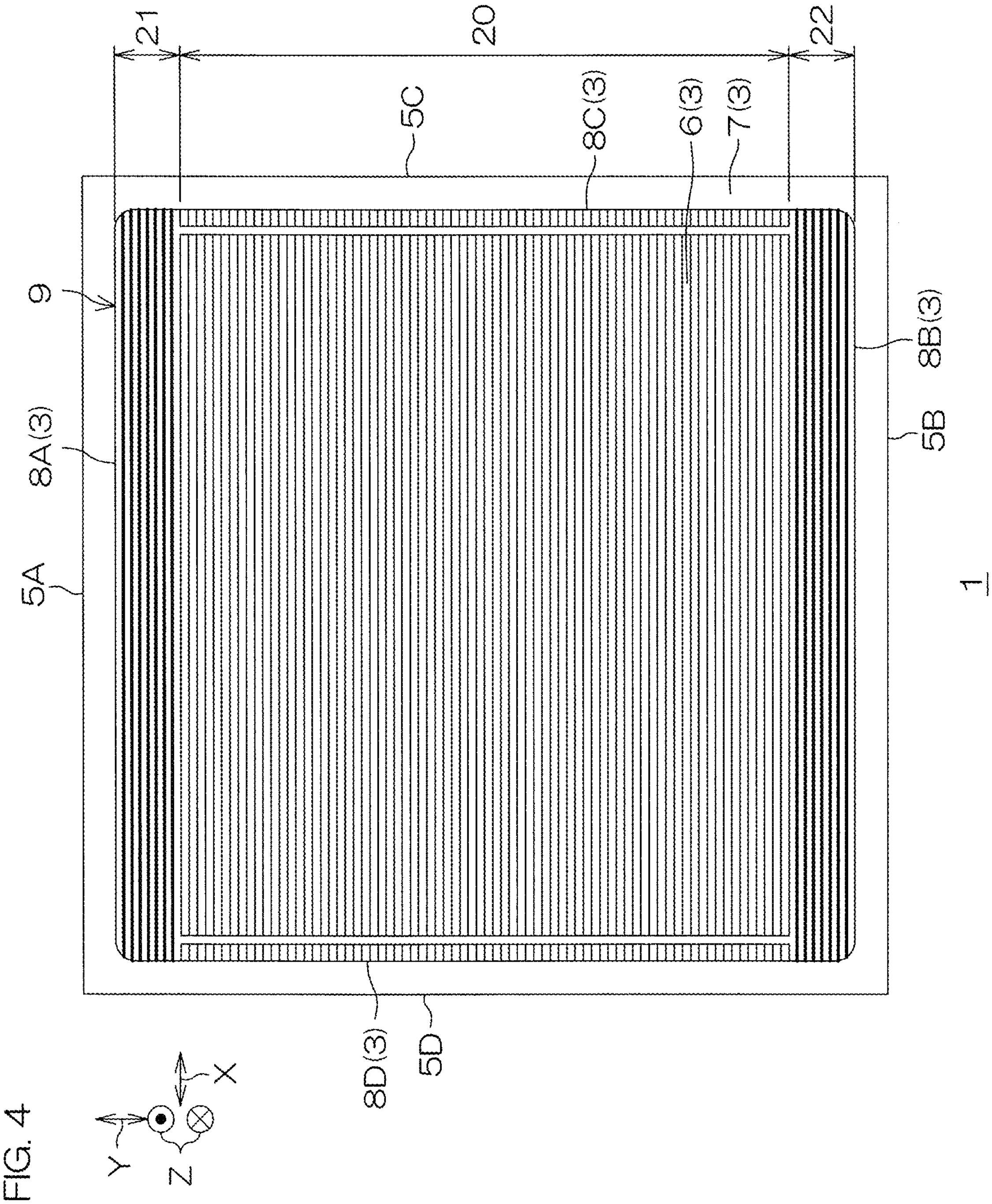
FIG. 4 is a plan view that shows the first main surface shown in FIG. 3 and in which a structure built into the SiC chip is visually simplified.
Figure 5:
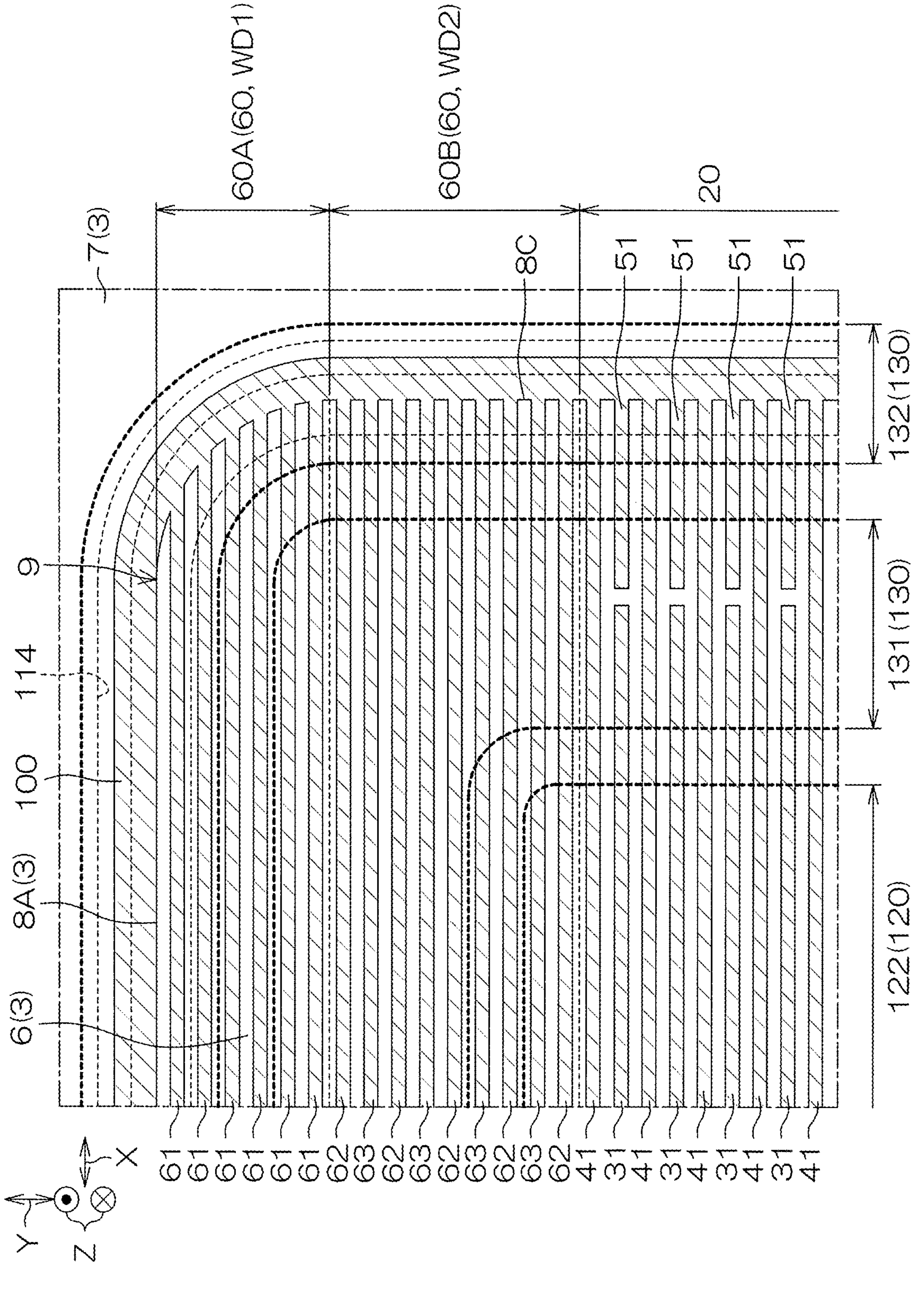
FIG. 5 is an enlarged plan view of a main portion of the first main surface shown in FIG. 4.

FIG. 4 is a plan view that shows the first main surface 3 shown in FIG. 3 and in which a structure built into the SiC chip 2 is visually simplified. FIG. 5 is an enlarged plan view of a main portion of the first main surface 3 shown in FIG. 4.

Referring to FIG. 4 and FIG. 5, the SiC semiconductor device 1 includes a transistor region 20 set in the active surface 6. The transistor region 20 may be referred to as an active region. In this embodiment, only one transistor region 20 is set in the active surface 6. In other words, in this embodiment, the SiC semiconductor device 1 is a discrete device including the single transistor region 20. In this embodiment, the transistor region 20 is set at a central portion of the active surface 6 at a distance inwardly from the first connecting surface 8A and the second connecting surface 8B. The transistor region 20 is set in a quadrangular shape having four sides parallel to the first to fourth connecting surfaces 8A to 8D.

In the active surface 6, the SiC semiconductor device 1 includes a plurality of peripheral regions 21 and 22 each of which is set in a region outside the transistor region 20. In detail, the peripheral regions 21 and 22 include a first peripheral region 21 and a second peripheral region 22. The first peripheral region 21 is set in a belt shape extending in the first direction X between the third connecting surface 8C and the fourth connecting surface 8D in a region between the first connecting surface 8A and the transistor region 20.

The first peripheral region 21 faces the transistor region 20 in the second direction Y. The second peripheral region 22 is set in a belt shape extending in the first direction X between the third connecting surface 8C and the fourth connecting surface 8D in a region between the second connecting surface 8B and the transistor region 20. The second peripheral region 22 faces the first peripheral region 21 with the transistor region 20 between the second peripheral region 22 and the first peripheral region 21 in the second direction Y.

Figure 6:
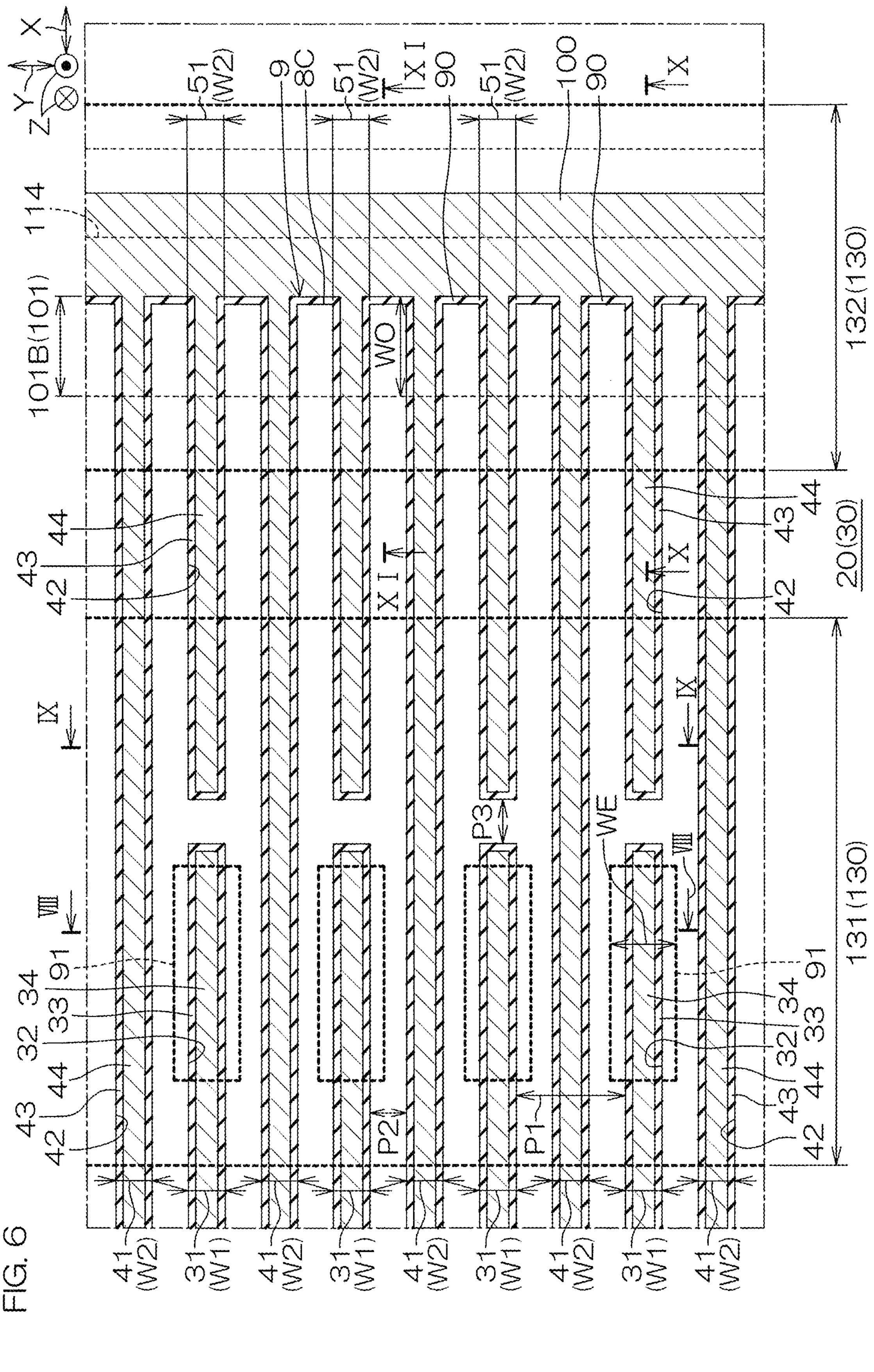
FIG. 6 is an enlarged plan of an end portion of a transistor region shown in FIG. 5.
Figure 7:
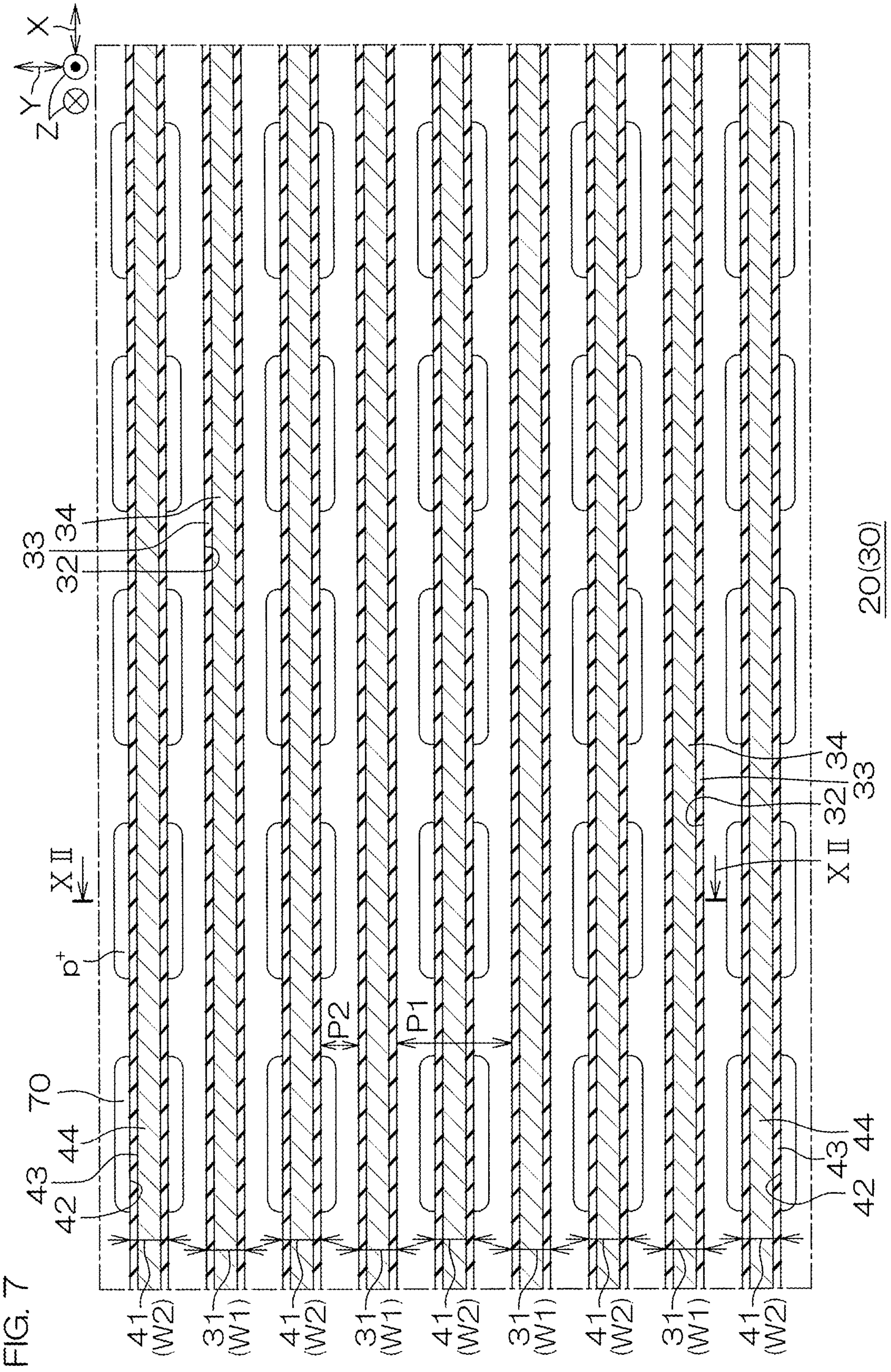
FIG. 7 is an enlarged plan view of an inward portion of the transistor region shown in FIG. 5.
Figure 8:
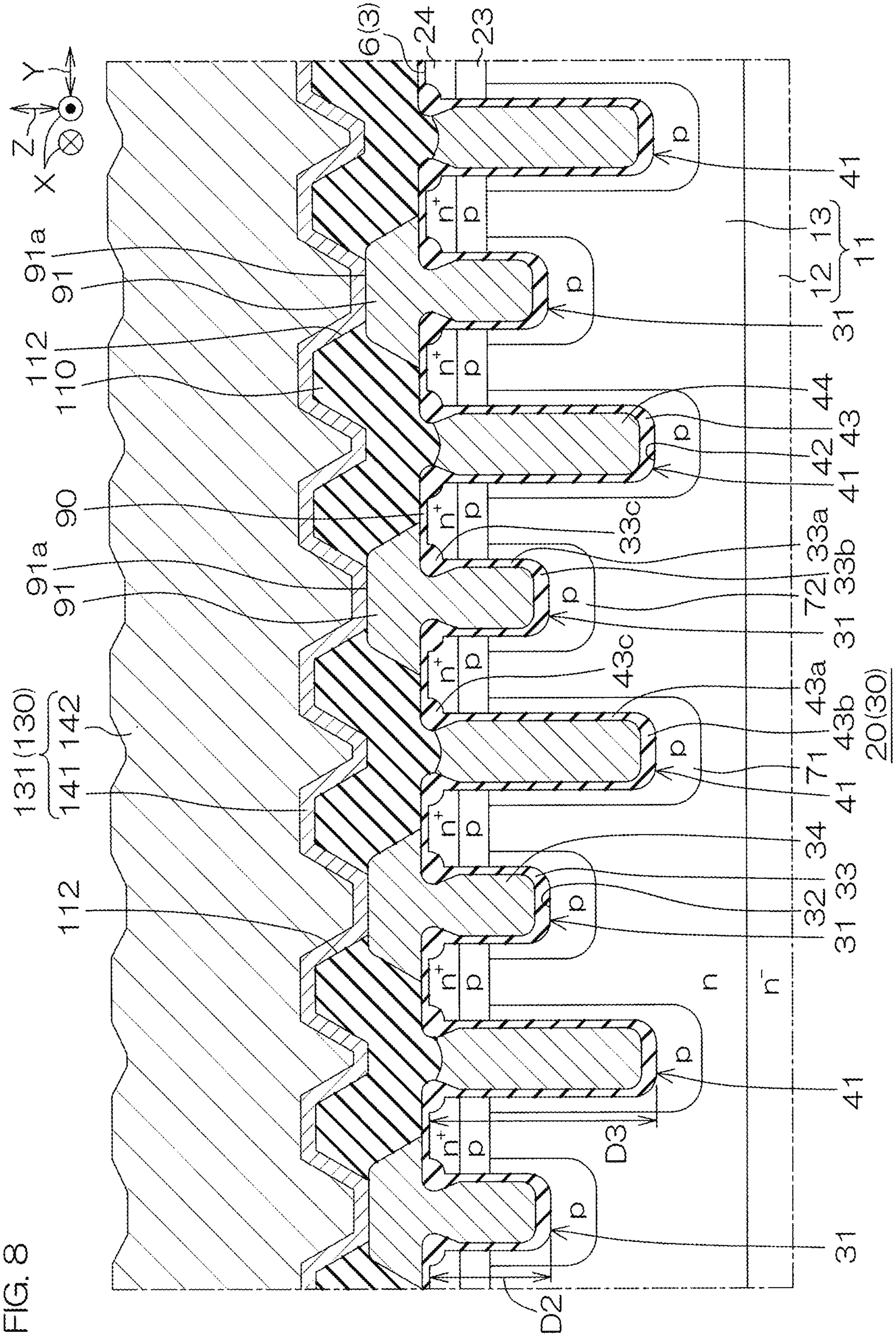
FIG. 8 is a cross-sectional view along line VIII-VIII shown in FIG. 6.
Figure 9:
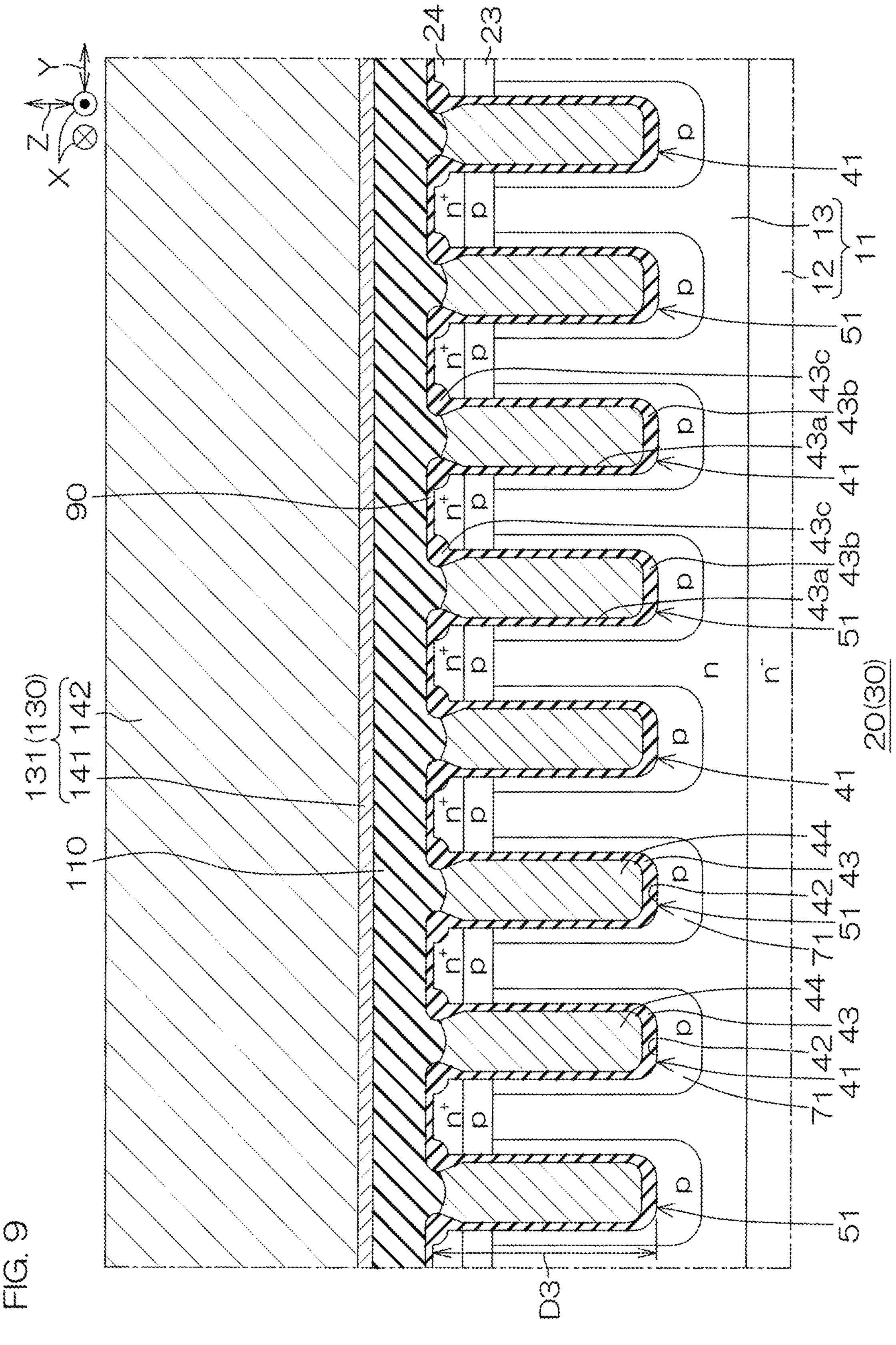
FIG. 9 is a cross-sectional view along line IX-IX shown in FIG. 6.
Figure 10:
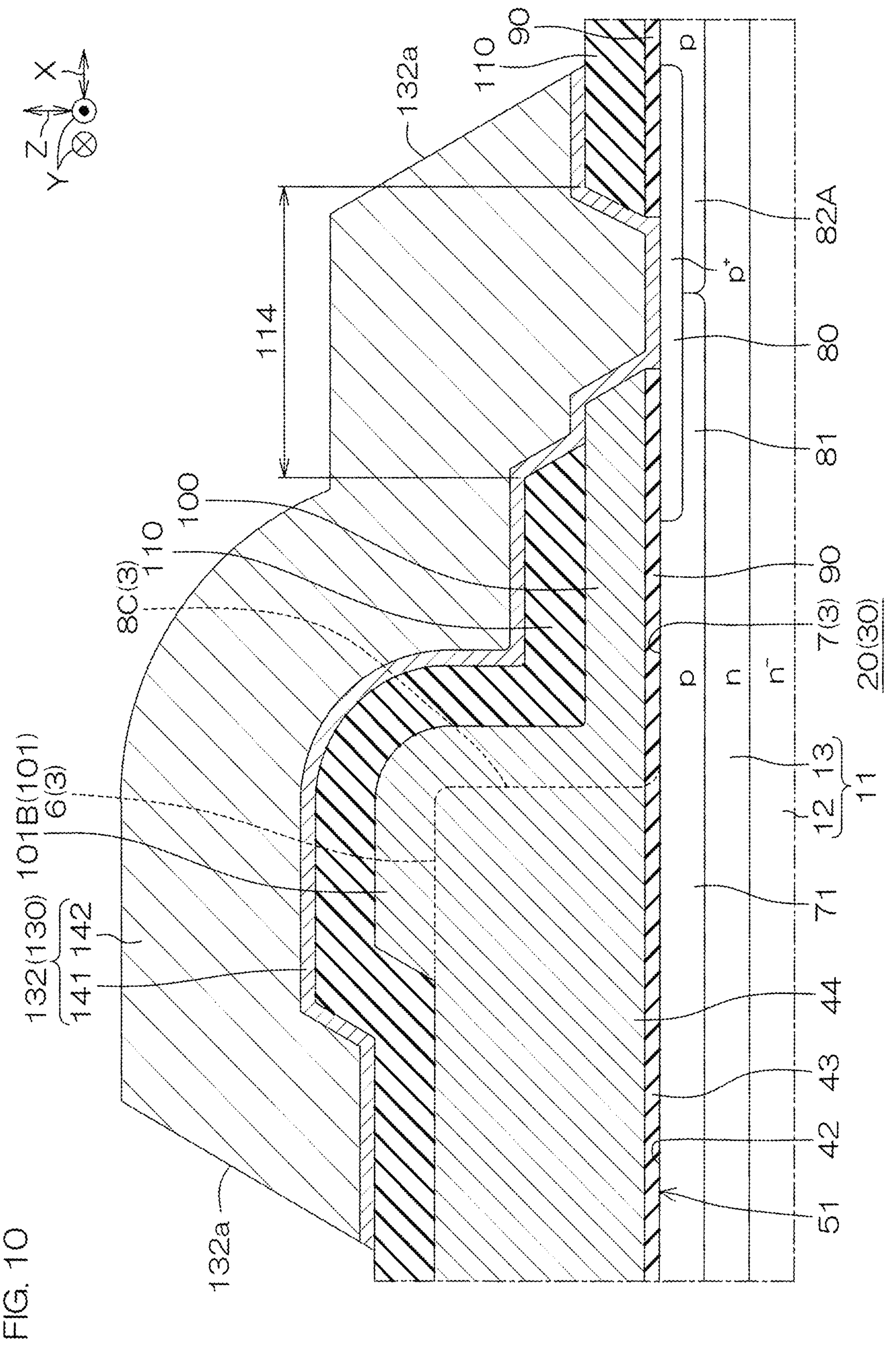
FIG. 10 is a cross-sectional view along line X-X shown in FIG. 6.
Figure 11:
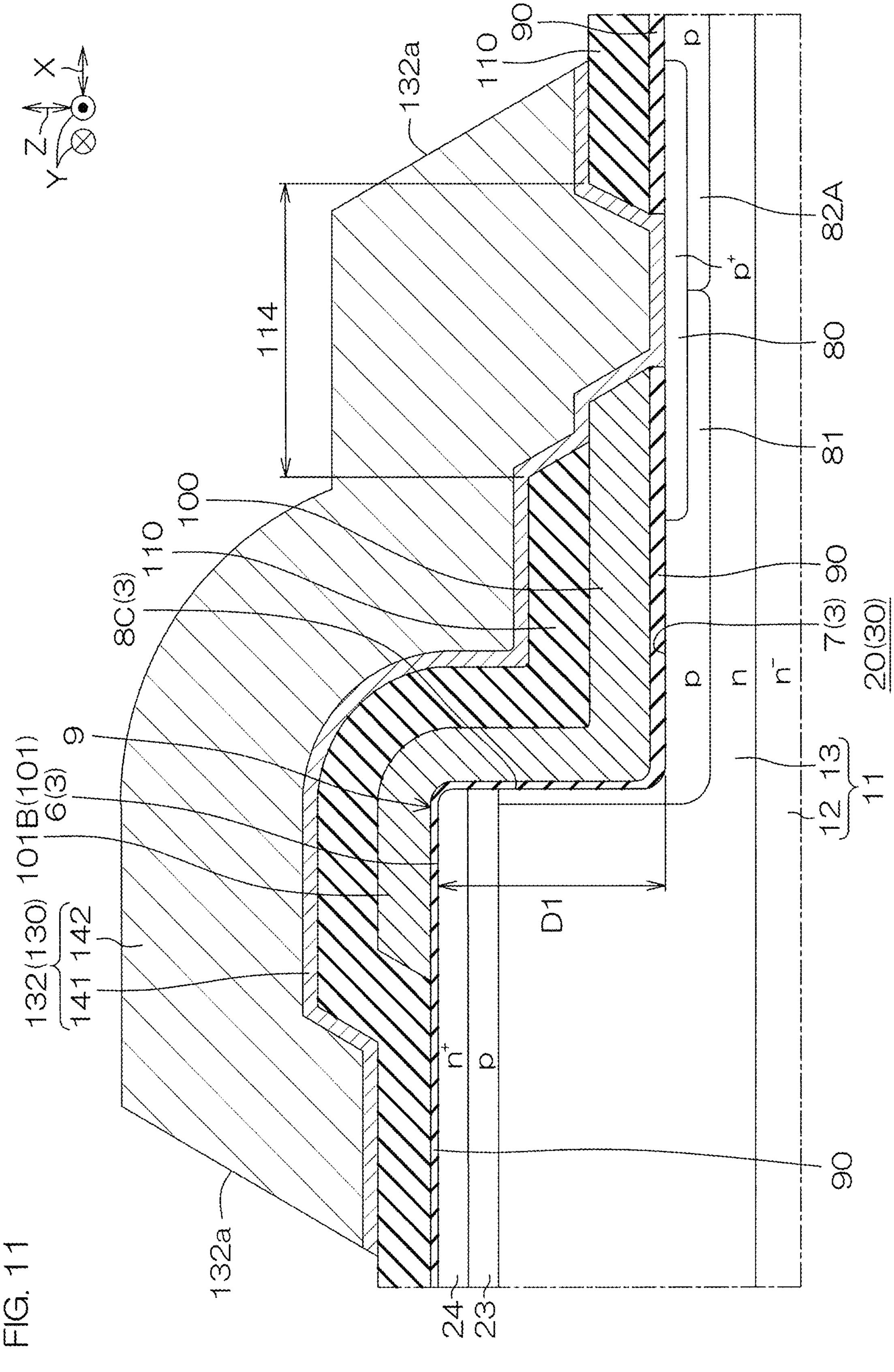
FIG. 11 is a cross-sectional view along line XI-XI shown in FIG. 6.
Figure 12:
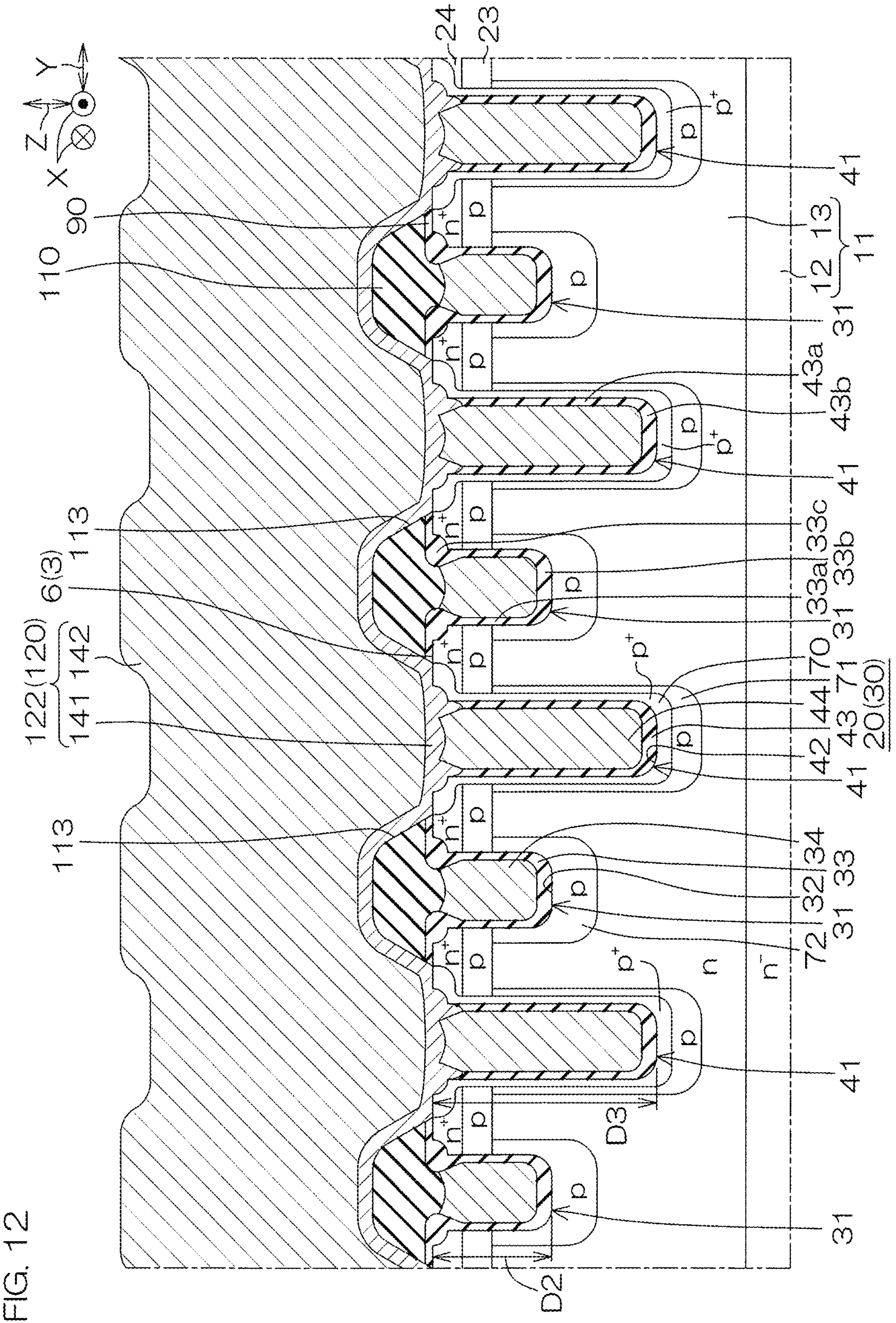
FIG. 12 is a cross-sectional view along line XII-XII shown in FIG. 7.

FIG. 6 is an enlarged plan of an end portion of the transistor region 20 shown in FIG. 5. FIG. 7 is an enlarged plan view of an inward portion of the transistor region 20 shown in FIG. 5. FIG. 8 is a cross-sectional view along line VIII-VIII shown in FIG. 6. FIG. 9 is a cross-sectional view along line IX-IX shown in FIG. 6. FIG. 10 is a cross-sectional view along line X-X shown in FIG. 6. FIG. 11 is a cross-sectional view along line XI-XI shown in FIG. 6. FIG. 12 is a cross-sectional view along line XII-XII shown in FIG. 7.

Referring to FIG. 6 to FIG. 12, the SiC semiconductor device 1 includes a p-type (second-conductivity-type) body region 23 formed at a surface layer portion of the active surface 6. The body region 23 forms a part of a body diode of the MISFET. The p-type impurity concentration of the body region 23 may be not less than $1\times10^{16}$ $cm^{-3}$ and not more than $1\times10^{18}$ $cm^{-3}$. In detail, the body region 23 is formed at a surface layer portion of the second semiconductor region 11 in the whole area of the active surface 6. In more detail, the body region 23 is formed at the surface layer portion of the second concentration region 13, and faces the first semiconductor region 10 (third semiconductor region 14) with a part of the first concentration region 12 between the body region 23 and the first semiconductor region 10.

In the active surface 6, the SiC semiconductor device 1 includes an n-type source region 24 formed at a surface layer portion of the body region 23. The source region 24 forms a source of the MISFET. The source region 24 has an n-type impurity concentration exceeding the n-type impurity concentration of the second semiconductor region 11 (second concentration region 13). The n-type impurity concentration of the source region 24 may be not less than $1\times10^{18}$ $cm^{-3}$ and not more than $1\times10^{21}$ $cm^{-3}$.

In this embodiment, the source region 24 is formed at the surface layer portion of the body region 23 in the whole area of the active surface 6. The source region 24 is formed at a distance from a bottom portion of the body region 23 toward the active-surface-6 side. The source region 24 forms a channel of the MISFET with the second semiconductor region 11 (second concentration region 13) in the body region 23. The source region 24 is not necessarily required to be formed in the whole area of the active surface 6, and, in the active surface 6, the source region 24 may be formed only in a region (for example, transistor region 20) in which a channel is to be formed.

The SiC semiconductor device 1 includes a transistor structure 30 formed at the active surface 6 in the transistor region 20 (in an inward portion of the active surface 6). The transistor structure 30 includes a plurality of trench gate structures 31 formed at the active surface 6. The trench gate structures 31 form a gate of the MISFET. A gate potential is given to the trench gate structures 31. The trench gate structures 31 control the on/off of the channel in the body region 23.

The trench gate structures 31 are formed at the inward portion of the active surface 6 at a distance from the first to fourth connecting surfaces 8A to 8D in plan view. The trench gate structures 31 are each formed in a belt shape (rectangular shape) extending in the first direction X in plan view, and are formed with intervals therebetween in the second direction Y. The trench gate structures 31 are formed in a stripe shape extending in the first direction X in plan view. Preferably, the trench gate structures 31 cross a line, which passes through the central portion of the active surface 6 in the second direction Y in plan view, in the first direction X.

Each of the trench gate structures 31 has a first width W1. The first width W1 is a width in a direction perpendicular to a direction in which each of the trench gate structures 31 extends. The first width W1 may be not less than 0.1 μm and not more than 3 μm. Preferably, the first width W1 is not less than 0.5 μm and not more than 1.5 μm.

The trench gate structures 31 are arranged with first intervals P1 therebetween in the second direction Y. The first interval P1 is a distance between two trench gate structures 31 that are adjacent to each other in the second direction Y. Preferably, the first interval P1 exceeds the first width W1 (W1<P1). The first interval P1 may be not less than 0.4 μm and not more than 5 μm. Preferably, the first interval P1 is not less than 0.8 μm and not more than 3 μm.

Each of the trench gate structures 31 has a second depth D2. The second depth D2 is less than the first depth D1 of the outer surface 7 (D2<D1). The second depth D2 may be not less than 0.1 μm and not more than 3 μm. Preferably, the second depth D2 is not less than 0.5 μm and not more than 2 μm. Preferably, an aspect ratio D2/W1 of each of the trench gate structures 31 is not less than 1 and not more than 5. The aspect ratio D2/W1 is a ratio of the second depth D2 to the first width W1. Particularly preferably, the aspect ratio D2/W1 is 1.5 or more.

Each of the trench gate structures 31 includes a sidewall and a bottom wall. A part, which forms a long side, of the sidewall of each of the trench gate structures 31 is formed by the a-plane of the SiC monocrystal. A part, which forms a short side, of the sidewall of each of the trench gate structures 31 is formed by the m-plane of the SiC monocrystal. The bottom wall of each of the trench gate structures 31 is formed by the c-plane of the SiC monocrystal.

Each of the trench gate structures 31 may be formed in a vertical shape having a substantially uniform opening width. Each of the trench gate structures 31 may be formed in a tapered shape whose opening width becomes narrower toward the bottom wall. Preferably, the bottom wall of each of the trench gate structures 31 is formed in a curved shape toward the second main surface 4. As a matter of course, the bottom wall of each of the trench gate structures 31 may have a flat surface parallel to the active surface 6.

Each of the trench gate structures 31 is formed at the active surface 6 such as to cross the body region 23 and the source region 24 and reach the second semiconductor region 11. In detail, each of the trench gate structures 31 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the trench gate structures 31. In this embodiment, each of the trench gate structures 31 is formed in the second concentration region 13, and faces the first concentration region 12 with a part of the second concentration region 13 between the first concentration region 12 and each of the trench gate structures 31. The sidewall of each of the trench gate structures 31 is in contact with the second semiconductor region 11, the body region 23, and the source region 24. The bottom wall of each of the trench gate structures 31 is in contact with the second semiconductor region 11.

Each of the trench gate structures 31 includes a gate trench 32, a gate insulating film 33, and a gate electrode 34. The single trench gate structure 31 will be hereinafter described. The gate trench 32 forms the sidewall and the bottom wall of the trench gate structure 31. The sidewall and the bottom wall form a wall surface (inner wall and outer wall) of the gate trench 32.

An opening edge portion of the gate trench 32 is inclined obliquely downward from the active surface 6 toward the gate trench 32. The opening edge portion is a connection portion between the active surface 6 and the sidewall of the gate trench 32. In this embodiment, the opening edge portion is formed in a curved shape hollowed toward the SiC chip 2. The opening edge portion may be formed in a curved shape toward the inward side of the gate trench 32.

The gate insulating film 33 is formed in a film shape on the inner wall of the gate trench 32, and defines a recessed space in the gate trench 32. The gate insulating film 33 covers the second semiconductor region 11, the body region 23, and the source region 24 in the inner wall of the gate trench 32. The gate insulating film 33 includes at least one among a silicon oxide film, a silicon nitride film, and a silicon oxynitride film. In this embodiment, the gate insulating film 33 has a single layer structure constituted of a silicon oxide film.

The gate insulating film 33 includes a first portion 33*a*, a second portion 33*b*, and a third portion 33*c*. The first portion 33*a* covers the sidewall of the gate trench 32. The second portion 33*b* covers the bottom wall of the gate trench 32. The third portion 33*c* covers the opening edge portion. In this embodiment, the third portion 33*c* bulges in a curved shape toward the inward side of the gate trench 32 in the opening edge portion.

The thickness of the first portion 33*a* may be not less than 10 nm and not more than 100 nm. The second portion 33*b* may have a thickness exceeding the thickness of the first portion 33*a*. The thickness of the second portion 33*b* may be not less than 50 nm and not more than 200 nm. The third portion 33*c* has a thickness exceeding the thickness of the first portion 33*a*. The thickness of the third portion 33*c* may be not less than 50 nm and not more than 200 nm. As a matter of course, a gate insulating film 33 having a uniform thickness may be formed.

The gate electrode 34 is embedded in the gate trench 32 with the gate insulating film 33 between the gate electrode 34 and the gate trench 32. The gate electrode 34 faces the second semiconductor region 11, the body region 23, and the source region 24 with the gate insulating film 33 between these regions and the gate electrode 34. The gate electrode 34 has an electrode surface exposed from the gate trench 32. The electrode surface of the gate electrode 34 is formed in a curved shape hollowed toward the bottom wall of the gate trench 32, and is narrowed by the third portion 33*c* of the gate insulating film 33.

The gate potential is applied to the gate electrode 34. The gate electrode 34 controls the on/off of the channel in the body region 23 through the gate insulating film 33. Preferably, the gate electrode 34 is constituted of conductive polysilicon. The gate electrode 34 may include n-type polysilicon that is doped with an n-type impurity and/or p-type polysilicon that is doped with a p-type impurity.

The transistor structure 30 includes a plurality of first trench source structures 41 formed at the active surface 6. A source potential is given to the first trench source structures 41. The source potential may be a reference potential that serves as an operation standard. The first trench source structures 41 are each formed at the active surface 6 such as to adjoin the trench gate structures 31 in the second direction Y. In detail, the first trench source structures 41 are each formed at a distance from each of the trench gate structures 31 in a region between two trench gate structures 31 that are adjacent to each other in the active surface 6, The first trench source structures 41 are each formed in a belt shape extending in the first direction X in plan view, and are formed with intervals therebetween in the second direction Y in a manner in which the single trench gate structure 31 is interposed therebetween. The first trench source structures 41 are formed in a stripe shape extending in the first direction X in plan view.

Preferably, the first trench source structures 41 cross the line, which passes through the central portion of the active surface 6 in the second direction Y in plan view, in the first direction X. In this embodiment, each of the first trench source structures 41 has a length exceeding the length of each of the trench gate structures 31 regarding the first direction X. The first trench source structures 41 cross an end portion of each of the trench gate structures 31 from the second-direction-Y side in the first direction X in plan view.

Each of the first trench source structures 41 includes a portion facing the second direction Y in a region between the peripheral edge of the active surface 6 (third and fourth connecting surfaces 8C and 8D) and the end portion of each of the trench gate structures 31 in plan view. The first trench source structures 41 are exposed from at least one of the third and fourth connecting surfaces 8C and 8D. In this embodiment, the first trench source structures 41 are exposed from both of the third and fourth connecting surfaces 8C and 8D. In other words, the first trench source structures 41 pass through the third and fourth connecting surfaces 8C and 8D.

Each of the first trench source structures 41 has a second width W2. The second width W2 is a width in a direction (i.e., second direction Y) perpendicular to a direction in which each of the first trench source structures 41 extends. The second width W2 may be not less than 0.1 μm and not more than 3 μm. Preferably, the second width W2 is not less than 0.5 μm and not more than 1.5 μm. The second width W2 may exceed the first width W1 (W1<W2), or may be equal to or less than the first width W1 (W1≥W2). In this embodiment, the second width W2 is substantially equal to the first width W1 (W1≈W2). Preferably, the second width W2 has a value falling within ±10% of the value of the first width W1.

Each of the first trench source structures 41 has a third depth D3. The third depth D3 exceeds the second depth D2 of the trench gate structure 31 (D2<D3). Preferably, the third depth D3 is not less than 1.5 times and not more than 3 times as long as the second depth D2. In this embodiment, the third depth D3 is substantially equal to the first depth D1 of the outer surface 7 (D1 & D3). In other words, each of the first trench source structures 41 communicates with the outer surface 7 and with the third and fourth connecting surfaces 8C and 8D. Preferably, the third depth D3 has a value falling within ±10% of the value of the first depth D1.

The third depth D3 may be not less than 0.5 μm and not more than 10 μm. Preferably, the third depth D3 is 5 μm or less. Particularly preferably, the third depth D3 is 2.5 μm or less. Preferably, an aspect ratio D3/W2 of each of the first trench source structures 41 is not less than 1 and not more than 5. The aspect ratio D3/W2 is a ratio of the third depth D3 to the second width W2. Particularly preferably, the aspect ratio D3/W2 is 2 or more.

The first trench source structures 41 are arranged with second intervals P2 between the trench gate structures 31 and the first trench source structures 41, respectively, in the second direction Y. The second interval P2 is a distance between the single trench gate structure 31 and the single first trench source structure 41 that are adjacent to each other in the second direction Y. Preferably, the second interval P2 is not less than ¼ of the first interval P1 and not more than ½ of the first interval P1 (¼×P1≤P2≤½×P1).

The second interval P2 may be not less than 0.1 μm and not more than 2.5 μm. Preferably, the second interval P2 is not less than 0.5 μm and not more than 1.5 μm. Preferably, the second interval P2 is less than the first width W1 of the trench gate structure 31 (P2<W1). Preferably, the second interval P2 is less than the second width W2 of the first trench source structure 41 (P2<W2). As a matter of course, the second interval P2 may be equal to or more than the first width W1 and the second width W2.

Each of the first trench source structures 41 includes a sidewall and a bottom wall. The sidewall of each of the first trench source structures 41 is formed by the a-plane of the SiC monocrystal. The sidewall of each of the first trench source structures 41 communicates with the third and fourth connecting surfaces 8C and 8D. The bottom wall of each of the first trench source structures 41 is formed by the c-plane of the SiC monocrystal. The bottom wall of each of the first trench source structures 41 communicates with the outer surface 7.

Each of the first trench source structures 41 may be formed in a vertical shape having a substantially uniform opening width. Each of the first trench source structures 41 may be formed in a tapered shape whose opening width becomes narrower toward the bottom wall. Preferably, the bottom wall of each of the first trench source structures 41 is formed in a curved shape toward the second main surface 4. As a matter of course, the bottom wall of each of the first trench source structures 41 may have a flat surface parallel to the active surface 6.

Each of the first trench source structures 41 is formed at the active surface 6 such as to cross the body region 23 and the source region 24 and reach the second semiconductor region 11. In detail, each of the first trench source structures 41 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the first trench source structures 41. In this embodiment, each of the first trench source structures 41 is formed in the second concentration region 13, and faces the first concentration region 12 with a part of the second concentration region 13 between the first concentration region 12 and each of the first trench source structures 41.

The sidewall of each of the first trench source structures 41 is in contact with the second semiconductor region 11, the body region 23, and the source region 24. The bottom wall of each of the first trench source structures 41 is in contact with the second semiconductor region 11. In this embodiment, each of the first trench source structures 41 is formed deeper than each of the trench gate structures 31. In other words, the bottom wall of each of the first trench source structures 41 is positioned at the bottom-portion side of the second semiconductor region 11 (second concentration region 13) with respect to the bottom wall of each of the trench gate structures 31.

Each of the first trench source structures 41 includes a source trench 42, a source insulating film 43, and a source electrode 44. The source trench 42, the source insulating film 43, and the source electrode 44 of each of the first trench source structures 41 may be referred to as the "first source trench," "first source insulating film," and "first source electrode," respectively. The single first trench source structure 41 will be hereinafter described.

The source trench 42 forms the sidewall and the bottom wall of the first trench source structure 41. The sidewall and the bottom wall form a wall surface (inner wall and outer wall) of the source trench 42. An opening edge portion of the source trench 42 is inclined obliquely downward from the active surface 6 toward the source trench 42. The opening edge portion is a connection portion between the active surface 6 and the sidewall of the source trench 42. In this embodiment, the opening edge portion is formed in a curved shape hollowed toward the SiC chip 2. The opening edge portion may be formed in a curved shape toward the inward side of the source trench 42.

The source insulating film 43 is formed in a film shape on the inner wall of the source trench 42, and defines a recessed space in the source trench 42. The source insulating film 43 covers the second semiconductor region 11, the body region 23, and the source region 24 in the inner wall of the source trench 42. The source insulating film 43 includes at least one among a silicon oxide film, a silicon nitride film, and a silicon oxynitride film. In this embodiment, the source insulating film 43 has a single layer structure constituted of a silicon oxide film, The source insulating film 43 includes a first portion 43*a*, a second portion 43*b*, and a third portion 43*c*. The first portion 43*a* covers the sidewall of the source trench 42. In detail, the first portion 43*a* covers the sidewall of the source trench 42 and exposes the surface layer portion of the first main surface 3 from the sidewall of the source trench 42 at a distance from an opening end of the source trench 42 toward the bottom-wall side in an arbitrary region (concretely, a region in which a contact region 70 described later is formed) of the source trench 42.

The first portion 43*a* covers the whole area of the sidewall of the source trench 42 at the peripheral-edge-portion side of the active surface 6. The second portion 43*b* covers the bottom wall of the source trench 42. The third portion 33*c* covers the opening edge portion of the source trench 42 outside a region in which the first portion 43*a* is formed. In this embodiment, the third portion 43*c* bulges in a curved shape toward the inward side of the source trench 42 in the opening edge portion.

The thickness of the first portion 43*a* may be not less than 10 nm and not more than 100 nm. The second portion 43*b* may have a thickness exceeding the thickness of the first portion 43*a*. The thickness of the second portion 43*b* may be not less than 50 nm and not more than 200 nm. The third portion 43*c* has a thickness exceeding the thickness of the first portion 43*a*. The thickness of the third portion 43*c* may be not less than 50 nm and not more than 200 nm. As a matter of course, a gate insulating film 43 having a uniform thickness may be formed.

The source electrode 44 is embedded in the source trench 42 with the source insulating film 43 between the source electrode 44 and the source trench 42. The source electrode 44 faces the second semiconductor region 11, the body region 23, and the source region 24 with the source insulating film 43 between these regions and the source electrode 44. The source electrode 44 has an upper end portion exposed from the source insulating film 43 in a portion in which the first portion 43*a* of the source insulating film 43 has been formed. The upper end portion of the source electrode 44 defines a recess hollowed in the thickness direction of the SiC chip 2 between the source trench 42 and the source insulating film 43.

The source electrode 44 has an electrode surface exposed from the source trench 42. The electrode surface of the source electrode 44 is formed in a curved shape hollowed toward the bottom wall of the source trench 42. The electrode surface of the source electrode 44 is narrowed by the third portion 43*c* of the insulating film at the peripheral-edge-portion side of the active surface 6.

The source potential is applied to the source electrode 44. Preferably, the source electrode 44 is constituted of conductive polysilicon. The source electrode 44 may include n-type polysilicon that is doped with an n-type impurity and/or p-type polysilicon that is doped with a p-type impurity. Preferably, the source electrode 44 includes the same conductive material as the gate electrode 34.

The transistor structure 30 includes a plurality of second trench source structures 51. The second trench source structure 51 may be referred to as an intermediate trench source structure. The source potential is given to the second trench source structures 51.

The second trench source structures 51 are each formed in a region between the peripheral edge of the active surface 6 and the trench gate structures 31. In detail, the second trench source structures 51 are each formed in a region between the third connecting surface 8C and the trench gate structures 31 and in a region between the fourth connecting surface 8D and the trench gate structures 31 in the active surface 6. The second trench source structures 51 are each formed at a distance from the trench gate structure 31 and from two first trench source structures 41 in a region between these two first trench source structures 41 that are adjacent to each other in the active surface 6.

In detail, the second trench source structures 51 are arranged with intervals therebetween in the second direction Y in a manner in which the single first trench source structure 41 is interposed therebetween, and face the trench gate structures 31 in a one-to-one correspondence in the first direction X, respectively. In other words, each of the second trench source structures 51 faces the trench gate structure 31 in the first direction X, and faces the second trench source structure 51 in the second direction Y.

Also, the second trench source structures 51 are each arranged in a region at the third-connecting-surface-8C side and in a region at the fourth-connecting-surface-8D side such as to sandwich a corresponding trench gate structure 31 from both sides in the first direction X. The second trench source structures 51 are each formed in a belt shape extending in the first direction X in plan view. The second trench source structures 51 are formed in a stripe shape extending in the first direction X in plan view.

The second trench source structures 51 positioned at the third-connecting-surface-8C side are exposed from the third connecting surface 8C, and the second trench source structures 51 positioned at the fourth-connecting-surface-8D side are exposed from the fourth connecting surface 8D. In other words, the second trench source structures 51 are formed such as to pass through either one of the third and fourth connecting surfaces 8C and 8D in accordance with its arrangement.

The second trench source structures 51 have a length less than the length of the trench gate structures 31 regarding the first direction X. In consideration of the single trench gate structure 31 and the two second trench source structures 51 that are arranged in the first direction X, the total length of the two second trench source structures 51 is less than the length of the single trench gate structure 31. The thus formed structure is effective in securing a channel length.

Each of the second trench source structures 51 has the second width W2 and the third depth D3 (aspect ratio D3/W2) in the same way as the first trench source structure 41. Also, the second trench source structures 51 are arranged with the second intervals P2 in the second direction Y in the same way as the first trench source structure 41.

The second trench source structures 51 are arranged with third intervals P3 between the trench gate structures 31 and the second trench source structures 51, respectively, in the first direction X. The third interval P3 is a distance between the single trench gate structure 31 and the single second trench source structure 51 that are adjacent to each other in the first direction X. Preferably, the third interval P3 is not less than ¼ of the first interval P1 and not more than the first interval P1 of the trench gate structures 31 ($\frac{1}{4}\times P1 \leq P3 < P1$). Preferably, the third interval P3 is equal to or less than ½ of the first interval P1 ($P3 \leq \frac{1}{2}\times P1$).

The third interval P3 may be not less than 0.1 μm and not more than 2.5 μm. Preferably, the third interval P3 is not less than 0.5 μm and not more than 1.5 μm. Preferably, the third interval P3 is substantially equal to the second interval P2 between the trench gate structure 31 and the first trench source structure 41 ($P2 > P3$). Preferably, the third interval P3 has a value falling within #10% of the value of the second interval P2.

Each of the second trench source structures 51 includes a sidewall and a bottom wall. The sidewall forming the long side of each of the second trench source structures 51 is formed by the a-plane of the SiC monocrystal. The sidewall forming the short side of each of the second trench source structures 51 is formed by the m-plane of the SiC monocrystal. The sidewall of each of the second trench source structures 51 communicates with either one of the third and fourth connecting surfaces 8C and 8D. The bottom wall of each of the second trench source structures 51 is formed by the c-plane of the SiC monocrystal. The bottom wall of each of the second trench source structures 51 communicates with the outer surface 7.

Each of the second trench source structures 51 may be formed in a vertical shape having a substantially uniform opening width. Each of the second trench source structures 51 may be formed in a tapered shape whose opening width becomes narrower toward the bottom wall. Preferably, the bottom wall of each of the second trench source structures 51 is formed in a curved shape toward the second main surface 4. As a matter of course, the bottom wall of each of the second trench source structures 51 may have a flat surface parallel to the active surface 6.

Each of the second trench source structures 51 is formed at the active surface 6 such as to cross the body region 23 and the source region 24 and reach the second semiconductor region 11. In detail, each of the second trench source structures 51 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the second trench source structures 51.

In this embodiment, each of the second trench source structures 51 is formed in the second concentration region 13, and faces the first concentration region 12 with a part of the second concentration region 13 between the first concentration region 12 and each of the second trench source structures 51.

The sidewall of each of the second trench source structures 51 is in contact with the second semiconductor region 11, the body region 23, and the source region 24. The bottom wall of each of the second trench source structures 51 is in contact with the second semiconductor region 11. In this embodiment, each of the second trench source structures 51 is formed deeper than each of the trench gate structures 31. In other words, the bottom wall of each of the second trench source structures 51 is positioned at the bottom-portion side of the second semiconductor region 11 (second concentration region 13) with respect to the bottom wall of each of the trench gate structures 31.

Each of the second trench source structures 51 includes the source trench 42, the source insulating film 43, and the source electrode 44 in the same way as the first trench source structure 41. The source trench 42, the source insulating film 43, and the source electrode 44 of each of the second trench source structures 51 may be referred to as the "second source trench," "second source insulating film," and "second source electrode," respectively.

In each of the second trench source structures 51, the third portion 43*c* of the source insulating film 43 is formed in the whole area of the opening edge portion of the source trench 42. Besides, a description of the source trench 42, the source insulating film 43, and the source electrode 44 of the first trench source structure 41 is applied to a description of the source trench 42, the source insulating film 43, and the source electrode 44 of the second trench source structure 51, respectively.

Figure 13:
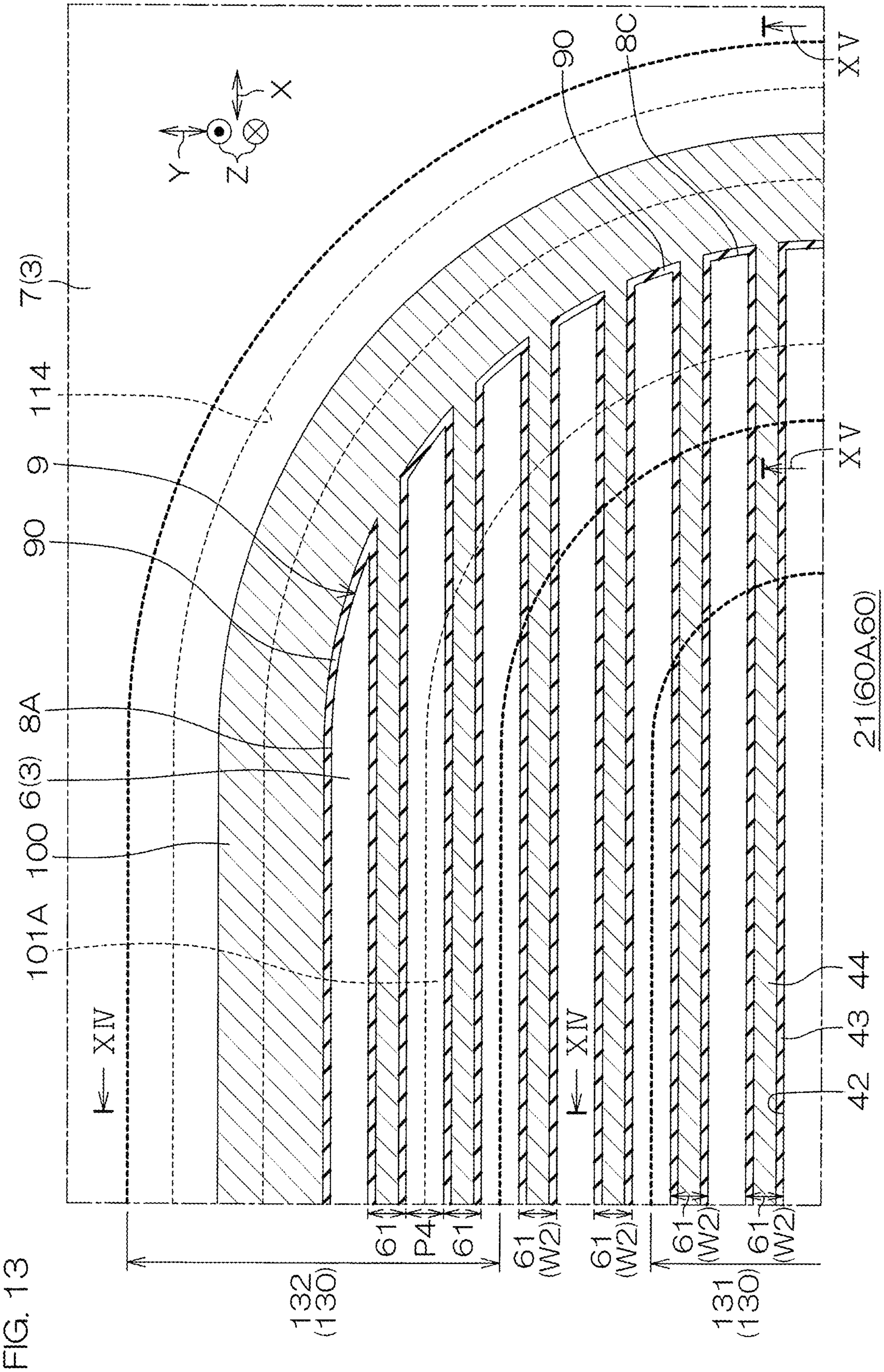
FIG. 13 is an enlarged plan view of a corner portion of a first peripheral region shown in FIG. 5.
Figure 14:
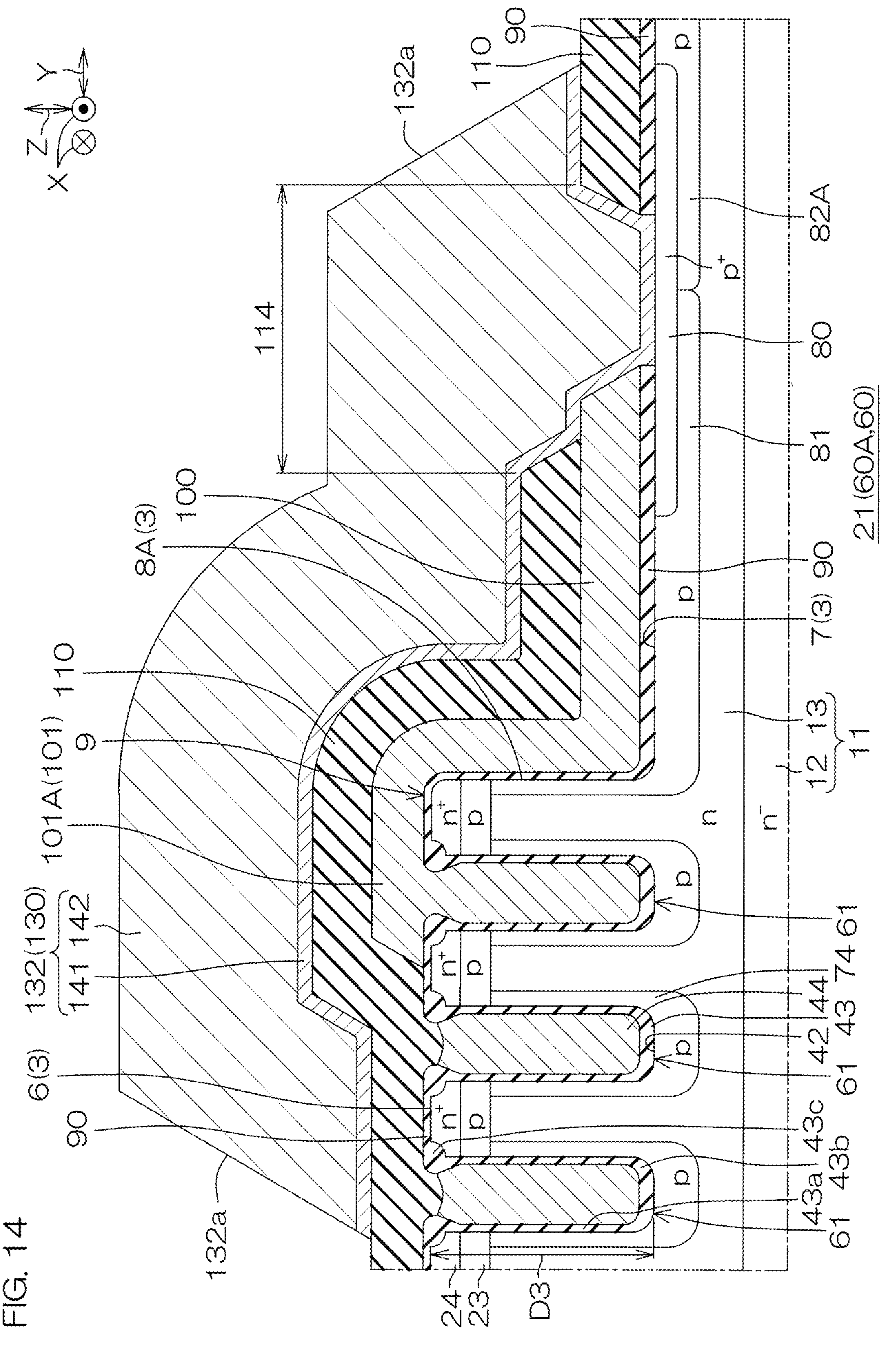
FIG. 14 is a cross-sectional view along line XIV-XIV shown in FIG. 13.
Figure 15:
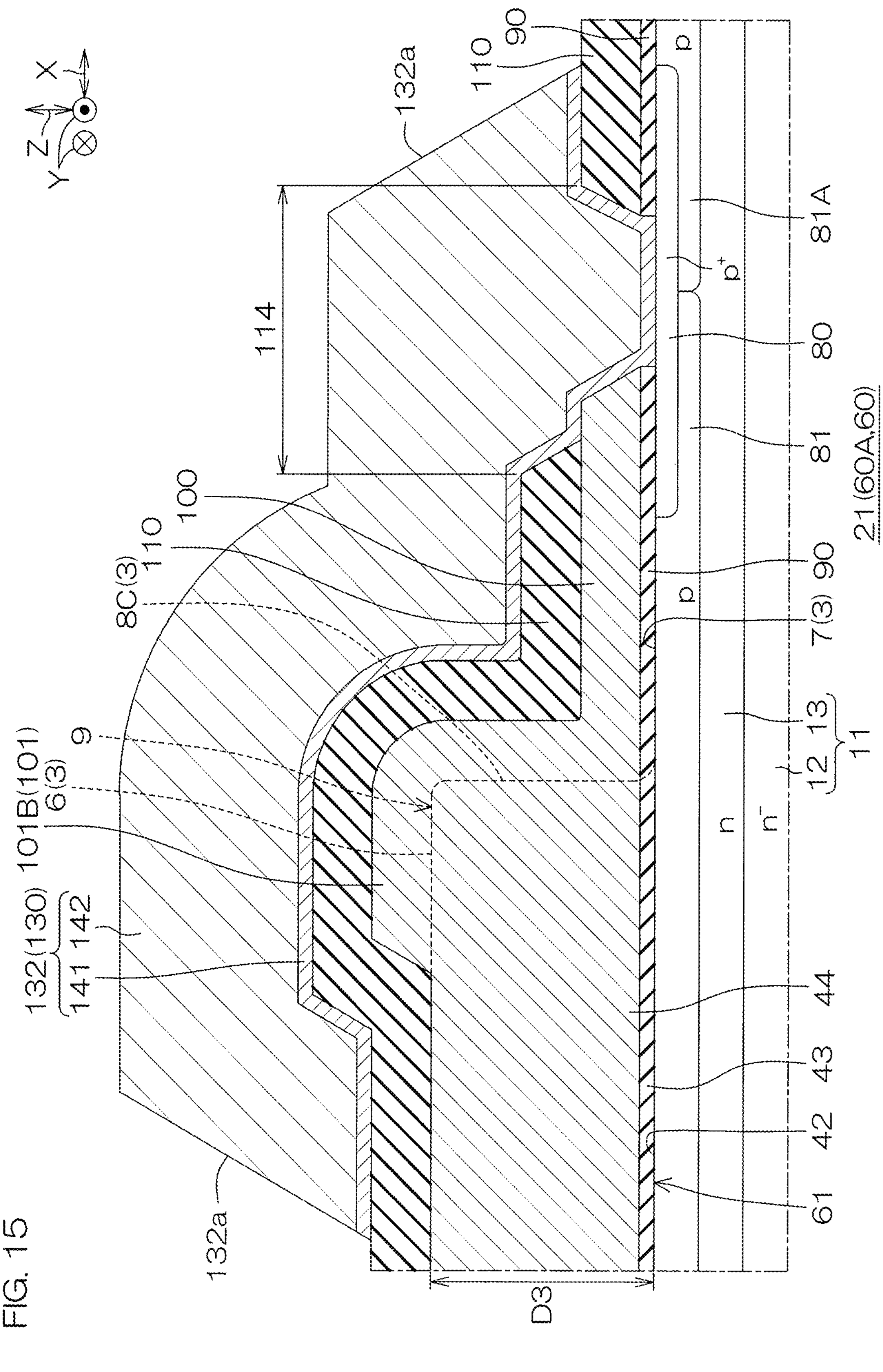
FIG. 15 is a cross-sectional view along line XV-XV shown in FIG. 13.
Figure 16:
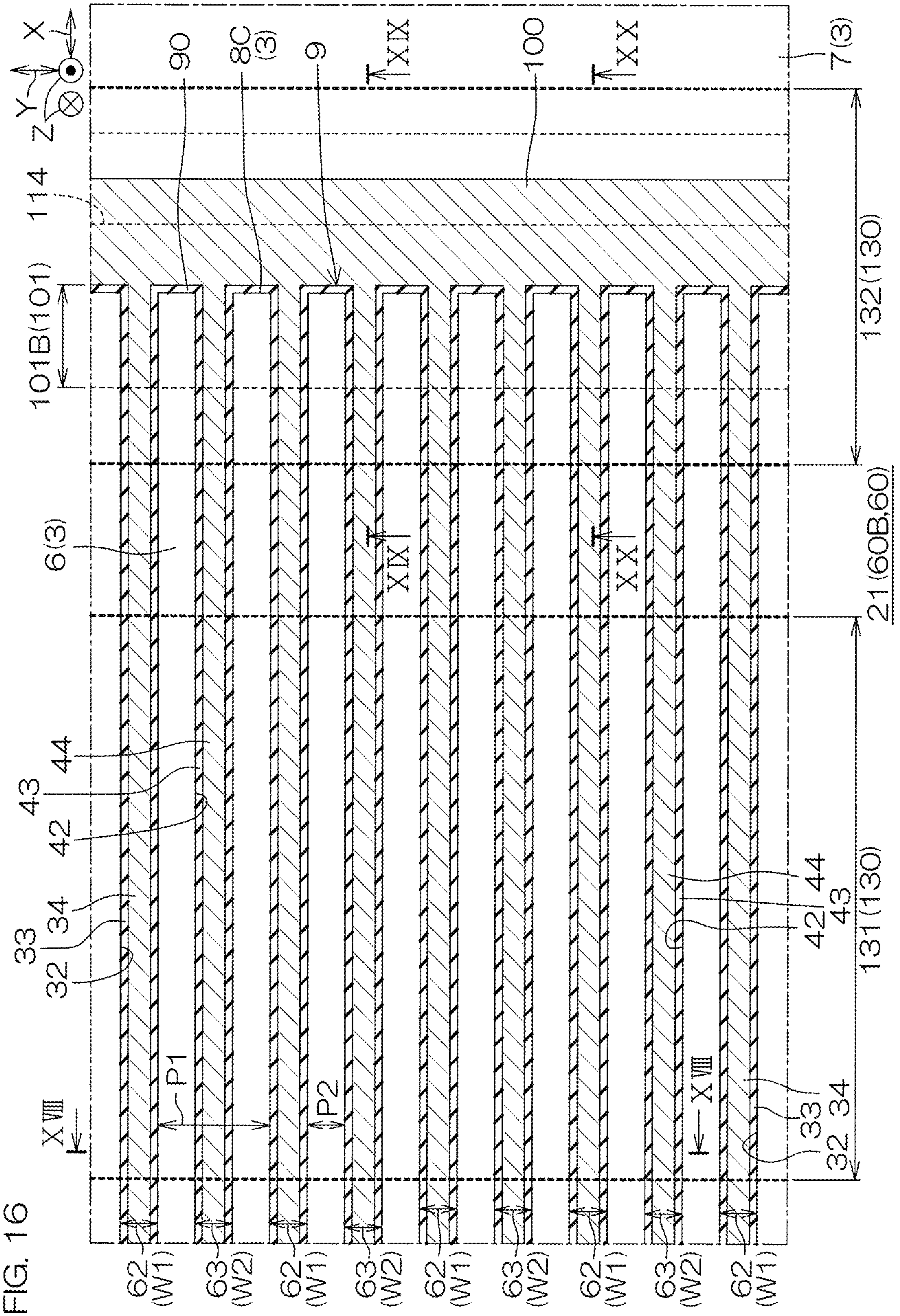
FIG. 16 is an enlarged plan view of an end portion of the first peripheral region shown in FIG. 5.
Figure 17:
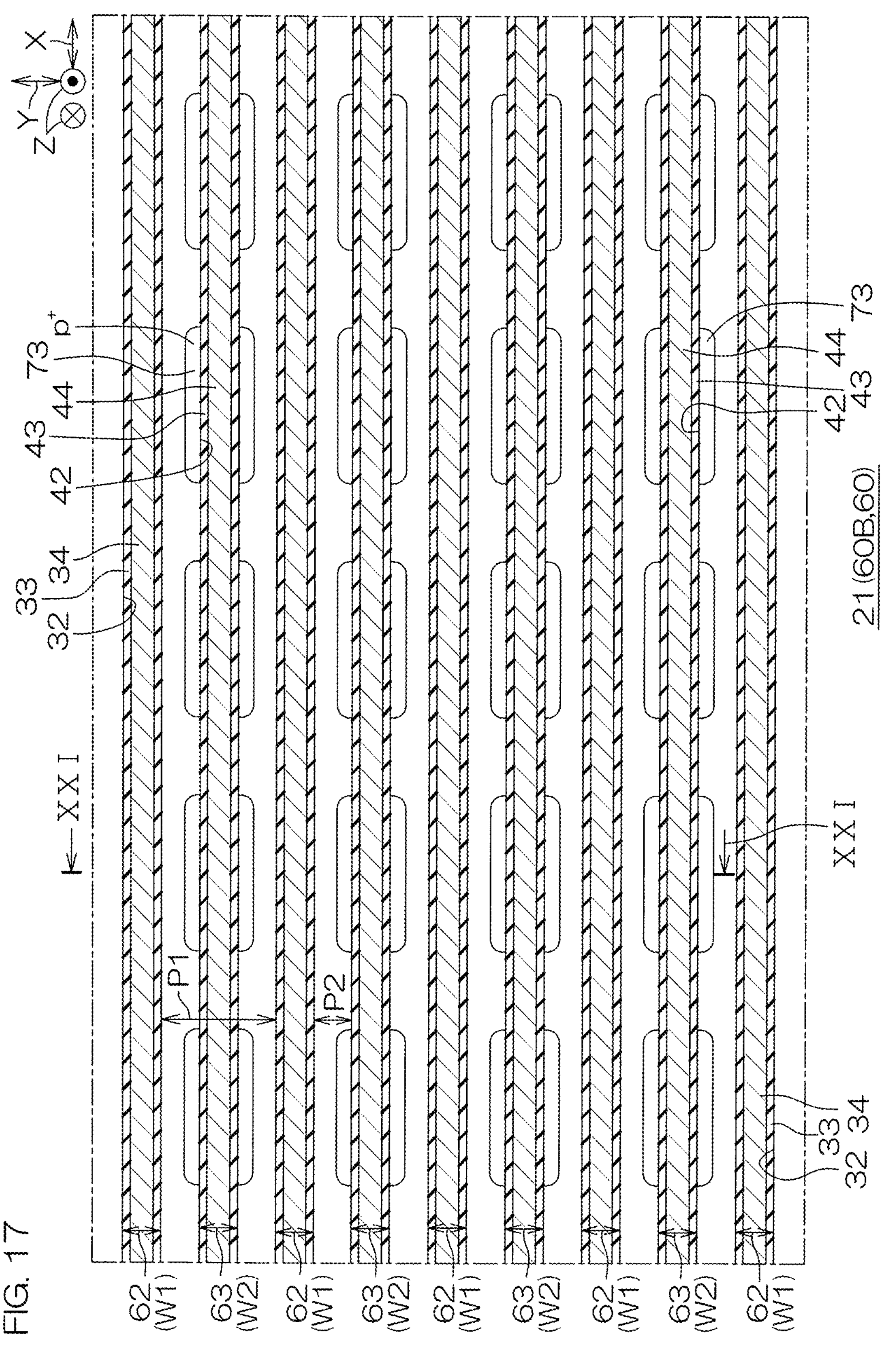
FIG. 17 is an enlarged plan view of an inward portion of the first peripheral region shown in FIG. 5.
Figure 18:
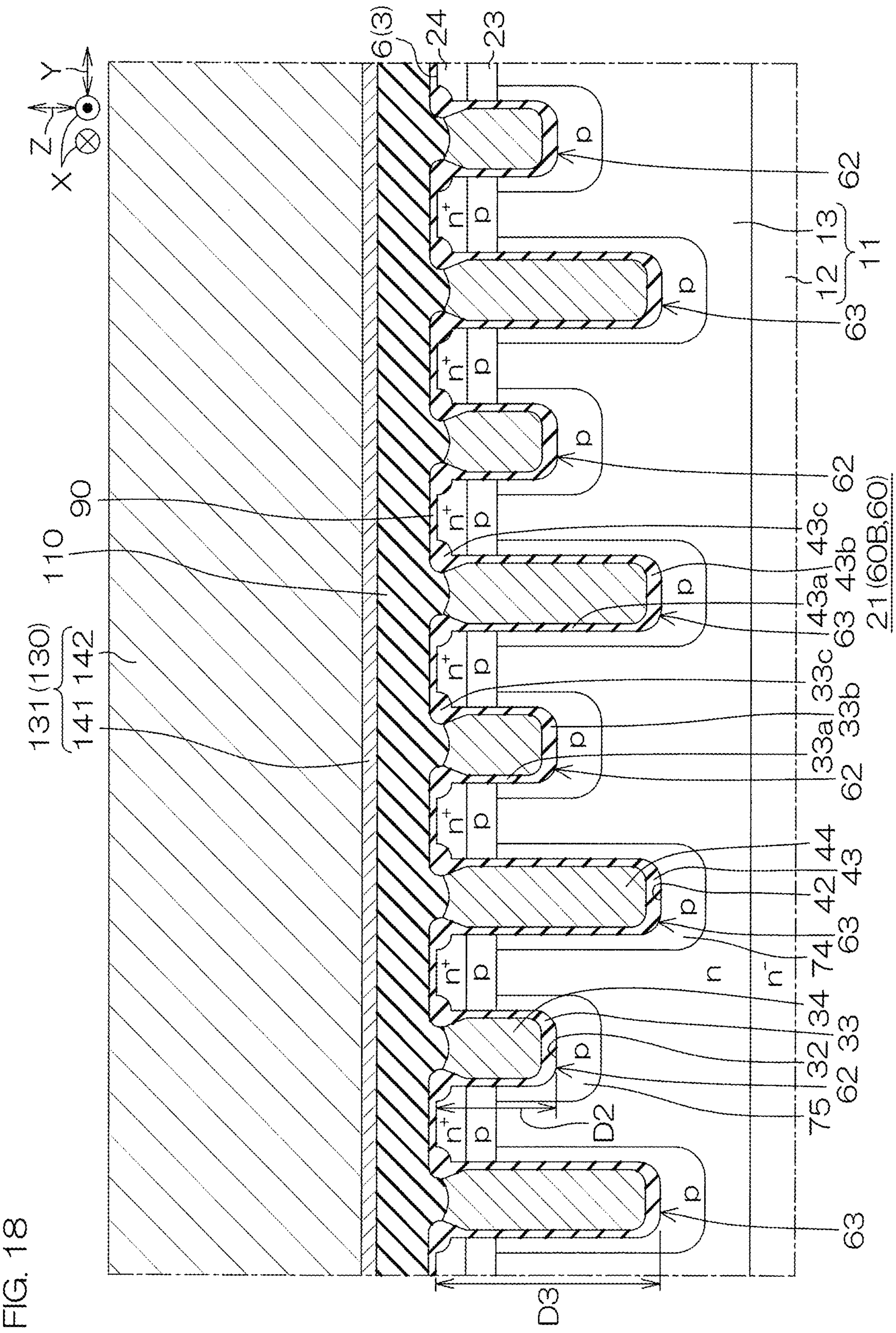
FIG. 18 is a cross-sectional view along line XVIII-XVIII shown in FIG. 16.

FIG. 13 is an enlarged plan view of a corner portion of the first peripheral region shown in FIG. 5, FIG. 14 is a cross-sectional view along line XIV-XIV shown in FIG. 13. FIG. 15 is a cross-sectional view along line XV-XV shown in FIG. 13. FIG. 16 is an enlarged plan view of an end portion of the first peripheral region 21 shown in FIG. 5. FIG. 17 is an enlarged plan view of an inward portion of the first peripheral region 21 shown in FIG. 5. FIG. 18 is a cross-sectional view along line XVIII-XVIII shown in FIG. 16.

Figure 19:
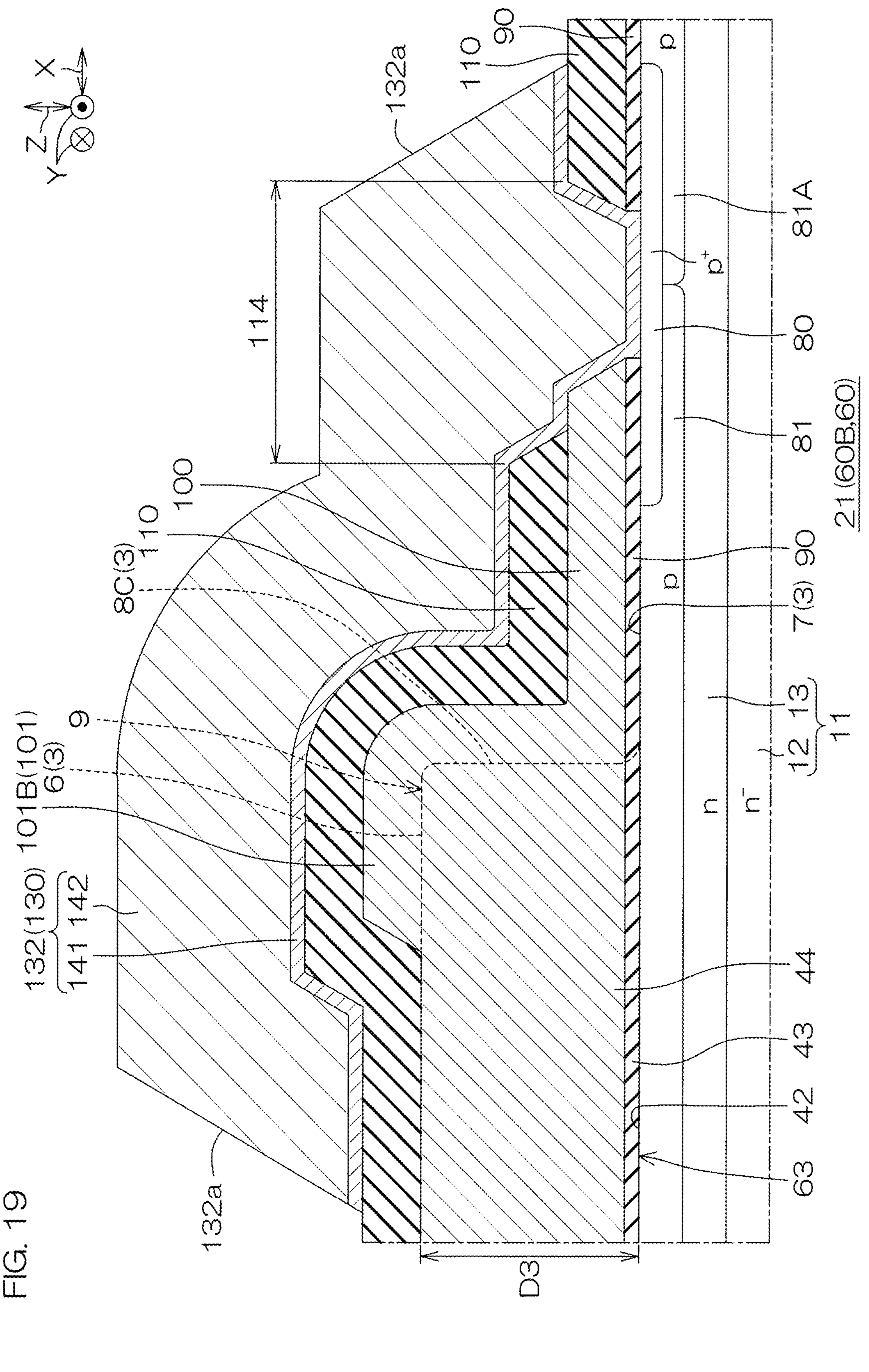
FIG. 19 is a cross-sectional view along line XIX-XIX shown in FIG. 16.
Figure 20:
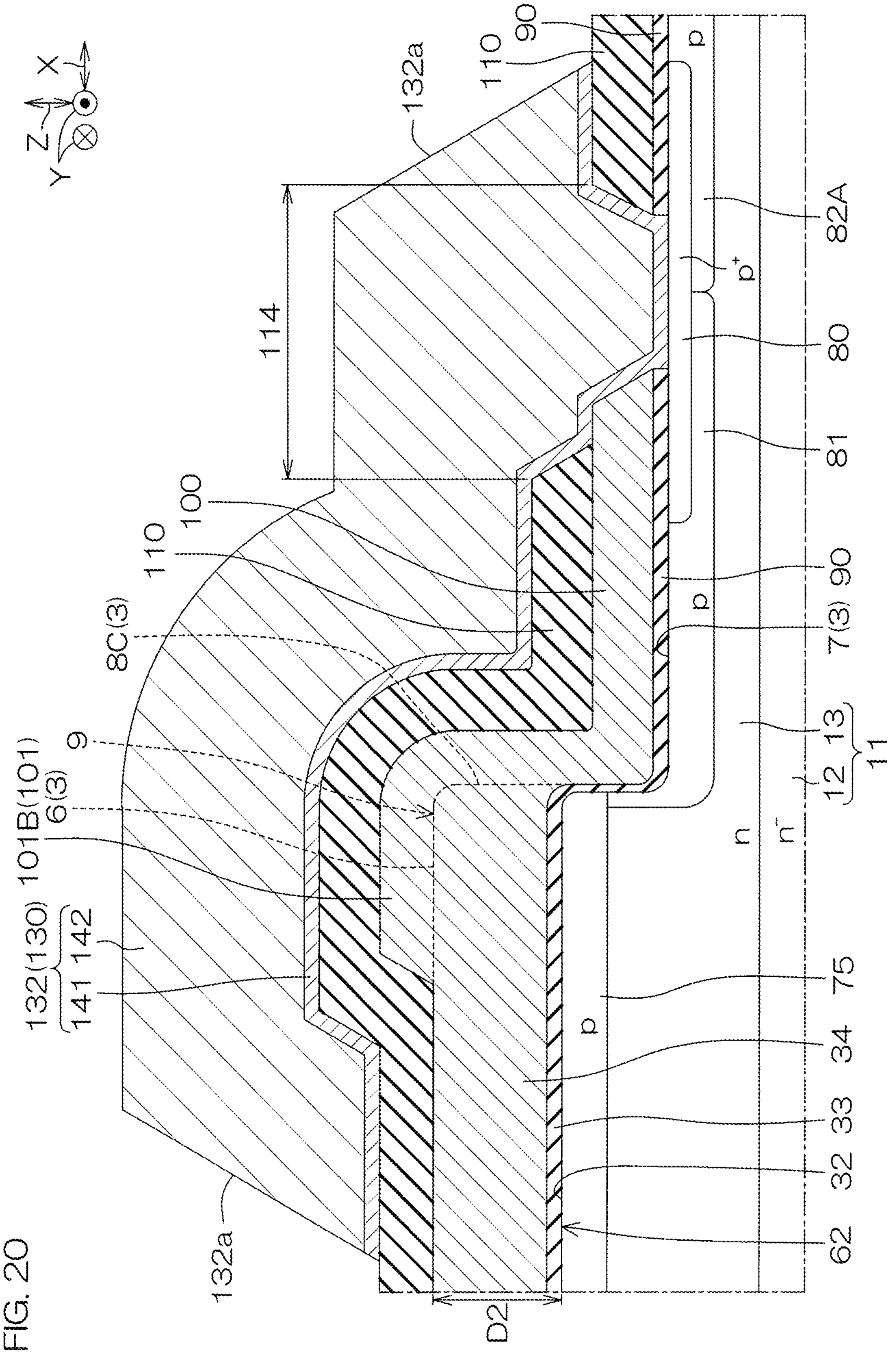
FIG. 20 is a cross-sectional view along line XX-XX shown in FIG. 16.
Figure 21:
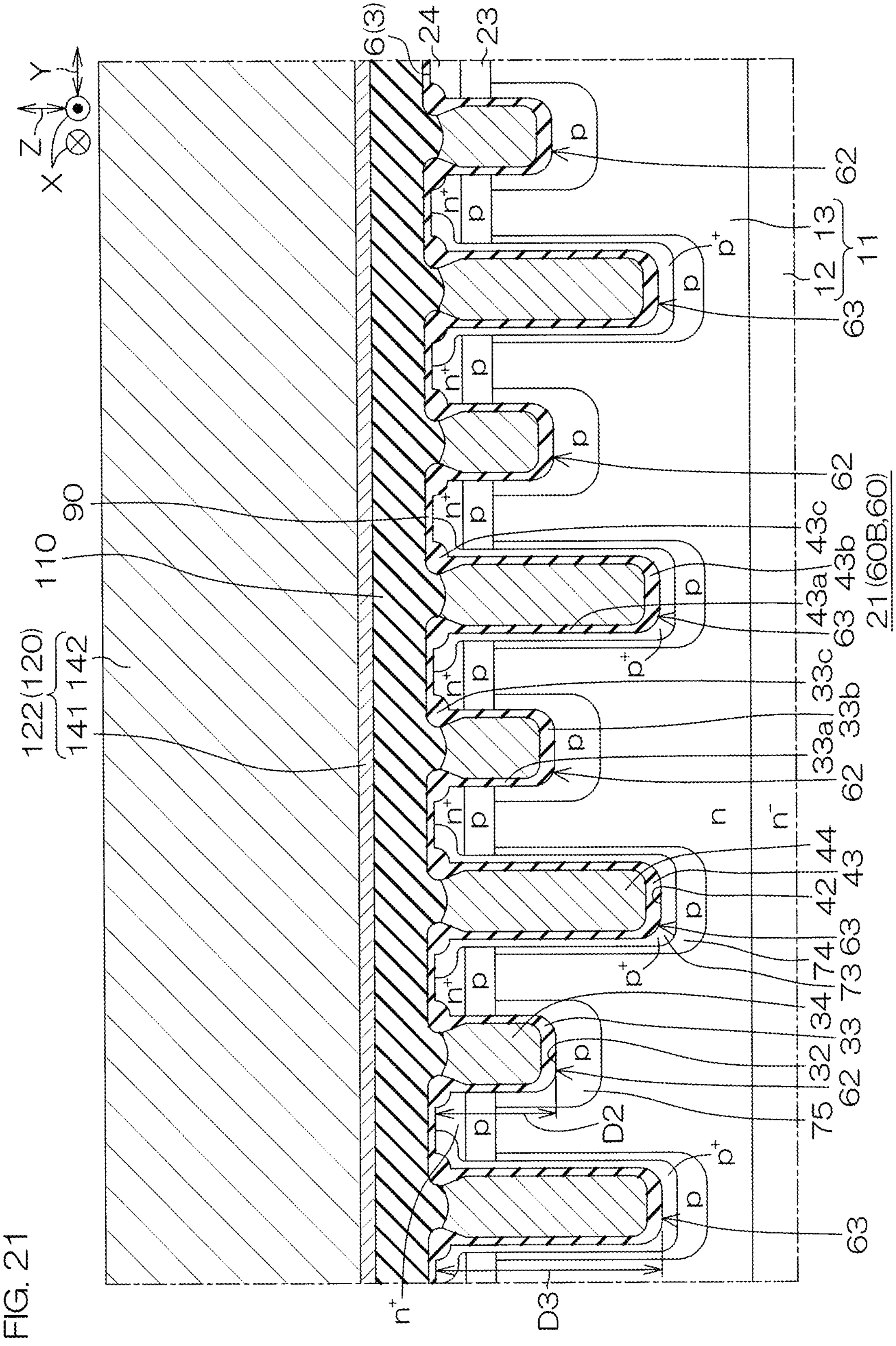
FIG. 21 is a cross-sectional view along line XXI-XXI shown in FIG. 17.

FIG. 19 is a cross-sectional view along line XIX-XIX shown in FIG. 16. FIG. 20 is a cross-sectional view along line XX-XX shown in FIG. 16. FIG. 21 is a cross-sectional view along line XXI-XXI shown in FIG. 17. A structure at the second-peripheral-region-22 side (second-connecting-surface-8B side) is the same as a structure at the first-peripheral-region-21 side (first-connecting-surface-8A side), and therefore the structure at the first-peripheral-region-21 side (first-connecting-surface-8A side) will be hereinafter described as an example.

Referring to FIG. 5 and FIGS. 13 to 21, the SiC semiconductor device 1 includes a dummy structure 60 formed in the first peripheral region 21 (peripheral edge portion of the active surface 6) in the active surface 6. The dummy structure 60 is a region that does not operate as a MISFET, and may be referred to as a dummy transistor structure. In this embodiment, the dummy structure 60 includes a first dummy structure 60A and a second dummy structure 60B.

The first dummy structure 60A is formed in a region between the peripheral edge (first connecting surface 8A) of the active surface 6 and the transistor structure 30 in the first peripheral region 21. The first dummy structure 60A is formed at the most peripheral edge portion (region adjacent to the first connecting surface 8A) of the active surface 6 in the first peripheral region 21. The second dummy structure 60B is formed in a region between the transistor structure 30 and the first dummy structure 60A in the first peripheral region 21.

The first dummy structure 60A has a first dummy width WD1 regarding the second direction Y. The second dummy structure 60B has a second dummy width WD2 regarding the second direction Y. Preferably, the second dummy width WD2 exceeds the first dummy width WD1 ($WD1<WD2$) although the second dummy width WD2 is arbitrary. Preferably, the second dummy width WD2 is equal to or less than five times as long as the first dummy width WD1 ($WD2<5\times WD1$), Particularly preferably, the second dummy width WD2 is equal to or less than three times as long as the first dummy width WD1 ($WD2<3\times WD1$).

The dummy structure 60 suffices to include at least one of the first dummy structure 60A and the second dummy structure 60B, and is not necessarily required to simultaneously include both the first dummy structure 60A and the second dummy structure 60B. The dummy structure 60 may have a single dummy structure composed of the first dummy structure 60A or the second dummy structure 60B. Preferably, the dummy structure 60 includes at least the first dummy structure 60A. Most preferably, the dummy structure 60 includes both the first dummy structure 60A and the second dummy structure 60B.

The first dummy structure 60A includes at least one first dummy trench source structure 61 formed at the active surface 6. In this embodiment, the first dummy structure 60A includes a plurality of first dummy trench source structures 61. Preferably, the number of the first dummy trench source structures 61 is not less than 10 and not more than 50 although the number of the first dummy trench source structures 61 is arbitrary. The first dummy width WD1 is adjusted by the number of the first dummy trench source structures 61. Particularly preferably, the number of the first dummy trench source structures 61 is 25 or less. In this case, it is possible to restrain a decrease in the area of the transistor region 20 due to the first peripheral region 21.

The source potential is given to the first dummy trench source structures 61. The first dummy trench source structures 61 are each formed in a belt shape extending in the first direction X in plan view, and are consecutively arranged with intervals therebetween in the second direction Y such as to adjoin each other. The first dummy trench source structures 61 are formed in a stripe shape extending in the first direction X in plan view.

Preferably, the first dummy trench source structures 61 cross the line, which passes through the central portion of the active surface 6 in the second direction Y in plan view, in the first direction X. In this embodiment, each of the first dummy trench source structures 61 has a length exceeding the length of each of the trench gate structures 31 regarding the first direction X. The first dummy trench source structures 61 cross the end portion of each of the trench gate structures 31 from the second-direction-Y side in the first direction X in plan view.

Each of the first dummy trench source structures 61 includes a portion facing the second direction Y in a region between the peripheral edge of the active surface 6 (third and fourth connecting surfaces 8C and 8D) and the end portion of each of the trench gate structures 31 in plan view. The first dummy trench source structures 61 face the trench gate structures 31, the first trench source structures 41, and the second trench source structures 51 in the second direction Y.

The first dummy trench source structures 61 are each exposed from at least one of the third and fourth connecting surfaces 8C and 8D. In this embodiment, the first dummy trench source structures 61 are each exposed from both of the third and fourth connecting surfaces 8C and 8D. In other words, the first dummy trench source structures 61 pass through the third and fourth connecting surfaces 8C and 8D in the same way as the first trench source structure 41, Each of the first dummy trench source structures 61 has the second width W2 and the third depth D3 (aspect ratio D3/W2) in the same way as the first trench source structure 41. In other words, each of the first dummy trench source structures 61 communicates with the outer surface 7 and the third and fourth connecting surfaces 8C and 8D.

The first dummy trench source structures 61 are arranged with fourth intervals P4 therebetween in the second direction Y. The fourth interval P4 is a distance between two first dummy trench source structures 61 that are adjacent to each other in the second direction Y. Preferably, the fourth interval P4 is not less than ¼ of the first interval P1 and not more than ½ of the first interval P1 ($\frac{1}{4}\times P1 \leq P4 \leq \frac{1}{2}\times P1$).

The fourth interval P4 may be not less than 0.1 μm and not more than 2.5 μm. Preferably, the fourth interval P4 is not less than 0.5 μm and not more than 1.5 μm. Preferably, the fourth interval P4 is less than the first width W1 of the trench gate structure 31 ($P4<W1$). Preferably, the fourth interval P4 is less than the second width W2 of the first dummy trench source structure 61 ($P4<W2$). As a matter of course, the fourth interval P4 may be equal to or more than the first width W1 and the second width W2.

Preferably, the fourth interval P4 is substantially equal to the second interval P2 between the trench gate structure 31 and the first trench source structure 41 ($P2\approx P4$). Preferably, the fourth interval P4 has a value falling within ±10% of the value of the second interval P2. Preferably, the fourth interval P4 is substantially equal to the third interval P3 between the trench gate structure 31 and the second trench source structure 51 ($P3=P4$). Preferably, the fourth interval P4 has a value falling within ±10% of the value of the third interval P3.

Each of the first dummy trench source structures 61 includes a sidewall and a bottom wall. The sidewall of each of the first dummy trench source structures 61 is formed by the a-plane of the SiC monocrystal. The sidewall of each of the first dummy trench source structures 61 communicates with the third and fourth connecting surfaces 8C and 8D. The bottom wall of each of the first dummy trench source structures 61 is formed by the c-plane of the Sic monocrystal. The bottom wall of each of the first dummy trench source structures 61 communicates with the outer surface 7.

Each of the first dummy trench source structures 61 may be formed in a vertical shape having a substantially uniform opening width. Each of the first dummy trench source structures 61 may be formed in a tapered shape whose opening width becomes narrower toward the bottom wall. Preferably, the bottom wall of each of the first dummy trench source structures 61 is formed in a curved shape toward the second main surface 4. As a matter of course, the bottom wall of each of the first dummy trench source structures 61 may have a flat surface parallel to the active surface 6.

Each of the first dummy trench source structures 61 is formed at the active surface 6 such as to cross the body region 23 and the source region 24 and reach the second semiconductor region 11. In detail, each of the first dummy trench source structures 61 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the first dummy trench source structures 61. In this embodiment, each of the first dummy trench source structures 61 is formed in the second concentration region 13, and faces the first concentration region 12 with a part of the second concentration region 13 between the first concentration region 12 and each of the first dummy trench source structures 61.

The sidewall of each of the first dummy trench source structures 61 is in contact with the second semiconductor region 11, the body region 23, and the source region 24. The bottom wall of each of the first dummy trench source structures 61 is in contact with the second semiconductor region 11. In this embodiment, each of the first dummy trench source structures 61 is formed deeper than each of the trench gate structures 31. In other words, the bottom wall of each of the first dummy trench source structures 61 is positioned at the bottom-portion side of the second semiconductor region 11 (second concentration region 13) with respect to the bottom wall of each of the trench gate structures 31.

Each of the first dummy trench source structures 61 includes the source trench 42, the source insulating film 43, and the source electrode 44 in the same way as the first trench source structure 41. The source trench 42, the source insulating film 43, and the source electrode 44 of each of the first dummy trench source structures 61 may be referred to as the "first dummy source trench," "first dummy source insulating film," and "first dummy source electrode," respectively.

In each of the first dummy trench source structures 61, the third portion 43*c* of the source insulating film 43 is formed in the whole area of the opening edge portion of the source trench 42. Besides, a description of the source trench 42, the source insulating film 43, and the source electrode 44 of the first trench source structure 41 is applied to a description of the source trench 42, the source insulating film 43, and the source electrode 44 of the first dummy trench source structure 61, respectively.

The second dummy structure 60B includes at least one dummy trench gate structure 62 formed at the active surface 6 and at least one second dummy trench source structure 63 formed at the active surface 6 such as to adjoin the dummy trench gate structure 62. In this embodiment, the second dummy structure 60B includes a plurality of dummy trench gate structures 62 and a plurality of second dummy trench source structures 63.

The dummy trench gate structures 62 and the second dummy trench source structures 63 are alternately arranged with intervals between the dummy trench gate structures 62 and the second dummy trench source structures 63 in the second direction Y in a state in which two dummy trench gate structures 62 are set as an arrangement start point and an arrangement end point, respectively. In other words, in this embodiment, the second dummy structure 60B is defined by a trench structure group in which two dummy trench gate structures 62 are set as an arrangement start point and an arrangement end point, respectively. The second dummy structure 60B is formed with the second interval P2 between the first trench source structure 41 of the transistor structure 30 and the second dummy structure 60B, and is formed with the fourth interval P4 (the second interval P2) between the first dummy trench source structure 61 of the first dummy structure 60A and the second dummy structure 60B.

Preferably, the number of the dummy trench gate structures 62 is less than the number of the trench gate structures 31 although the number of the dummy trench gate structures 62 is arbitrary. The number of the dummy trench gate structures 62 may be not less than 10 and not more than 50. Preferably, the number of the dummy trench gate structures 62 is 25 or less. Preferably, the number of the second dummy trench source structures 63 is less than the number of the first trench source structures 41 although the number of the second dummy trench source structures 63 is arbitrary. The number of the second dummy trench source structures 63 may be not less than 10 and not more than 50. Preferably, the number of the second dummy trench source structures 63 is 25 or less.

Preferably, the total number of the dummy trench gate structures 62 and the second dummy trench source structures 63 exceeds the total number of the first dummy trench source structures 61 of the first dummy structure 60A. Preferably, the total number of the dummy trench gate structures 62 and the second dummy trench source structures 63 is 50 or less. In this case, it is possible to restrain a decrease in the area of the transistor region 20 due to the first peripheral region 21.

The dummy trench gate structures 62 do not form the gate of the MISFET unlike the trench gate structure 31. The source potential is given to the dummy trench gate structures 62. Therefore, channel formation due to the dummy trench gate structures 62 is restrained. The dummy trench gate structures 62 are each formed in a belt shape extending in the first direction X in plan view, and are arranged with intervals therebetween in the second direction Y. The dummy trench gate structures 62 are formed in a stripe shape extending in the first direction X in plan view.

Preferably, the dummy trench gate structures 62 cross the line, which passes through the central portion of the active surface 6 in the second direction Y in plan view, in the first direction X. In this embodiment, each of the dummy trench gate structures 62 has a length exceeding the length of each of the trench gate structures 31 regarding the first direction X. The dummy trench gate structures 62 cross the end portion of each of the trench gate structures 31 from the second-direction-Y side in the first direction X in plan view.

The dummy trench gate structures 62 include a portion facing the second direction Y in a region between the peripheral edge of the active surface 6 (third and fourth connecting surfaces 8C and 8D) and the end portion of each of the trench gate structures 31 in plan view. The dummy trench gate structures 62 face the trench gate structures 31, the first trench source structures 41, the second trench source structures 51, and the first dummy trench source structures 61 in the second direction Y.

The dummy trench gate structures 62 are exposed from at least one of the third and fourth connecting surfaces 8C and 8D. In this embodiment, the dummy trench gate structures 62 are each exposed from both of the third and fourth connecting surfaces 8C and 8D. In other words, the dummy trench gate structures 62 pass through the third and fourth connecting surfaces 8C and 8D in the same way as the first trench source structure 41.

Each of the dummy trench gate structures 62 has the first width W1 and the second depth D2 (aspect ratio D2/W1) in the same way as the trench gate structure 31. In other words, each of the first dummy trench source structures 61 communicates with the third and fourth connecting surfaces 8C and 8D at a distance from the outer surface 7 toward the active-surface-6 side. Also, the dummy trench gate structures 62 are arranged with the first intervals P1 in the second direction Y in the same way as the trench gate structure 31.

Each of the dummy trench gate structures 62 includes a sidewall and a bottom wall. The sidewall of each of the dummy trench gate structures 62 is formed by the a-plane of the SiC monocrystal. The sidewall of each of the dummy trench gate structures 62 communicates with the third and fourth connecting surfaces 8C and 8D. The bottom wall of each of the dummy trench gate structures 62 is formed by the c-plane of the SiC monocrystal. The bottom wall of each of the dummy trench gate structures 62 communicates with the third and fourth connecting surfaces 8C and 8D.

Each of the dummy trench gate structures 62 may be formed in a vertical shape having a substantially uniform opening width. Each of the dummy trench gate structures 62 may be formed in a tapered shape whose opening width becomes narrower toward the bottom wall. Preferably, the bottom wall of each of the dummy trench gate structures 62 is formed in a curved shape toward the second main surface 4. As a matter of course, the bottom wall of each of the dummy trench gate structures 62 may have a flat surface parallel to the active surface 6.

Each of the dummy trench gate structures 62 is formed at the active surface 6 such as to cross the body region 23 and the source region 24 and reach the second semiconductor region 11. In detail, each of the dummy trench gate structures 62 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the dummy trench gate structures 62.

In this embodiment, each of the dummy trench gate structures 62 is formed in the second concentration region 13, and faces the first concentration region 12 with a part of the second concentration region 13 between the first concentration region 12 and each of the dummy trench gate structures 62. The sidewall of each of the dummy trench gate structures 62 is in contact with the second semiconductor region 11, the body region 23, and the source region 24. The bottom wall of each of the dummy trench gate structures 62 is in contact with the second semiconductor region 11.

Each of the dummy trench gate structures 62 includes the gate trench 32, the gate insulating film 33, and the gate electrode 34 in the same way as the trench gate structure 31. The gate trench 32, the gate insulating film 33, and the gate electrode 34 of each of the dummy trench gate structures 62 may be referred to as the "dummy gate trench," "dummy gate insulating film," and "dummy gate electrode," respectively.

A description of the gate trench 32, the gate insulating film 33, and the gate electrode 34 of the trench gate structure 31 is applied to a description of the gate trench 32, the gate insulating film 33, and the gate electrode 34 of the dummy trench gate structure 62, respectively.

The source potential is given to the second dummy trench source structures 63. The second dummy trench source structures 63 are formed at the active surface 6 such as to adjoin the dummy trench gate structures 62, respectively, in the second direction Y. In detail, the second dummy trench source structures 63 are each formed at a distance from each of the dummy trench gate structures 62 in a region between two dummy trench gate structures 62 that are adjacent to each other in the active surface 6.

In more detail, the second dummy trench source structures 63 are each formed in a belt shape extending in the first direction X in plan view, and are formed with intervals therebetween in the second direction Y in a manner in which the single dummy trench gate structure 62 is interposed therebetween. The second dummy trench source structures 63 are formed in a stripe shape extending in the first direction X in plan view. Preferably, the second dummy trench source structures 63 cross the line, which passes through the central portion of the active surface 6 in the second direction Y in plan view, in the first direction X, In this embodiment, the second dummy trench source structures 63 have a length exceeding the length of each of the trench gate structures 31 regarding the first direction X. The second dummy trench source structures 63 cross the end portion of each of the trench gate structures 31 from the second-direction-Y side in the first direction X in plan view. The second dummy trench source structures 63 include a portion facing the second direction Y in a region between the peripheral edge of the active surface 6 (third and fourth connecting surfaces 8C and 8D) and an end portion of each of the dummy trench gate structures 62 in plan view. The second dummy trench source structure 63 face the trench gate structures 31, the first trench source structures 41, the second trench source structures 51, the first dummy trench source structures 61, and the dummy trench gate structures 62 in the second direction Y.

The second dummy trench source structures 63 are exposed from at least one of the third and fourth connecting surfaces 8C and 8D. In this embodiment, the second dummy trench source structures 63 are each exposed from both of the third and fourth connecting surfaces 8C and 8D. In other words, the second dummy trench source structures 63 pass through the third and fourth connecting surfaces 8C and 8D.

Each of the second dummy trench source structures 63 has the second width W2 and the third depth D3 (aspect ratio D3/W2) in the same way as the first trench source structure 41. In other words, each of the second dummy trench source structures 63 communicates with the outer surface 7 and the third and fourth connecting surfaces 8C and 8D in the same way as the first trench source structure 41. Also, the second dummy trench source structures 63 are arranged with the second intervals P2 in the second direction Y in the same way as the first trench source structure 41.

Each of the second dummy trench source structures 63 includes a sidewall and a bottom wall. The sidewall of each of the second dummy trench source structures 63 is formed by the a-plane of the SiC monocrystal. The sidewall of each of the second dummy trench source structures 63 communicates with the third and fourth connecting surfaces 8C and 8D. The bottom wall of each of the second dummy trench source structures 63 is formed by the c-plane of the SiC monocrystal. The bottom wall of each of the second dummy trench source structures 63 communicates with the outer surface 7.

Each of the second dummy trench source structures 63 may be formed in a vertical shape having a substantially uniform opening width. Each of the second dummy trench source structures 63 may be formed in a tapered shape whose opening width becomes narrower toward the bottom wall. Preferably, the bottom wall of each of the second dummy trench source structures 63 is formed in a curved shape toward the second main surface 4. As a matter of course, the bottom wall of each of the second dummy trench source structures 63 may have a flat surface parallel to the active surface 6.

Each of the second dummy trench source structures 63 is formed at the active surface 6 such as to cross the body region 23 and the source region 24 and reach the second semiconductor region 11. In detail, each of the second dummy trench source structures 63 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and each of the second dummy trench source structures 63. In this embodiment, each of the second dummy trench source structures 63 is formed in the second concentration region 13, and faces the first concentration region 12 with a part of the second concentration region 13 between the first concentration region 12 and each of the second dummy trench source structures 63.

The sidewall of each of the second dummy trench source structures 63 is in contact with the second semiconductor region 11, the body region 23, and the source region 24. The bottom wall of each of the second dummy trench source structures in with 63: is contact the second semiconductor region 11. In this embodiment, each of the second dummy trench source structures 63 is formed deeper than each of the dummy trench gate structures 62. In other words, the bottom wall of each of the second dummy trench source structures 63 is positioned at the bottom-portion side of the second semiconductor region 11 (second concentration region 13) with respect to the bottom wall of each of the dummy trench gate structures 62.

Each of the second dummy trench source structures 63 includes the source trench 42, the source insulating film 43, and the source electrode 44. The source trench 42, the source insulating film 43, and the source electrode 44 of each of the second dummy trench source structures 63 may be referred to as the "second dummy source trench," "second dummy source insulating film," and "second dummy source electrode," respectively.

In each of the second dummy trench source structures 63, the third portion 43*c* of the source insulating film 43 is formed in the whole area of the opening edge portion of the source trench 42. Besides, a description of the source trench 42, the source insulating film 43, and the source electrode 44 of the first trench source structure 41 is applied to a description of the source trench 42, the source insulating film 43, and the source electrode 44 of the second dummy trench source structure 63, respectively.

Referring again to FIG. 6 to FIG. 12, the SiC semiconductor device 1 includes a plurality of p-type contact regions 70 formed at the surface layer portion of the active surface 6 of the transistor region 20. The contact regions 70 are formed in a region along the first trench source structures 41, respectively, and are not formed in a region along the second trench source structures 51. Each of the contact regions 70 has a p-type impurity concentration exceeding the p-type impurity concentration of the body region 23. The p-type impurity concentration of the contact regions 70 may be not less than $1\times10^{18}$ cm$^{-3}$ and not more than $1\times10^{21}$ cm$^{-3}$.

The contact regions 70 are each formed in a one-to-many correspondence with respect to each of the first trench source structures 41 in plan view. The contact regions 70 are formed with intervals therebetween along each of the first trench source structures 41 in plan view, and partially expose each of the first trench source structures 41. In this embodiment, the contact regions 70 are each formed in a belt shape extending in the first direction X in plan view. Preferably, each of the contact regions 70 has a length exceeding the distance between two adjoining contact regions 70 in the first direction X.

The contact regions 70 that cover the single first trench source structure 41 face the contact regions 70 that cover another adjacent first trench source structure 41; respectively, in a one-to-one correspondence in the second direction Y. In other words, in this embodiment, the contact regions 70 are arranged in a matrix manner with intervals therebetween in the first directions X and the second directions Y as a whole in plan view, The contact regions 70 that cover the single first trench source structure 41 may be arranged while being deviated by a half pitch in the first direction X with respect to the contact regions 70 that cover another adjacent first trench Source structure 41. In other words, the contact regions 70 may be arranged in a staggered manner with intervals therebetween in the first directions X and the second directions Y as a whole in plan view.

In this embodiment, the contact regions 70 are formed at a distance from the peripheral edge of the active surface 6 (third and fourth connecting surfaces 8C and 8D) toward the inward portion of the first trench source structures 41 in plan view. In detail, the contact regions 70 are formed at the inward portion of the active surface 6 such that the distance between an end portion of the first trench source structure 41 and an outermost contact region 70 becomes larger than the distance between two adjoining contact regions 70 in the first direction X.

In this embodiment, the contact regions 70 are not formed at a portion facing the second trench source structures 51 in the first trench source structures 41. Also, the contact regions 70 are not formed at a portion facing the end portion of the trench gate structures 31 in the first trench source structures 41, The contact regions 70 are exposed from the active surface 6. The contact regions 70 are formed at a distance from the trench structure 31 gate toward the first-trench-source-structure-41 side. Each of the contact regions 70 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the contact regions 70. Each of the contact regions 70 covers the sidewall and the bottom wall of each of the first trench source structures 41 in the second semiconductor region 11 (second concentration region 13). The contact regions 70 are electrically connected to the body region 23 in the sidewall of each of the first trench source structures 41.

The SiC semiconductor device 1 includes a plurality of p-type well regions 71 formed at the surface layer portion of the active surface 6 of the transistor region 20. Each of the well regions 71 is formed in a region along each of the first trench source structures 41. Each of the well regions 71 has a p-type impurity concentration exceeding the p-type impurity concentration of each of the contact regions 70. Preferably, the p-type impurity concentration of the well regions 71 exceeds the p-type impurity concentration of the body region 23. The p-type impurity concentration of the well regions 71 may be not less than $1\times10^{16}$ $cm^{-3}$ and not more than $1\times10^{18}$ $cm^{-3}$.

The well regions 71 are each formed in a one-to-one Correspondence with respect to the first trench source structures 41. Each of the well regions 71 is formed in a belt shape extending along each of the first trench source structures 41 in plan view, and is exposed from the third and fourth connecting surfaces 8C and 8D. Each of the well regions 71 is formed at a distance from the trench gate structure 31 toward the first-trench-source-structure-41 side, and exposes the trench gate structure 31.

Each of the well regions 71 covers the sidewall and the bottom wall of each of the first trench source structures 41. Each of the well regions 71 covers each of the first trench source structures 41 with the contact regions 70 between each of the first trench source structures 41 and each of the well regions 71. In other words, each of the well regions 71 includes a portion directly covering each of the first trench source structures 41 with the contact regions 70 between each of the first trench source structures 41 and this portion of each of the well regions 71 and a portion covering each of the first trench source structures 41 with the contact regions 70 between each of the first trench source structures 41 and this portion of each of the well regions 71. Each of the well regions 71 is electrically connected to the body region 23 in the sidewall of each of the first trench source structures 41.

Preferably, the thickness of a part, which covers the bottom wall of each of the first trench source structures 41, of each of the well regions 71 exceeds the thickness of a part, which covers the sidewall of each of the first trench source structures 41, of each of the well regions 71. The thickness of the part, which covers the sidewall of each of the first trench source structures 41, of each of the well regions 71 is the thickness in the normal direction of the sidewall of each of the first trench source structures 41. The thickness of the part, which covers the bottom wall of each of the first trench source structures 41, of each of the well regions 71 is the thickness in the normal direction of the bottom wall of each of the first trench source structures 41.

In this embodiment, each of the well regions 71 is also formed in a region along each of the second trench source structures 51. Each of the well regions 71 is formed in a one-to-one correspondence with respect to each of the second trench source structures 51. Each of the well regions 71 is formed in a belt shape extending along each of the second trench source structures 51 in plan view. Each of the well regions 71 along each of the second trench source structures 51 at the third-connecting-surface-8C side is exposed from the third connecting surface 8C. Each of the well regions 71 along each of the second trench Source structures 51 at the fourth-connecting-surface-8D side is exposed from the fourth connecting surface 8D.

Each of the well regions 71 is formed at a distance from the trench gate structure 31 toward the second-trench-source-structure-51 side, and exposes the trench gate structure 31. Each of the well regions 71 covers the sidewall and the bottom wall of each of the second trench source structures 51. Each of the well regions 71 directly covers each of the second trench source structures 51. Each of the well regions 71 is electrically connected to the body region 23 in the sidewall of each of the second trench source structures 51.

Preferably, the thickness of a part, which covers the bottom wall of each of the second trench source structures 51, of each of the well regions 71 exceeds the thickness of a part, which covers the sidewall of each of the second trench source structures 51, of each of the well regions 71. The thickness of the part, which covers the sidewall of each of the second trench source structures 51, of each of the well regions 71 is the thickness in the normal direction of the sidewall of each of the second trench source structures 51. The thickness of the part, which covers the bottom wall of each of the second trench source structures 51, of each of the well regions 71 is the thickness in the normal direction of the bottom wall of each of the second trench source structures 51.

Each of the well regions 71 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the well regions 71. In other words, each of the well regions 71 is electrically connected to the second semiconductor region 11 (second concentration region 13).

Preferably, the bottom portion of the well regions 71 is formed at a substantially uniform depth with respect to the bottom wall of the first trench source structures 41 and the bottom wall of the second trench source structures 51. The well regions 71 form a pn-junction portion with the second semiconductor region 11 (second concentration region 13), and expand a depletion layer in the width and depth directions of the SiC chip 2. The well regions 71 bring the trench insulated-gate type MISFET close to the structure of a pn-junction diode, and relax an electric field in the Sic chip 2.

Preferably, the well regions 71 are formed such that the depletion layer overlaps the bottom wall of the trench gate structure 31. The second concentration region 13 interposed between the well regions 71 reduces JFET (Junction Field Effect Transistor) resistance. The second concentration region 13 positioned below the well regions 71 reduces current spreading resistance. In the thus formed structure, the first concentration region 12 raises the withstand voltage of the SiC chip 2.

The SiC semiconductor device 1 includes a plurality of p-type gate well regions 72 formed in a region along the trench gate structures 31, respectively, in the surface layer portion of the active surface 6. The gate well regions 72 have a p-type impurity concentration less than the p-type impurity concentration of the contact regions 70. Preferably, the p-type impurity concentration of each of the gate well regions 72 exceeds the p-type impurity concentration of the body region 23. The p-type impurity concentration of each of the gate well regions 72 may be not less than $1\times10^{16}$ $cm^{-3}$ and not more than $1\times10^{18}$ $cm^{-3}$. Preferably, the p-type impurity concentration of each of the gate well regions 72 is substantially equal to the p-type impurity concentration of each of the well regions 71.

The gate well regions 72 are each formed in a one-to-one correspondence with respect to the trench gate structures 31. Each of the gate well regions 72 is formed in a belt shape extending along each of the trench gate structures 31 in plan view. Each of the gate well regions 72 is formed at a distance from the first trench source structure 41 toward the trench-gate-structure-31 side. Each of the gate well regions 72 covers the sidewall and the bottom wall of each of the trench gate structures 31. Each of the gate well regions 72 is electrically connected to the body region 23 in the sidewall of each of the trench gate structures 31.

Each of the gate well regions 72 is formed at a distance from the bottom portion of the second semiconductor region 11 (second concentration region 13) toward the first-main surface-3 side, and faces the first semiconductor region 10 (third semiconductor region 14) with a part of the second semiconductor region 11 between the first semiconductor region 10 and each of the gate well regions 72. In this embodiment, each of the gate well regions 72 is formed in the second concentration region 13, and faces the first concentration region 12 with a part of the second concentration region 13 between the first concentration region 12 and each of the gate well regions 72.

Preferably, the thickness of a part, which covers the bottom wall of each of the trench gate structures 31, of each of the gate well regions 72 exceeds the thickness of a part, which covers the sidewall of each of the trench gate structures 31, of each of the gate well regions 72. The thickness of the part, which covers the sidewall of each of the trench gate structures 31, of each of the gate well regions 72 is the thickness in the normal direction of the sidewall of each of the trench gate structures 31. The thickness of the part, which covers the bottom wall of each of the trench gate structures 31, of each of the gate well regions 72 is the thickness in the normal direction of the bottom wall of the trench gate structure 31.

The bottom portion of the gate well regions 72 is positioned at the bottom-wall side of the trench gate structure 31 with respect to the bottom portion of the well regions 71. Preferably, the bottom portion of the gate well regions 72 is formed at a substantially uniform depth with respect to the bottom wall of the trench gate structures 31. The gate well regions 72 form a pn-junction portion with the second semiconductor region 11 (second concentration region 13), and expand a depletion layer in the width and depth directions of the SiC chip 2. The gate well regions 72 bring the trench insulated-gate type MISFET close to the structure of a pn-junction diode, and relax an electric field in the SiC chip 2.

Referring again to FIG. 13 to FIG. 21, the SiC semiconductor device 1 includes a plurality of p-type dummy contact regions 73 formed at the surface layer portion of the active surface 6 of the first peripheral region 21. The dummy contact regions 73 are formed in a region along the second dummy trench source structures 63 of the second dummy structure 60B, respectively, and are not formed in a region along the first dummy trench source structures 61 of the first dummy structure 60A.

The dummy contact regions 73 have a p-type impurity concentration exceeding the p-type impurity concentration of the body region 23. The p-type impurity concentration of the dummy contact regions 73 may be not less than $1\times10^{18}$ $cm^{-3}$ and not more than $1\times10^{21}$ $cm^{-3}$. Preferably, the p-type impurity concentration of the dummy contact regions 73 exceeds the p-type impurity concentration of the well regions 71. Preferably, the p-type impurity concentration of the dummy contact regions 73 is substantially equal to the p-type impurity concentration of the contact regions 70.

The dummy contact regions 73 are each formed in a one-to-many correspondence with respect to each of the second dummy trench source structures 63 in plan view. The dummy contact regions 73 are formed with intervals therebetween along each of the second dummy trench source structures 63 in plan view, and partially expose each of the second dummy trench source structures 63. In this embodiment, the dummy contact regions 73 are each formed in a belt shape extending in the first direction X in plan view. Preferably, the dummy contact regions 73 have a length exceeding the distance between two adjoining dummy contact regions 73 in the first direction X.

The dummy contact regions 73 that cover the single second dummy trench source structure 63 face the dummy contact regions 73 that cover another adjacent second dummy trench source structure 63, respectively, in a one-to-one correspondence in the second direction Y. In other words, in this embodiment, the dummy contact regions 73 are arranged in a matrix manner with intervals therebetween in the first directions X and the second directions Y as a whole in plan view. In this embodiment, the dummy contact regions 73 face the contact regions 70 in the second direction Y in plan view.

The dummy contact regions 73 that cover the single second dummy trench source structure 63 may be arranged while being deviated by a half pitch in the first direction X with respect to the dummy contact regions 73 that cover another adjacent second dummy trench source structure 63. In other words, the dummy contact regions 73 may be arranged in a staggered manner with intervals therebetween in the first directions X and the second directions Y as a whole in plan view. In this case, the dummy contact regions 73 may face the contact regions 70 in the second direction Y in plan view.

In this embodiment, the dummy contact regions 73 are formed at a distance from the peripheral edge of the active surface 6 (third and fourth connecting surfaces 8C and 8D) toward the inward portion of the second dummy trench source structures 63 in plan view. In detail, the dummy contact regions 73 are formed at the inward portion of the active surface 6 such that the distance between an end portion of the second dummy trench source structure 63 and an outermost dummy contact region 73 becomes larger than the distance between two adjoining dummy contact regions 73 in the first direction X.

In this embodiment, the dummy contact regions 73 are not formed at a portion facing the second trench source structures 51 in the second dummy trench source structures 63. Also, the dummy contact regions 73 are not formed at a portion facing the end portion of the trench gate structures 31 in the second dummy trench source structures 63. In other words, the dummy contact regions 73 are formed along the second dummy trench source structure 63 in the same way as the contact regions 70.

The dummy contact regions 73 are exposed from the active surface 6. The dummy contact regions 73 are formed at a distance from the dummy trench gate structure 62 toward the second-dummy-trench-source-structure-63 side. Each of the dummy contact regions 73 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the dummy contact regions 73. Each of the dummy contact regions 73 covers the sidewall and the bottom wall of each of the second dummy trench source structures 63 in the second semiconductor region 11 (second concentration region 13). The dummy contact regions 73 are electrically connected to the body region 23 in the sidewall of each of the second dummy trench source structures 63.

The SiC semiconductor device 1 includes a plurality of p-type dummy well regions 74 formed at the surface layer portion of the active surface 6 of the first peripheral region 21. The dummy well regions 74 have a p-type impurity concentration less than the p-type impurity concentration of the dummy contact regions 73. Preferably, the p-type impurity concentration of the dummy well regions 74 exceeds the p-type impurity concentration of the body region 23. The p-type impurity concentration of the dummy well regions 74 may be not less than $1\times10^{16}$ $cm^{-3}$ and not more than $1\times10^{18}$ $cm^{-3}$. Preferably, the p-type impurity concentration of the dummy well regions 74 is substantially equal to the p-type impurity concentration of the well regions 71.

The dummy well regions 74 are formed in a region along the first dummy trench source structures 61 in the first dummy structure 60A. The dummy well regions 74 are each formed in a one-to-one correspondence with respect to the first dummy trench source structures 61. In detail, each of the dummy well regions 74 covers a corresponding first dummy trench source structure 61 at a distance from an adjacent first dummy trench source structure 61.

Each of the dummy well regions 74 is formed in a belt shape extending along each of the first dummy trench source structures 61 in plan view, and is exposed from the third and fourth connecting surfaces 8C and 8D. Each of the dummy well regions 74 covers the sidewall and the bottom wall of each of the first dummy trench source structures 61. Each of the dummy well regions 74 directly covers each of the first dummy trench source structures 61. Each of the dummy well regions 74 is electrically connected to the body region 23 in the sidewall of each of the first dummy trench source structures 61.

Preferably, the thickness of a part, which covers the bottom wall of each of the first dummy trench source structures 61, of each of the dummy well regions 74 exceeds the thickness of a part, which covers the sidewall of each of the first dummy trench source structures 61, of each of the dummy well regions 74. The thickness of the part, which covers the sidewall of each of the first dummy trench source structures 61, of each of the dummy well regions 74 is the thickness in the normal direction of the sidewall of each of the first dummy trench source structures 61. The thickness of the part, which covers the bottom wall of each of the first dummy trench source structures 61, of each of the dummy well regions 74 is the thickness in the normal direction of the bottom wall of each of the first dummy trench source structures 61.

In this embodiment, each of the dummy well regions 74 is also formed in a region along each of the second dummy trench source structures 63 in the second dummy structure 60B. The dummy well regions 74 are formed in a one-to-one correspondence with respect to the second dummy trench source structures 63, respectively. Each of the dummy well regions 74 covers a corresponding second dummy trench source structure 63 at a distance from the dummy trench gate structure 62 toward the second-dummy-trench-source-structure-63 side.

Each of the dummy well regions 74 is formed in a belt shape extending along each of the second dummy trench source structures 63 in plan view, and is exposed from the third and fourth connecting surfaces 8C and 8D. Each of the dummy well regions 74 covers the sidewall and the bottom wall of each of the second dummy trench source structures 63, Each of the dummy well regions 74 covers each of the second dummy trench source structures 63 with the dummy contact regions 73 between each of the second dummy trench source structures 63 and each of the dummy well regions 74.

In other words, each of the dummy well regions 74 includes a portion directly covering each of the second dummy trench source structures 63 with the dummy contact regions 73 between each of the second dummy trench source structures 63 and this portion of each of the dummy well regions 74 and a portion covering each of the second dummy trench source structures 63 with the dummy contact regions 73 between each of the second dummy trench source structures 63 and this portion of each of the dummy well regions 74. Each of the dummy well regions 74 is electrically connected to the body region 23 in the sidewall of each of the second dummy source structures 63.

Preferably, the thickness of a part, which covers the bottom wall of each of the second dummy trench source structures 63, of each of the dummy well regions 74 exceeds the thickness of a part, which covers the sidewall of each of the second dummy trench source structures 63, of each of the dummy well regions 74. The thickness of the part, which covers the sidewall of each of the second dummy trench source structures 63, of each of the dummy well regions 74 is the thickness in the normal direction of the sidewall of each of the second dummy trench source structures 63. The thickness of the part, which covers the bottom wall of each of the second dummy trench source structures 63, of each of the dummy well regions 74 is the thickness in the normal direction of the bottom wall of each of the second dummy trench source structures 63.

Each of the dummy well regions 74 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the dummy well regions 74. In other words, each of the dummy well regions 74 is electrically connected to the second semiconductor region 11 (second concentration region 13). Preferably, the bottom portion of the dummy well regions 74 is formed at a substantially uniform depth with respect to the bottom wall of the first dummy trench source structures 61 and the bottom wall of the second dummy trench source structures 63.

Preferably, the bottom portion of the dummy well regions 74 is formed at substantially the same depth as the bottom portion of the well regions 71. The dummy well regions 74 form a pn-junction portion with the second semiconductor region 11 (second concentration region 13), and expand a depletion layer in the width and depth directions of the SiC chip 2. The dummy well regions 74 bring the trench insulated-gate type MISFET close to the structure of a pn-junction diode, and relax an electric field in the SiC chip 2. Preferably, the dummy well regions 74 are formed such that the depletion layer overlaps the bottom wall of the dummy trench gate structure 62.

The SiC semiconductor device 1 includes a plurality of p-type dummy gate well regions 75 formed in a region along the dummy trench gate structures 62, respectively, in the surface layer portion of the active surface 6. The dummy gate well regions 75 have a p-type impurity concentration exceeding the p-type impurity concentration of the body region 23. Preferably, the p-type impurity concentration of each of the dummy gate well regions 75 is less than the p-type impurity concentration of the dummy contact regions 73. The p-type impurity concentration of each of the dummy gate well regions 75 may be not less than $1\times10^{16}$ $cm^{-3}$ and not more than $1\times10^{18}$ $cm^{-3}$. Preferably, the p-type impurity concentration of each of the dummy gate well regions 75 is substantially equal to the p-type impurity concentration of each of the gate well regions 72.

The dummy gate well regions 75 are each formed in a one-to-one correspondence with respect to the dummy trench gate structures 62. Each of the dummy gate well regions 75 is formed in a belt shape extending along each of the dummy trench gate structures 62 in plan view. Each of the dummy gate well regions 75 is formed at a distance from the second dummy trench source structure 63 toward the dummy-trench-gate-structure-62 side. Each of the dummy gate well regions 75 covers the sidewall and the bottom wall of each of the dummy trench gate structures 62. Each of the dummy gate well regions 75 is electrically connected to the body region 23 in the sidewall of each of the dummy trench gate structures 62.

Each of the dummy gate well regions 75 is formed at a distance from the bottom portion of the second semiconductor region 11 (second concentration region 13) toward the first-main surface-3 side, and faces the first semiconductor region 10 (third semiconductor region 14) with a part of the second semiconductor region 11 between the first semiconductor region 10 and each of the dummy gate well regions 75. In this embodiment, each of the dummy gate well regions 75 is formed in the second concentration region 13, and faces the first concentration region 12 with a part of the second concentration region 13 between the first concentration region 12 and each of the dummy gate well regions 75.

Preferably, the thickness of a part, which covers the bottom wall of each of the dummy trench gate structures 62, of each of the dummy gate well regions 75 exceeds the thickness of a part, which covers the sidewall of each of the dummy trench gate structures 62, of each of the dummy gate well regions 75. The thickness of the part, which covers the sidewall of each of the dummy trench gate structures 62, of each of the dummy gate well regions 75 is the thickness in the normal direction of the sidewall of each of the dummy trench gate structures 62. The thickness of the part, which covers the bottom wall of each of the dummy trench gate structures 62, of each of the dummy gate well regions 75 is the thickness in the normal direction of the bottom wall of the dummy trench gate structure 62.

The bottom portion of the dummy gate well regions 75 is positioned at the bottom-wall side of the dummy trench gate structure 62 with respect to the bottom portion of the dummy well regions 74. Preferably, the bottom portion of the dummy gate well regions 75 is formed at a substantially uniform depth with respect to the bottom wall of the dummy trench gate structures 62. Preferably, the bottom portion of the dummy gate well regions 75 is formed at substantially the same depth as the bottom portion of the gate well regions 72.

The dummy gate well regions 75 form a pn-junction portion with the second semiconductor region 11 (second concentration region 13), and expand a depletion layer in the width and depth directions of the SiC chip 2. The dummy gate well regions 75 bring the trench insulated-gate type MISFET close to the structure of a pn-junction diode, and relax an electric field in the SiC chip 2.

Figure 22:
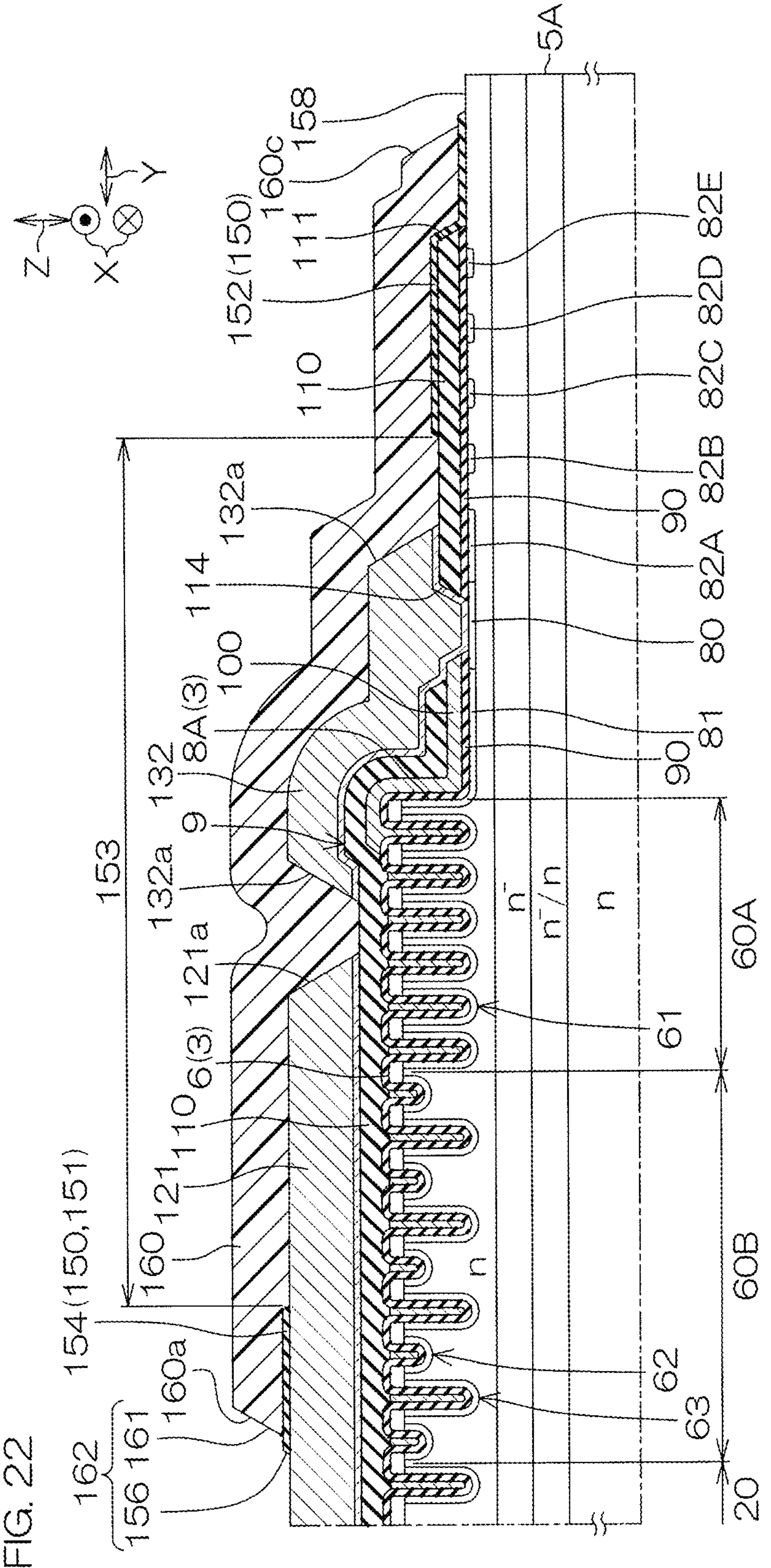
FIG. 22 is a cross-sectional view along line XXII-XXII shown in FIG. 1.
Figure 23:
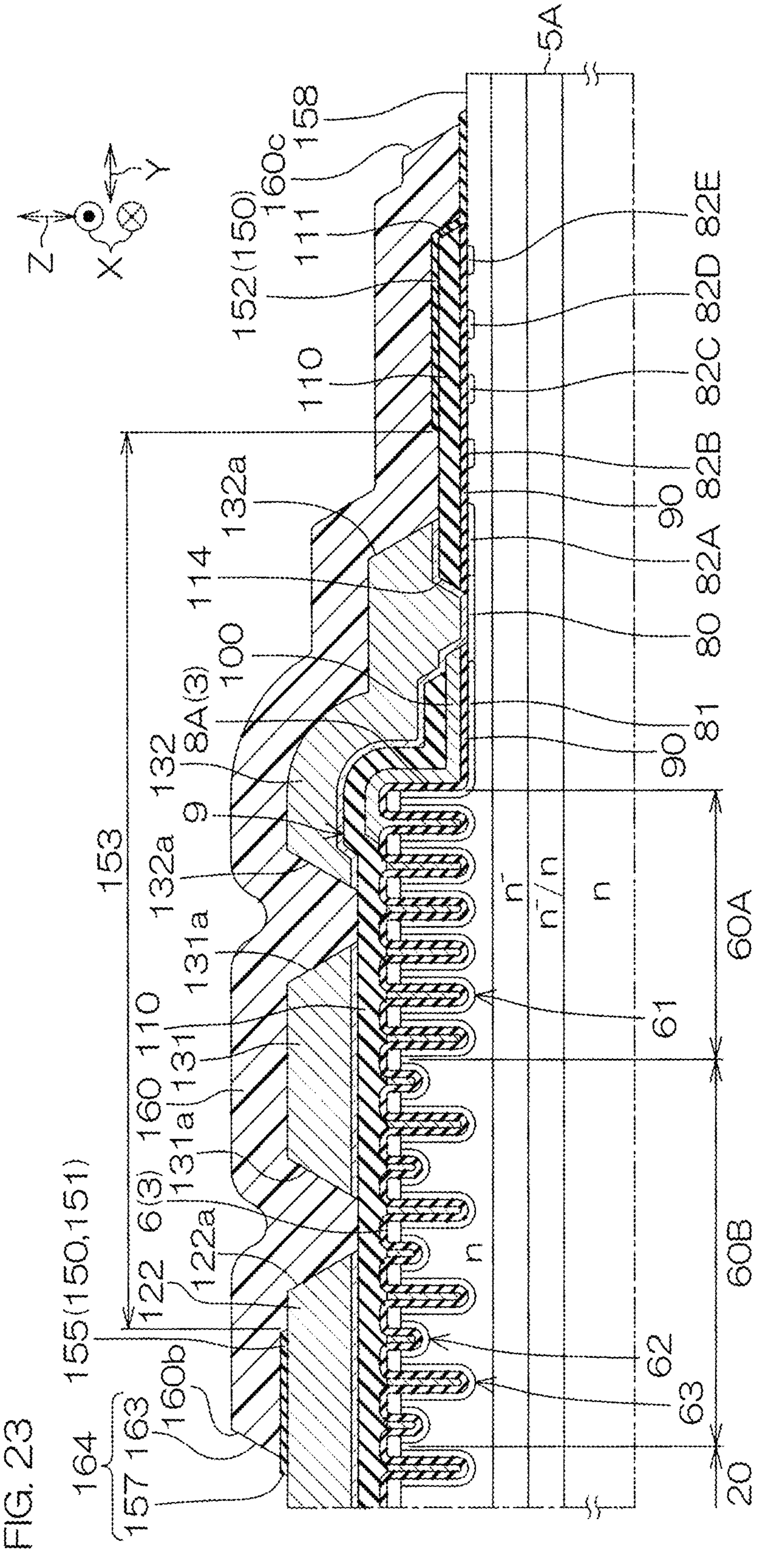
FIG. 23 is a cross-sectional view along line XXIII-XXIII shown in FIG. 1.
Figure 24:
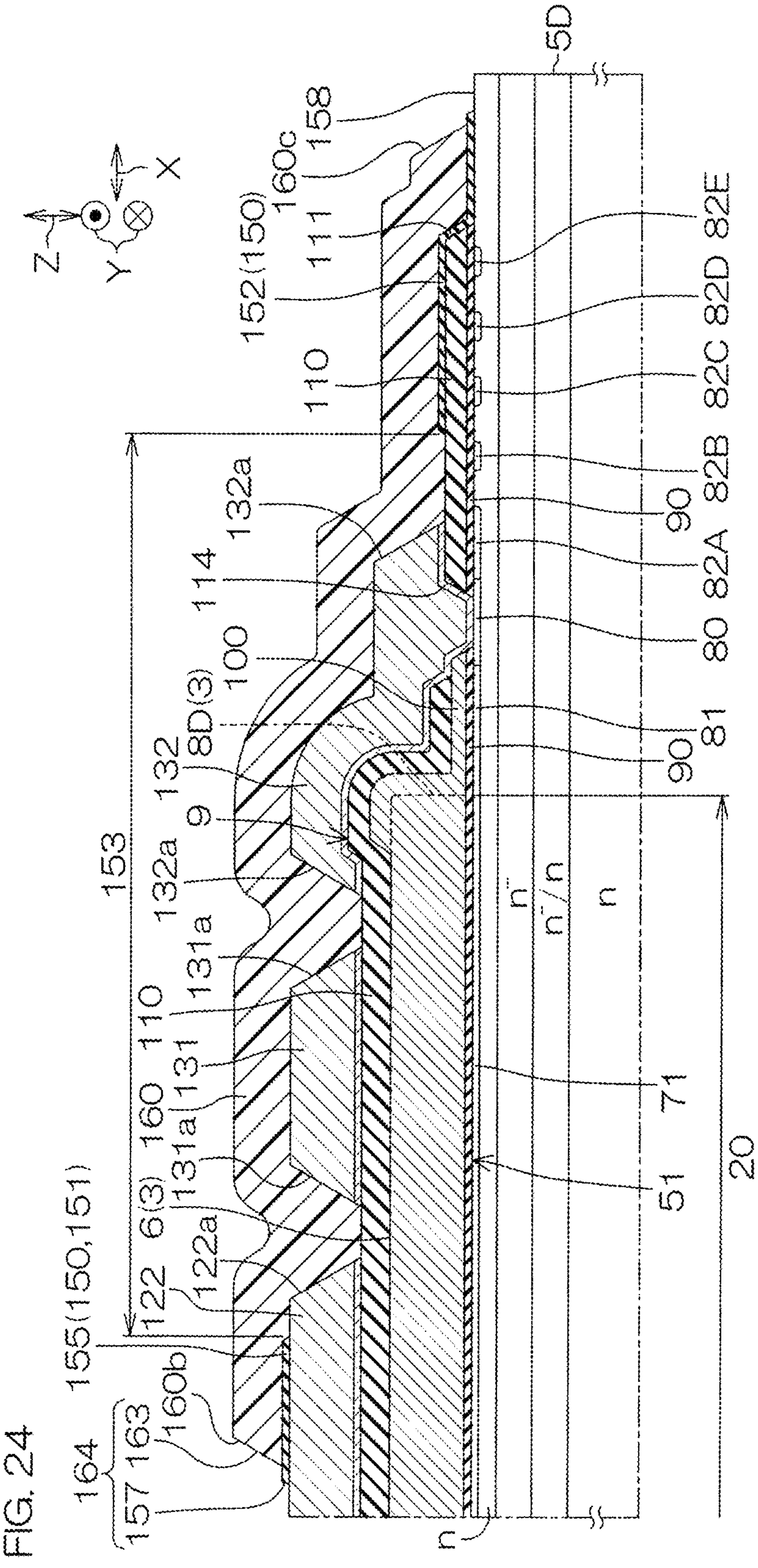
FIG. 24 is a cross-sectional view along line XXIV-XXIV shown in FIG. 1.
Figure 25:
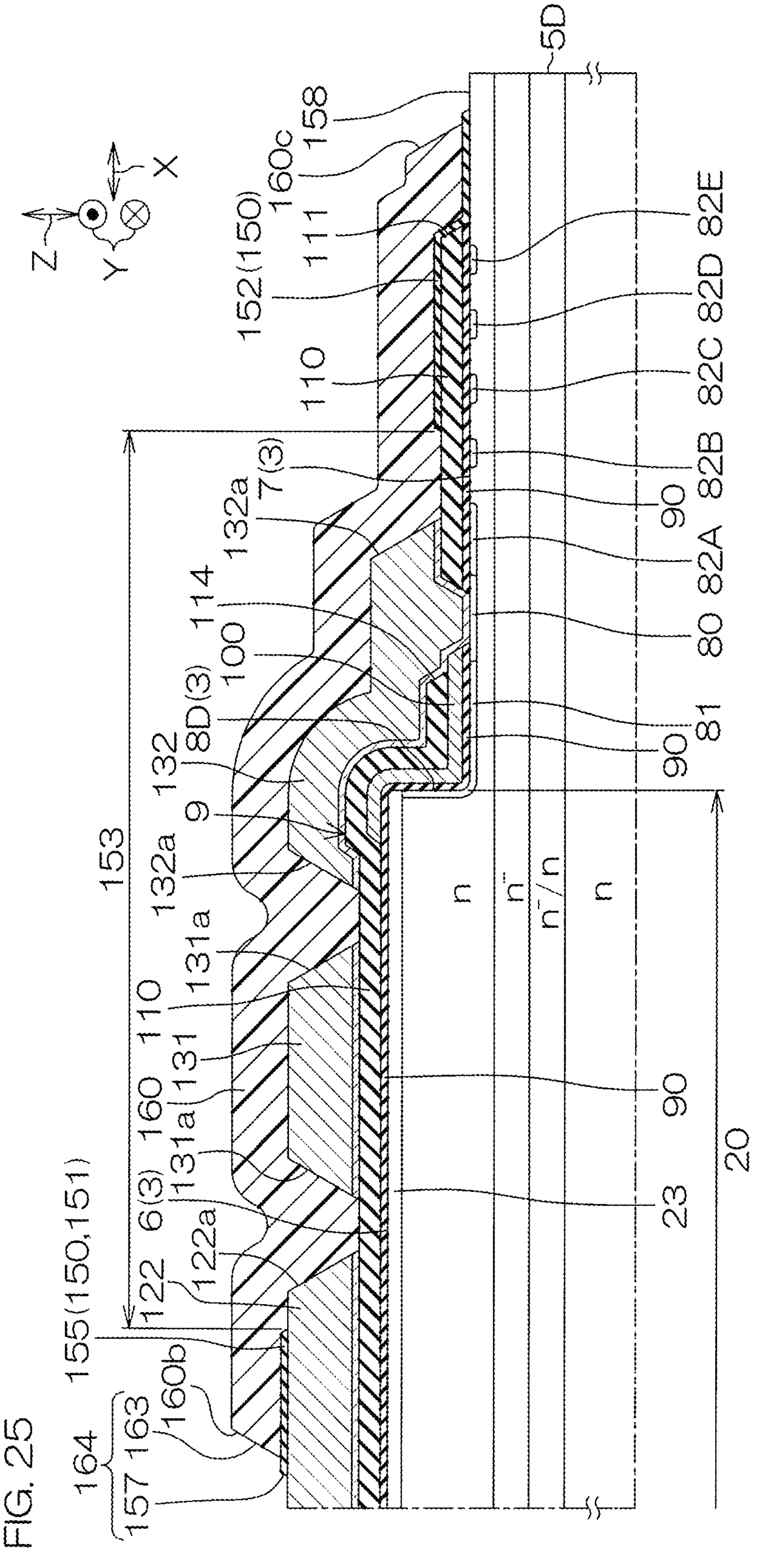
FIG. 25 is a cross-sectional view along line XXV-XXV shown in FIG. 1.
Figure 26:
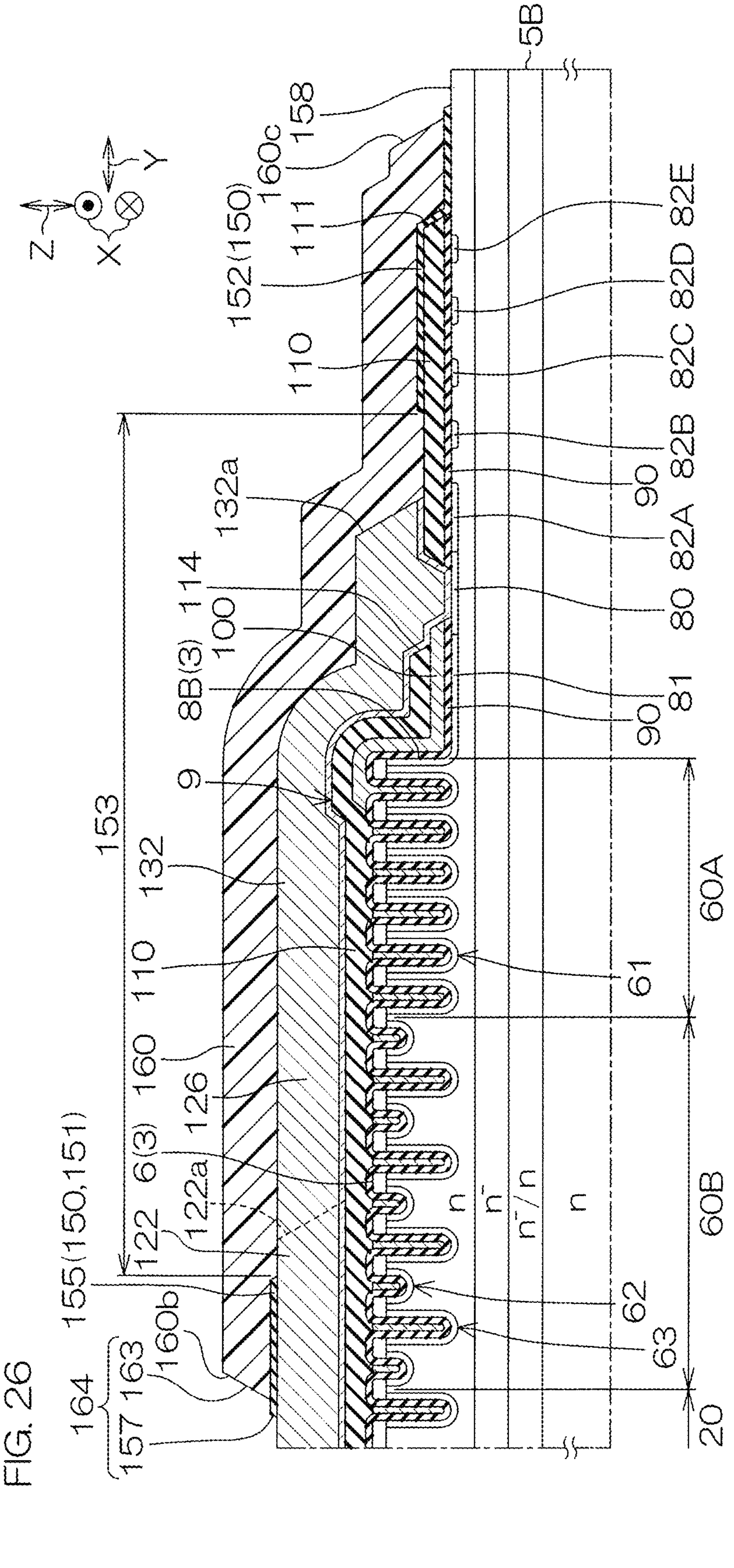
FIG. 26 is a cross-sectional view along line XXVI-XXVI shown in FIG. 1.
Figure 27:
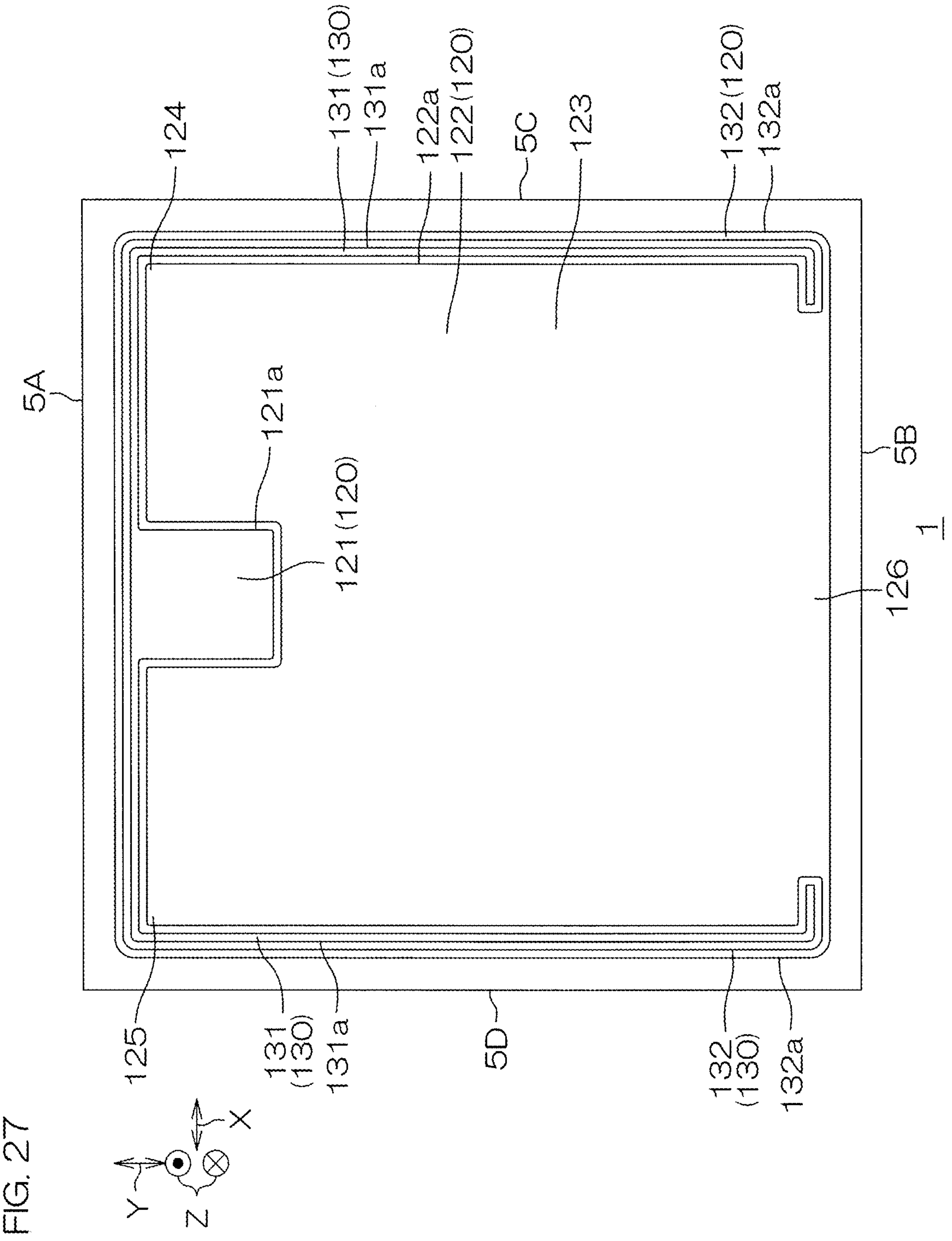
FIG. 27 is a plan view shown to describe a structure of a main surface electrode.
Figure 28:
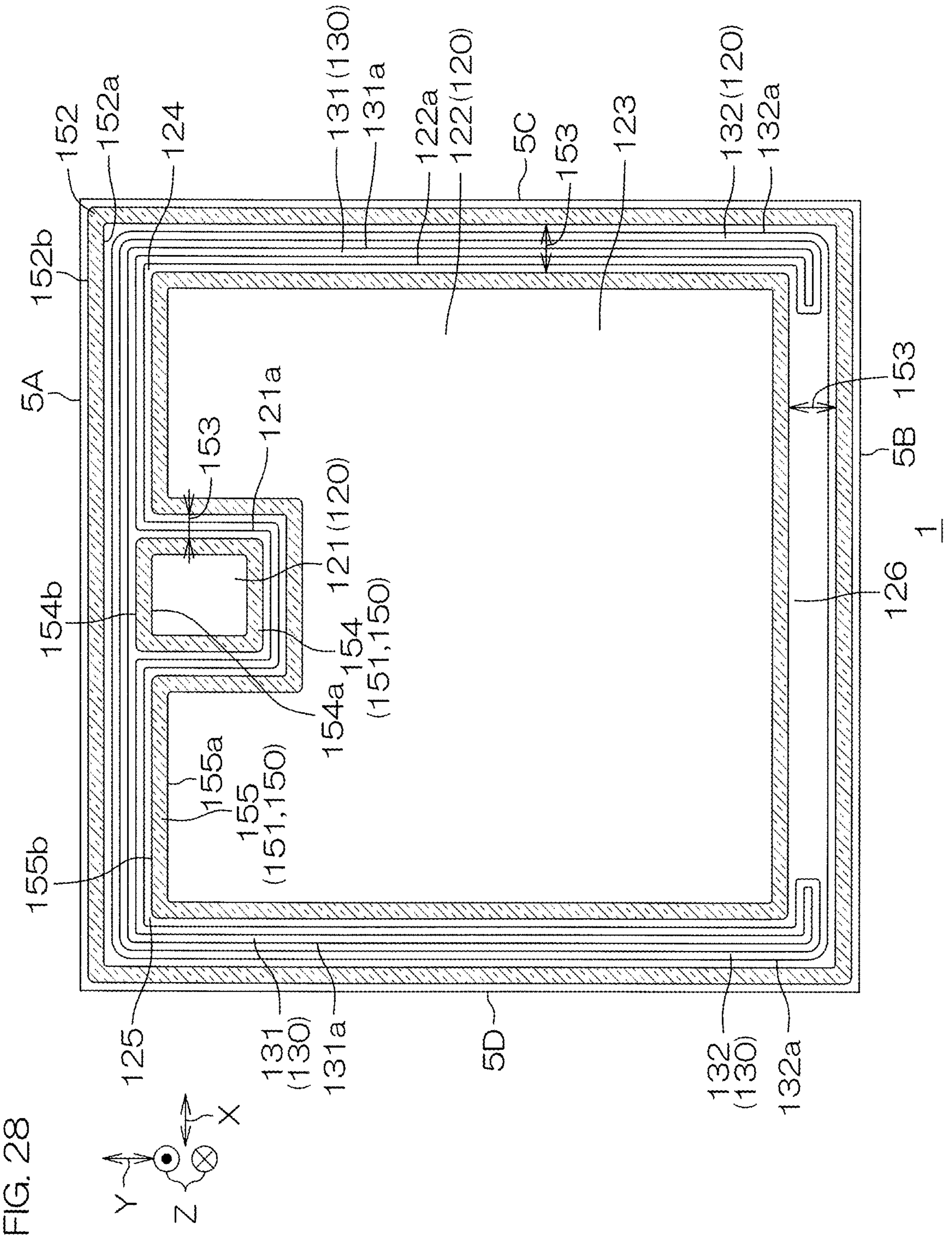
FIG. 28 is a plan view shown to describe a structure of a second inorganic insulating film.

FIG. 22 is a cross-sectional view along line XXII-XXII shown in FIG. 1. FIG. 23 is a cross-sectional view along line XXIII-XXIII shown in FIG. 1, FIG. 24 is a cross-sectional view along line XXIV-XXIV shown in FIG. 1, FIG. 25 is a cross-sectional view along line XXV-XXV shown in FIG. 1. FIG. 26 is a cross-sectional view along line XXVI-XXVI shown in FIG. 1. FIG. 27 is a plan view shown to describe a structure of a main surface electrode 120. FIG. 28 is a plan view shown to describe a structure of a second inorganic insulating film 150.

The SiC semiconductor device 1 includes a p-type outer contact region 80 formed at the surface layer portion of the outer surface 7. The outer contact region 80 may have a p-type impurity concentration of not less than $1\times10^{18}$ $cm^{-3}$ and not more than $1\times10^{21}$ $cm^{-3}$. The outer contact region 80 has a p-type impurity concentration exceeding the p-type impurity concentration of the body region 23. Preferably, the p-type impurity concentration of the outer contact region 80 is substantially equal to the p-type impurity concentration of the contact region 70 (dummy contact region 73).

The outer contact region 80 is formed in a region between the peripheral edge of the active surface 6 and the peripheral edge of the outer surface 7 at a distance from the peripheral edge of the active surface 6 (first to fourth connecting surfaces 8A to 8D) and from the peripheral edge of the outer surface 7 (first to fourth side surfaces 5A to 5D) in plan view. The outer contact region 80 extends in a belt shape along the active surface 6 (first to fourth connecting surfaces 8A to 8D) in plan view. In this embodiment, the outer contact region 80 is formed in an annular shape surrounding the active surface 6 in plan view. In detail, the outer contact region 80 is formed in a quadrangular annular shape having four sides parallel to the active surface 6 in plan view.

The outer contact region 80 is formed at a distance from the bottom portion of the second semiconductor region 11 toward the outer surface 7. In detail, the outer contact region 80 is formed at a distance from the bottom portion of the second concentration region 13 toward the outer surface 7. The entirety of the outer contact region 80 is positioned at the bottom-portion side of the second semiconductor region 11 with respect to the bottom wall of the trench gate structures 31 and with respect to the bottom wall of the dummy trench gate structures 62. The bottom portion of the outer contact region 80 is positioned at the bottom-portion side of the second semiconductor region 11 with respect to the bottom wall of the first trench source structures 41, the bottom wall of the second trench source structures 51, the bottom wall of the first dummy trench source structures 61, and the bottom wall of the second dummy trench source structures 63, Preferably, the bottom portion of the outer contact region 80 is formed at substantially the same depth position as the bottom portion of the contact regions 70 and the dummy contact regions 73. The outer contact region 80 forms a pn-junction portion together with the second semiconductor region 11 (concretely, the second concentration region 13). Hence, a pn-junction diode is formed in which the outer contact region 80 serves as an anode and in which the second semiconductor region 11 serves as a cathode. The outer contact region 80 may be referred to as an anode region.

The SiC semiconductor device 1 includes a p-type outer well region 81 formed at the surface layer portion of the outer surface 7. The p-type impurity concentration of the outer well region 81 may be not less than $1\times10^{16}$ $cm^{-3}$ and not more than $1\times10^{18}$ $cm^{-3}$. The outer well region 81 has a p-type impurity concentration less than the p-type impurity concentration of the outer contact region 80. Preferably, the p-type impurity concentration of the outer well region 81 is substantially equal to the p-type impurity concentration of the well region 71 (dummy well region 74). Preferably, the p-type impurity concentration of the outer well region 81 is substantially equal to the p-type impurity concentration of the gate well region 72 (dummy gate well region 75).

The outer well region 81 is formed in a region between the peripheral edge of the active surface 6 (first to fourth connecting surfaces 8A to 8D) and the outer contact region 80 in plan view. The outer well region 81 extends in a belt shape along the active surface 6 (first to fourth connecting surfaces 8A to 8D) in plan view. In this embodiment, the outer well region 81 is formed in an annular shape (in this embodiment, quadrangular annular shape) surrounding the active surface 6 (first to fourth connecting surfaces 8A to 8D) in plan view.

In this embodiment, the outer well region 81 is formed in the whole area of a region between the first to fourth connecting surfaces 8A to 8D and the outer contact region 80. Also, the outer well region 81 extends from the outer surface 7 toward the first to fourth connecting surfaces 8A to 8D, and covers the first to fourth connecting surfaces 8A to 8D in the SiC chip 2. The outer well region 81 is electrically connected to the well region 71, the dummy well region 74, and the dummy gate well region 75 in the surface layer portion of the first to fourth connecting surfaces 8A to 8D. A part, which covers the first to fourth connecting surfaces 8A to 8D, of the outer well region 81 may be regarded as an integral well region that integrally includes the well region 71, the dummy well region 74, and the dummy gate well region 75.

The outer well region 81 is continuous with the well region 71 in a portion in which the bottom wall of the first trench source structure 41 communicates with the outer surface 7. In other words, the outer well region 81 is surfacewisely and continuously led out from a part, which covers the bottom wall of the first trench source structure 41, of the well region 71 toward the outer surface 7. The outer well region 81 is continuous with the well region 71 in a portion in which the bottom wall of the second trench source structure 51 communicates with the outer surface 7. In other words, the outer well region 81 is surfacewisely and continuously led out from a part, which covers the bottom wall of the second trench source structure 51, of the well region 71 toward the outer surface 7.

The outer well region 81 is continuous with the dummy well region 74 in a portion in which the bottom wall of the first dummy trench source structure 61 communicates with the outer surface 7. In other words, the outer well region 81 is surfacewisely and continuously led out from a part, which covers the bottom wall of the first dummy trench source structure 61, of the dummy well region 74 toward the outer surface 7. The outer well region 81 is continuous with the dummy well region 74 in a portion in which the bottom wall of the second dummy trench source structure 63 communicates with the outer surface 7. In other words, the outer well region 81 is surfacewisely and continuously led out from a part, which covers the bottom wall of the second dummy trench source structure 63, of the dummy well region 74 toward the outer surface 7.

The outer well region 81 is formed at a distance from the bottom portion of the second semiconductor region 11 toward the outer surface 7. In detail, the outer well region 81 is formed at a distance from the bottom portion of the second concentration region 13 toward the outer surface 7. The entirety of the outer well region 81 is positioned at the bottom-portion side of the second semiconductor region 11 with respect to the bottom wall of the trench gate structures 31 and with respect to the bottom wall of the dummy trench gate structures 62.

The outer well region 81 is electrically connected to the outer contact region 80 in the outer surface 7. The outer well region 81 is formed deeper than the outer contact region 80. The bottom portion of the outer well region 81 is positioned at the bottom-portion side of the second semiconductor region 11 with respect to the bottom wall of the first trench source structures 41, the bottom wall of the second trench source structures 51, the bottom wall of the first dummy trench source structures 61, and the bottom wall of the second dummy trench source structures 63. Preferably, the bottom portion of the outer well region 81 is formed at substantially the same depth position as the bottom portion of the well region 71 and the bottom portion of the dummy well region 74.

The outer well region 81 forms a pn-junction portion with the second semiconductor region 11 (concretely, the second concentration region 13) together with the outer contact region 80. Also, the outer well region 81 forms a pn-junction portion with the second semiconductor region 11 in a portion along the first to fourth connecting surfaces 8A to 8D. In other words, a pn-junction portion is formed in the portion along the first to fourth connecting surfaces 8A to 8D in the SiC chip 2.

The SiC semiconductor device 1 includes at least one (preferably, not less than two and not more than twenty)

p-type field region(s) 82A to 82E formed in a region between the outer contact region 80 and the peripheral edge of the outer surface 7 (first to fourth side surfaces 5A to 5D) in the surface layer portion of the outer surface 7. In this embodiment, the SiC semiconductor device 1 includes five field regions 82A to 82E. The five field regions 82A to 82E include a first field region 82A, a second field region 82B, a third field region 82C, a fourth field region 82D, and a fifth field region 82E. The first to fifth field regions 82A to 82E are formed in this order at a distance from the outer-contact-region-80 side toward the peripheral side of the outer surface 7.

The field regions 82A to 82E relax an electric field in the outer surface 7. The number, the width, the depth, the p-type impurity concentration, etc., of the field regions 82A to 82E can have various values in accordance with the electric field to be relaxed. The p-type impurity concentration of the field regions 82A to 82E may be not less than $1\times10^{15}$ $cm^{-3}$ and not more than $1\times10^{18}$ $cm^{-3}$.

Each of the field regions 82A to 82E is formed in a belt shape extending along the active surface 6 in plan view. Each of the field regions 82A to 82E is formed in an annular shape surrounding the active surface 6 in plan view. In detail, each of the field regions 82A to 82E is formed in a quadrangular annular shape having four sides parallel to the active surface 6 (first to fourth connecting surfaces 8A to 8D) in plan view. Each of the field regions 82A to 82E may be referred to as an FLR (Field Limiting Ring) region.

In this embodiment, the innermost first field region 82A is connected to the outer contact region 80. The innermost first field region 82A forms a pn-junction portion with the second semiconductor region 11 (concretely, the second concentration region 13) together with the outer contact region 80. On the other hand, the second to fifth field regions 82B to 82E are formed in an electric floating state at a distance from the outer contact region 80. Each of the field regions 82A to 82E is formed deeper than the outer contact region 80. Each of the field regions 82A to 82E is formed at a distance from the bottom portion of the second semiconductor region 11 toward the outer surface 7. In detail, each of the field regions 82A to 82E is formed at a distance from the bottom portion of the second concentration region 13 toward the outer surface 7.

The entirety of each of the field regions 82A to 82E is positioned at the bottom-portion side of the second semiconductor region 11 with respect to the trench gate structures 31 and with respect to the bottom wall of the dummy trench gate structures 62. The bottom portion of each of the field regions 82A to 82E is positioned at the bottom-portion side of the second semiconductor region 11 with respect to the bottom wall of the first trench source structures 41, the bottom wall of the second trench source structures 51, the bottom wall of the first dummy trench source structures 61, and the bottom wall of the second dummy trench source structures 63.

Referring to the cross-sectional views of FIGS. 6 to 21, the SiC semiconductor device 1 includes a main surface insulating film 90 that covers the first main surface 3. In detail, the main surface insulating film 90 covers the active surface 6, the outer surface 7, and the first to fourth connecting surfaces 8A to 8D in a film shape. The main surface insulating film 90 includes at least one among a silicon oxide film, a silicon nitride film, and a silicon oxynitride film. In this embodiment, the main surface insulating film 90 has a single layer structure constituted of a silicon oxide film. In detail, the main surface insulating film 90 includes a silicon oxide film constituted of an oxide of the SiC chip 2. The thickness of the main surface insulating film 90 may be not less than 50 nm and not more than 500 nm.

The main surface insulating film 90 covers the active surface 6 such as to be continuous with the gate insulating film 33 of the trench gate structures 31, the source insulating film 43 of the first trench source structures 41, the source insulating film 43 of the second trench source structures 51, the source insulating film 43 of the first dummy trench source structures 61, the gate insulating film 33 of the dummy trench gate structures 62, and the source insulating film 43 of the second dummy trench source structures 63.

In other words, the main surface insulating film 90 exposes the gate electrode 34 of the trench gate structures 31, the source electrode 44 of the first trench source structures 41, the source electrode 44 of the second trench source structures 51, the source electrode 44 of the first dummy trench source structures 61, the gate electrode 34 of the dummy trench gate structures 62, and the source electrode 44 of the second dummy trench source structures 63 in the active surface 6.

The main surface insulating film 90 covers the first to fourth connecting surfaces 8A to 8D such as to be continuous with the gate insulating film 33 of the trench gate structures 31, the source insulating film 43 of the first trench source structures 41, the source insulating film 43 of the second trench source structures 51, the source insulating film 43 of the first dummy trench source structures 61, the gate insulating film 33 of the dummy trench gate structures 62, and the source insulating film 43 of the second dummy trench source structures 63, In other words, the main surface insulating film 90 exposes the gate electrode 34 of the trench gate structures 31, the source electrode 44 of the first trench source structures 41, the source electrode 44 of the second trench source structures 51, the source electrode 44 of the first dummy trench source structures 61, the gate electrode 34 of the dummy trench gate structures 62, and the source electrode 44 of the second dummy trench source structures 63 in the first to fourth connecting surfaces 8A to 8D. The main surface insulating film 90 is formed at a distance inwardly from the peripheral edge of the outer surface 7 (first to fourth side surfaces 5A to 5D), and has a peripheral end wall that exposes the peripheral edge portion of the outer surface 7, Referring to FIG. 6 and FIG. 8, the SiC semiconductor device 1 includes a plurality of gate contact electrodes that cover the gate electrode 34 of the trench gate structure 31 above the first main surface 3 (concretely, active surface 6) in the transistor region 20. In FIG. 6, the gate contact electrodes 91 are each shown by the thick broken line. In this embodiment, the gate contact electrodes 91 are not formed in the first peripheral region 21 and the second peripheral region 22. In other words, the gate contact electrodes 91 are not formed on the gate electrode 34 of the dummy trench gate structure 62.

The gate contact electrodes 91 cover the trench gate structures 31, respectively, and are electrically connected to corresponding gate electrodes 34, respectively. In detail, the gate contact electrodes 91 are formed at both end portions of the trench gate structures 31, respectively, at a distance from the inward portion of the trench gate structures 31. In other words, the gate contact electrodes 91 are electrically connected to corresponding gate electrodes 34, respectively, in a region adjacent to both end portions of the trench gate structure 31 with respect to the inward portion of the trench gate structure 31.

The gate contact electrodes 91 are each led out from above the trench gate structures 31 onto the main surface insulating film 90. The gate contact electrodes 91 are each formed at a distance from the first trench source structures 41 in the second direction Y in plan view. The gate contact electrodes 91 are each formed at a distance from the second trench source structures 51 in the first direction X in plan view.

The gate contact electrodes 91 are arranged alternately with the first trench source structures 41 in the second direction Y in a manner in which the single first trench source structure 41 is interposed therebetween in plan view. In this embodiment, the gate contact electrodes 91 are each formed in a belt shape extending in the first direction X. The gate contact electrodes 91 are formed in a stripe shape extending in the first direction X in plan view. The gate contact electrodes 91 do not face the second trench source structures 51 in the second direction Y in plan view.

The gate contact electrodes 91 have an electrode width WE exceeding the first width W1 of the trench gate structure 31 (W1<WE) regarding the first direction X. The electrode width WE is a width in a direction (second direction Y) perpendicular to a direction (first direction X) in which the gate contact electrode 91 extends. The gate contact electrodes 91 have a length less than the length of the trench gate structure 31 regarding the second direction Y.

Each of the gate contact electrodes 91 has an electrode surface 91*a* extending along the active surface 6. In this embodiment, the gate contact electrodes 91 is formed in a tapered shape (quadrangular truncated conical shape) in which the electrode width WE becomes narrower from the active surface 6 toward the electrode surface 91*a*. Preferably, the electrode surface 91*a* is formed wider in width than the electrode surface of the gate electrode 34 regarding the second direction Y. In other words, preferably, the electrode surface 91*a* includes a portion facing the gate electrode 34 in the normal direction Z and a portion facing a region (i.e., main surface insulating film 90) outside the trench gate structure 31 in the normal direction Z.

Preferably, each of the gate contact electrodes 91 is constituted of conductive polysilicon. Each of the gate contact electrodes 91 may include n-type polysilicon that is doped with an n-type impurity and/or p-type polysilicon that is doped with a p-type impurity. Preferably, each of the gate contact electrodes 91 is constituted of the same conductive material as each of the gate electrodes 34. In this embodiment, each of the gate contact electrodes 91 is formed of a lead-out portion that is led out from each of the gate electrodes 34 to a space above the active surface 6. In other words, the gate contact electrodes 91 are led out from the gate electrode 34 onto the main surface insulating film 90 through the third portion 33*c* of the gate insulating film 33.

Referring to the plan view and the cross-sectional view showing the peripheral edge of the active surface 6 of FIGS. 5 to 21, the SiC semiconductor device 1 includes a sidewall wiring 100 formed above the outer surface 7 such as to cover at least one among the first to fourth connecting surfaces 8A to 8D. The sidewall wiring 100 is formed as a sidewall structure (level difference relaxation structure) that relaxes a level difference formed between the active surface 6 and the outer surface 7. In detail, the sidewall wiring 100 is formed on the main surface insulating film 90.

Preferably, the sidewall wiring 100 covers at least either one of the third and fourth connecting surfaces 8C and 8D. In this embodiment, the sidewall wiring 100 is formed in a belt shape extending along the first to fourth connecting surfaces 8A to 8D in plan view. In detail, the sidewall wiring 100 is formed in an annular shape (concretely, quadrangular annular shape) surrounding the active surface 6, and covers the whole area of the first to fourth connecting surfaces 8A to 8D.

In other words, the sidewall wiring 100 extends in a direction (first direction X) along the trench gate structure 31, the first trench source structure 41, the second trench source structure 51, the first dummy trench source structure 61, the dummy trench gate structure 62, and the second dummy trench source structure 63 at the first-connecting-surface-8A side and the second-connecting-surface-8B side. The sidewall wiring 100 extends in a direction (second direction Y) intersecting the trench gate structure 31, the first trench source structure 41, the second trench source structure 51, the first dummy trench source structure 61, the dummy trench gate structure 62, and the second dummy trench source structure 63 at the third-connecting-surface-80 side and the fourth-connecting-surface-8D side.

A part, which covers the four corners (corner portions of the first to fourth connecting surfaces 8A to 8D) of the active surface 6, of the sidewall wiring 100 is formed in a curved shape toward the outer-surface-7 side. Therefore, in this embodiment, the sidewall wiring 100 is formed in a quadrangular annular shape whose four corners are curved as a whole in plan view.

The sidewall wiring 100 includes a portion that extends in a film shape along the outer surface 7 and a portion that extends in a film shape along the first to fourth connecting surfaces 8A to 8D. A part, which is positioned above the outer surface 7, of the sidewall wiring 100 may cover the outer surface 7 in a region at the outer-surface-7 side with respect to the active surface 6. The part, which is positioned above the outer surface 7, of the sidewall wiring 100 may have a thickness less than the thickness (first depth D1) of the active mesa 9.

A part, which is positioned at the first to fourth connecting surfaces 8A to 8D, of the sidewall wiring 100 is formed in a film shape along the first to fourth connecting surfaces 8A to 8D. The part, which is positioned at the first to fourth connecting surfaces 8A to 8D, of the sidewall wiring 100 may have an outer surface that is inclined obliquely downward from the active surface 6 toward the outer surface 7. In this case, the outer surface of the sidewall wiring 100 may be formed in a curved shape protruding in a direction away from the first to fourth connecting surfaces 8A to 8D, or may be formed in a curved shape hollowed toward the first to fourth connecting surfaces 8A to 8D side.

The sidewall wiring 100 faces a part of the outer well region 81 with the main surface insulating film 90 between the part of the outer well region 81 and the sidewall wiring 100 above the outer surface 7. Also, the sidewall wiring 100 faces the outer contact region 80 with the main surface insulating film 90 between the outer contact region 80 and the sidewall wiring 100 above the outer surface 7. In this embodiment, the sidewall wiring 100 is formed at a distance from the field regions 82A to 82E toward the active-surface-6 side in plan view, and does not face the field regions 82A to 82E with the main surface insulating film 90 between the field regions 82A to 82E and the sidewall wiring 100.

The sidewall wiring 100 faces the SiC chip 2 on the first to fourth connecting surfaces 8A to 8D with the main surface insulating film 90 between the SiC chip 2 and the sidewall wiring 100. In other words, the sidewall wiring 100 faces a pn-junction portion (pn-junction portion between the outer well region 81 and the second semiconductor region 11) along the first to fourth connecting surfaces 8A to 8D on the first to fourth connecting surfaces 8A to 8D with the main surface insulating film 90 between the pn-junction portion and the sidewall wiring 100.

Also, the sidewall wiring 100 covers the exposed portion of the first trench source structure 41, the exposed portion of the second trench source structure 51, the exposed portion of the first dummy trench source structure 61, the exposed portion of the dummy trench gate structure 62, and the exposed portion of the second dummy trench source structure 63 on the first to fourth connecting surfaces 8A to 8D. Hence, the sidewall wiring 100 is electrically connected to the first trench source structure 41, the second trench source structure 51, the first dummy trench source structure 61, the dummy trench gate structure 62, and the second dummy trench source structure 63 on the first to fourth connecting surfaces 8A to 8D.

In detail, the sidewall wiring 100 is electrically connected to the source electrode 44 of the first trench source structure 41, the source electrode 44 of the second trench source structure 51, the source electrode 44 of the first dummy trench source structure 61, the gate electrode 34 of the dummy trench gate structure 62, and the source electrode 44 of the second dummy trench source structure 63 on the first to fourth connecting surfaces 8A to 8D. In other words, the sidewall wiring 100 is formed above the outer surface 7 as a wiring that gives the source potential.

In this embodiment, the sidewall wiring 100 is formed integrally with the source electrode 44 of the first trench source structure 41, the source electrode 44 of the second trench source structure 51, the source electrode 44 of the first dummy trench source structure 61, the gate electrode 34 of the dummy trench gate structure 62, and the source electrode 44 of the second dummy trench source structure 63 on the first to fourth connecting surfaces 8A to 8D.

The sidewall wiring 100 has an overlap portion 101 that rides on the edge portion of the active surface 6 from at least one among the first to fourth connecting surfaces 8A to 8D. The overlap portion 101 is formed in a belt shape extending along the edge portion of the active surface 6 in plan view. In this embodiment, the overlap portion 101 is rides on the edge portion of the active surface 6 from all of the first to fourth connecting surfaces 8A to 8D. In other words, the overlap portion 101 extends along the edge portion of the active surface 6 in plan view, and is formed in an annular shape surrounding the inward portion of the active surface 6.

The overlap portion 101 includes a pair of first overlap portions 101A and a pair of second overlap portions 101B. The pair of first overlap portions 101A are a part, which extends along the first and second connecting surfaces 8A and 8B, of the overlap portion 101, and the pair of second overlap portions 101B are a part, which extends along the third and fourth connecting surfaces 8C and 8D, of the overlap portion 101. The pair of first overlap portions 101A have the same structure, and the pair of second overlap portions 101B have the same structure. A description will be hereinafter given of a structure of the first overlap portion 101A at the first-connecting-surface-8A side and a structure of the second overlap portion 101B at the third-connecting-surface-8C side.

The first overlap portion 101A faces the active surface 6 with the main surface insulating film 90 between the active surface 6 and the first overlap portion 101A, and covers at least one first dummy trench source structure 61 positioned at the outermost side. In this embodiment, the first overlap portion 101A covers the whole area of the single first dummy trench source structure 61 positioned at the outermost side. The first overlap portion 101A is electrically connected to the source electrode 44 of the outermost first dummy trench source structure 61 above the active surface 6.

In detail, the first overlap portion 101A is formed integrally with the source electrode 44 of the outermost first dummy trench source structure 61 above the active surface 6. The first overlap portion 101A may cover the first dummy trench source structures 61. In this case, preferably, the number of the first dummy trench source structures 61 covered by the first overlap portion 101A is less than the number of the first dummy trench source structures 61 exposed from the first overlap portion 101A.

The second overlap portion 101B faces the active surface 6 with the main surface insulating film 90 between the active surface 6 and the second overlap portion 101B, and covers the end portion of the first trench source structure 41, the end portion of the second trench source structure 51, the end portion of the first dummy trench source structure 61, the end portion of the dummy trench gate structure 62, and the end portion of the second dummy trench source structure 63. The second overlap portion 101B is electrically connected to the source electrode 44 of the first trench source structure 41, the source electrode 44 of the second trench source structure 51, the source electrode 44 of the first dummy trench source structure 61, the gate electrode 34 of the dummy trench gate structure 62, and the source electrode 44 of the second dummy trench source structure 63 above the active surface 6.

In detail, the second overlap portion 101B is formed integrally with the source electrode 44 of the first trench source structure 41, the source electrode 44 of the second trench source structure 51, the source electrode 44 of the first dummy trench source structure 61, the gate electrode 34 of the dummy trench gate structure 62, and the source electrode 44 of the second dummy trench source structure 63 above the active surface 6.

The overlap portion 101 has an overlap width W0. The overlap width W0 is a width in a direction perpendicular to a direction in which the overlap portion 101 extends based on the first to fourth connecting surfaces 8A to 8D. Preferably, the overlap width W0 is less than the first depth D1 of the outer surface 7 (W0<D1). Preferably, the overlap width W0 is less than the third depth of the first trench source structure 41 (W0<D3). The overlap width W0 may be equal to or more than the second depth D2 of the trench gate structure 31 (W0>D2), or may be less than the second depth D2 (W0<D2).

Preferably, the sidewall wiring 100 is constituted of conductive polysilicon. The sidewall wiring 100 may include n-type polysilicon that is doped with an n-type impurity and/or p-type polysilicon that is doped with a p-type impurity. Preferably, the sidewall wiring 100 is constituted of the same conductive material as the gate electrode 34. Also, preferably, the sidewall wiring 100 is constituted of the same conductive material as the source electrode 44.

The SiC semiconductor device 1 includes a first inorganic insulating film 110 formed on the main surface insulating film 90. The first inorganic insulating film 110 may be referred to as an "interlayer insulating film," "intermediate insulating film," "upper insulating film," or "covered object." The first inorganic insulating film 110 may have a laminated structure including a plurality of insulating films, or may have a single layer structure constituted of a single insulating film. Preferably, the first inorganic insulating film 110 includes at least one among a silicon oxide film, a silicon nitride film, and a silicon oxynitride film. The first inorganic insulating film 110 may have a laminated structure including a plurality of silicon oxide films, a laminated structure including a plurality of silicon nitride films, or a laminated structure including a plurality of silicon oxynitride films.

The first inorganic insulating film 110 may have a laminated structure in which at least two among a silicon oxide film, a silicon nitride film, and a silicon oxynitride film are laminated in an arbitrary order. The first inorganic insulating film 110 may have a single layer structure constituted of a silicon oxide film, a silicon nitride film, or a silicon oxynitride film. In this embodiment, the first inorganic insulating film 110 has a laminated structure in which a plurality of silicon oxide films are laminated.

In detail, the first inorganic insulating film 110 has a laminated structure including an NSG (Nondoped Silicate Glass) film and a PSG (Phosphor Silicate Glass) film that are laminated in this order from the main surface-insulating-film-90 side. The NSG film is a silicon oxide film that is not doped with impurities. The PSG film is a silicon oxide film that is doped with phosphorus. The thickness of the NSG film may be not less than 10 nm and not more than 300 nm. The thickness of the PSG film may be not less than 50 nm and not more than 500 nm. Preferably, the thickness of the first inorganic insulating film 110 exceeds the thickness of the main surface insulating film 90.

The first inorganic insulating film 110 covers the transistor region 20, the first peripheral region 21, and the second peripheral region 22 in a film shape above the active surface 6. The first inorganic insulating film 110 selectively covers the trench gate structures 31, the first trench source structures 41, and the second trench source structures 51 in the transistor region 20. The first inorganic insulating film 110 covers the whole area of the first dummy structure 60A and the whole area of the second dummy structure 60B in the first and second peripheral regions 21 and 22. In other words, first the inorganic insulating film 110 collectively covers the first dummy trench source structures 61, the dummy trench gate structures 62, and the second dummy trench source structures 63.

The first inorganic insulating film 110 covers the sidewall wiring 100 in a region between the active surface 6 and the outer surface 7, and crosses the first to fourth connecting surfaces 8A to 8D from above the active surface 6, and is led out onto the outer surface 7. The first inorganic insulating film 110 covers the sidewall wiring 100 in a film shape. The first inorganic insulating film 110 covers the main surface insulating film 90 in a film shape above the outer surface 7. The first inorganic insulating film 110 is formed at a distance inwardly from the peripheral edge of the outer surface 7 (first to fourth side surfaces 5A to 5D), and has a peripheral end wall that exposes the peripheral edge portion of the outer surface 7. The peripheral end wall of the first inorganic insulating film 110 defines a notch opening 111 that exposes the peripheral edge portion of the outer surface 7 together with the peripheral end wall of the main surface insulating film 90, Referring to FIG. 6 and FIG. 14, the first inorganic insulating film 110 has a plurality of gate openings 112 at the active-surface-6 side. The gate openings 112 are formed at the transistor-region-20 side, and expose both end portions of the trench gate structures 31, respectively. The gate openings 112 are not formed at the first-peripheral-region-21 side and at the second-peripheral-region-22 side, and do not expose the dummy trench gate structures 62.

In this embodiment, the gate openings 112 expose the gate contact electrodes 91, respectively, in a one-to-one correspondence. As a matter of course, the gate openings 112 may each expose the single gate contact electrode 91 in a one-to-many correspondence. In this embodiment, each of the gate openings 112 exposes the electrode surface 91*a* of a corresponding gate contact electrode 91 at a distance from the peripheral edge of a corresponding gate contact electrode 91 in plan view.

In other words, each of the gate openings 112 exposes only the electrode surface 91*a* of a corresponding gate contact electrode 91. In this embodiment, the gate openings 112 are each formed in a belt shape extending in a direction (first direction X) in which the gate contact electrode 91 extends. The gate openings 112 are formed in a stripe shape as a whole in plan view. The planar shape of the gate openings 112 is arbitrary, and may be formed in a circular shape. Referring to FIG. 11, the first inorganic insulating film 110 has a plurality of source openings 113 at the active-surface-6 side. The source openings 113 are formed at the transistor-region-20 side, and expose the first trench source structures 41, respectively. The source openings 113 do not expose the second trench source structures 51. In other words, the second trench source structures 51 are covered by the first inorganic insulating film 110. Also, the source openings 113 are not formed at the first-peripheral-region-21 side and at the second-peripheral-region-22 side, and do not expose the first dummy trench source structures 61 and the second dummy trench source structures 63.

In this embodiment, the source openings 113 are formed in one-to-one correspondence with respect to the contact regions 70, respectively, and expose corresponding first trench source structures 41 from a plurality of places, respectively. In other words, the source openings 113 are arranged with a matrix pattern or a staggered pattern with intervals therebetween in the first directions X and the second directions Y in plan view in accordance with the arrangement of the contact regions 70.

In this embodiment, the source openings 113 are each formed in a belt shape extending in the first direction X correspondingly to the planar shape of the contact regions 70. The planar shape of the source openings 113 is arbitrary, and may be formed in a circular shape. Each of the source openings 113 exposes a corresponding source region 24 and a corresponding contact region 70 in addition to the source electrode 44 of a corresponding first trench source structure 41. As a matter of course, the source openings 113 may expose the first trench source structures 41, respectively, in a one-to-one correspondence. Preferably, in this case, the first trench source structures 41 are formed in a belt shape extending along the corresponding first trench source Structure 41.

Referring to FIG. 10, FIG. 13, and FIG. 14, the first inorganic insulating film 110 has at least one sidewall opening 114 at the outer-surface-7 side. In this embodiment, the first inorganic insulating film 110 has a single sidewall opening 114. The sidewall opening 114 is formed in a belt shape extending along the sidewall wiring 100 in plan view. In this embodiment, the sidewall opening 114 is formed in an annular shape (concretely, quadrangular annular shape) extending along the sidewall wiring 100 in plan view. The sidewall opening 114 exposes a part, which covers the outer surface 7, of the sidewall wiring 100 over the entire periphery. In this embodiment, the sidewall opening 114 also exposes the outer contact region 80 over the entire periphery.

Referring to FIG. 22 to FIG. 28, the SiC semiconductor device 1 includes a first main surface electrode 120 formed on the first inorganic insulating film 110. In this embodiment, the first main surface electrode 120 is arranged only above the active surface 6, and is not arranged above the outer surface 7. The first main surface electrode 120 includes a gate main surface electrode 121. The gate main surface electrode 121 may be referred to as a gate pad electrode. The gate main surface electrode 121 is electrically connected to the trench gate structures 31 (gate electrode 34), and gives the gate potential (gate signal) input from the outside to the trench gate structures 31 (gate electrode 34).

The gate main surface electrode 121 is arranged at a distance from the first to fourth connecting surfaces 8A to 8D above the peripheral edge portion of the active surface 6 in plan view. In this embodiment, the gate main surface electrode 121 is arranged in a region facing the central portion of the first connecting surface 8A in the peripheral edge portion of the active surface 6. The gate main surface electrode 121 is arranged at a distance at least from the outermost first dummy trench source structure 61 (sidewall wiring 100) toward the inward side of the active surface 6. The gate main surface electrode 121 is formed in a quadrangular shape having four sides parallel to the active surface 6 in plan view.

The gate main surface electrode 121 faces a part of the first peripheral region 21 (part of the first dummy structure 60A) with the first inorganic insulating film 110 between the part of the first peripheral region 21 and the gate main surface electrode 121. Preferably, the gate main surface electrode 121 faces at least one first dummy trench source structure 61 with the first inorganic insulating film 110 between the first dummy trench source structure 61 and the gate main surface electrode 121. In this embodiment, the gate main surface electrode 121 crosses the first dummy trench source structures 61. The gate main surface electrode 121 is electrically separated from the first dummy trench source structures 61 by means of the first inorganic insulating film 110.

The gate main surface electrode 121 is led out from the first-dummy-structure-60A side to the second-dummy-structure-60B side, and faces a part of the second dummy structure 60B with the first inorganic insulating film 110 between the part of the second dummy structure 60B and the gate main surface electrode 121. The gate main surface electrode 121 faces either one or both of the dummy trench gate structure 62 and the second dummy trench source structure 63 with the first inorganic insulating film 110 between the structure 62 (63) and the gate main surface electrode 121. In this embodiment, the gate main surface electrode 121 crosses all of both the dummy trench gate structures 62 and the second dummy trench source structures 63. The gate main surface electrode 121 is electrically separated from the dummy trench gate structures 62 and from the second dummy trench source structures 63 by means of the first inorganic insulating film 110.

The gate main surface electrode 121 is led out from the first-peripheral-region-21 side to the transistor-region-20 side, and faces a part of the transistor structure 30 with the first inorganic insulating film 110 between the part of the transistor structure 30 and the gate main surface electrode 121. The gate main surface electrode 121 faces either one or both of the trench gate structure 31 and the first trench source structure 41. In this embodiment, the gate main surface electrode 121 crosses the trench gate structures 31 and the first trench source structures 41. The gate main surface electrode 121 is electrically separated from the trench gate structures 31 and from the first trench source structures 41 by means of the first inorganic insulating film 110. The gate main surface electrode 121 is arranged at a distance from the second trench source structures 51, and is also electrically separated from the second trench source structures 51, The gate main surface electrode 121 has a gate electrode sidewall 121*a* (electrode sidewall) positioned at the first inorganic insulating film 110. The gate electrode sidewall 121*a* is formed in a tapered shape that is inclined obliquely downward from the main surface of the gate main surface electrode 121. The gate electrode sidewall 121*a* may be formed in a curved tapered shape that is curved toward the first inorganic insulating film 110.

The first main surface electrode 120 includes a source main surface electrode 122. The source main surface electrode 122 is arranged on the active surface 6 at a distance from the gate main surface electrode 121. The source main surface electrode 122 may be referred to as a source pad electrode. The source main surface electrode 122 is electrically connected to the first trench source structures 41 (the source electrode 44), and gives the source potential input from the outside to the first trench source structures 41 (source electrode 44).

The source main surface electrode 122 is formed on the active surface 6 at a distance from the first to fourth connecting surfaces 8A to 8D in plan view. In this embodiment, the source main surface electrode 122 is formed in a quadrangular shape having four sides parallel to the active surface 6 (first to fourth connecting surfaces 8A to 8D) in plan view. In detail, the source main surface electrode 122 is formed in a polygonal shape having a concave portion hollowed toward the inward side of the active surface 6 such as to match the gate main surface electrode 121 in a side along the first connecting surface 8A in plan view.

The source main surface electrode 122 has a plane area exceeding the plane area of the gate main surface electrode 121. The source main surface electrode 122 is arranged at a distance from at least an outermost first dummy trench source structure 61 (sidewall wiring 100) toward the inward side of the active surface 6. In this embodiment, the source main surface electrode 122 is arranged at a distance from the first dummy structure 60A toward the inward side of the active surface 6 in plan view, The source main surface electrode 122 includes a main portion 123, a first lead-out portion 124, a second lead-out portion 125, and a third lead-out portion 126. The main portion 123 is arranged above the transistor region 20, and faces the gate main surface electrode 121 in the second direction Y. In this embodiment, the main portion 123 faces all of the trench gate structures 31 and all of the first trench Source structures 41. The main portion 123 enters the source openings 113 from above the first inorganic insulating film 110, and is electrically connected to the source regions 24, the source electrodes 44, and the contact regions 70. Hence, the source potential applied to the source main surface electrode 122 is given to the source electrodes 44, to the source regions 24, and to the contact regions 70.

The first lead-out portion 124 is led out from above the transistor region one side 20 onto (third-connecting-surface-8C side) of the first peripheral region 21, and faces the gate main surface electrode 121 in the first direction X. The second lead-out portion 125 is led out from above the transistor region 20 onto the other side (fourth-connecting-surface-8D side) of the first peripheral region 21, and faces the first lead-out portion 124 with the gate main surface electrode 121 between the first lead-out portion 124 and the second lead-out portion 125 in the first direction X.

The first and second lead-out portions 124 and 125 face a part of the second dummy structure 60B with the first inorganic insulating film 110 between the part of the second dummy structure 60B and the first and second lead-out portions 124 and 125. The first and second lead-out portions 124 and 125 face either one or both of the dummy trench gate structure 62 and the second dummy trench source structure 63, respectively. In this embodiment, the first and second lead-out portions 124 and 125 face both the dummy trench gate structure 62 and the second dummy trench source structure 63, respectively.

The first and second lead-out portions 124 and 125 may face the dummy trench gate structures 62 and the second dummy trench source structures 63, respectively. The first and second lead-out portions 124 and 125 are electrically separated from the dummy trench gate structures 62 and from the second dummy trench source structures 63, respectively, by means of the first inorganic insulating film 110.

In this embodiment, the first and second lead-out portions 124 and 125 are arranged at a distance from the first-dummy-structure-60A side toward the second-dummy-structure-60B side. Therefore, the first and second lead-out portions 124 and 125 do not face the first dummy trench source structures 61 with the first inorganic insulating film 110 between the first dummy trench source structures 61 and the first and second lead-out portions 124 and 125. The first and second lead-out portions 124 and 125 are electrically separated from the first dummy trench source structures 61, respectively, by means of the first inorganic insulating film 110.

As a matter of course, the first and second lead-out portions 124 and 125 may be led out from the second-dummy-structure-60B side to the first-dummy-structure-60A side, and may face a part of the first dummy structure 60A with the first inorganic insulating film 110 between the part of the first dummy structure 60A and the first and second lead-out portions 124 and 125. In this case, the first and second lead-out portions 124 and 125 may face at least one first dummy trench source structure 61 with the first inorganic insulating film 110 between the first dummy trench source structure 61 and the first and second lead-out portions 124 and 125, The third lead-out portion 126 is led out from above the transistor region 20 to a space above the second peripheral region 22, and faces a part of the second dummy structure 60B with the first inorganic insulating film 110 between the part of the second dummy structure 60B and the third lead-out portion 126. The third lead-out portion 126 faces either one or both of the dummy trench gate structure 62 and the second dummy trench source structure 63.

In this embodiment, the third lead-out portion 126 faces both the dummy trench gate structure 62 and the second dummy trench source structure 63. The third lead-out portion 126 may face the dummy trench gate structures 62 and the second dummy trench source structures 63. The third lead-out portion 126 is electrically separated from the dummy trench gate structures 62 and from the second dummy trench source structures 63 by means of the first inorganic insulating film 110.

The third lead-out portion 126 is led out from the second-dummy-structure-60B side to the first-dummy-structure-60A side, and faces a part of the first dummy structure 60A with the first inorganic insulating film 110 between the part of the first dummy structure 60A and the third lead-out portion 126. The third lead-out portion 126 faces the first dummy trench source structures 61 (in this embodiment, all of the first dummy trench source structures 61) with the first inorganic insulating film 110 between the first dummy trench source structures 61 and the third lead-out portion 126. The third lead-out portion 126 is electrically separated from the first dummy trench source structures 61 by means of the first inorganic insulating film 110.

The source main surface electrode 122 has a source electrode sidewall 122*a* (electrode sidewall) positioned at the first inorganic insulating film 110. The source electrode sidewall 122*a* is formed in a tapered shape that is inclined obliquely downward from the main surface of the source main surface electrode 122. The source electrode sidewall 122*a* may be formed in a curved tapered shape that is curved toward the first inorganic insulating film 110.

The SiC semiconductor device 1 includes a wiring electrode 130 formed on the first inorganic insulating film 110. The wiring electrode 130 is routed around to an arbitrary region including a region that covers the active surface 6 and a region that covers the outer surface 7 on the first inorganic insulating film 110.

The wiring electrode 130 includes a gate wiring electrode 131 (gate wiring). The gate wiring electrode 131 may be referred to as a gate finger electrode. The gate wiring electrode 131 is led out from the gate main surface electrode 121 onto a part, which covers the active surface 6, of the first inorganic insulating film 110. The gate wiring electrode 131 is formed above the active surface 6, and is not formed above the outer surface 7. The gate wiring electrode 131 transmits the gate potential applied to the gate main surface electrode 121 to another region.

The gate wiring electrode 131 is led out from the gate main surface electrode 121 to a region between the first to fourth connecting surfaces 8A to 8D and the source main surface electrode 122 at a distance from the first to fourth connecting surfaces 8A to 8D and from the source main surface electrode 122. The gate wiring electrode 131 is formed in a belt shape extending along the first to fourth connecting surfaces 8A to 8D. In detail, preferably, the gate wiring electrode 131 extends in a belt shape along at least two of the first to fourth connecting surfaces 8A to 8D such as to face the source main surface electrode 122 from a plurality of directions in plan view.

In this embodiment, the gate wiring electrode 131 faces the source main surface electrode 122 from four directions in plan view. A part, which extends along four corners of the active surface 6, of the gate wiring electrode 131 is formed in a curved shape toward the outer-surface-7 side. Therefore, in this embodiment, the gate wiring electrode 131 extends in a belt shape whose four corners are curved as a whole in plan view. The gate wiring electrode 131 has an open portion at the second-connecting-surface-8B side. The position and the size of the open portion are arbitrary.

The gate wiring electrode 131 is led out from the gate main surface electrode 121 onto the first peripheral region 21, and extends along the first and third connecting surfaces 8A and 8C. The gate wiring electrode 131 faces a part of the first dummy structure 60A and a part of the second dummy structure 60B at the first-peripheral-region-21 side with the first inorganic insulating film 110 between these parts and the gate wiring electrode 131.

In detail, the gate wiring electrode 131 faces the first dummy trench source structures 61, the dummy trench gate structures 62, and the second dummy trench source structures 63 with the first inorganic insulating film 110 between these structures and the gate wiring electrode 131. The gate wiring electrode 131 is electrically separated from the first dummy trench source structures 61, from the dummy trench gate structures 62, and from the second dummy trench source structures 63 by means of the first inorganic insulating film 110.

The gate wiring electrode 131 is led out from the first-peripheral-region-21 side to the transistor-region-20 side, and extends along the third and fourth connecting surfaces 8C and 8D. The gate wiring electrode 131 faces a part of the transistor structure 30 at the transistor-region-20 side with the first inorganic insulating film 110 between the part of the transistor structure 30 and the gate wiring electrode 131. The gate wiring electrode 131 intersects (in detail, perpendicularly intersects) the trench gate structures 31 and the first trench source structures 41 in plan view in the transistor region 20.

In other words, the gate wiring electrode 131 extends in a direction (second direction Y) intersecting (in detail, perpendicularly intersecting) a direction (first direction X) in which the trench gate structures 31 and the first trench source structures 41 extend. In other words, the gate wiring electrode 131 extends in a direction (second direction Y) intersecting (in detail, perpendicularly intersecting) mutually-facing directions (first direction X) of the trench gate structures 31 and the second trench source structures 51.

The gate wiring electrode 131 extends such as to cross a region between the trench gate structure 31 and the second trench source structure 51 in plan view, and intersects (in detail, perpendicularly intersects) the end portion of the trench gate structures 31, the inward portion of the first trench source structures 41, and the end portion of the second trench source structures 51. The gate wiring electrode 131 enters the gate openings 112 from above the first inorganic insulating film 110, and is electrically connected to the gate Contact electrodes 91. Hence, the gate potential applied to the gate main surface electrode 121 is given to the trench gate structures 31 through the gate wiring electrode 131.

The gate wiring electrode 131 is led out from the transistor region 20 to a space above the second peripheral region 22, and extends along the third connecting surface 8C and the second connecting surface 8B. The gate wiring electrode 131 faces a part of the first dummy structure 60A and a part of the second dummy structure 60B with the first inorganic insulating film 110 between these parts and the gate wiring electrode 131 at the second-peripheral-region-22 side.

In detail, the gate wiring electrode 131 faces the first dummy trench source structures 61, the dummy trench gate structures 62, and the second dummy trench source structures 63 with the first inorganic insulating film 110 between these structures and the gate wiring electrode 131. The gate wiring electrode 131 is electrically separated from the first dummy trench source structures 61, from the dummy trench gate structures 62, and from the second dummy trench source structures 63 by means of the first inorganic insulating film 110.

The gate wiring electrode 131 has a gate wiring sidewall 131*a* (wiring sidewall) positioned at the first inorganic insulating film 110. The gate wiring sidewall 131*a* is formed in a tapered shape that is inclined obliquely downward from the main surface of the gate wiring electrode 131. The gate wiring sidewall 131*a* may be formed in a curved tapered shape that is curved toward the first inorganic insulating film 110.

The wiring electrode 130 includes a source wiring electrode 132 (source wiring). The source wiring electrode 132 may be referred to as a source finger electrode. The source wiring electrode 132 transmits the source potential applied to the source main surface electrode 122 to another region. The source wiring electrode 132 passes through the open portion of the gate wiring electrode 131 from the source main surface electrode 122, and is led out onto a part, which covers the sidewall wiring 100, of the first inorganic insulating film 110. The source wiring electrode 132 is formed in a belt shape extending along the sidewall wiring 100 at a distance from the gate wiring electrode 131 in plan view.

The source wiring electrode 132 is formed in a belt shape extending along the first to fourth connecting surfaces 8A to 8D. In detail, preferably, the source wiring electrode 132 extends in a belt shape along at least two of the first to fourth connecting surfaces 8A to 8D such as to face the source main surface electrode 122 from a plurality of directions in plan view. In this embodiment, the source wiring electrode 132 is formed in an annular shape (in detail, quadrangular annular shape) extending along the sidewall wiring 100 such as to face the source main surface electrode 122 from four directions in plan view. In other words, the source wiring electrode 132 collectively surrounds the gate main surface electrode 121, the source main surface electrode 122, and the gate wiring electrode 131 in plan view, A part, which extends along the four corners of the active surface 6, of the source wiring electrode 132 is formed in a curved shape toward the outer-surface-7 side. Therefore, in this embodiment, the source wiring electrode 132 is formed in an annular shape whose four corners are curved as a whole in plan view. In this embodiment, the source wiring electrode 132 covers the whole area of the sidewall wiring 100 with the first inorganic insulating film 110 between the sidewall wiring 100 and the source wiring electrode 132.

Also, the source wiring electrode 132 is led out from above the sidewall wiring 100 onto a part, which covers the outer surface 7, of the first inorganic insulating film 110. In detail, the source wiring electrode 132 is led out onto the outer contact region 80, and is formed in a belt shape extending along the outer contact region 80 in plan view. In this embodiment, the source wiring electrode 132 is formed in an annular shape (in detail, quadrangular annular shape) extending along the outer contact region 80 in plan view. In other words, the source wiring electrode 132 covers the outer contact region 80 and the sidewall wiring 100 over the entire periphery.

The source wiring electrode 132 enters the sidewall opening 114 from above the first inorganic insulating film 110, and is electrically connected to the sidewall wiring 100 and to the outer contact region 80. In this embodiment, the source wiring electrode 132 is electrically connected to the sidewall wiring 100 and to the outer contact region 80 over the entire periphery. Hence, the source potential applied to the source main surface electrode 122 is given to the sidewall wiring 100 and to the outer contact region 80 through the source wiring electrode 132.

The source potential given to the sidewall wiring 100 is given to the first trench source structures 41, the second trench source structures 51, the first dummy trench source structures 61, the dummy trench gate structures 62, and the second dummy trench source structures 63. In other words, the use of the sidewall wiring 100 enables the source wiring electrode 132 to electrically connect the first trench source structures 41 to the source main surface electrode 122 at a position differing from that of the source main surface electrode 122, Also, the use of the sidewall wiring 100 enables the source wiring electrode 132 to electrically connect the second trench source structures 51, the first dummy trench source structures 61, the dummy trench gate structures 62, and the second dummy trench source structures 63, which have been electrically separated from the source main surface electrode 122 in the active surface 6, from the first to fourth connecting surfaces 8A to 8D side to the source main surface electrode 122. In other words, according to the sidewall wiring 100, an arbitrary trench structure, which has been electrically separated from the first main surface electrode 120 in the active surface 6, is electrically connected to the first main surface electrode 120 in a region (first to fourth connecting surfaces 8A to 8D) outside the active surface 6.

The source wiring electrode 132 has a source wiring sidewall 132*a* (wiring sidewall) positioned at the first inorganic insulating film 110. The source wiring sidewall 132*a* is formed in a tapered shape that is inclined obliquely downward from the main surface of the source main surface electrode 122. The source wiring sidewall 132*a* may be formed in a curved tapered shape that is curved toward the first inorganic insulating film 110.

The first main surface electrode 120 and the wiring electrode 130 each have a laminated structure including a first electrode film 141 and a second electrode film 142 laminated in this order from the first-inorganic-insulating-film-110 side. The first electrode film 141 is formed in a film shape along the first inorganic insulating film 110. The first electrode film 141 is constituted of a metallic barrier film. In this embodiment, the first electrode film 141 is constituted of a Ti-based metal film.

The first electrode film 141 includes at least one of a titanium film and a titanium nitride film. The first electrode film 141 may have a single layer structure constituted of a titanium film or a titanium nitride film. In this embodiment, the first electrode film 141 has a laminated structure including a titanium film and a titanium nitride film laminated in this order from the first-main surface-3 side. The thickness of the first electrode film 141 may be not less than 10 nm and not more than 500 nm.

The second electrode film 142 is formed in a film shape along the first electrode film 141. The first electrode film 141 is constituted of a Cu-based metal film or an Al-based metal film. The first electrode film 141 may include at least one among a pure Cu film (Cu film whose purity is 99% or more), a pure Al film (Al film whose purity is 99% or more), an AlCu alloy film, an AlSi alloy film, and an AlSiCu alloy film. In this embodiment, the first electrode film 141 has a single layer structure constituted of an AlCu alloy film. The thickness of the second electrode film 142 may be not less than 0.5 μm and not more than 10 μm. Preferably, the thickness of the second electrode film 142 is not less than 2.5 μm and not more than 7.5 μm.

The SiC semiconductor device 1 includes a second inorganic insulating film 150. The second inorganic insulating film 150 is constituted of an inorganic insulator having a comparatively high denseness, and has a barrier property (shielding ability) against water (moisture), For example, an oxide of the first main surface electrode 120 (in this embodiment, aluminum oxide) lowers electrical characteristics of the first main surface electrode 120. Also, the oxide of the first main surface electrode 120 becomes a factor that causes partial peel-off, cracking, etc., of the first main surface electrode 120 or of other structures because of thermal expansion.

The second inorganic insulating film 150 shields water (moisture) from the outside, and protects the SiC chip 2 or the first main surface electrode 120 from oxidation by covering either one or both of the first inorganic insulating film 110 and the first main surface electrode 120. The second inorganic insulating film 150 may be referred to as a passivation film, The second inorganic insulating film 150 may have a laminated structure including a plurality of insulating films, or may have a single layer structure constituted of a single insulating film. Preferably, the second inorganic insulating film 150 includes at least one among a silicon oxide film, a silicon nitride film, and a silicon oxynitride film. The second inorganic insulating film 150 may have a laminated structure including a plurality of silicon oxide films, a laminated structure including a plurality of silicon nitride films, or a laminated structure including a plurality of silicon oxynitride films.

The second inorganic insulating film 150 may have a laminated structure in which at least two among a silicon oxide film, a silicon nitride film, and a silicon oxynitride film are laminated in an arbitrary order. The second inorganic insulating film 150 may have a single layer structure constituted of a silicon oxide film, a silicon nitride film, or a silicon oxynitride film. In this embodiment, the second inorganic insulating film 150 has a single layer structure constituted of a silicon nitride film. In other words, the second inorganic insulating film 150 is constituted of an insulator differing from that of the first inorganic insulating film 110.

Preferably, the thickness of the second inorganic insulating film 150 is less than the thickness of the first inorganic insulating film 110. The thickness of the second inorganic insulating film 150 may be equal to or more than the thickness of the first inorganic insulating film 110. Preferably, the thickness of the second inorganic insulating film 150 exceeds the thickness of the first electrode film 141. Preferably, the thickness of the second inorganic insulating film 150 is equal to or less than the thickness of the second electrode film 142. Particularly preferably, the thickness of the second inorganic insulating film 150 is less than the thickness of the second electrode film 142. The thickness of the second inorganic insulating film 150 may be not less than 0.05 μm and not more than 5 μm. Preferably, the thickness of the second inorganic insulating film 150 is not less than 0.1 μm and not more than 2 μm.

Referring to FIG. 23, in this embodiment, the second inorganic insulating film 150 includes a plurality of inner covering portions 151 (electrode covering portions), an outer covering portion 152 (insulation covering portion), and a removed portion 153. Each of the inner covering portions 151 covers the first main surface electrode 120 such as to expose the electrode sidewall of the first main surface electrode 120. In detail, the inner covering portions 151 include a gate inner covering portion 154 that covers the gate main surface electrode 121 and a source inner covering portion 155 that covers the source main surface electrode 122.

The second inorganic insulating film 150 suffices to have at least one of the gate inner covering portion 154 and the source inner covering portion 155, and is not necessarily required to simultaneously include both the gate inner covering portion 154 and the source inner covering portion 155. Preferably, the second inorganic insulating film 150 has at least the source inner covering portion 155 that covers the source main surface electrode 122 whose area is larger than the gate main surface electrode 121.

Particularly preferably, the second inorganic insulating film 150 has both the gate inner covering portion 154 and the source inner covering portion 155, Also, the second inorganic insulating film 150 suffices to have at least one of the inner covering portions 151 and the outer covering portion 152, and is not necessarily required to include both the inner covering portions 151 and the outer covering portion 152. Preferably, the second inorganic insulating film 150 has at least the inner covering portions 151. Most preferably, the second inorganic insulating film 150 includes both the inner covering portions 151 and the outer covering portion 152.

The gate inner covering portion 154 of the second inorganic insulating film 150 covers the gate main surface electrode 121 such as to expose the gate electrode sidewall 121*a* above the active surface 6. In detail, the gate inner Covering portion 154 covers the gate main surface electrode 121 at a distance from the gate electrode sidewall 121*a* such as to expose the peripheral edge portion of the gate main surface electrode 121. The gate inner covering portion 154 also exposes the inward portion of the gate main surface electrode 121.

The gate inner covering portion 154 is formed in a belt shape extending along the gate electrode sidewall 121*a* in plan view. In this embodiment, the gate inner covering portion 154 is formed in an annular shape surrounding the inward portion of the gate main surface electrode 121 in plan view. In detail, the gate inner covering portion 154 is formed in an annular shape (in detail, quadrangular annular shape) having four sides parallel to the gate electrode sidewall 121*a* in plan view.

The gate inner covering portion 154 has a first inner wall portion 154*a* at the inward-portion side of the gate main surface electrode 121 and a first outer wall portion 154*b* at the gate-electrode-sidewall-121*a* side. In this embodiment, the first inner wall portion 154*a* is formed in a quadrangular shape having four sides parallel to the gate electrode sidewall 1218 in plan view. The first inner wall portion 154*a* is formed in a tapered shape that is inclined obliquely downward from the main surface of the second inorganic insulating film 150 toward the inward portion of the gate main surface electrode 121. The first inner wall portion 154*a* defines a first gate opening 156 that exposes the inward portion of the gate main surface electrode 121.

The first outer wall portion 154*b* is formed on the gate main surface electrode 121 at a distance from the gate electrode sidewall 121*a* such as to expose the peripheral edge portion of the gate main surface electrode 121. In this embodiment, the first outer wall portion 154*b* is formed in a quadrangular shape having four sides parallel to the gate electrode sidewall 121*a* in plan view. The first outer wall portion 154*b* is formed in a tapered shape that is inclined obliquely downward from the main surface of the second inorganic insulating film 150 toward the gate electrode sidewall 121*a* of the gate main surface electrode 121.

The source inner covering portion 155 of the second inorganic insulating film 150 covers the source main surface electrode 122 such as to expose the source electrode sidewall 122*a* above the active surface 6. In detail, the source inner covering portion 155 covers the source main surface electrode 122 at a distance from the source electrode sidewall 122*a* such as to expose the peripheral edge portion of the source main surface electrode 122. The source inner covering portion 155 also exposes the inward portion of the source main surface electrode 122.

The source inner covering portion 155 is formed in a belt shape extending along the source electrode sidewall 122*a* in plan view. In this embodiment, the source inner covering portion 155 is formed in an annular shape surrounding the inward portion of the source main surface electrode 122 in plan view.

The source inner covering portion 155 has a portion concavely hollowed toward the inward side of the source main surface electrode 122 such as to conform to a portion forming the concave portion of the source electrode sidewall 122*a* in plan view. Hence, the source inner covering portion 155 is formed in an annular shape (in detail, polygonal annular shape) having sides parallel to the source electrode sidewall 122*a* in plan view.

The source inner covering portion 155 has a second inner wall portion 155*a* at the inward-portion side of the source main surface electrode 122 and a second outer wall portion 155*b* at the source-electrode-sidewall-122*a* side of the source main surface electrode 122. In this embodiment, the second inner wall portion 155*a* is formed in a polygonal shape having sides parallel to the source electrode sidewall 122*a* in plan view. The second inner wall portion 155*a* is formed in a tapered shape that is inclined obliquely downward from the main surface of the second inorganic insulating film 150 toward the inward portion of the source main surface electrode 122. The second inner wall portion 155*a* defines a first source opening 157 that exposes the inward portion of the source main surface electrode 122.

The second outer wall portion 155*b* is formed on the source main surface electrode 122 at a distance from the source electrode sidewall 122*a* such as to expose the peripheral edge portion of the source main surface electrode 122. In this embodiment, the second outer wall portion 155*b* is formed in a polygonal shape having sides parallel to the source electrode sidewall 122*a* in plan view. The second outer wall portion 155*b* is formed in a tapered shape that is inclined obliquely downward from the main surface of the second inorganic insulating film 150 toward the source electrode sidewall 122*a* of the source main surface electrode 122.

The outer covering portion 152 of the second inorganic insulating film 150 covers the first inorganic insulating film 110 at a distance from the gate main surface electrode 121 and from the source main surface electrode 122 toward the peripheral side of the first main surface 3 such as to expose the gate electrode sidewall 121*a* and the source electrode sidewall 122*a*. The outer covering portion 152 is formed at a distance from the gate wiring electrode 131 toward the peripheral edge of the first main surface 3 such as to expose the gate wiring sidewall 131*a*. The outer covering portion 152 is formed at a distance from the source wiring electrode 132 toward the peripheral edge of the first main surface 3 such as to expose the source wiring sidewall 132*a*. The outer covering portion 152 is formed at a distance from the sidewall wiring 100 toward the peripheral edge of the first main surface 3.

The outer covering portion 152 is formed in a belt shape extending along the active surface 6 (first to fourth connecting surfaces 8A to 8D) in plan view. The outer covering portion 152 is formed in an annular shape surrounding the active surface 6 in plan view. In detail, the outer covering portion 152 is formed in a quadrangular annular shape having four sides parallel to the active surface 6 in plan view. The outer covering portion 152 surrounds the sidewall wiring 100, the gate main surface electrode 121, the source main surface electrode 122, the gate wiring electrode 131, and the source wiring electrode 132 in plan view.

The outer covering portion 152 faces at least one field region 82A to 82E with the first inorganic insulating film 110 between the field region and the outer covering portion 152. In this embodiment, the outer covering portion 152 is formed at a distance from the innermost first field region 82A toward the peripheral side of the first main surface 3 in plan view, and faces the second to fifth field regions 82B to 82E with the first inorganic insulating film 110 between the second to fifth field regions 82B to 82E and the outer covering portion 152. As a matter of course, the outer covering portion 152 may face all of the first to fifth field regions 82A to 82E with the first inorganic insulating film 110 between the first to fifth field regions 82A to 82E and the outer covering portion 152.

In this embodiment, the outer covering portion 152 is led out from above the first inorganic insulating film 110 onto the peripheral edge portion of the outer surface 7 exposed from the notch opening 111. The first inorganic insulating film 110 (outer covering portion 152) defines a dicing street 158 in which the peripheral edge portion of the outer surface 7 is exposed between the first inorganic insulating film 110 and the peripheral edge of the first main surface 3. The dicing street 158 is defined in a quadrangular annular shape extending along the peripheral edge of the first main surface 3, The width of the dicing street 158 may be not less than 5 μm and not more than 25 μm. The width of the dicing street 158 is a width in a direction perpendicular to a direction in which the dicing street 158 extends.

The outer covering portion 152 has a third inner wall portion 152*a* at the active-surface-6 side and a third outer wall portion 152*b* at the peripheral side of the first main surface 3. The third inner wall portion 152*a* is formed on the first inorganic insulating film 110 at a distance from the sidewall opening 114 such as to expose the first inorganic insulating film 110 above the outer surface 7. In detail, the third inner wall portion 152*a* is formed on the first inorganic insulating film 110 at a distance from the source wiring sidewall 132*a* of the source wiring electrode 132 such as to expose the first inorganic insulating film 110.

In this embodiment, the third inner wall portion 152*a* is formed in a quadrangular shape having four sides parallel to the source wiring electrode 132 (source wiring sidewall 132*a*) in plan view. The third inner wall portion 152*a* collectively surrounds the sidewall wiring 100, the gate main surface electrode 121, the source main surface electrode 122, the gate wiring electrode 131, and the source wiring electrode 132. The third inner wall portion 152*a* is formed in a tapered shape that is inclined obliquely downward from the main surface of the second inorganic insulating film 150 toward the first inorganic insulating film 110.

The third outer wall portion 152*b* is formed in a region between the notch opening 111 and the peripheral edge of the outer surface 7 in plan view, and exposes the peripheral edge portion of the outer surface 7. The third outer wall portion 152*b* is formed in a tapered shape that is inclined obliquely downward from the main surface of the second inorganic insulating film 150 toward the outer surface 7, The third outer wall portion 152*b* defines the dicing street 158 between the third outer wall portion 152*b* and the peripheral edge of the outer surface 7.

The removed portion 153 of the second inorganic insulating film 150 is defined between the gate inner covering portion 154 (first outer wall portion 154*b*) and the outer covering portion 152 (third inner wall portion 152*a*), between the source inner covering portion 155 (second outer wall portion 155*b*) and the outer covering portion 152 (third inner wall portion 152*a*), and between the gate inner covering portion 154 (first outer wall portion 154*b*) and the source inner covering portion 155 (second outer wall portion 155*b*).

In this embodiment, the removed portion 153 is formed in a belt shape extending along the first to fourth connecting surfaces 8A to 8D, along the first outer wall portion 154*b*, and along the second outer wall portion 155*b* in plan view. In this embodiment, the removed portion 153 integrally includes an annular portion extending along the first outer wall portion 154*b* and an annular portion extending along the second outer wall portion 155*b* (first to fourth connecting surfaces 8A to 8D) in plan view, The removed portion 153 exposes a level difference portion (i.e., first to fourth connecting surfaces 8A to 8D) between the active surface 6 and the outer surface 7 over the entire periphery, and, concurrently, exposes the gate electrode sidewall 121*a*, the source electrode sidewall 122*a*, the gate wiring sidewall 131*a*, and the source wiring sidewall 132*a* over the entire periphery. In other words, the removed portion 153 exposes the whole area of the gate wiring electrode 131, the whole area of the source wiring electrode 132, and the whole area of the sidewall wiring 100 that is interposed between the gate wiring electrode 131 and the source wiring electrode 132.

In the second inorganic insulating film 150, the gate inner covering portion 154 is formed on the flat gate main surface electrode 121, and the source inner covering portion 155 is formed on the flat source main surface electrode 122, and the outer covering portion 152 is formed on the flat first inorganic insulating film 110. Therefore, in the second inorganic insulating film 150, level differences, which are caused by the sidewall wiring 100, the gate main surface electrode 121, the source main surface electrode 122, the gate wiring electrode 131, and the source wiring electrode 132, are eliminated by the removed portion 153.

The SiC semiconductor device 1 includes an organic insulating film 160 that selectively covers the first inorganic insulating film 110, the second inorganic insulating film 150, and the first main surface electrode 120. The organic insulating film 160 has a hardness that is lower than a hardness of the second inorganic insulating film 150. In other words, the organic insulating film 160 has an elastic modulus smaller than the elastic modulus of the second inorganic insulating film 150, and functions as a cushioning material (protective film) against an external force. The organic insulating film 160 protects the SiC chip 2, the first main surface electrode 120, the second inorganic insulating film 150, etc., from the external force.

Preferably, the organic insulating film 160 includes a photosensitive resin. The photosensitive resin may be a negative type or a positive type. The organic insulating film 160 may include at least one among a polyimide film, a polyamide film, and a polybenzoxazole film. In this embodiment, the organic insulating film 160 includes a polyimide film.

The thickness of the organic insulating film 160 may be not less than 1 μm and not more than 50 μm. Preferably, the thickness of the organic insulating film 160 is not less than 5 μm and not more than 20 μm. Preferably, the thickness of the organic insulating film 160 exceeds the thickness of the second inorganic insulating film 150. Particularly preferably, the thickness of the organic insulating film 160 exceeds the thickness of the first main surface electrode 120. The organic insulating film 160 covers the gate electrode sidewall 121*a* of the gate main surface electrode 121 above the active surface 6. In detail, the organic insulating film 160 covers the gate electrode sidewall 121*a* over the entire periphery of the gate main surface electrode 121. The organic insulating film 160 covers the first electrode film 141 and the second electrode film 142 in the gate electrode sidewall 121*a*. The organic insulating film 160 covers the edge portion of the gate main surface electrode 121.

In other words, the organic insulating film 160 extends from the gate electrode sidewall 121*a* toward the gate inner covering portion 154, and covers the peripheral edge portion of the gate main surface electrode 121 exposed from between the gate electrode sidewall 121*a* and the gate inner covering portion 154. Also, the organic insulating film 160 extends from the peripheral edge portion of the gate main surface electrode 121 onto the gate inner covering portion 154, and covers the gate inner covering portion 154.

The organic insulating film 160 covers the gate inner covering portion 154 such as to expose the inward portion of the gate main surface electrode 121. In detail, the organic insulating film 160 covers the gate inner covering portion 154 such as to expose the first inner wall portion 154*a* of the gate inner covering portion 154. In more detail, the organic insulating film 160 covers the gate inner covering portion 154 at a distance from the first inner wall portion 154*a* toward the first-outer-wall-portion-154*b* side, and exposes the inward portion of the gate main surface electrode 121 and the edge portion of the gate inner covering portion 154.

The organic insulating film 160 covers the source electrode sidewall 122*a* of the source main surface electrode 122 above the active surface 6. In detail, the organic insulating film 160 covers the source electrode sidewall 122*a* over the entire periphery of the source main surface electrode 122. The organic insulating film 160 covers the first electrode film 141 and the second electrode film 142 in the source electrode sidewall 122*a*. The organic insulating film 160 covers the edge portion of the source main surface electrode 122.

In other words, the organic insulating film 160 extends from the source electrode sidewall 122*a* toward the source-inner-covering-portion-155 side, and covers the peripheral edge portion of the source main surface electrode 122 exposed from between the source electrode sidewall 122*a* and the source inner covering portion 155. Also, the organic insulating film 160 extends from the peripheral edge portion of the source main surface electrode 122 onto the source inner covering portion 155, and covers the source inner covering portion 155.

The organic insulating film 160 covers the source inner covering portion 155 such as to expose the inward portion of the source main surface electrode 122. In detail, the organic insulating film 160 covers the source inner covering portion 155 such as to expose the second inner wall portion 155*a* of the source inner covering portion 155. In more detail, the organic insulating film 160 covers the source inner covering portion 155 at a distance from the second inner wall portion 155*a* toward the second-outer-wall-portion-155*b* side, and exposes the inward portion of the source main surface electrode 122 and the edge portion of the source inner covering portion 155.

The organic insulating film 160 covers the gate wiring sidewall 131*a* of the gate wiring electrode 131 above the active surface 6. In detail, the organic insulating film 160 covers the gate wiring sidewall 131*a* over the entire periphery of the gate wiring electrode 131. The organic insulating film 160 covers the first electrode film 141 and the second electrode film 142 in the gate wiring sidewall 131*a*. The organic insulating film 160 extends from the gate wiring sidewall 131*a* onto the gate wiring electrode 131, and covers the whole area of the gate wiring electrode 131.

The organic insulating film 160 covers the sidewall wiring 100 in a region between the active surface 6 and the outer surface 7 with the source wiring electrode 132 and the first inorganic insulating film 110 between the sidewall wiring 100 and the organic insulating film 160. The organic insulating film 160 covers the source wiring sidewall 132*a* over the entire periphery of the source wiring electrode 132. The organic insulating film 160 covers the first electrode film 141 and the second electrode film 142 in the source wiring sidewall 132*a*. The organic insulating film 160 extends from the source wiring sidewall 132*a* onto the source wiring electrode 132, and covers the whole area of the source wiring electrode 132. In other words, the organic insulating film 160 covers the whole area of the sidewall wiring 100 with the source wiring electrode 132 and the first inorganic insulating film 110 between the sidewall wiring 100 and the organic insulating film 160.

The organic insulating film 160 is led out from above the source wiring electrode 132 onto the outer covering portion 152 of the second inorganic insulating film 150, and covers the outer covering portion 152. The organic insulating film 160 covers the outer covering portion 152 such as to expose the peripheral edge portion of the outer surface 7. In detail, the organic insulating film 160 covers the outer covering portion 152 such as to expose the third outer wall portion 152*b* of the outer covering portion 152. In more detail, the organic insulating film 160 covers the outer covering portion 152 at a distance from the third outer wall portion 152*b* toward the third-inner-wall-portion-152*a* side, and exposes the peripheral edge portion of the outer surface 7 and the peripheral edge portion of the outer covering portion 152 in plan view.

The organic insulating film 160 has a fourth inner wall portion 160*a* at the gate-main surface-electrode-121 side. The fourth inner wall portion 160*a* extends along the first inner wall portion 154*a* (first gate opening 156) of the gate inner covering portion 154. In this embodiment, the fourth inner wall portion 160*a* is formed in a quadrangular shape having four sides parallel to the first inner wall portion 154*a* in plan view.

In detail, the fourth inner wall portion 160*a* is formed on the gate inner covering portion 154 at a distance from the first inner 154*a* toward wall portion the first-outer-wall-portion-154*b* side, and exposes the inward portion of the gate main surface electrode 121 and the edge portion of the gate inner covering portion 154. In other words, a second gate opening 161 exposes the inward portion of the gate main surface electrode 121 and the edge portion of the gate inner covering portion 154. The fourth inner wall portion 160*a* defines the second gate opening 161 that exposes the inward portion of the gate main surface electrode 121.

The fourth inner wall portion 160*a* (second gate opening 161) communicates with the first inner wall portion 154*a* (first gate opening 156), and forms a single gate pad opening 162 with the first inner wall portion 154*a* (first gate opening 156). The fourth inner wall portion 160*a* (second gate opening 161) is formed in a tapered shape that is inclined obliquely downward from the main surface of the organic insulating film 160 toward the first inner wall portion 154*a*. In this embodiment, the fourth inner wall portion 160*a* is formed in a curved tapered shape that is curved toward the gate inner covering portion 154.

The organic insulating film 160 has a fifth inner wall portion 160*b* at the source-main-surface-electrode-122 side. The fifth inner wall portion 160*b* extends along the second inner wall portion 155*a* of the source inner covering portion 155 (first source opening 157). In this embodiment, the fifth inner wall portion 160*b* is formed in a polygonal shape having sides parallel to the second inner wall portion 155*a* of the source inner covering portion 155 in plan view.

In detail, the fifth inner wall portion 160*b* is formed on the source inner covering portion 155 at a distance from the second inner wall portion 155*a* of the source inner covering portion 155 toward the second-outer-wall-portion-155*b* side, and exposes the inward portion of the source main surface electrode 122 and the edge portion of the source inner covering portion 155. In other words, a second source opening 163 exposes the inward portion of the source main surface electrode 122 and the edge portion of the source inner covering portion 155. The fifth inner wall portion 160*b* defines the second source opening 163 that exposes the inward portion of the source main surface electrode 122.

The fifth inner wall portion 160*b* (second source opening 163) communicates with the second inner wall portion 155*a* of the source inner covering portion 155 (first source opening 157), and forms a single source pad opening 164 with the second inner wall portion 155*a* (first source opening 157). The fifth inner wall portion 160*b* (second source opening 163) is formed in a tapered shape that is inclined obliquely downward from the main surface of the organic insulating film 160 toward the second inner wall portion 155*a*. In this embodiment, the fifth inner wall portion 160*b* is formed in a curved tapered shape that is curved toward the source inner covering portion 155.

The organic insulating film 160 has a fourth outer wall portion 160*c*. The fourth outer wall portion 160*c* is formed at a distance from the peripheral edge of the outer surface 7 (first to fourth side surfaces 5A to 5D) toward the outer-covering-portion-152 side such as to expose the peripheral edge portion of the outer surface 7. In detail, the fourth outer wall portion 160*c* is formed on the third outer wall portion 152*b* such as to expose the third outer wall portion 152*b* of the outer covering portion 152.

In this embodiment, the fourth outer wall portion 160*c* is formed in a quadrangular shape having four sides parallel to the active surface 6 in plan view. The fourth outer wall portion 160*c* is formed in a tapered shape that is inclined obliquely downward from the main surface of the organic insulating film 160 toward the third outer wall portion 152*b* of the outer covering portion 152. In this embodiment, the fourth outer wall portion 160*c* is formed in a curved tapered shape that is curved toward the outer covering portion 152. The fourth outer wall portion 160*c* defines the dicing street 158 together with the third outer wall portion 152*b*.

As thus described, the organic insulating film 160 covers the edge portion of the gate main surface electrode 121, the edge portion of the source main surface electrode 122, the whole area of the gate wiring electrode 131, and the inner covering portions 151 of the second inorganic insulating film 150 above the active surface 6. The organic insulating film 160 covers parts, which are exposed from the gate main surface electrode 121, from the gate wiring electrode 131, from the source main surface electrode 122, and from the source wiring electrode 132, of the first inorganic insulating film 110 on the active surface 6.

The organic insulating film 160 covers the whole area of the source wiring electrode 132 (sidewall wiring 100) between the active surface 6 and the outer surface 7. The organic insulating film 160 covers the outer covering portion 152 of the second inorganic insulating film 150. The organic insulating film 160 covers parts, which are exposed from the source wiring electrode 132 and from the second inorganic insulating film 150, of the first inorganic insulating film 110 on the outer surface 7.

Also, the organic insulating film 160 is formed such as to straddle the inner covering portions 151 and the outer covering portion 152 of the second inorganic insulating film 150, and covers the whole area of the source wiring electrode 132 (sidewall wiring 100), the whole area of the gate wiring electrode 131, the edge portion of the gate main surface electrode 121, and the edge portion of the source main surface electrode 122 in the removed portion 153 between the inner covering portions 151 and the outer covering portion 152.

In other words, the organic insulating film 160 fills an unevenness that is formed by the first inorganic insulating film 110, by the source wiring electrode 132 (sidewall wiring 100), by the second inorganic insulating film 150, by the gate main surface electrode 121, by the source main surface electrode 122, by the gate wiring electrode 131, and by the source wiring electrode 132 in the removed portion 153. A level difference of a part, which is positioned in the removed portion 153, of the organic insulating film 160 is lessened by the sidewall wiring 100.

The SiC semiconductor device 1 includes a second main surface electrode 170 that covers the second main surface 4. The second main surface electrode 170 may be referred to as a drain electrode. The second main surface electrode 170 covers the whole area of the second main surface 4, and is continuous with the peripheral edge of the first main surface 3 (first to fourth side surfaces 5A to 5D). The second main surface electrode 170 is electrically connected to the first semiconductor region 10 (second main surface 4). In detail, the second main surface electrode 170 forms an ohmic contact with the first semiconductor region 10 (second main surface 4).

In this embodiment, the second main surface electrode 170 includes at least one among a Ti film, an Ni film, a Pd film, an Au film, and an Ag film. The second main surface electrode 170 suffices to include at least a Ti film, and the presence or absence of an Ni film, a Pd film, an Au film, and an Ag film is arbitrary, or the order in which these films are laminated is arbitrary. The second main surface electrode 170 may include a Ti film, an Ni film, a Pd film, and an Au film laminated in this order from the second-main surface-4 side as an example. The second main surface electrode 170 may have a laminated structure including a Ti film, an Ni film, and an Au film as another example.

Figure 29A:
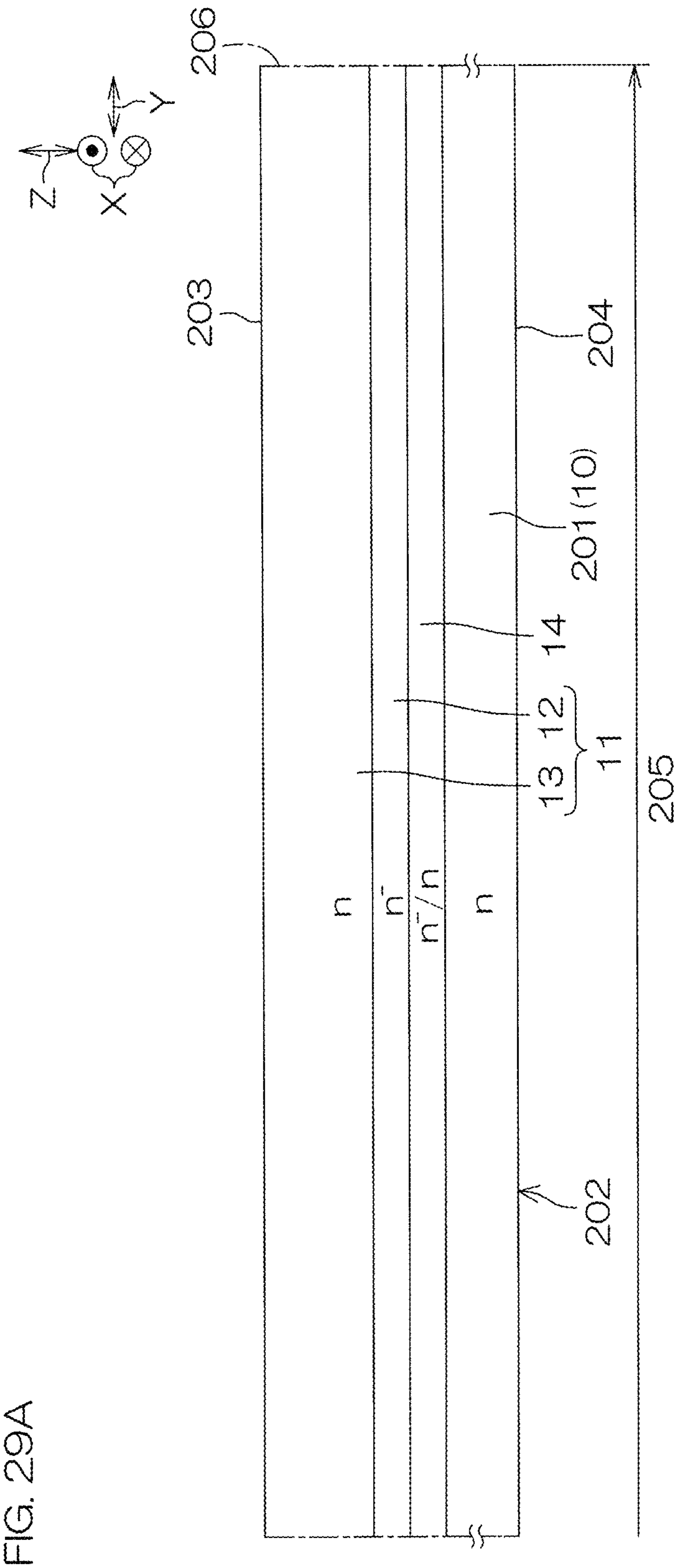
FIG. 29A is a cross-sectional view showing an example of a manufacturing method of the SiC semiconductor device shown in FIG. 1.
Figure 29B:
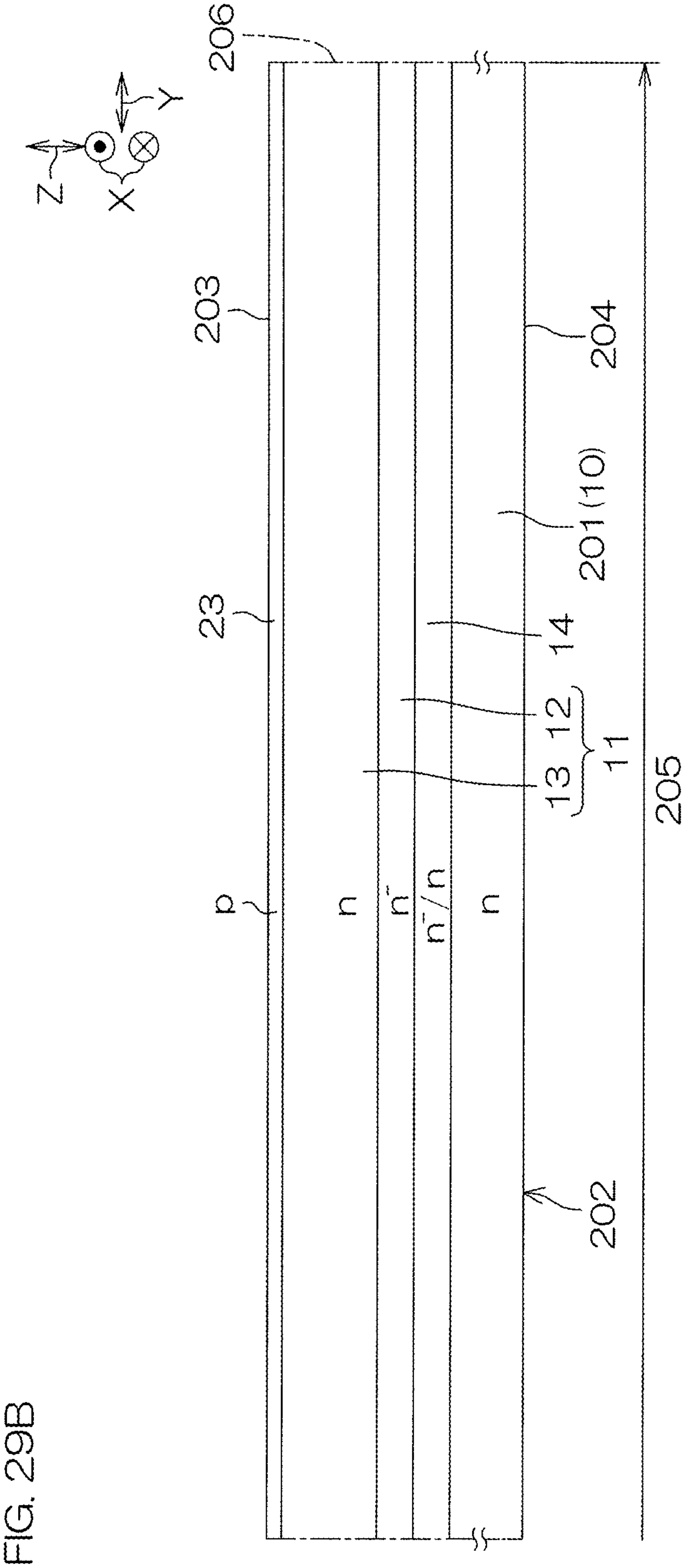
FIG. 29B is a cross-sectional view showing a step subsequent to that of FIG. 29A.
Figure 29C:
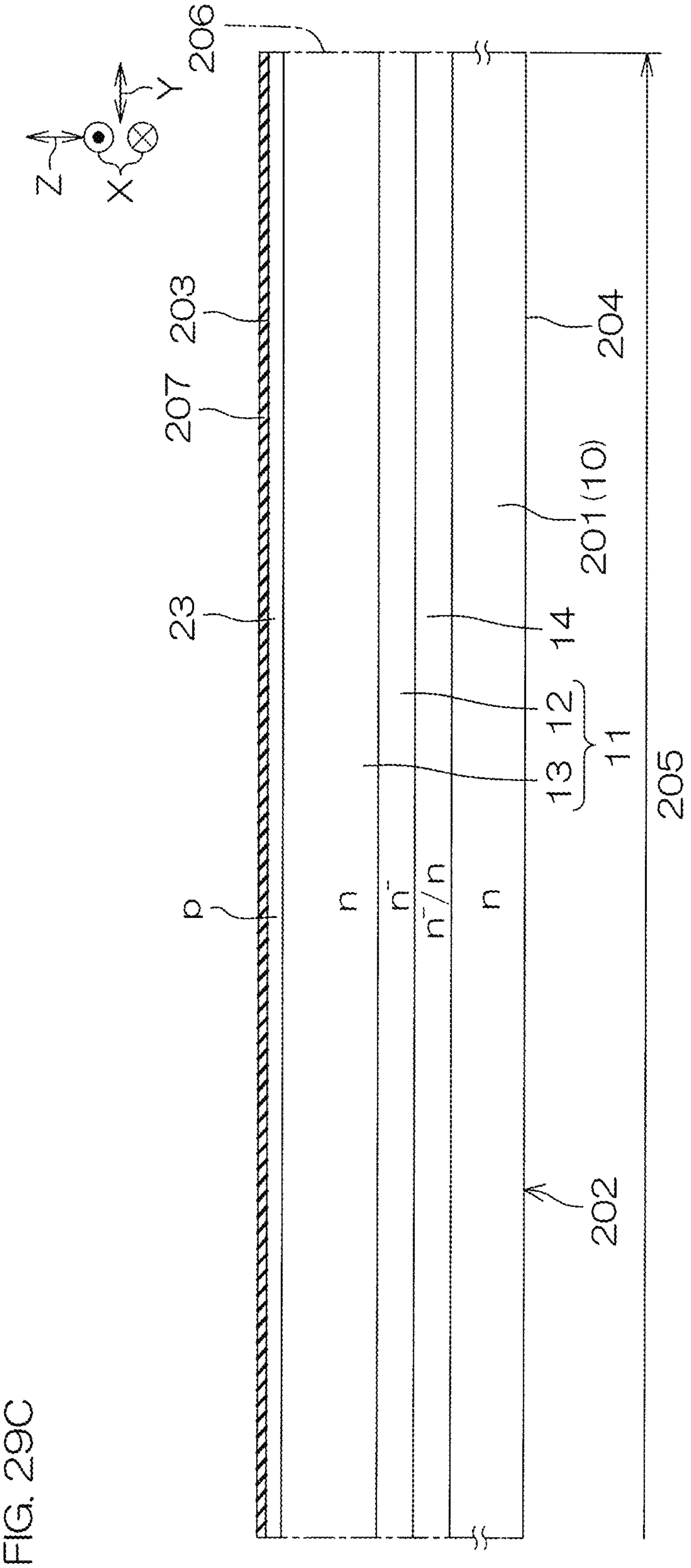
FIG. 29C is a cross-sectional view showing a step subsequent to that of FIG. 29B.
Figure 29D:
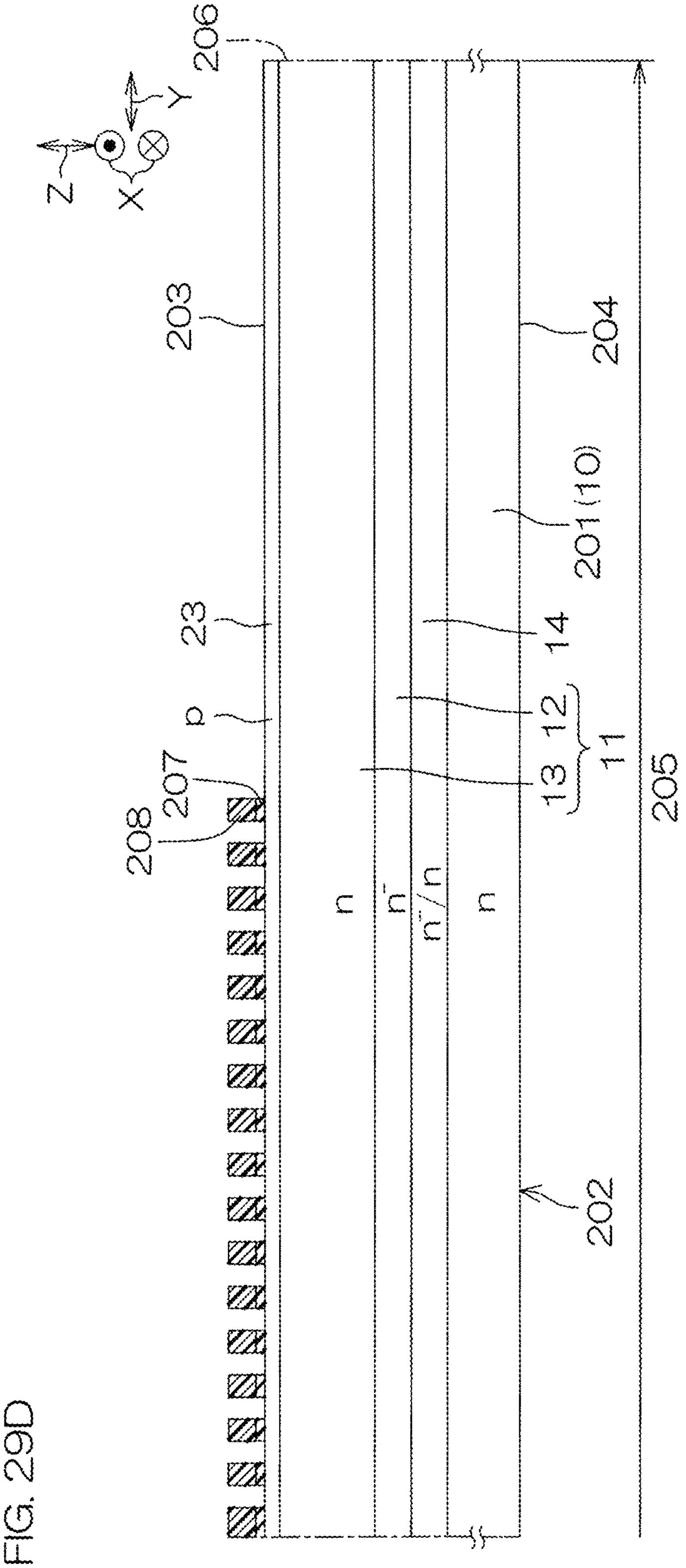
FIG. 29D is a cross-sectional view showing a step subsequent to that of FIG. 29C.
Figure 29E:
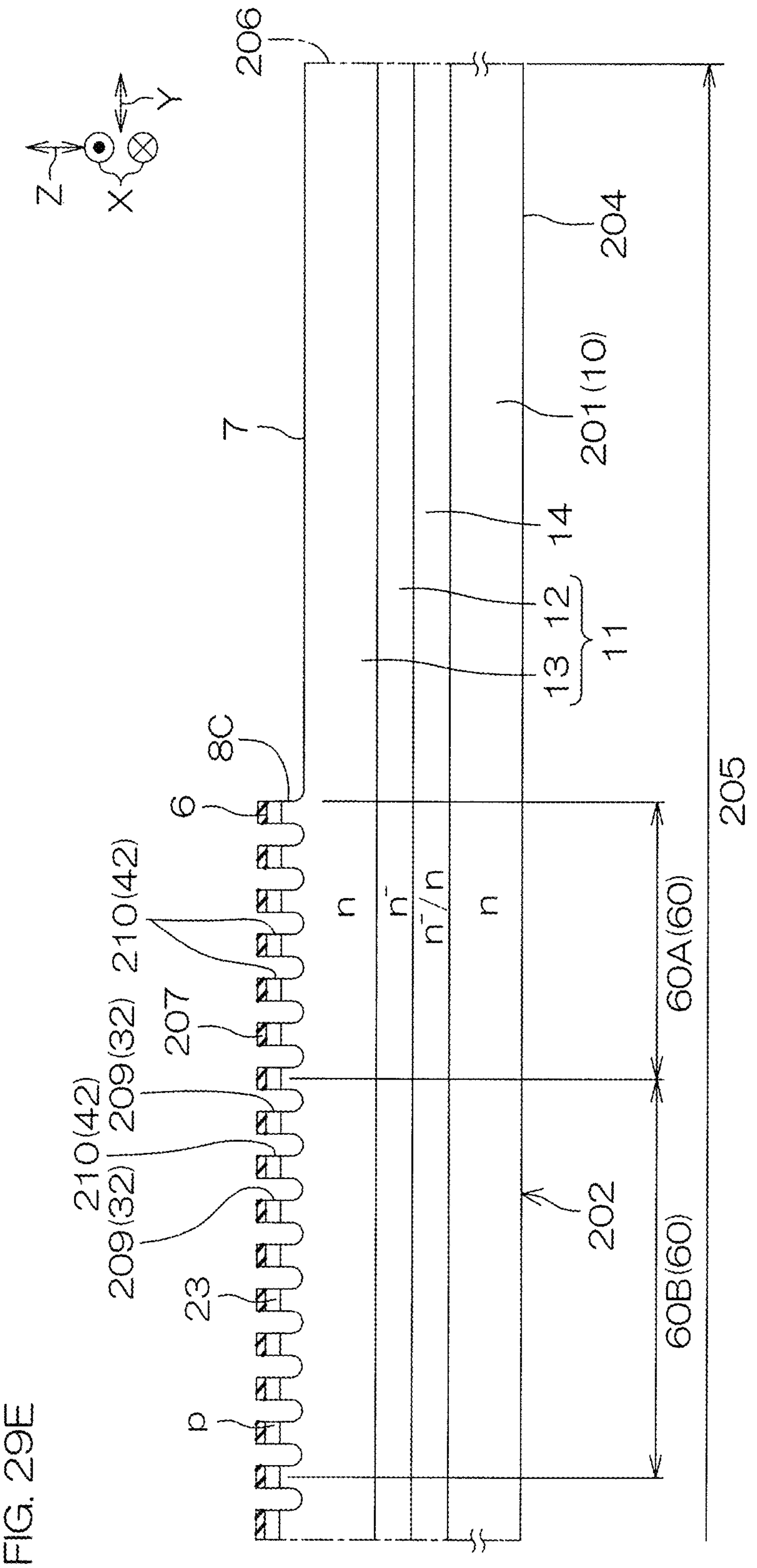
FIG. 29E is a cross-sectional view showing a step subsequent to that of FIG. 29D.
Figure 29F:
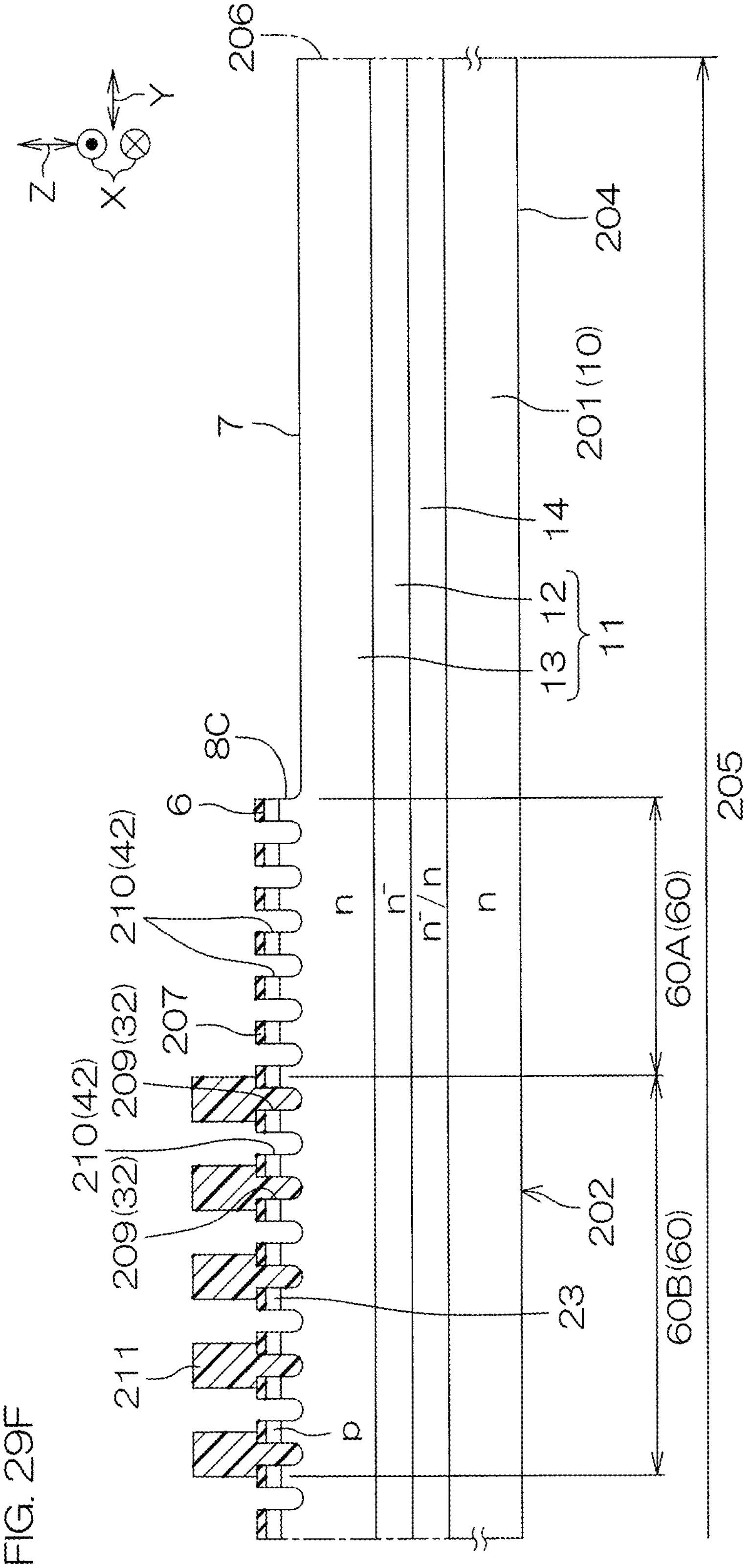
FIG. 29F is a cross-sectional view showing a step subsequent to that of FIG. 29E.
Figure 29G:
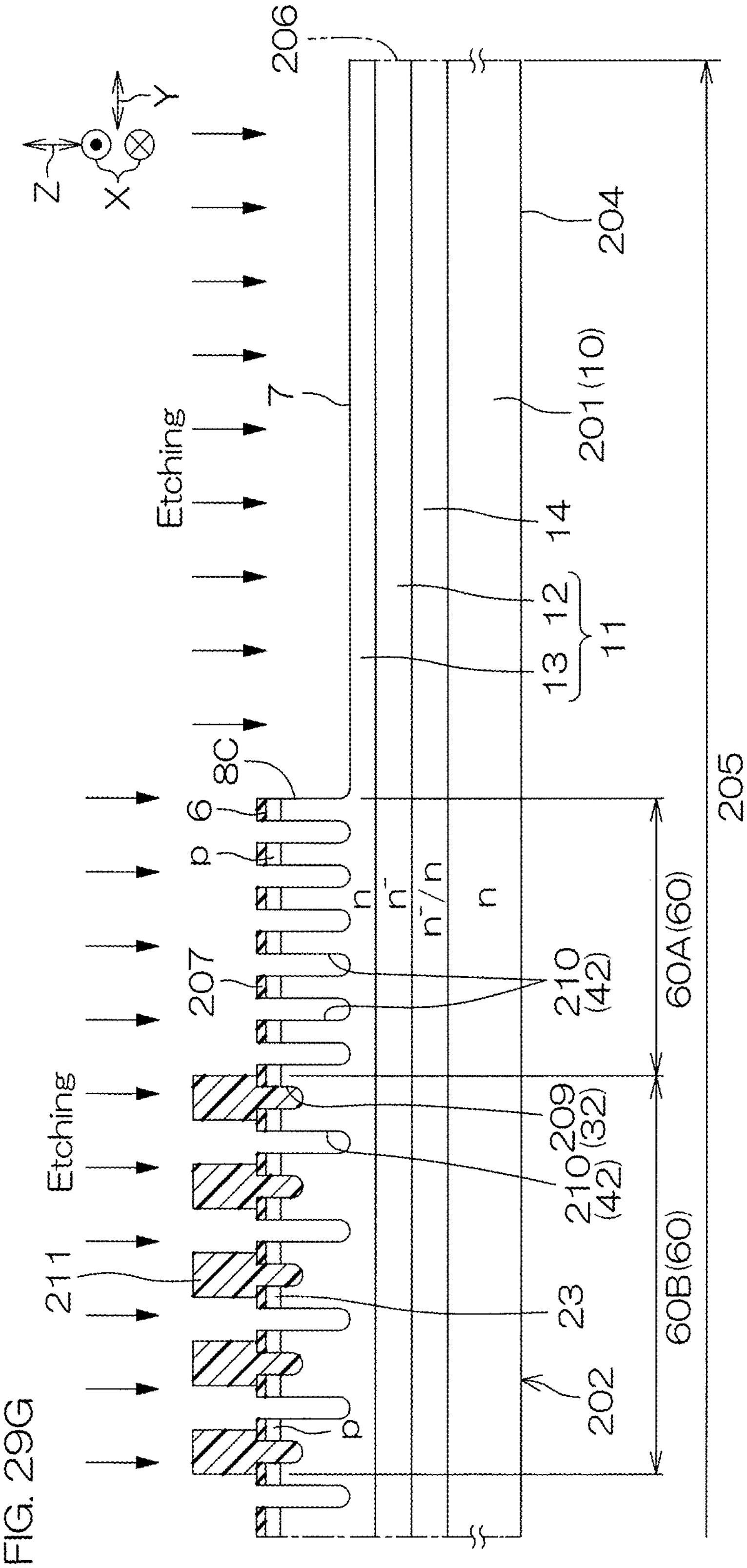
FIG. 29G is a cross-sectional view showing a step subsequent to that of FIG. 29F.
Figure 29H:
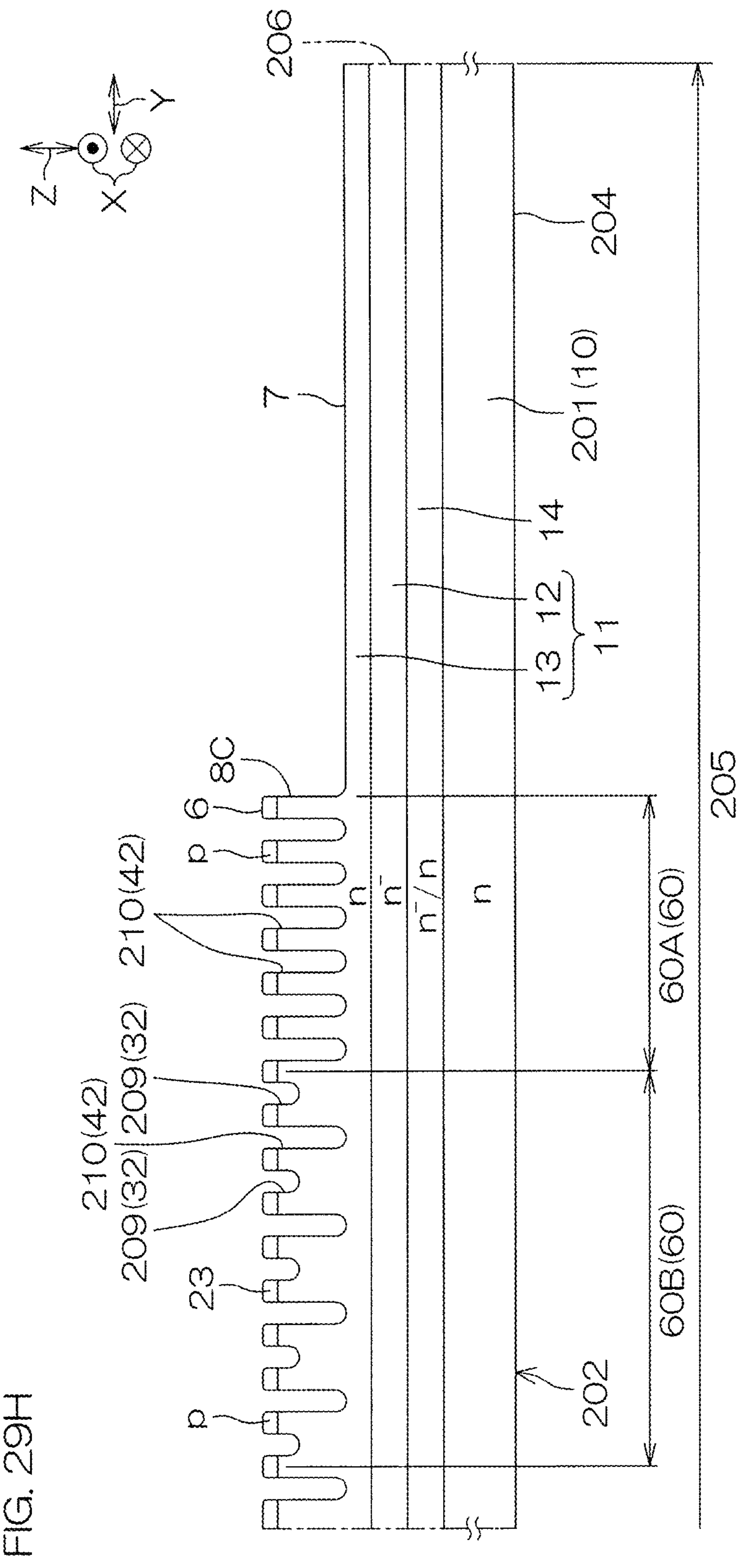
FIG. 29H is a cross-sectional view showing a step subsequent to that of FIG. 29G.
Figure 29I:
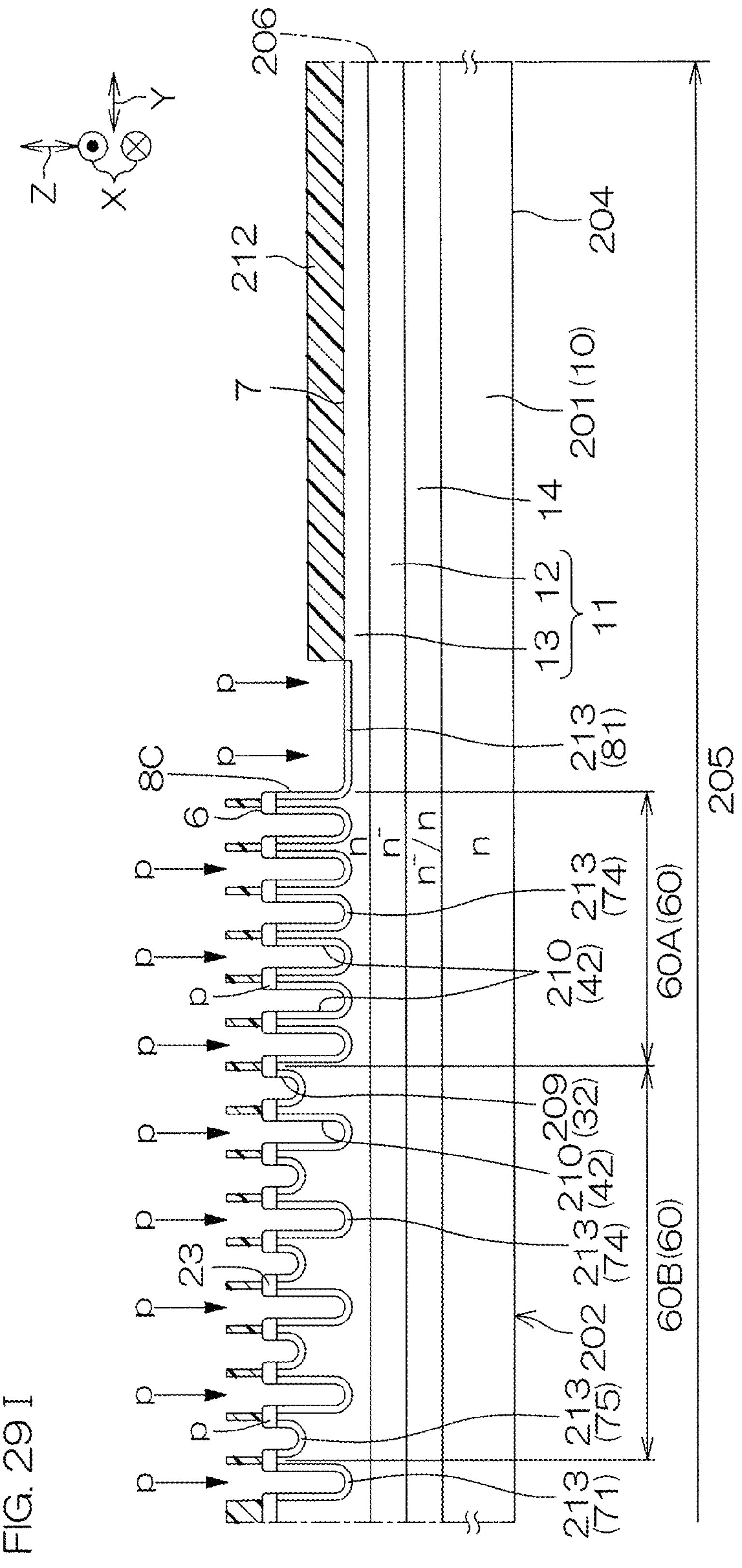
FIG. 29I is a cross-sectional view showing a step subsequent to that of FIG. 29H.
Figure 29J:
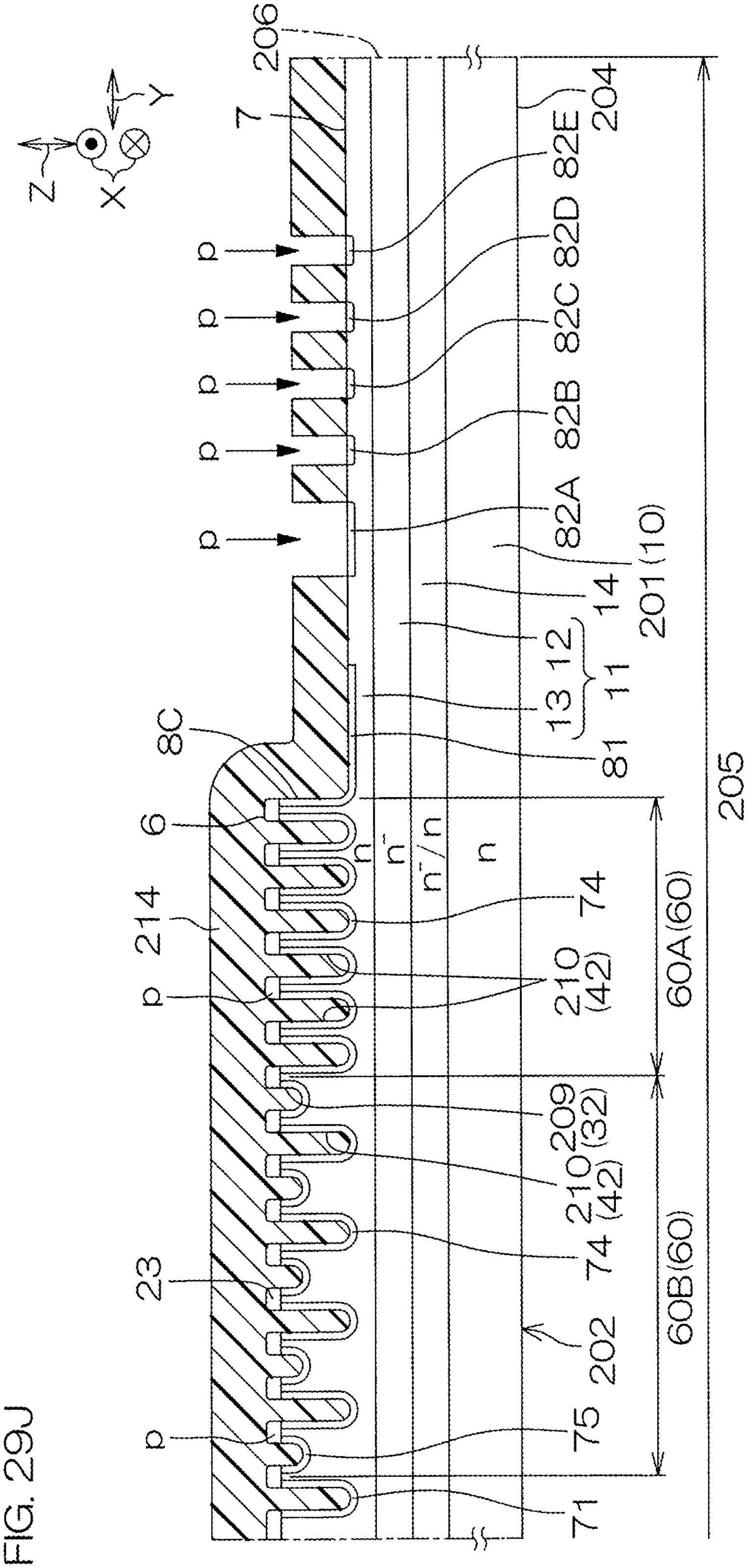
FIG. 29J is a cross-sectional view showing a step subsequent to that of FIG. 29I.
Figure 29K:
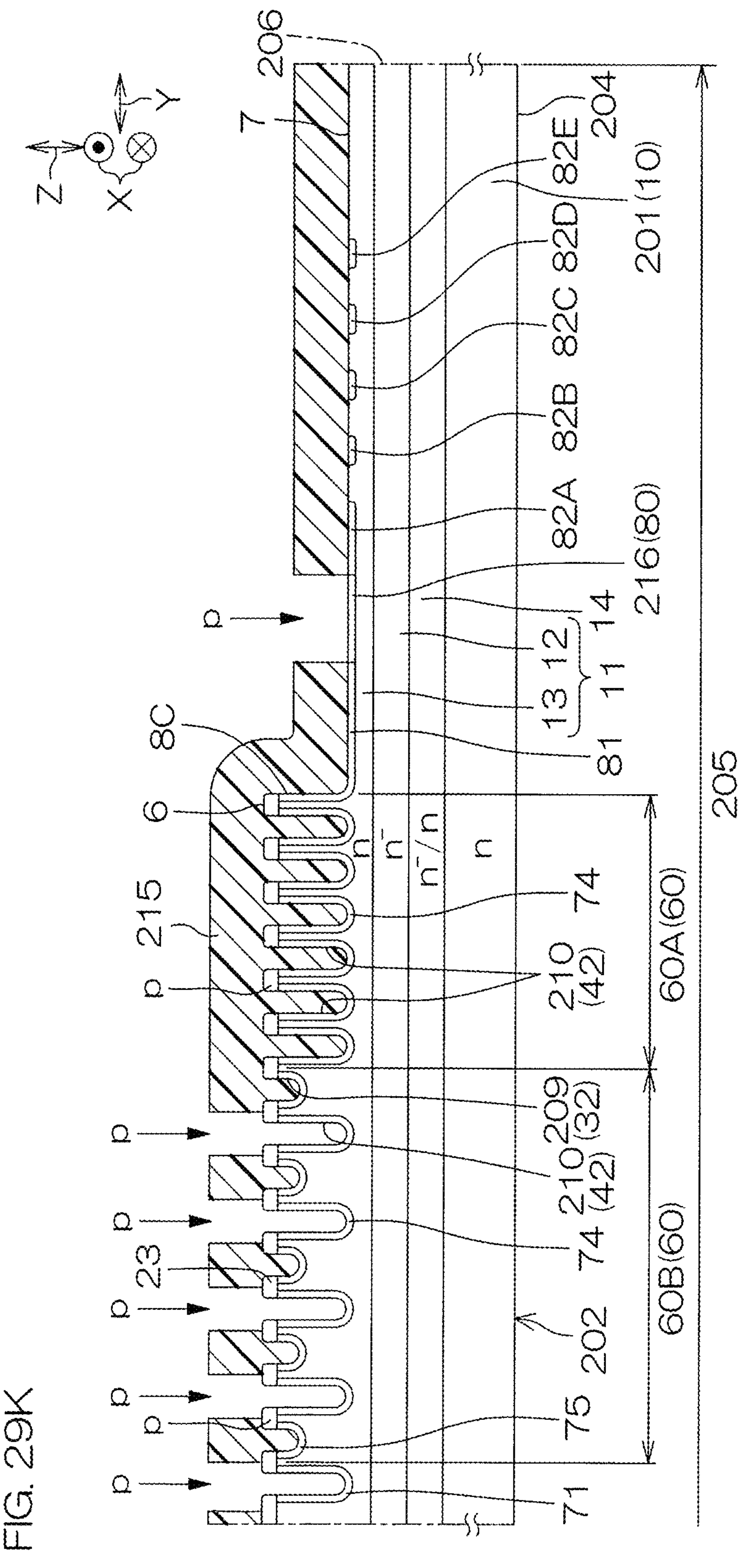
FIG. 29K is a cross-sectional view showing a step subsequent to that of FIG. 29J.
Figure 29L:
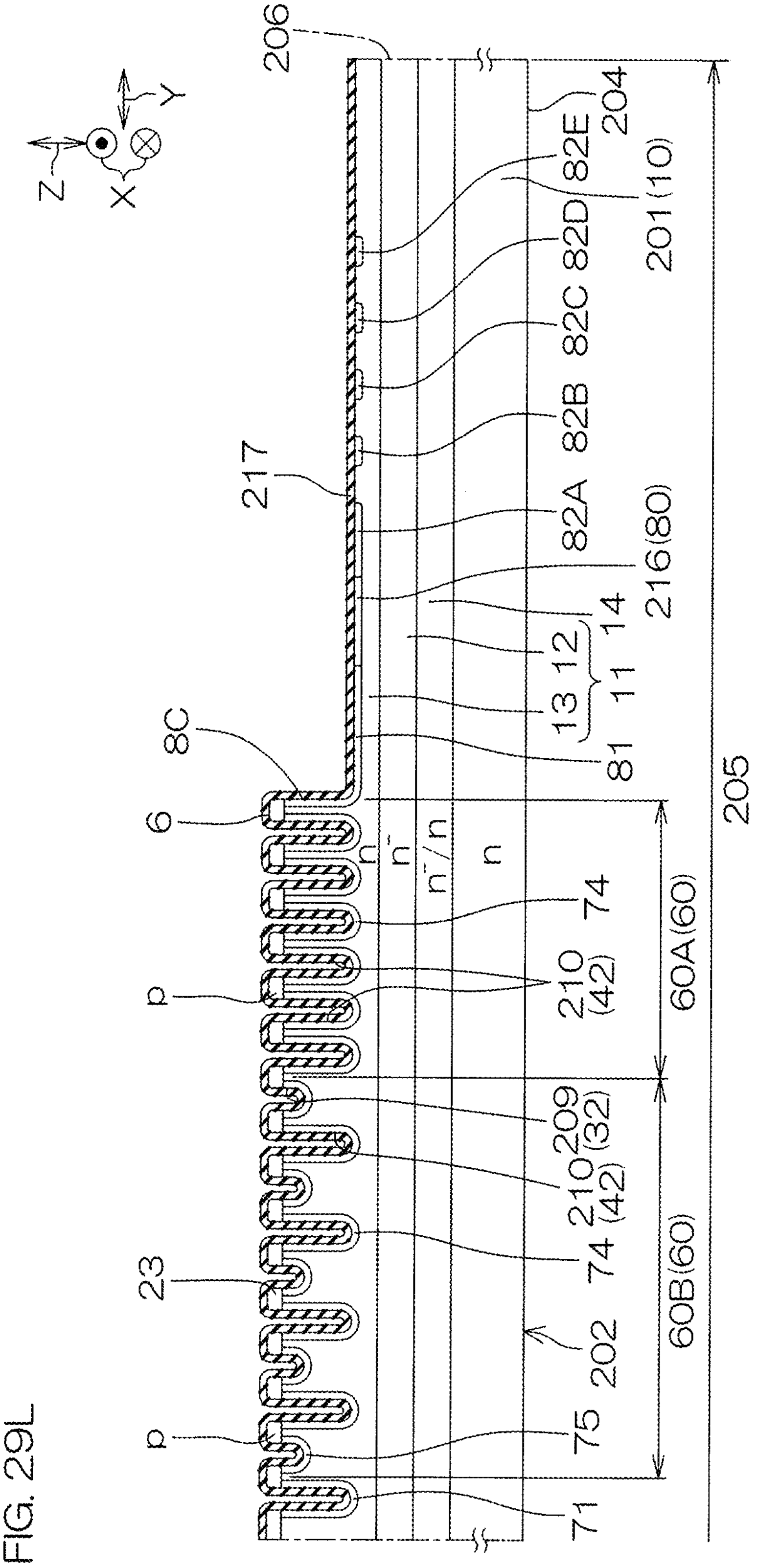
FIG. 29L is a cross-sectional view showing a step subsequent to that of FIG. 29K.
Figure 29M:
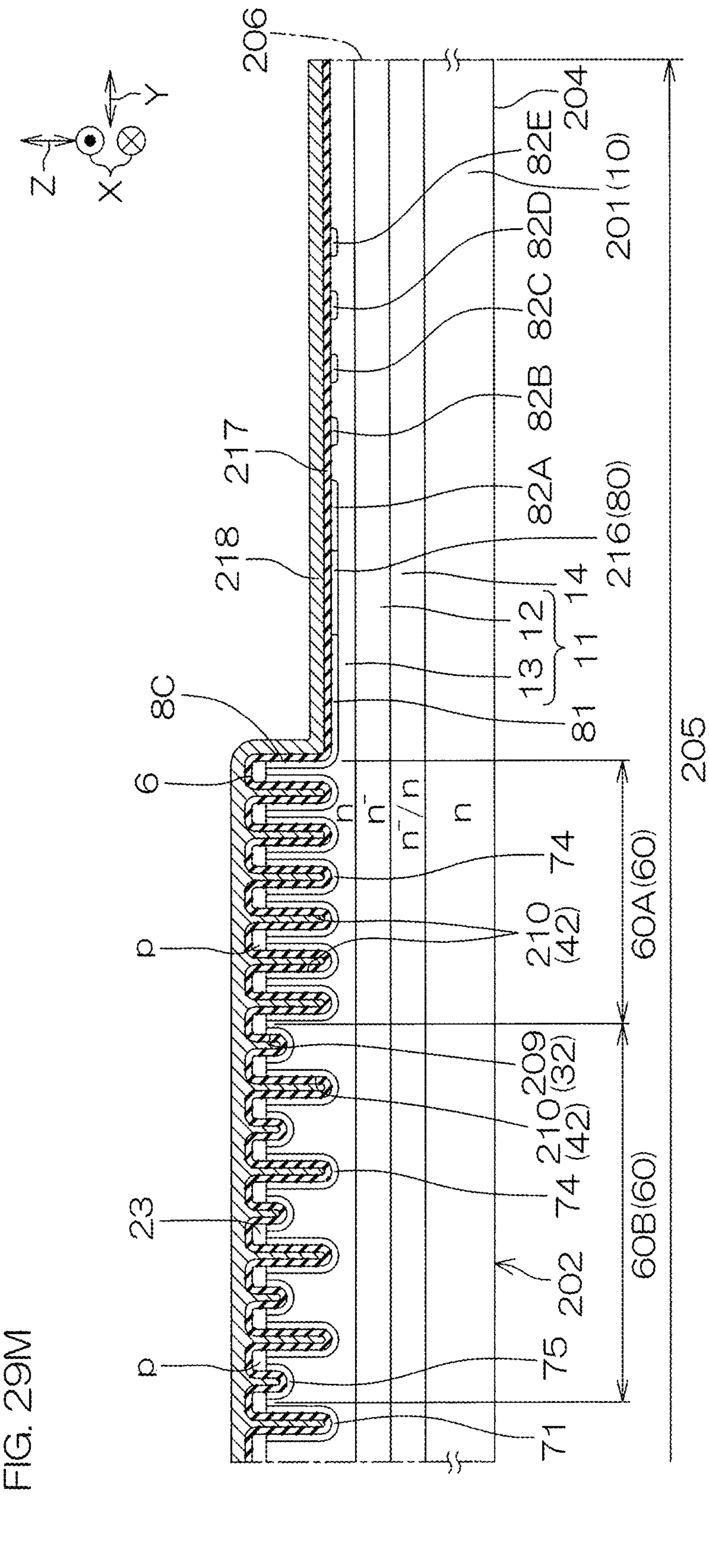
FIG. 29M is a cross-sectional view showing a step subsequent to that of FIG. 29L.
Figure 29N:
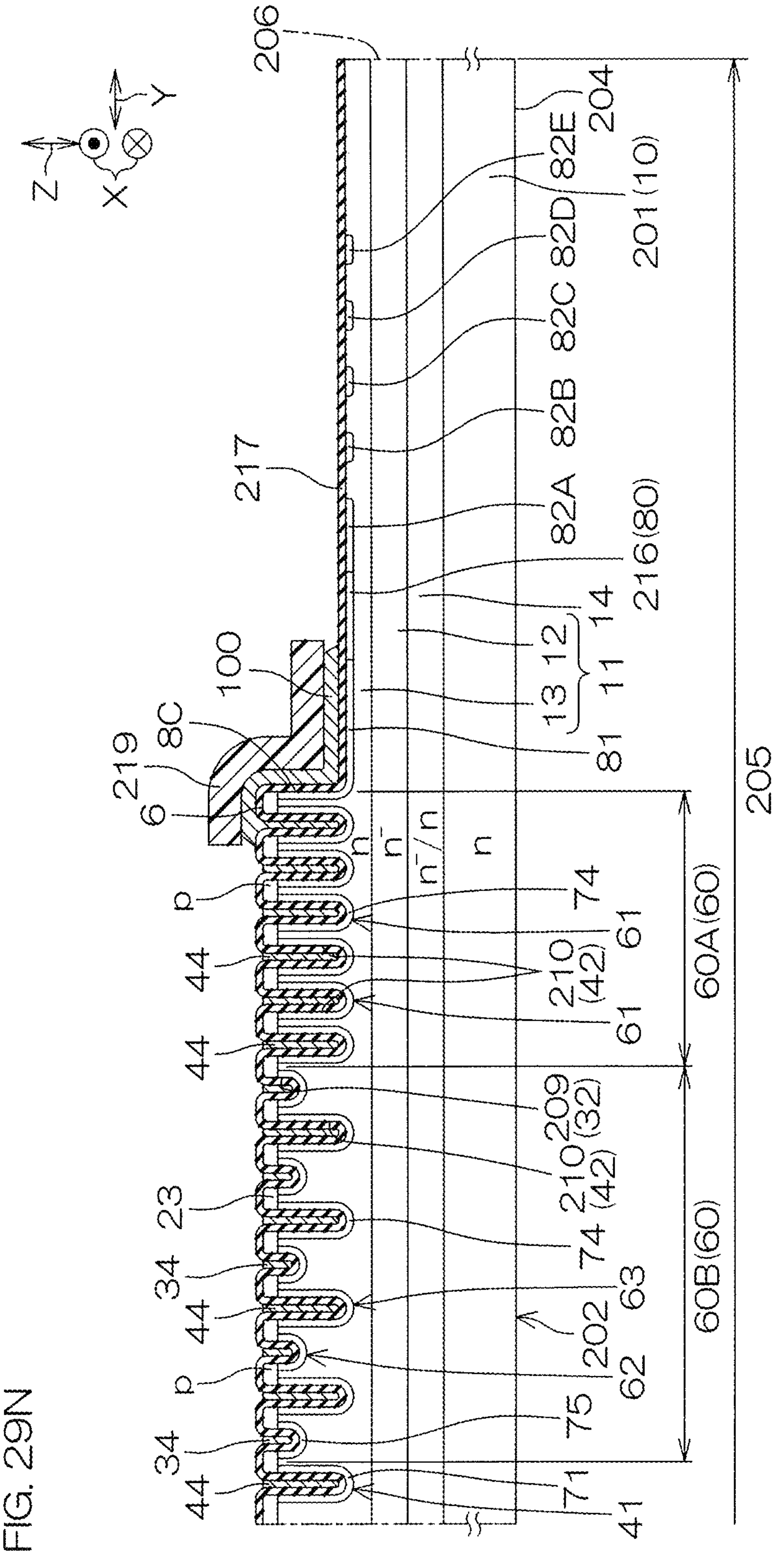
FIG. 29N is a cross-sectional view showing a step subsequent to that of FIG. 29M.
Figure 29O:
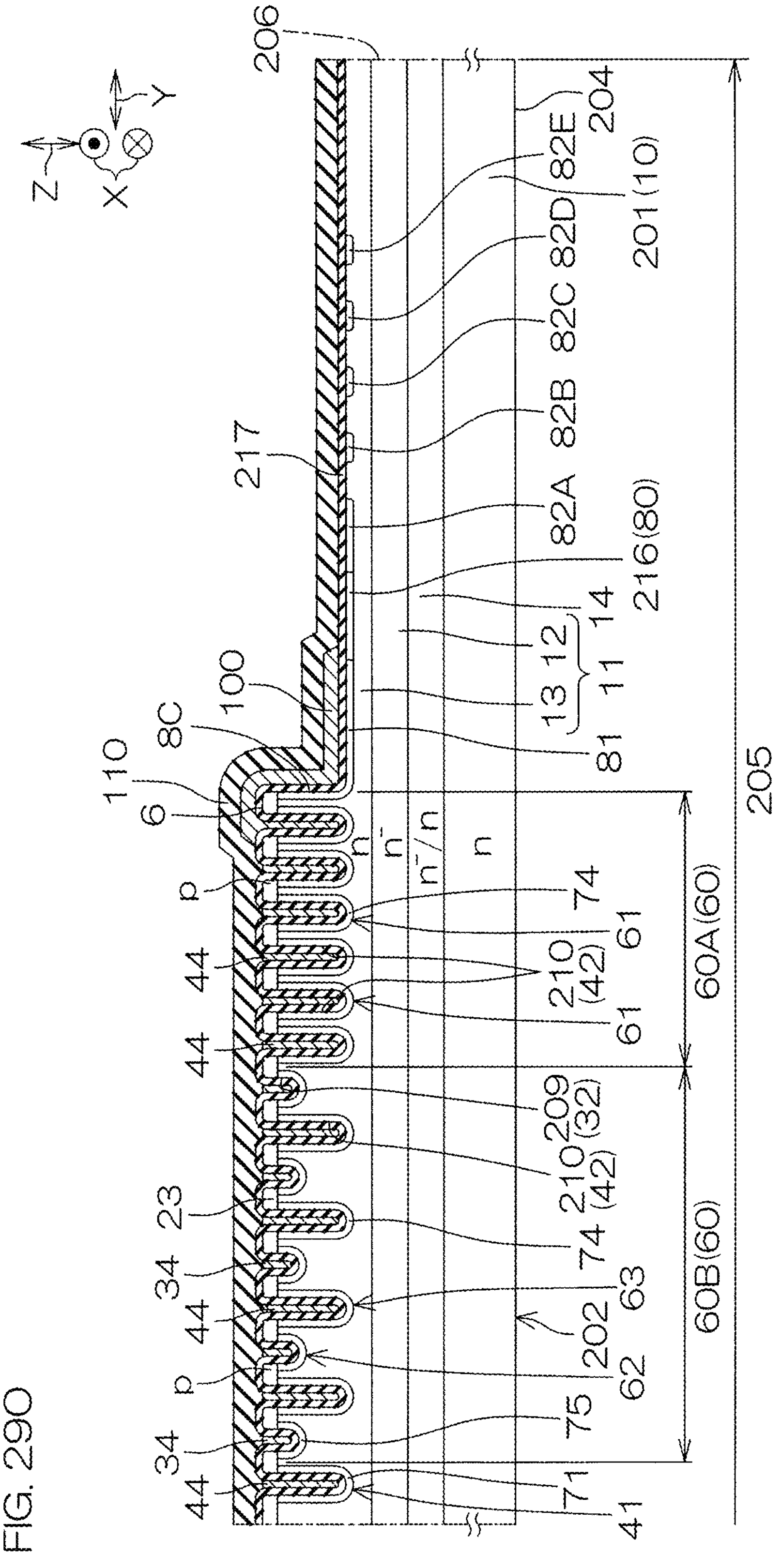
FIG. 29O is a cross-sectional view showing a step subsequent to that of FIG. 29N.
Figure 29P:
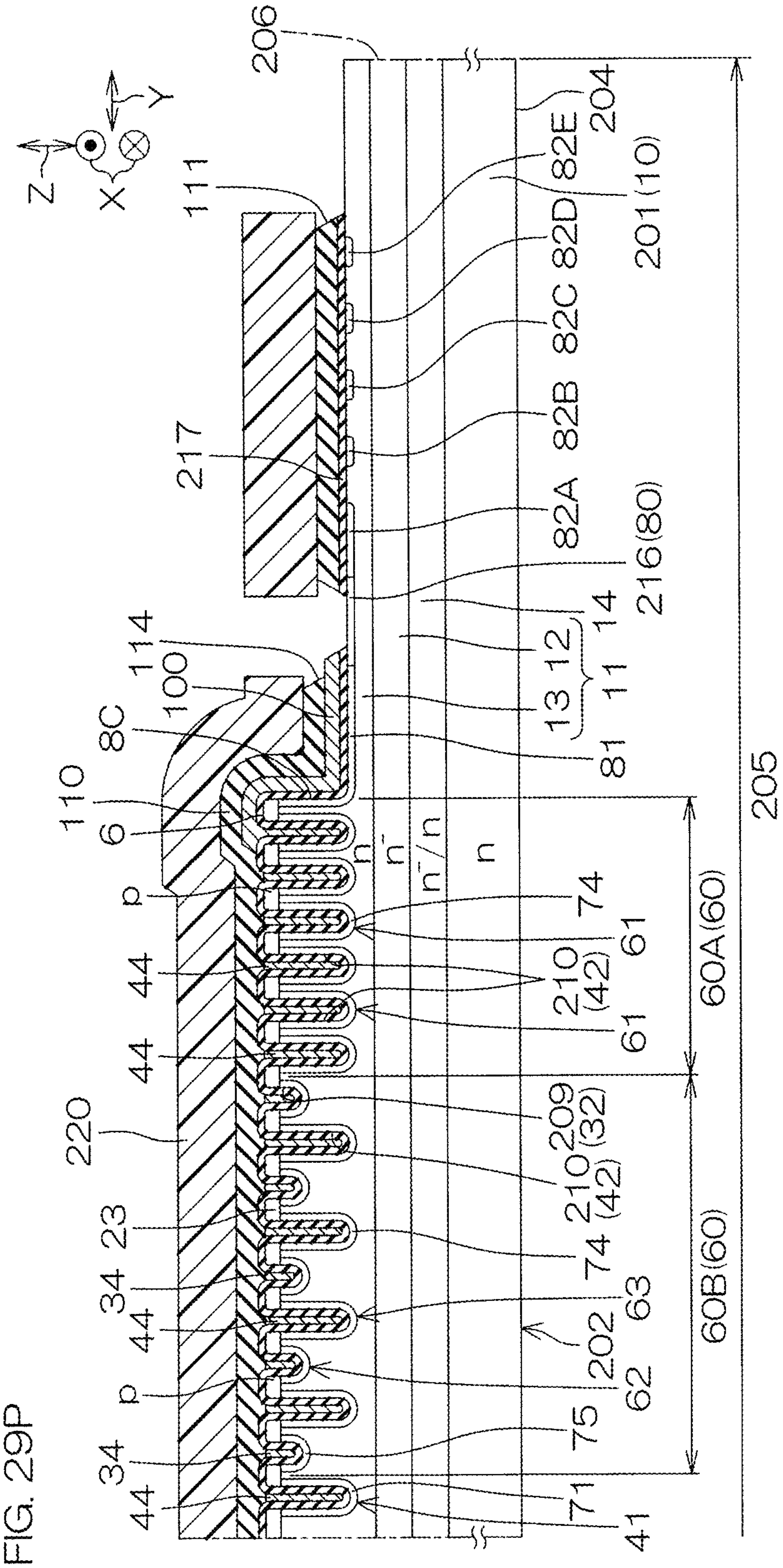
FIG. 29P is a cross-sectional view showing a step subsequent to that of FIG. 29O.
Figure 29Q:
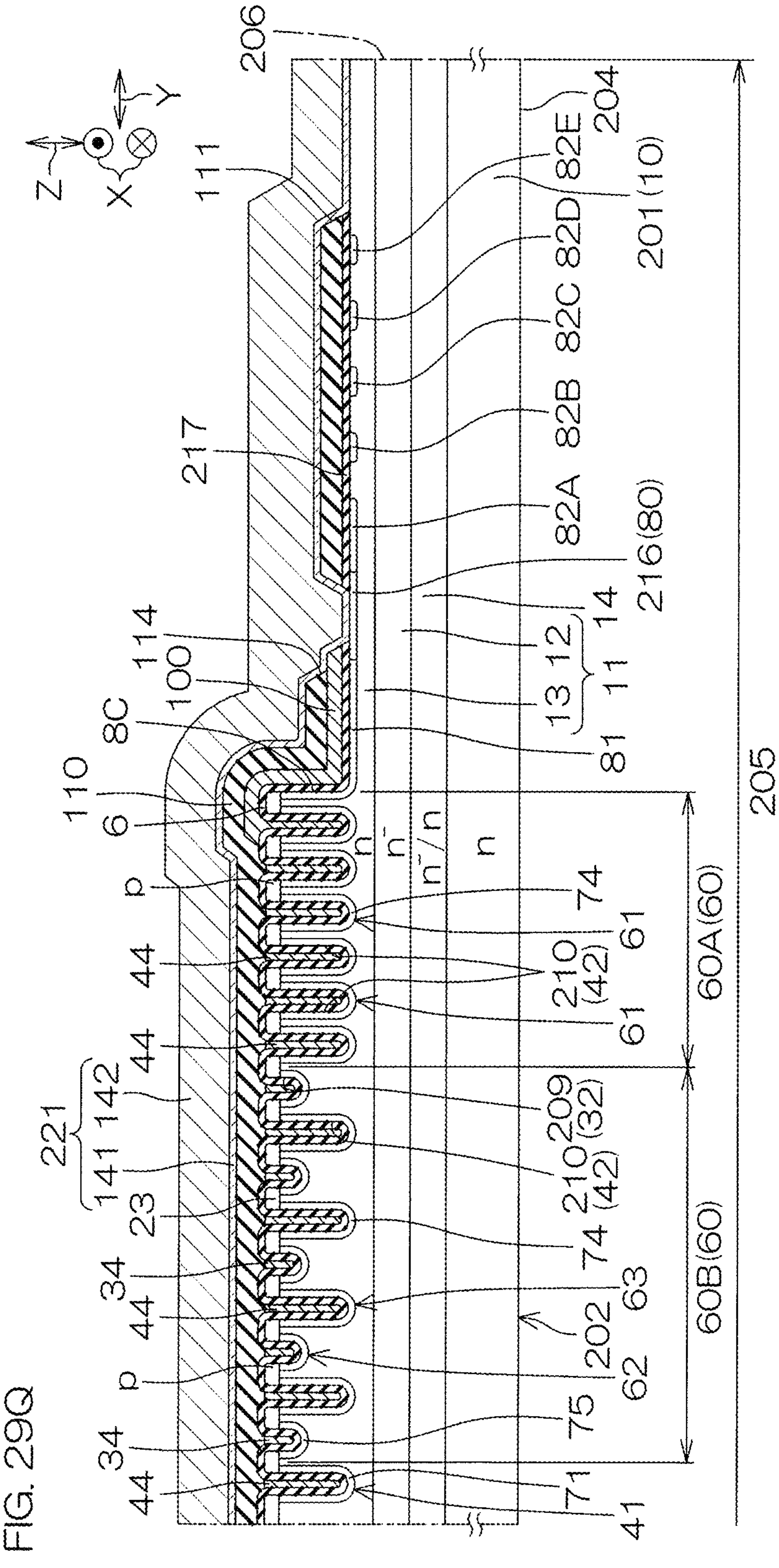
FIG. 29Q is a cross-sectional view showing a step subsequent to that of FIG. 29P.
Figure 29R:
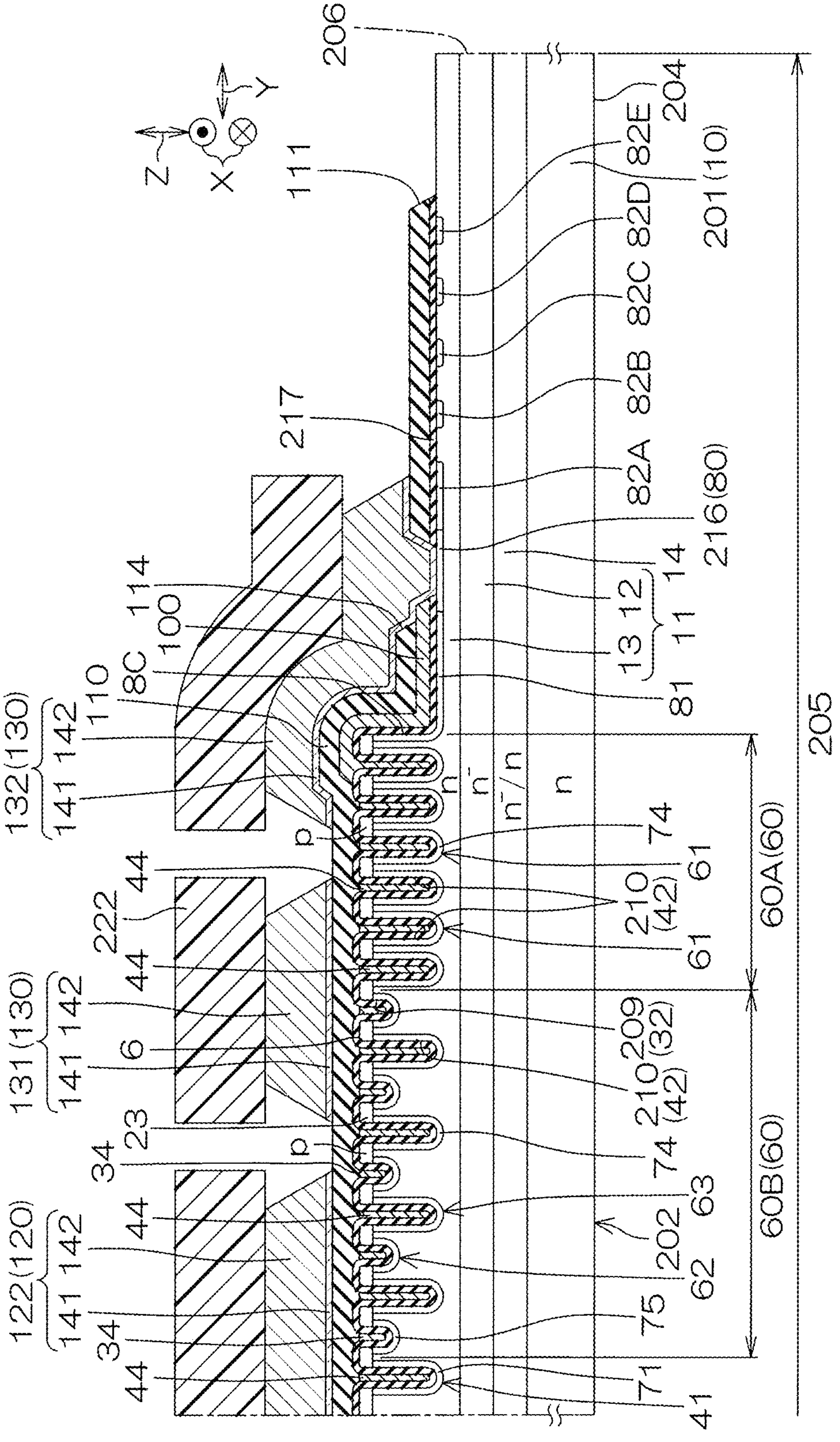
FIG. 29R is a cross-sectional view showing a step subsequent to that of FIG. 29Q.
Figure 29S:
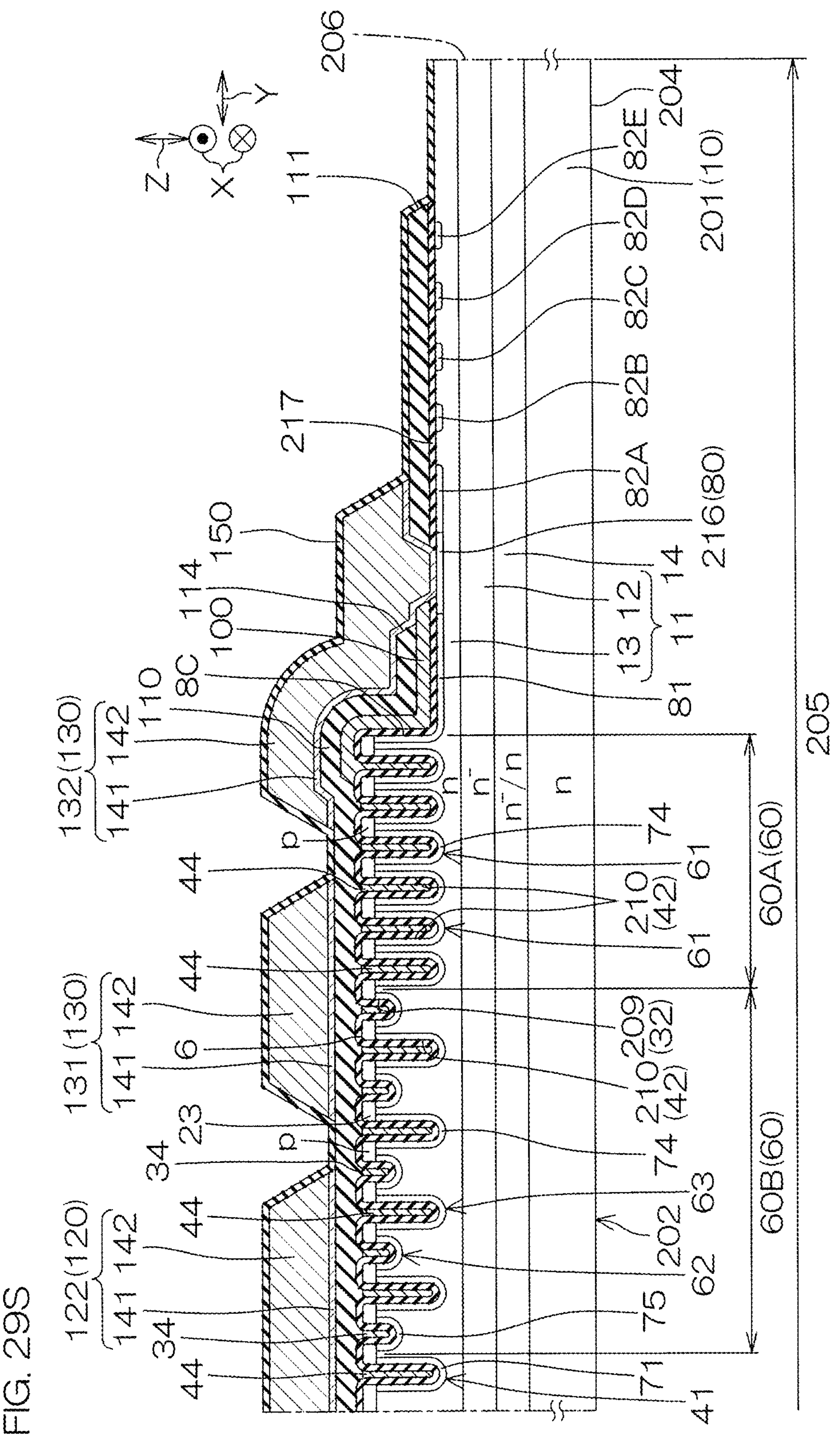
FIG. 29S is a cross-sectional view showing a step subsequent to that of FIG. 29R.
Figure 29T:
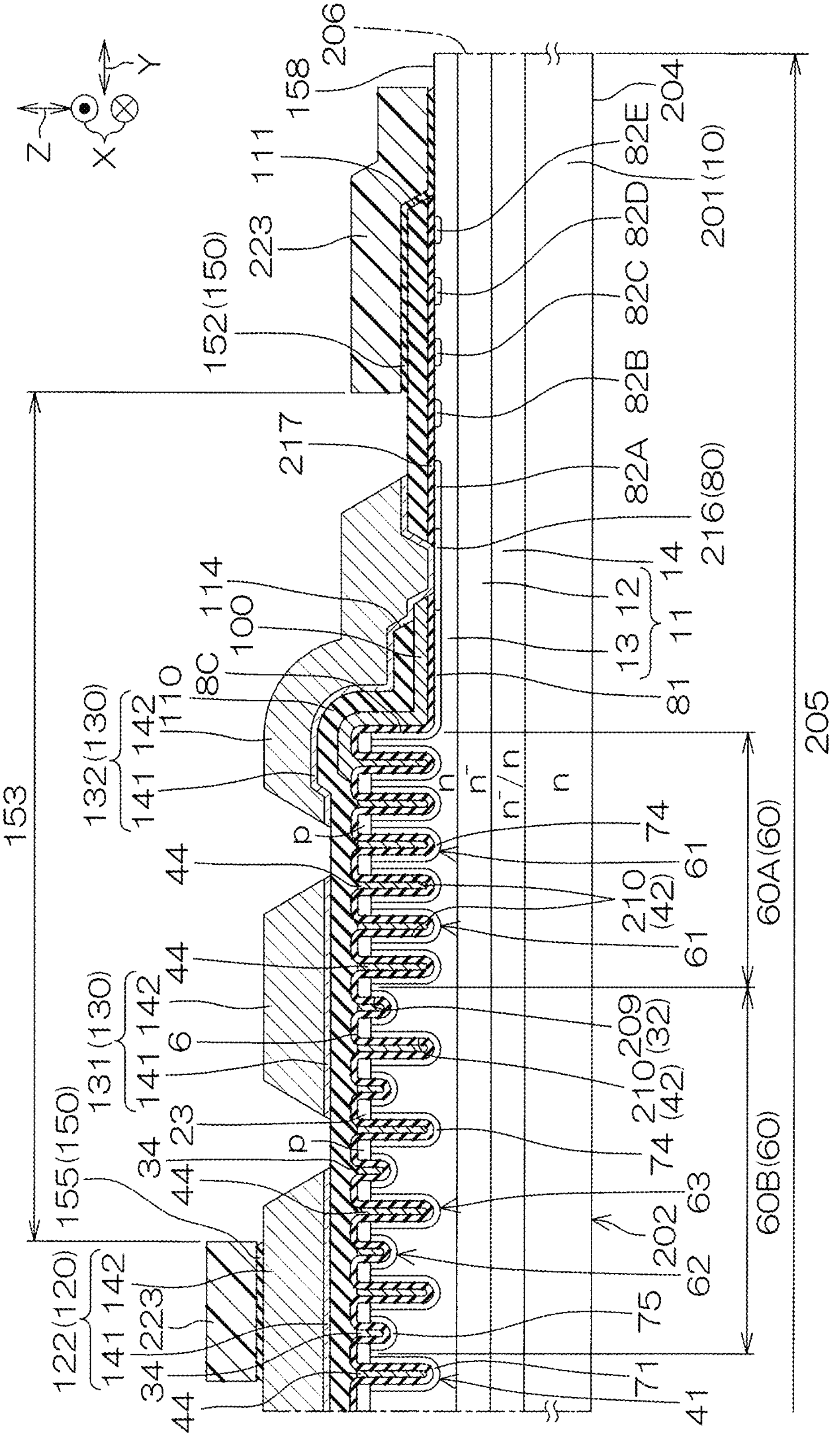
FIG. 29T is a cross-sectional view showing a step subsequent to that of FIG. 29S.
Figure 29U:
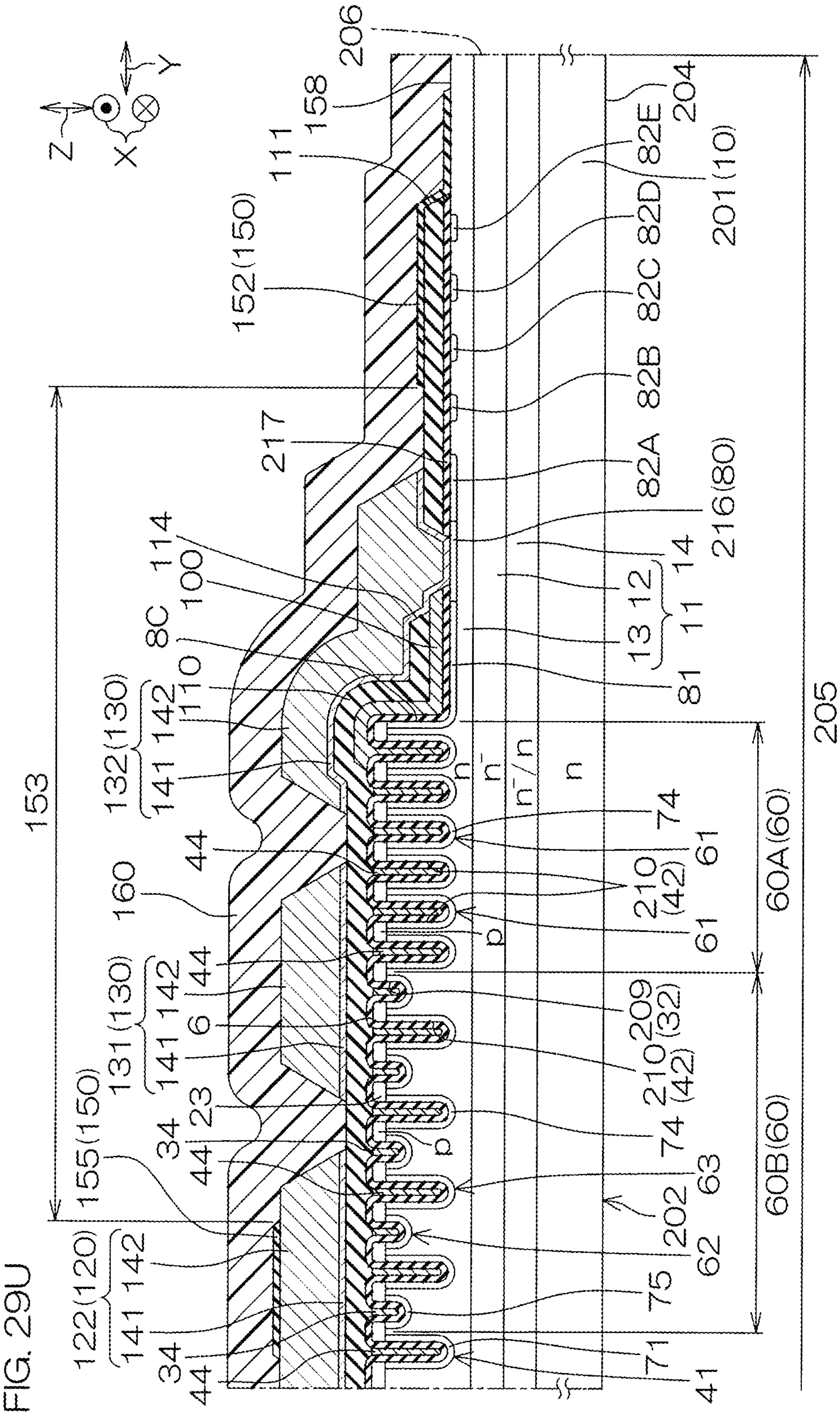
FIG. 29U is a cross-sectional view showing a step subsequent to that of FIG. 29T.
Figure 29V:
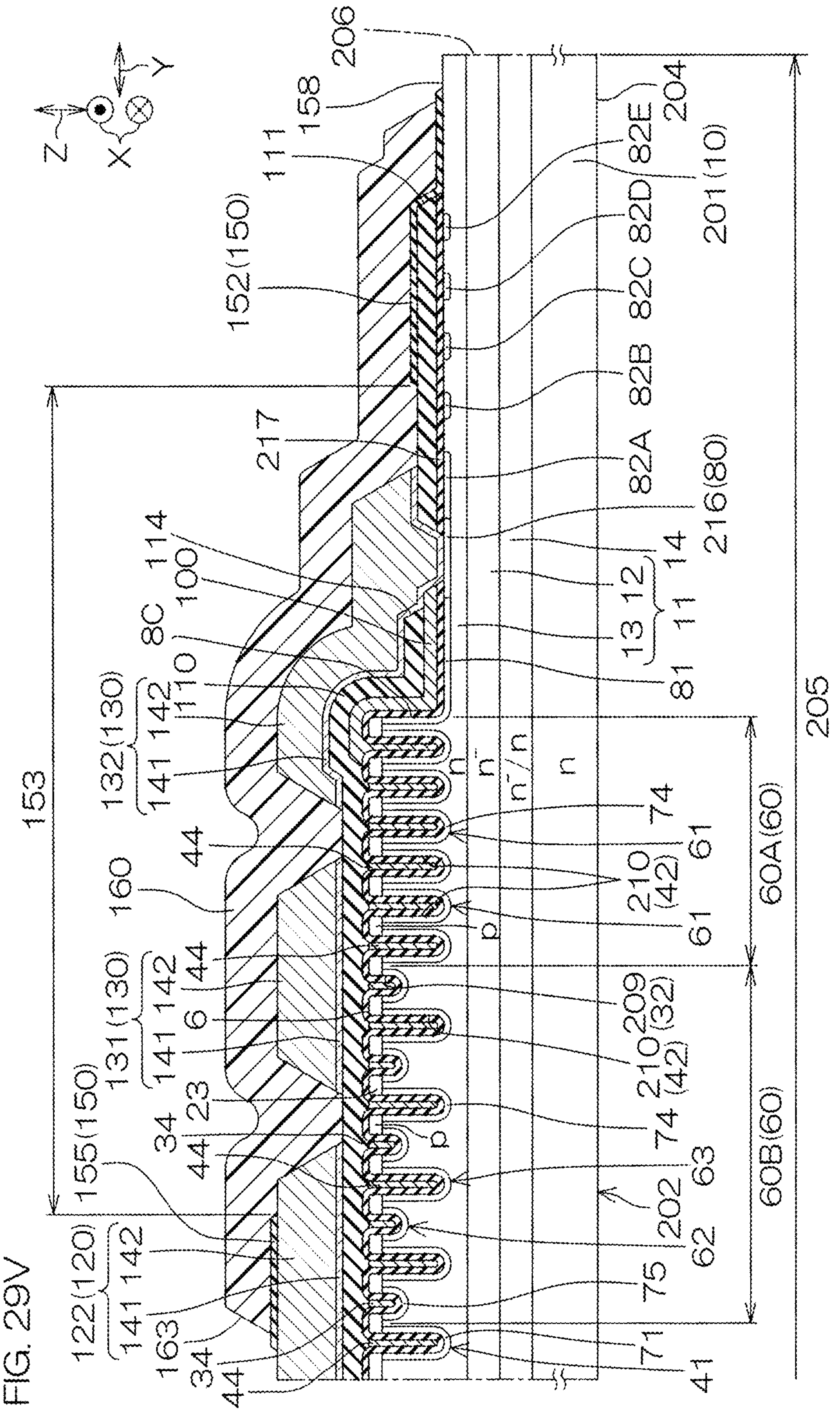
FIG. 29V is a cross-sectional view showing a step subsequent to that of FIG. 29U.

FIG. 29A to FIG. 29V are cross-sectional views showing an example of a manufacturing method of the SiC semiconductor device 1 shown in FIG. 1. Referring to FIG. 29A, a SiC wafer 201 (wafer/semiconductor wafer) that serves as a base of the first semiconductor region 10 is prepared. Next, by an epitaxial growth method, crystal growth of a semiconductor crystal (SiC in this embodiment) is performed from one surface of the SiC wafer 201. Hence, the third semiconductor region 14 having a predetermined n-type impurity concentration and the second semiconductor region 11 having a predetermined n-type impurity concentration are formed in this order on the SiC wafer 201. In this embodiment, the third semiconductor region 14 and the second semiconductor region 11 are each constituted of a SiC epitaxial layer.

A wafer structure including the first semiconductor region 10 (SiC wafer 201), the third semiconductor region 14 (SiC epitaxial layer), and the second semiconductor region 11 (SiC epitaxial layer) is hereinafter referred to as a SiC epi-wafer 202. The SiC epi-wafer 202 has a first wafer main surface 203 on one side and a second wafer main surface 204 on the other side. The first wafer main surface 203 and the second wafer main surface 204 correspond to the first main surface 3 and the second main surface 4 of the SiC chip 2, respectively.

Next, a plurality of device regions 205 and intended cutting lines 206 that define the device regions 205 are set in the first wafer main surface 203. The device regions 205 are set in a matrix manner, for example, with intervals therebetween in the first directions X and the second directions Y in plan view. The intended cutting lines 206 are set in a grid-shaped manner according to the arrangement of the device regions 205 in plan view. In FIG. 29A, a part of the single device region 205 is shown, and the intended cutting line 206 is shown by an alternate long and short dashed line (hereinafter, the same applies in FIG. 29B to FIG. 29V).

Next, referring to FIG. 29B, the p-type body region 23 and the n-type source region 24 (not shown) are formed at the surface layer portion of the first wafer main surface 203. The body region 23 is formed in the whole area of the surface layer portion of the first wafer main surface 203 in this step. The body region 23 is formed by introducing a p-type impurity into the first wafer main surface 203. The source region 24 is formed in the whole area of the surface layer portion of the first wafer main surface 203 in this step. The source region 24 is formed by introducing an n-type impurity into the first wafer main surface 203. The source region 24 may be performed before the formation step of the body region 23 although it is preferable for the source region 24 to be performed after the formation step of the body region 23.

Next, referring to FIG. 29C, a hard mask 207 is formed on the first wafer main surface 203. The hard mask 207 may include a silicon oxide. The hard mask 207 may be formed by a CVD (chemical vapor deposition) method or a thermal oxidation treatment method. The hard mask 207 is formed by the thermal oxidation treatment method in this step.

Next, referring to FIG. 29D, a first resist mask 208 having a predetermined pattern is formed on the hard mask 207. The first resist mask 208 exposes regions in which a plurality of gate trenches 209, a plurality of source trenches 210, and the outer surface 7 are to be formed, and covers regions other than those regions. The gate trench 32 of the trench gate structures 31 and the gate trench 32 of the dummy trench gate structures 62 are included in the gate trenches 209 (hereinafter, the same applies). The source trench 42 of the first trench source structures 41, the source trench 42 of the second trench source structures 51, the source trench 42 of the first dummy trench source structures 61, and the source trench 42 of the second dummy trench source structures 63 are included in the source trenches 210 (hereinafter, the same applies).

Next, unnecessary portions of the hard mask 207 are removed by an etching method (for example, dry etching method) through the first resist mask 208. Hence, exposure patterns corresponding to the gate trenches 209, to the source trenches 210, and to the outer surface 7 are formed at the hard mask 207. The first resist mask 208 is removed thereafter.

Next, referring to FIG. 29E, unnecessary portions of the SiC epi-wafer 202 are removed by the etching method (for example, dry etching method) through the hard mask 207. In this step, unnecessary portions of the second semiconductor region 11 are removed. Hence, the gate trenches 209, the source trenches 210, and the outer surface 7 are formed at the first wafer main surface 203. Also, the active mesa 9 is formed at the first wafer main surface 203. The active mesa 9 includes the active surface 6, the outer surface 7, and the first to fourth connecting surfaces 8A to 8D.

Next, referring to FIG. 29F, a second resist mask 211 having a predetermined pattern is formed on the hard mask 207. The second resist mask 211 covers each of the gate trenches 209 in a manner of filling the gate trenches 209, and exposes the source trenches 210 and the outer surface 7.

In other words, the second resist mask 211 exposes all of the source trenches 42 of the first dummy trench source structures 61 (i.e., whole area of the first dummy structure 60A), and exposes all of the second dummy trench source structures 63 (i.e., part of the second dummy structure 60B). The first dummy structure 60A and the second dummy structure 60B (particularly, the first dummy structure 60A) restrain the inclination of the second resist mask 211 caused by a level difference between the active surface 6 and the outer surface 7 in the peripheral edge portion of the active surface 6, and protect the transistor structure 30 from a defect in shape caused by the inclination of the second resist mask 211.

Next, referring to FIG. 29G, unnecessary portions of the SiC epi-wafer 202 are removed by the etching method through the second resist mask 211. Preferably, the etching method is an anisotropic dry etching method (for example, RIE (Reactive Ion Etching) method). In this step, the unnecessary portions of the second semiconductor region 11 are removed. Hence, the source trenches 210 and the outer surface 7 are further dug down in the thickness direction (the second-wafer-main surface-204 side) of the SiC epi-wafer 202. The second resist mask 211 is removed thereafter.

Next, referring to FIG. 29H, the hard mask 207 is removed by the etching method. The etching method may be a wet etching method and/or a dry etching method.

Next, referring to FIG. 29I, a third resist mask 212 having a predetermined pattern is formed on the first wafer main surface 203. The third resist mask 212 exposes regions in which a plurality of well regions 213 are to be formed, and covers other regions other than those regions. The well regions 213 include the well regions 71, the gate well regions 72, the dummy well regions 74, the dummy gate well regions 75, and the outer well region 81. Next, a p-type impurity is introduced into the surface layer portion of the first wafer main surface 203 through the third resist mask 212. Hence, the well regions 213 are formed at the surface layer portion of the first wafer main surface 203. The third resist mask 212 is removed thereafter.

Next, referring to FIG. 29J, a fourth resist mask 214 having a predetermined pattern is formed on the first wafer main surface 203. The fourth resist mask 214 exposes regions in which the field regions 82A to 82E are to be formed, and covers regions other than those regions. Next, a p-type impurity is introduced into the surface layer portion of the first wafer main surface 203 through the fourth resist mask 214. Hence, the field regions 82A to 82E are formed at the surface layer portion of the first wafer main surface 203. The fourth resist mask 214 is removed thereafter.

Next, referring to FIG. 29K, a fifth resist mask 215 having a predetermined pattern is formed on the first wafer main surface 203. The fifth resist mask 215 exposes regions in which contact regions 216 are to be formed, and covers regions other than those regions. The contact regions 216 include the contact regions 70, the dummy contact regions 73, and the outer contact region 80.

In detail, the fifth resist mask 215 covers the gate trenches 209 in a manner of filling the gate trenches 209, respectively. Also, the fifth resist mask 215 covers the first dummy trench source structures 61 in a manner of filling the source trenches 42 of the first dummy trench source structures 61, respectively. Also, the fifth resist mask 215 exposes the source trenches 42 of the first trench source structures 41, the source trenches 42 of the second trench source structures 51, the source trenches 42 of the second dummy trench source structures 63, and a part of the outer surface 7.

The fifth resist mask 215 covers all (whole area of the first dummy structure 60A) of the first dummy trench source structures 61. The first dummy structure 60A and the second dummy structure 60B (particularly, second dummy structure 60B) restrain the inclination of the fifth resist mask 215 caused by a level difference between the active surface 6 and the outer surface 7 in the peripheral edge portion of the active surface 6, and protect the transistor structure 30 from a defect in introduction of a p-type impurity caused by the inclination of the fifth resist mask 215.

Next, a p-type impurity is introduced into the surface layer portion of the first wafer main surface 203 through the fifth resist mask 215. Hence, the contact regions 216 are formed at the surface layer portion of the first wafer main surface 203. The fifth resist mask 215 is removed thereafter.

Next, referring to FIG. 29L, a base insulating film 217 that covers the first wafer main surface 203 is formed. The base insulating film 217 serves as a base of the gate insulating film 33, as a base of the source insulating film 43, and as a base of the main surface insulating film 90. The base insulating film 217 may be formed by the CVD (chemical vapor deposition) method or the thermal oxidation treatment method. The base insulating film 217 is formed by the thermal oxidation treatment method in this step. In other words, the base insulating film 217 includes an oxide film constituted of an oxide of the SiC epi-wafer 202.

In this step, a part, which covers the sidewall of the gate trench 209, of the base insulating film 217 and a part, which covers the sidewall of the source trench 210, of the base insulating film 217 are formed thinner than the other parts. Also, in this step, a part, which covers the opening edge portion of the gate trench 209, of the base insulating film 217 and a part, which covers the opening edge portion of the source trench 210, of the base insulating film 217 are formed thicker than the other parts.

Next, referring to FIG. 29M, a first base electrode film 218 is formed on the first wafer main surface 203. The first base electrode film 218 serves as a base of the gate electrodes 34, as a base of the source electrodes 44, as a base of the gate contact electrodes 91, and as a base of the sidewall wiring 100. The first base electrode film 218 fills the gate trenches 209 and the source trenches 210, and covers the first wafer main surface 203 (active surface 6, outer surface 7, and first to fourth connecting surfaces 8A to 8D). The first base electrode film 218 includes a polysilicon film in this step. The first base electrode film 218 may be formed by the CVD method. Preferably, the CVD method is an LP-CVD (Low Pressure-CVD) method.

Next, referring to FIG. 29N, a sixth resist mask 219 having a predetermined pattern is formed on the first base electrode film 218. The sixth resist mask 219 covers regions in which the gate contact electrodes 91 and the sidewall wiring 100 are to be formed, and exposes regions other than those regions. Next, unnecessary portions of the first base electrode film 218 are removed by the etching method through the sixth resist mask 219. The etching method may be a wet etching method and/or a dry etching method. The unnecessary portions of the first base electrode film 218 are removed until the base insulating film 217 is exposed.

Hence, the gate electrodes 34, the source electrodes 44, the gate contact electrodes 91, and the sidewall wiring 100 are formed. Also, the trench gate structures 31, the first trench source structures 41, the second trench source structures 51, the first dummy trench source structures 61, the dummy trench gate structures 62, and the second dummy trench source structures 63 are formed. The sixth resist mask 219 is removed thereafter.

Next, referring to FIG. 29O, the first inorganic insulating film 110 is formed on the first wafer main surface 203. The first inorganic insulating film 110 collectively covers the trench gate structures 31, the first trench source structures 41, the second trench source structures 51, the first dummy trench source structures 61, the dummy trench gate structures 62, the second dummy trench source structures 63, and the sidewall wiring 100 on the first wafer main surface 203. In this embodiment, the first inorganic insulating film 110 is constituted of a silicon oxide film. The first inorganic insulating film 110 may be formed by the CVD method.

Next, referring to FIG. 29P, a seventh resist mask 220 having a predetermined pattern is formed on the first inorganic insulating film 110. The seventh resist mask 220 exposes regions in which the notch opening 111, the gate openings 112, the source openings 113, and the sidewall opening 114 are to be formed, and covers regions other than those regions.

Next, unnecessary portions of the first inorganic insulating film 110 and unnecessary portions of the base insulating film 217 are removed by the etching method through the sixth resist mask 219. The etching method may be the wet etching method and/or the dry etching method. Hence, the notch opening 111, the gate openings 112, the source openings 113, and the sidewall opening 114 are formed in the first inorganic insulating film 110.

Next, referring to FIG. 29Q, a second base electrode film 221 that serves as a base of the first main surface electrode 120 is formed on the first wafer main surface 203. The second base electrode film 221 covers the whole area of the first inorganic insulating film 110 on the first wafer main surface 203. The second base electrode film 221 has a laminated structure including the first electrode film 141 and the second electrode film 142 laminated in this order from the first-wafer-main surface-203 side, In this embodiment, the first electrode film 141 is constituted of a Ti-based metal film. In this embodiment, the second electrode film 142 is constituted of an Al-based metal film. The first electrode film 141 and the second electrode film 142 may be formed by at least one among a sputtering method, a vapor deposition method, and a plating method. In this embodiment, the first electrode film 141 and the second electrode film 142 are each formed by the sputtering method.

Next, referring to FIG. 29R, an eighth resist mask 222 having a predetermined pattern is formed on the second base electrode film 221. The eighth resist mask 222 covers regions in which the first main surface electrode 120 (gate main surface electrode 121 and source main surface electrode 122) and the wiring electrode 130 (gate wiring electrode 131 and source wiring electrode 132) in the second base electrode film 221; and has an opening that exposes regions other than those regions.

Next, unnecessary portions of the second base electrode film 221 are removed by the etching method through the eighth resist mask 222. The etching method may be the wet etching method and/or the dry etching method. Hence, the first main surface electrode 120 and the wiring electrode 130 are formed. The eighth resist mask 222 is removed thereafter.

Next, referring to FIG. 29S, the second inorganic insulating film 150 is formed on the first wafer main surface 203 such as to cover the first inorganic insulating film 110 and the first main surface electrode 120. In this embodiment, the second inorganic insulating film 150 is constituted of a silicon nitride film. The second inorganic insulating film 150 is formed by the CVD method.

Next, referring to FIG. 29T, a ninth resist mask 223 having a predetermined pattern is formed on the second inorganic insulating film 150. The ninth resist mask 223 covers a part, which serves as the inner covering portions 151 and as the outer covering portion 152, of the second inorganic insulating film 150, and exposes a part, which serves as the removed portion 153 and as the dicing street 158, of the second inorganic insulating film 150.

Next, unnecessary portions of the second inorganic insulating film 150 are removed by the etching method through the ninth resist mask 223. The etching method may be the wet etching method and/or the dry etching method. Hence, the second inorganic insulating film 150 having the inner covering portions 151, the outer covering portion 152, and the removed portion 153 is formed. The outer covering portion 152 of the second inorganic insulating film 150 defines the dicing street 158 that exposes the intended cutting lines 206 on the first wafer main surface 203. The ninth resist mask 223 is removed thereafter, Next, referring to FIG. 29O, the organic insulating film 160 is formed on the first wafer main surface 203 such as to cover the first main surface electrode 120, the first inorganic insulating film 110, and the second inorganic insulating film 150. The organic insulating film 160 is formed by applying a photosensitive resin onto the first wafer main surface 203. In this embodiment, the organic insulating film 160 is constituted of a polyimide film.

Next, referring to the FIG. 29V, the organic insulating film 160 is exposed by a pattern corresponding to the second gate opening 161, to the second source opening 163, and to the dicing street 158, and is then developed. Hence, the second gate opening 161, the second source opening 163, and the dicing street 158 are formed in the organic insulating film 160.

Next, the SiC epi-wafer 202 is thinned to a desired thickness by grinding the second wafer main surface 204. The grinding step may be performed by a CMP (Chemical Mechanical Polishing) method. Hence, grinding marks are formed on the second wafer main surface 204. The grinding step of the second wafer main surface 204 is not necessarily required to be performed, and may be omitted if necessary, However, thinning the first semiconductor region 10 is effective in reducing the resistance value of the Sic chip 2. Annealing treatment may be applied to the second wafer main surface 204 after performing the grinding step of the second wafer main surface 204. The annealing treatment may be performed by a laser radiation method. Hence, the second wafer main surface 204 (second main surface 4) becomes an ohmic surface having grinding marks and laser irradiation marks, Next, the second main surface electrode 170 is formed on the second wafer main surface 204. The second main surface electrode 170 forms an ohmic contact with the second wafer main surface 204. The second main surface electrode 170 may include at least one among a Ti film, a Ni film, a Pd film, an Au film, and an Ag film. The Ti film, the Ni film, the Pd film, the Au film, and the Ag film may be formed by at least one method among the sputtering method, the vapor deposition method, and the plating method (in this embodiment, sputtering method).

Next, the SiC epi-wafer 202 is cut along the intended cutting lines 206. The cutting step of the SiC epi-wafer 202 may include a cutting step by use of a dicing blade. In this case, the SiC epi-wafer 202 is cut along the intended cutting lines 206 defined by the dicing street 158. Preferably, the dicing blade has a blade width less than the width of the dicing street 158. The first inorganic insulating film 110, the second inorganic insulating film 150, and the organic insulating film 160 are not positioned at the intended cutting lines 206, and thereby avoid the dicing by the dicing blade.

The cutting step of the SiC epi-wafer 202 may include a cleavage step using a laser radiation method. In this case, a laser beam is radiated from the laser radiation device (not shown) into the SiC epi-wafer 202 through the dicing street 158. Preferably, the laser beam is radiated from the first-wafer-main surface-203 side that does not have the second main surface electrode 170 into the SiC epi-wafer 202 in a pulse manner. A convergent portion (focal point) of the laser beam is set at the inside of the SiC epi-wafer 202 (halfway portion in thickness direction), and the radiation position of the laser beam is moved along the dicing street 158 (in detail, intended cutting lines 206).

Hence, a modified layer that extends in a grid-shaped manner along the dicing street 158 in plan view is formed inside the SiC epi-wafer 202. Preferably, the modified layer is formed at a distance from the first wafer main surface 203 inside the SiC epi-wafer 202. Preferably, the modified layer is formed at a part, that is constituted of the first semiconductor region 10 (SiC wafer 201), of the inside of the SiC epi-wafer 202. Particularly preferably, the modified layer is formed in the first semiconductor region 10 (SiC wafer 201) at a distance from the second semiconductor region 11 (Sic epitaxial layer). Most preferably, the modified layer is not formed in the second semiconductor region 11 (SiC epitaxial layer).

After the formation step of the modified layer, an external force is applied to the SiC epi-wafer 202, and the SiC epi-wafer 202 is cleaved while setting the modified layer as a starting point. Preferably, the external force is applied from the second-wafer-main surface-204 side to the SiC epi-wafer 202. The second main surface electrode 170 is cleaved simultaneously with the cleavage of the SiC epi-wafer 202. The first inorganic insulating film 110, the second inorganic insulating film 150, and the organic insulating film 160 are not positioned at the intended cutting lines 206, and thereby avoid the cleaving. The SiC semiconductor device 1 is manufactured through a process including the aforementioned steps.

Figure 30:
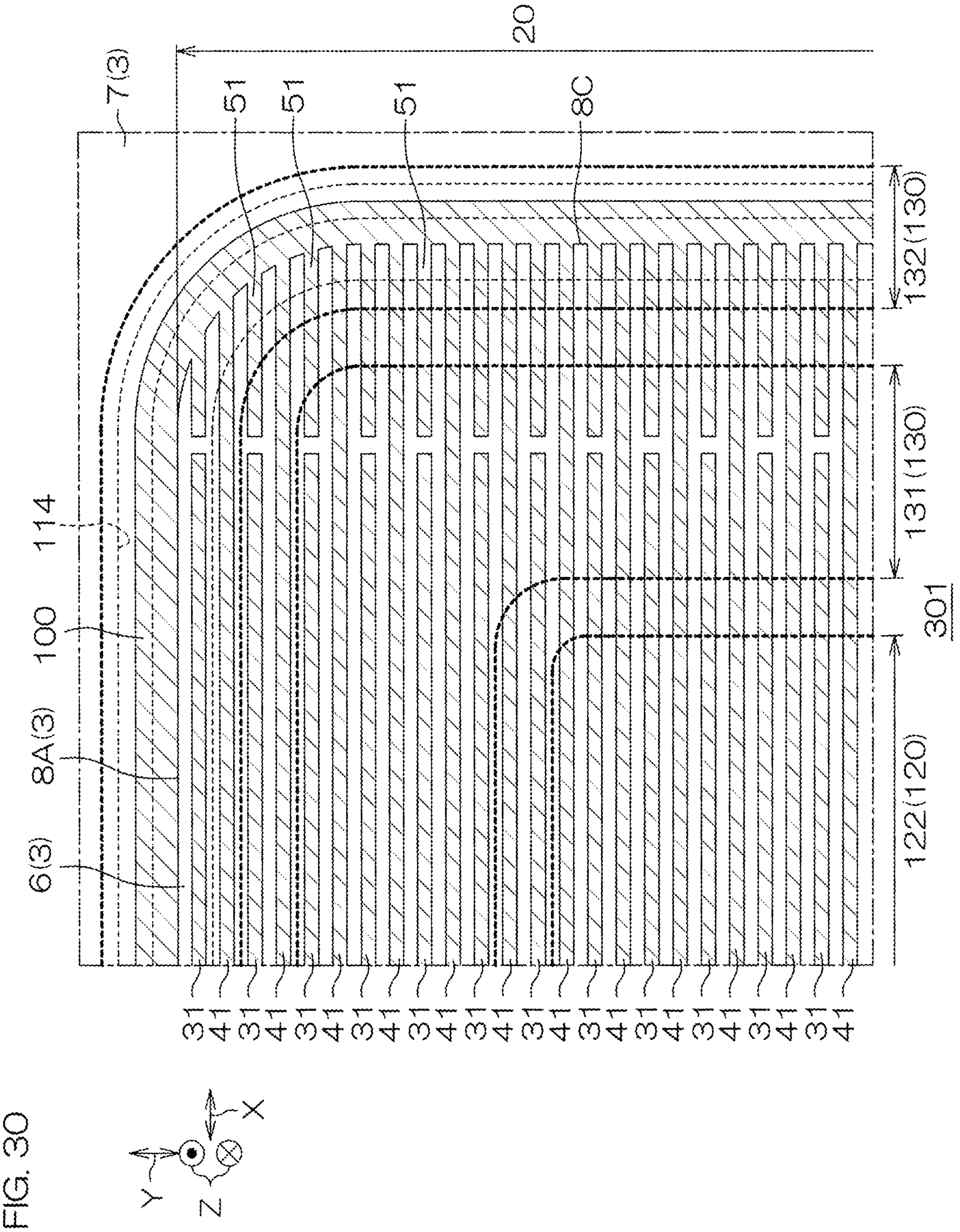
FIG. 30 corresponds to FIG. 5, and is a plan view showing a SiC semiconductor device according to a first reference preferred embodiment.

FIG. 30 corresponds to FIG. 5, and is a plan view showing a SiC semiconductor device 301 according to a first reference preferred embodiment, Referring to FIG. 30, the SiC semiconductor device 301 according to the first reference preferred embodiment has the transistor structure 30 in the whole area of the active surface 6, and does not have the first dummy structure 60A and the second dummy structure 60B.

In other words, in the SiC semiconductor device 301, the transistor structure 30 having the trench gate structures 31, the first trench source structures 41, and the second trench source structures 51 is also formed at the peripheral edge portion of the active surface 6 (first and second peripheral regions 21 and 22). Other structures of the SiC semiconductor device 301 according to the first reference preferred embodiment are substantially the same as those of the SiC semiconductor device 1. A description of other structures of the SiC semiconductor device 301 is omitted.

FIG. 31A to FIG. 31D are cross-sectional views showing an example of a manufacturing method of the SiC semiconductor device 301 according to the first reference preferred embodiment. In FIG. 31A to FIG. 31D, a cross section of the peripheral edge portion of the active surface 6 (first peripheral region 21) is shown.

Figure 31A:
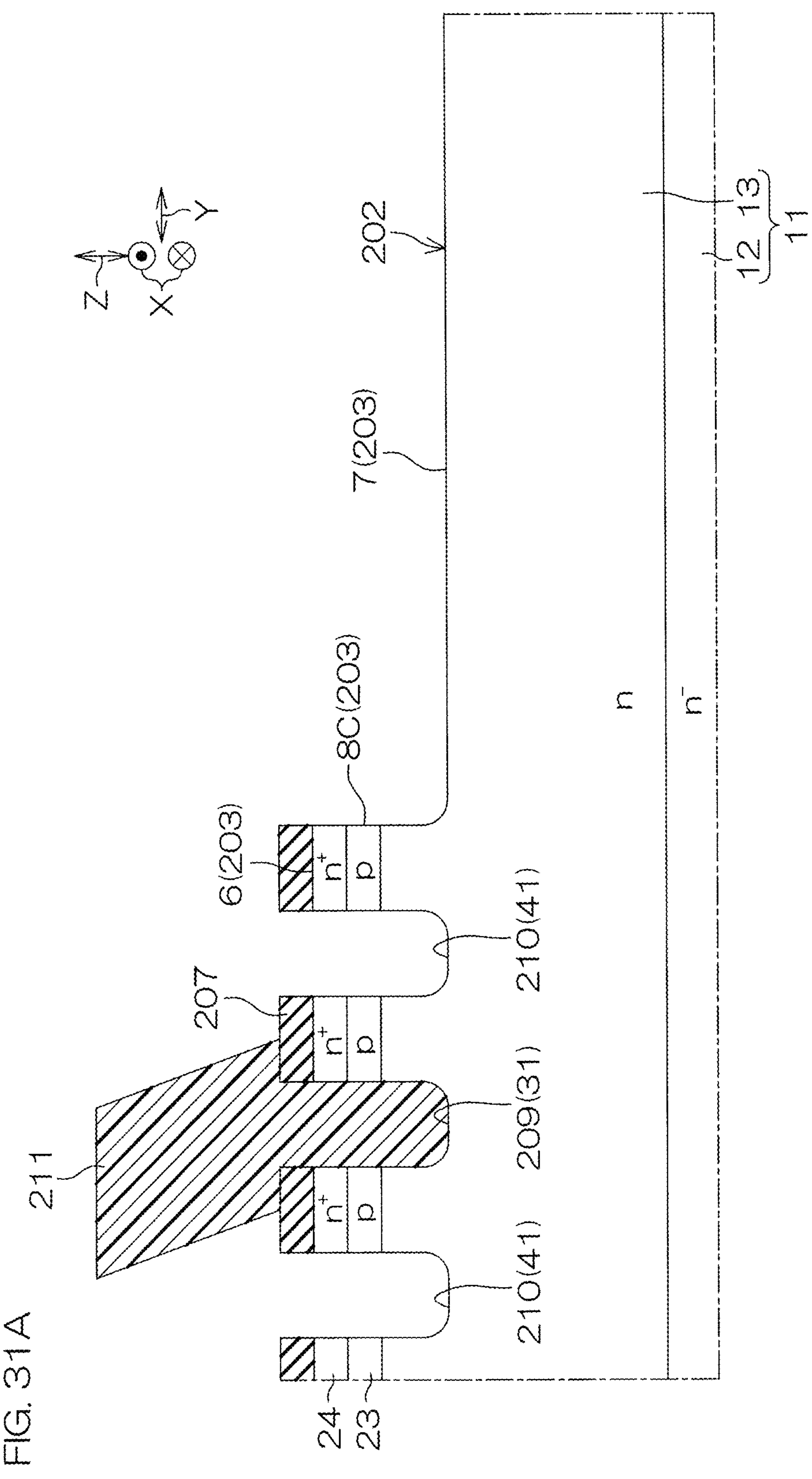
FIG. 31A is a cross-sectional view showing an example of a manufacturing method of the SiC semiconductor device shown in FIG. 30.

Referring to FIG. 31A, according to the manufacturing method of the SiC semiconductor device 301, the second resist mask 211 having a predetermined pattern is formed on the hard mask 207 (also see FIG. 29F) in a step of digging the source trenches 210 and the outer surface 7 down. The second resist mask 211 covers each of the gate trenches 209 in a manner of filling the gate trenches 209, and exposes the source trenches 210 and the outer surface 7. In this step, there is a case in which a part, which fills the gate trenches 209 formed in the peripheral edge portion of the active surface 6, of the second resist mask 211 is obliquely inclined because of level differences between the active surface 6 and the outer surface 7.

Figure 31B:
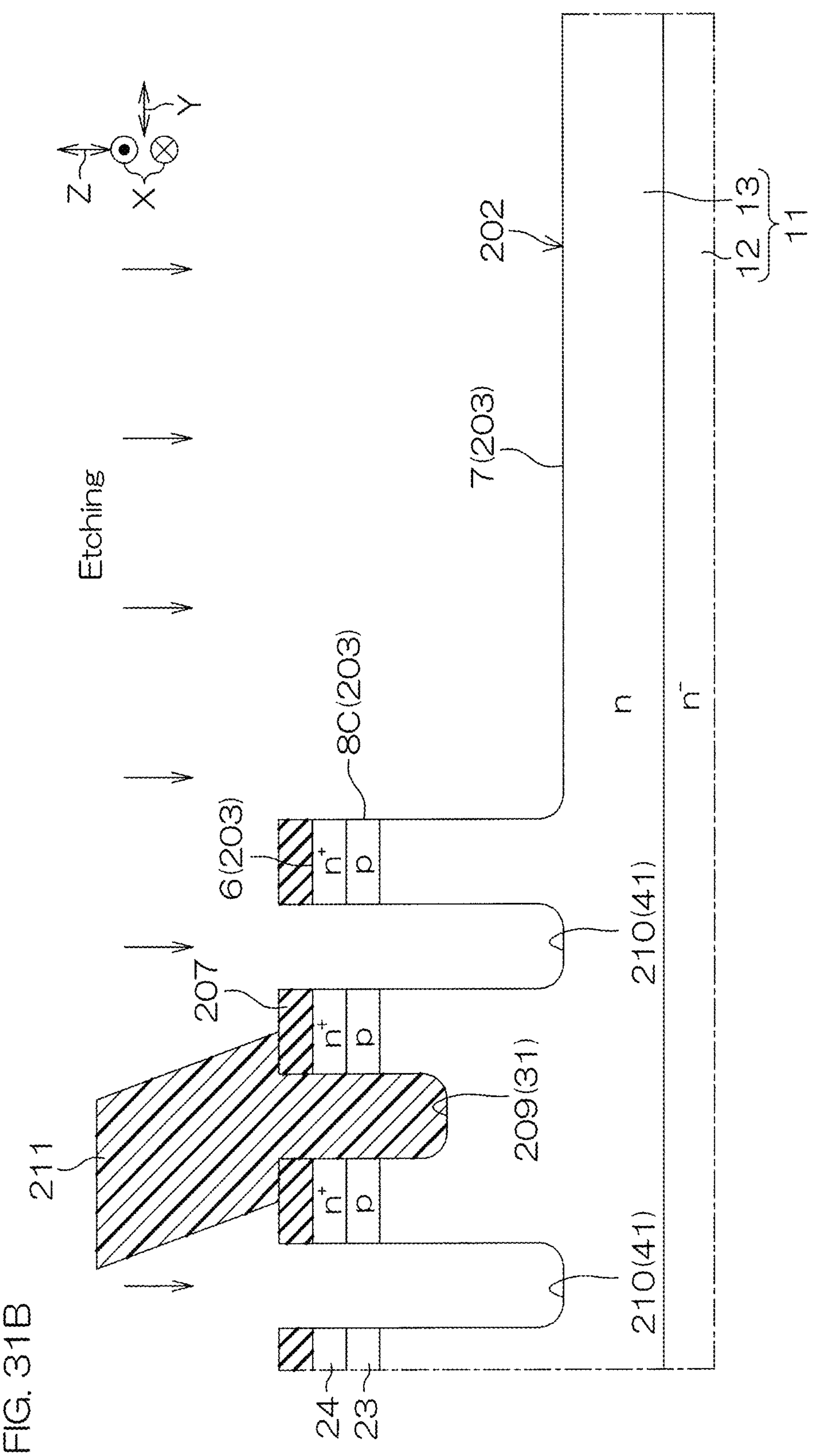
FIG. 31B is a cross-sectional view showing a step subsequent to that of FIG. 31A.

Next, referring to FIG. 31B, unnecessary portions of the SiC epi-wafer 202 are removed by the etching method through the second resist mask 211 (also see FIG. 29G). Preferably, the etching method is an anisotropic dry etching method (for example, RIE method). In this step, unnecessary portions of the second semiconductor region 11 are removed. Hence, the source trenches 210 and the outer surface 7 are further dug down in the thickness direction (second-wafer-main surface-204 side) of the SiC epi-wafer 202.

Figure 31C:
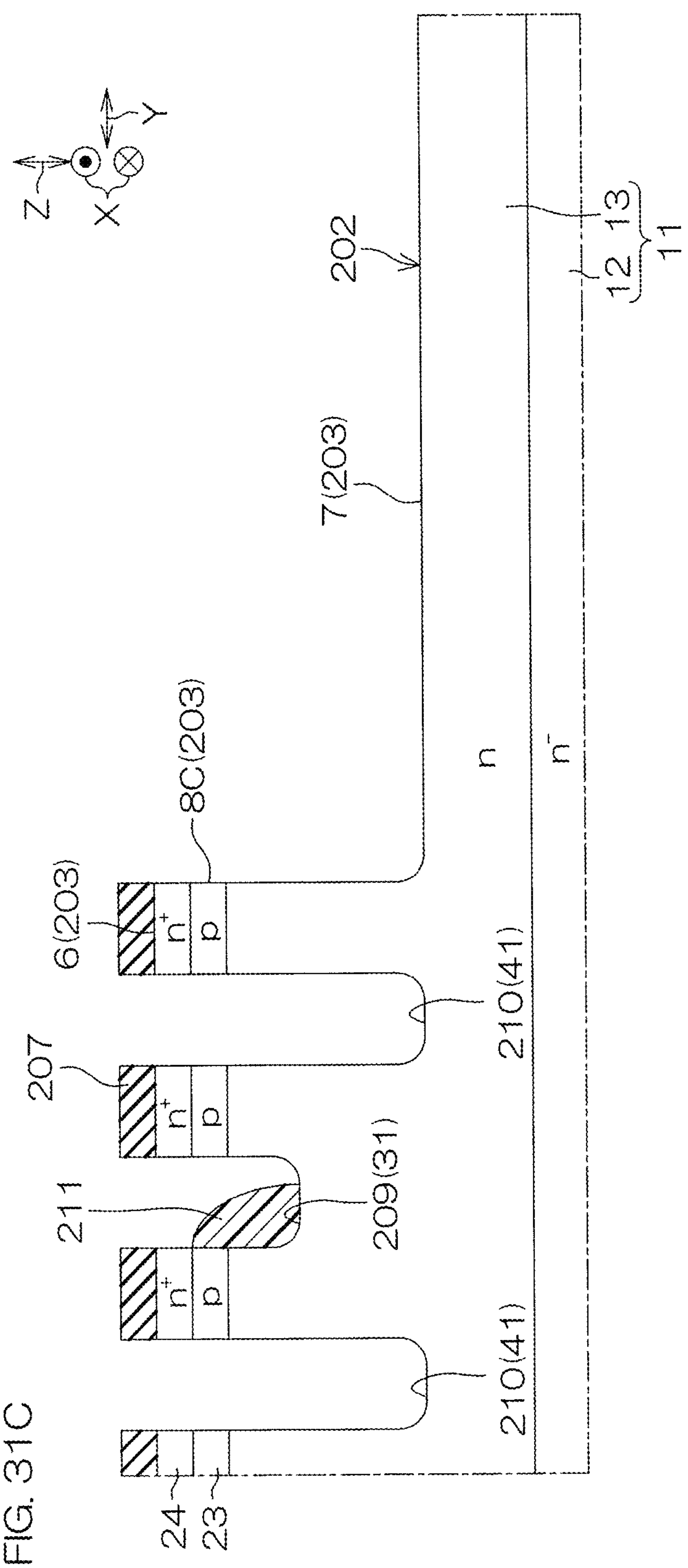
FIG. 31C is a cross-sectional view showing a step subsequent to that of FIG. 31B.

Next, referring to FIG. 31C, the second resist mask 211 is removed. At this time, the removal of the second resist mask 211 becomes insufficient in the peripheral edge portion of the active surface 6 because of the inclination of the second resist mask 211. As a result, a part of the second resist mask 211 remains as a residue in the gate trench 209.

Figure 31D:
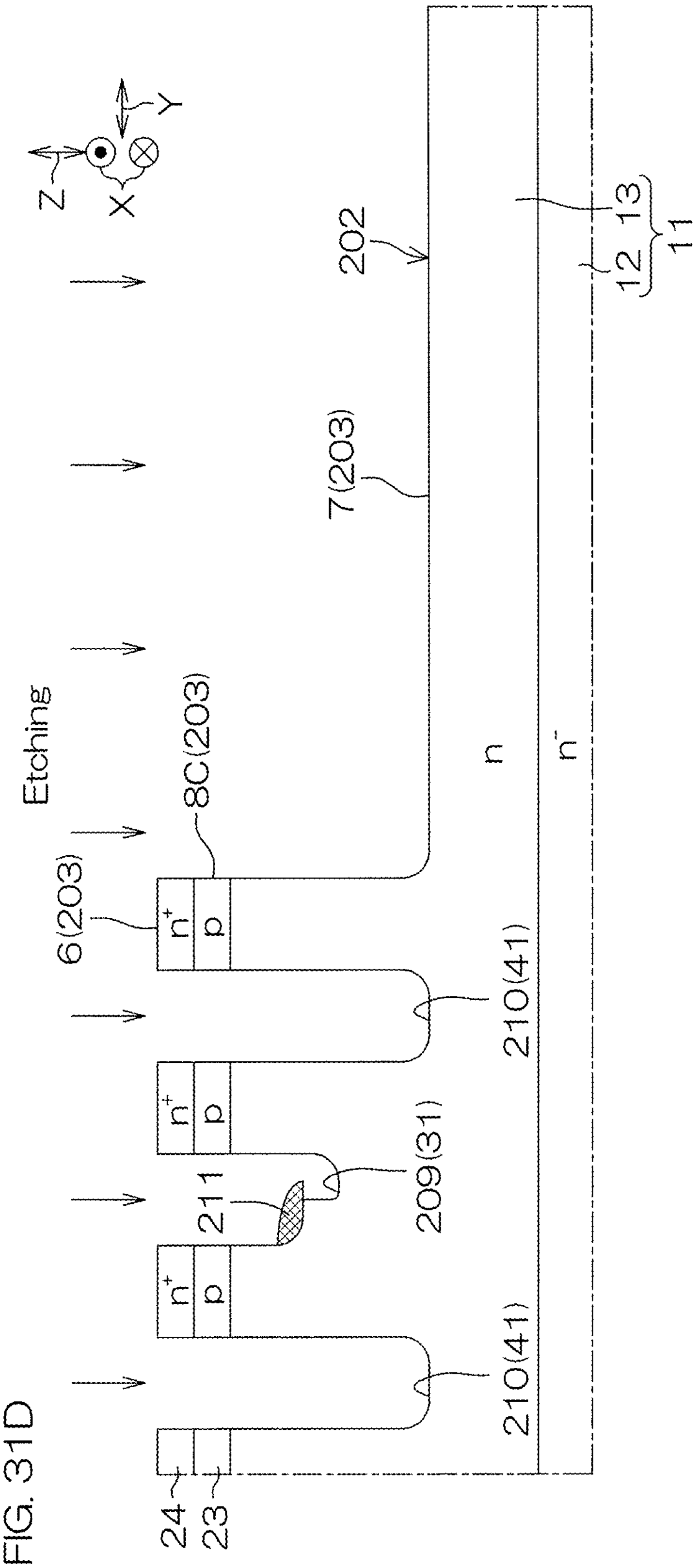
FIG. 31D is a cross-sectional view showing a step subsequent to that of FIG. 31C.

Next, referring to FIG. 31D, the hard mask 207 is removed by the etching method. The etching method may be the wet etching method and/or the dry etching method. The inner wall of the gate trench 209 is partially removed through the residue of the second resist mask 211 in the peripheral edge portion of the active surface 6. Therefore, a part, which has been exposed from the residue of the second resist mask 211, of the inner wall of the gate trench 209 is further dug down with respect to a part, which has been covered by this residue, thereof. The SiC semiconductor device 301 is formed through the same process as the manufacturing process of the SiC semiconductor device 1 thereafter.

The gate trench 32 having the inner wall at which a defect in shape has occurred in the peripheral edge portion of the active surface 6 is formed in the SiC semiconductor device 301 according to the first reference preferred embodiment. The gate trench 32 that is defective in shape lowers electrical characteristics of the SiC semiconductor device 301. The gate trench 32 that is defective in shape becomes a factor for a decrease in withstand voltage of the SiC semiconductor device 1 or for a change in gate threshold voltage as an example.

Therefore, the SiC semiconductor device 1, which has the SiC chip 2, the transistor structure 30, and the first dummy structure 60A (dummy structure 60), has been employed in the first preferred embodiment. The SiC chip 2 includes the first main surface 3. The first main surface 3 includes the active surface 6 (first surface), the outer surface 7 (second surface), and the first to fourth connecting surfaces 8A to 8D. The outer surface 7 is hollowed with the first depth D1 in the thickness direction outside the active surface 6. The first to fourth connecting surfaces 8A to 8D connect the active surface 6 and the outer surface 7. The active surface 6, the outer surface 7, and the first to fourth connecting surfaces 8A to 8D define the active mesa 9 (mesa) in the first main surface 3.

The transistor structure 30 is formed at the inward portion of the active surface 6. The transistor structure 30 includes the trench gate structure 31 and the first trench source structure 41. The trench gate structure 31 has the second depth D2 less than the first depth D1 (D2<D1). The first trench source structure 41 has the third depth D3 exceeding the second depth D2 (D2<D3), and adjoins the trench gate structure 31 in one direction (second direction Y). The first dummy structure 60A is formed at the peripheral edge portion of the active surface 6. The first dummy structure 60A has the first dummy trench source structures 61 that have the third depth D3 (D2<D3), respectively, and that adjoin in one direction (second direction Y).

According to this structure, the transistor structure 30 is formed at the inward portion of the active surface 6, and the first dummy structure 60A that does not function as the transistor structure 30 is formed at the peripheral edge portion of the active surface 6. Therefore, it is possible to restrain a change in electrical characteristics of the transistor structure 30 caused by a defect in shape in the peripheral edge portion of the active surface 6. Therefore, it is possible to provide a SiC semiconductor device 1 capable of improving reliability.

In detail, the first dummy trench source structures 61 are consecutively arranged with intervals therebetween such as to adjoin each other. Also, the first dummy trench source structures 61 are arranged with intervals therebetween without a trench structure having a depth less than the third depth therebetween. The gate potential is given to the trench gate structure 31. The source potential is given to the first trench source structure 41. Preferably, the source potential is given to the first dummy trench source structure 61.

Preferably, the first trench source structures 41 are exposed from either one or both of the third and fourth connecting surfaces 8C and 8D. Preferably, the first dummy trench source structures 61 are exposed from either one or both of the third and fourth connecting surfaces 8C and 8D.

Preferably, the trench gate structure 31 is formed at a distance from the third and fourth connecting surfaces 8C and 8D toward the inward side of the active surface 6. In this case, preferably, the transistor structure 30 includes at least one second trench source structure 51 that has the third depth D3 (D2<D3) and that faces the trench gate structure 31 in a direction (first direction X) perpendicular to mutually-facing directions (second direction Y) of both the trench gate structure 31 and the first trench source structure 41.

Preferably, at least one second trench source structure 51 is formed in a region between the peripheral edge of the active surface 6 and the trench gate structure 31. The second trench source structure 51 may be formed in a region between the third connecting surface 8C and the trench gate structure 31, or may be formed in a region between the fourth connecting surface 8D and the trench gate structure 31. Preferably, the second trench source structure 51 is exposed from the third connecting surface 8C or the fourth connecting surface 8D.

Preferably, the SiC semiconductor device 1 includes the second dummy structure 60B formed in a region between the transistor structure 30 and the first dummy structure 60A in the peripheral edge portion of the active surface 6. The second dummy structure 60B includes the dummy trench gate structure 62 having the second depth D2 (D2<D3) and the second dummy trench source structure 63 that has the third depth D3 (D2<D3) and that adjoins the dummy trench gate structure 62 in one direction (second direction Y).

According to this structure, the second dummy structure 60B, which has the same mode as the transistor structure 30 and yet does not function as the transistor structure 30, is formed in a region between the transistor structure 30 and the first dummy structure 60A in the peripheral edge portion of the active surface 6. In other words, a gradation structure in which the first dummy structure 60A, the second dummy structure 60B, and the transistor structure 30 are arranged in this order inwardly from the periphery of the active surface 6 is employed in the active surface 6.

According to this structure, it is possible to appropriately restrain a change in electrical characteristics of the transistor structure 30 caused by a defect in shape in the peripheral edge portion of the active surface 6. Therefore, it is possible to provide a SiC semiconductor device 1 capable of improving reliability. Preferably, the source potential is given to the dummy trench gate structure 62, Also, preferably, the source potential is given to the second dummy trench source structure 63.

Preferably, the SiC semiconductor device 1 includes the sidewall wiring 100 (sidewall structure) formed above the outer surface 7 such as to cover at least one among the first to fourth connecting surfaces 8A to 8D. According to this structure, it is possible to lessen a level difference between the active surface 6 and the outer surface 7.

Preferably, the SiC semiconductor device 1 includes the first inorganic insulating film 110 that covers the transistor structure 30 and the first dummy structure 60A above the active surface 6. Preferably, the SiC semiconductor device 1 includes the gate main surface electrode 121 formed on the first inorganic insulating film 110. Preferably, the SiC semiconductor device 1 includes the gate wiring electrode 131 led out from the gate main surface electrode 121 onto the first inorganic insulating film 110. Preferably, the gate wiring electrode 131 is electrically connected to the trench gate structure 31 through the first inorganic insulating film 110, and faces the first trench source structure 41 with the first inorganic insulating film 110 between the first trench source structure 41 and the gate wiring electrode 131.

Preferably, the Sic semiconductor device 1 includes the source main surface electrode 122 formed away from the gate main surface electrode 121 and from the gate wiring electrode 131 on the first inorganic insulating film 110. Preferably, the source main surface electrode 122 is electrically connected to the first trench source structure 41 through the first inorganic insulating film 110, and faces the trench gate structure 31 with the first inorganic insulating film 110 between the trench gate structure 31 and the source main surface electrode 122. Preferably, the source main surface electrode 122 is formed away from the first dummy structure 60A on the first inorganic insulating film 110 in plan view.

Preferably, the SiC semiconductor device 1 includes the source wiring electrode 132 led out from the source main surface electrode 122 onto the first inorganic insulating film 110. Preferably, the source wiring electrode 132 passes through the first inorganic insulating film 110 at a position differing from the source main surface electrode 122, and is electrically connected to the first trench source structure 41. Preferably, the source wiring electrode 132 passes through the first inorganic insulating film 110, and is electrically connected to the first dummy trench source structure 61.

The SiC semiconductor device 1 including the SiC chip 2, the transistor structure 30, and the second dummy structure 60B (dummy structure 60) may be employed to solve a problem shown in FIG. 31A to FIG. 31D. The SiC chip 2 includes the first main surface 3. The first main surface 3 includes the active surface 6 (first surface), the outer surface 7 (second surface), and the first to fourth connecting surfaces 8A to 8D. The outer surface 7 is hollowed with the first depth D1 in the thickness direction outside the active surface 6. The first to fourth connecting surfaces 8A to 8D connect the active surface 6 and the outer surface 7. The active surface 6, the outer surface 7, and the first to fourth connecting surfaces 8A to 8D define the active mesa 9 (mesa) in the first main surface 3.

The transistor structure 30 is formed at the inward portion of the active surface 6. The transistor structure 30 includes the trench gate structure 31 and the first trench source structure 41. The trench gate structure 31 has the second depth D2 less than the first depth D1 (D2<D1). The first trench source structure 41 has the third depth D3 exceeding the second depth D2 (D2<D3), and adjoins the trench gate structure 31 in one direction (second direction Y). The first dummy structure 60A is formed at the peripheral edge portion of the active surface 6. The second dummy structure 60B includes the dummy trench gate structure 62 that has the second depth D2 (D2<D1) and the dummy trench source structure 63 that has the third depth D3 (D2<D3) and that adjoins the dummy trench gate structure 62 in one direction (second direction Y), According to this structure, the transistor structure 30 is formed at the inward portion of the active surface 6, and the second dummy structure 60B that does not function as the transistor structure 30 is formed at the peripheral edge portion of the active surface 6. Therefore, it is possible to restrain a change in electrical characteristics of the transistor structure 30 caused by a defect in shape in the peripheral edge portion of the active surface 6. Therefore, it is possible to provide a SiC semiconductor device 1 capable of improving reliability.

According to the first preferred embodiment, it is also possible to provide a SiC semiconductor device 1 having a wiring structure in which flexibility is given to design rules in a structure having the trench structure formed at the active mesa 9. In other words, the SiC semiconductor device 1 includes the SiC chip 2, the first trench source structure 41 (trench structure), and the sidewall wiring 100.

The SiC chip 2 includes the first main surface 3. The first main surface 3 includes the active surface 6 (first surface), the outer surface 7 (second surface), and the first to fourth connecting surfaces 8A to 8D. The outer surface 7 is hollowed with the first depth D1 in the thickness direction outside the active surface 6. The first to fourth connecting surfaces 8A to 8D connect the active surface 6 and the outer surface 7. The active surface 6, the outer surface 7, and the first to fourth connecting surfaces 8A to 8D define the active mesa 9 (mesa) in the first main surface 3.

The first trench source structure 41 is formed at the active surface 6 such as to be exposed from at least one among the first to fourth connecting surfaces 8A to 8D. The sidewall wiring 100 covers at least one among the first to fourth connecting surfaces 8A to 8D above the outer surface 7 such as to be electrically connected to the first trench source structure 41. According to this structure, it is possible to electrically connect the first trench source structure 41 and the sidewall wiring 100 at the first to fourth connecting surfaces 8A to 8D side. Therefore, it is possible to provide a SiC semiconductor device 1 having a novel wiring structure in which flexibility is given to design rules by means of the sidewall wiring 100.

Preferably, in this structure, the first trench source structures 41 are formed with intervals therebetween at the active surface 6. Preferably, in this case, the sidewall wiring 100 is electrically connected to the first trench source structures 41 in at least one among the first to fourth connecting surfaces 8A to 8D, Preferably, the first trench source structure 41 includes the source trench 42 formed at the active surface 6, the source insulating film 43 covering the inner wall of the source trench 42, and the source electrode 44 embedded in the Source trench 42 with the source insulating film 43 between the source trench 42 and the source electrode 44. Preferably, in this case, the sidewall wiring 100 is electrically connected to the source electrode 44.

Preferably, the SiC semiconductor device 1 includes the main surface insulating film 90 that covers the outer surface 7 and the first to fourth connecting surfaces 8A to 8D and that is continuous with the source insulating film 43. Preferably, in this case, the sidewall wiring 100 is formed on the main surface insulating film 90.

Preferably, the sic semiconductor device 1 includes a pn-junction portion (well region 71 and/or outer well region 81) formed in a region along the first to fourth connecting surfaces 8A to 8D inside the SiC chip 2. Preferably, in this case, the sidewall wiring 100 faces the pn-junction portion in the first to fourth connecting surfaces 8A to 8D with the main surface insulating film 90 between the pn-junction portion and the sidewall wiring 100.

Preferably, the sidewall wiring 100 is formed integrally with the source electrode 44. Preferably, the bottom wall of the source trench 42 communicates with the outer surface 7. Preferably, the sidewall wiring 100 includes the overlap portion 101 covering the peripheral edge portion of the active surface 6. Preferably, the first trench source structure 41 extends in one direction (first direction X) in plan view. Preferably, in this case, the sidewall wiring 100 extends in an intersection direction (second direction Y) intersecting one direction (first direction X) in plan view.

Preferably, the SiC semiconductor device 1 includes the first inorganic insulating film 110 covering the sidewall wiring 100. According to this structure, it is possible to protect the sidewall wiring 100 by means of the first inorganic insulating film 110, Preferably, in this structure, the first inorganic insulating film 110 crosses the sidewall wiring 100 and covers the active surface 6 and the outer surface 7.

From another viewpoint, the SiC semiconductor device 1 includes the SiC chip 2, the trench gate structure 31, the first trench source structure 41, and the sidewall wiring 100. The SiC chip 2 includes the first main surface 3. The first main surface 3 includes the active surface 6 (first surface), the outer surface 7 (second surface), and the first to fourth connecting surfaces 8A to 8D. The outer surface 7 is hollowed with the first depth D1 in the thickness direction outside the active surface 6. The first to fourth connecting surfaces 8A to 8D connect the active surface 6 and the outer surface 7. The active surface 6, the outer surface 7, and the first to fourth connecting surfaces 8A to 8D define the active mesa 9 (mesa) in the first main surface 3.

The trench gate structure 31 is formed at the active surface 6 at a distance from the first to fourth connecting surfaces 8A to 8D. The first trench source structure 41 is formed at the active surface 6 such as to be exposed from at least one among the first to fourth connecting surfaces 8A to 8D. The sidewall wiring 100 covers at least one among the first to fourth connecting surfaces 8A to 8D such as to be electrically connected to the first trench source structure 41, and is formed above the outer surface 7.

According to this structure, it is possible to electrically connect the first trench source structure 41 and the sidewall wiring 100 at the first to fourth connecting surfaces 8A to 8D side, Therefore, it is possible to provide a SiC semiconductor device 1 having a novel wiring structure in which flexibility is given to design rules by means of the sidewall wiring 100.

Preferably, the first trench source structure 41 is formed deeper than the trench gate structure 31. Preferably, the trench gate structures 31 are formed at the active surface 6. Preferably, in this case, the first trench source structures 41 are formed at the active surface 6 alternately with the trench gate structures 31. Also, preferably, in this case, the sidewall wiring 100 is electrically connected to the first trench source structures 41, and is electrically separated from the trench gate structures 31.

Preferably, the SiC semiconductor device 1 includes the second trench source structure 51 formed in a region between the first to fourth connecting surfaces 8A to 8D and the trench gate structure 31 in the active surface 6. Preferably, in this structure, the second trench source structure 51 is exposed from at least one among the first to fourth connecting surfaces 8A to 8D. Preferably, in this structure, the sidewall wiring 100 is electrically connected to the first trench source structure 41 and the second trench source structure 51.

Preferably, the SiC semiconductor device 1 includes the first inorganic insulating film 110 covering the trench gate structure 31, the first trench source structure 41, and the sidewall wiring 100 above the first main surface 3. According to this structure, it is possible to protect the trench gate structure 31, the first trench source structure 41, and the sidewall wiring 100 by means of the first inorganic insulating film 110.

Preferably, the SiC semiconductor device 1 includes the gate main surface electrode 121 formed on the first inorganic insulating film 110. Preferably, the SiC semiconductor device 1 includes the gate wiring electrode 131 that is led out from the gate main surface electrode 121 onto the first inorganic insulating film 110, that is electrically connected to the trench gate structure 31 through the first inorganic insulating film 110, and that faces the first trench source structure 41 with the first inorganic insulating film 110 between the first trench source structure 41 and the gate wiring electrode 131.

Preferably, the SiC semiconductor device 1 includes the source main surface electrode 122 that is formed on the first inorganic insulating film 110, that is electrically connected to the first trench source structure 41 through the first inorganic insulating film 110, and that faces the trench gate structure 31 with the first inorganic insulating film 110 between the trench gate structure 31 and the source main surface electrode 122. Preferably, the SiC semiconductor device 1 includes the source wiring electrode 132 that is led out from the source main surface electrode 122 onto the first inorganic insulating film 110 and that is electrically connected to the sidewall wiring 100 through the first inorganic insulating film 110. Preferably, the source wiring electrode 132 is electrically connected to the first trench source structure 41 through the first inorganic insulating film 110 at a position differing from the source main surface electrode 122.

Figure 32:
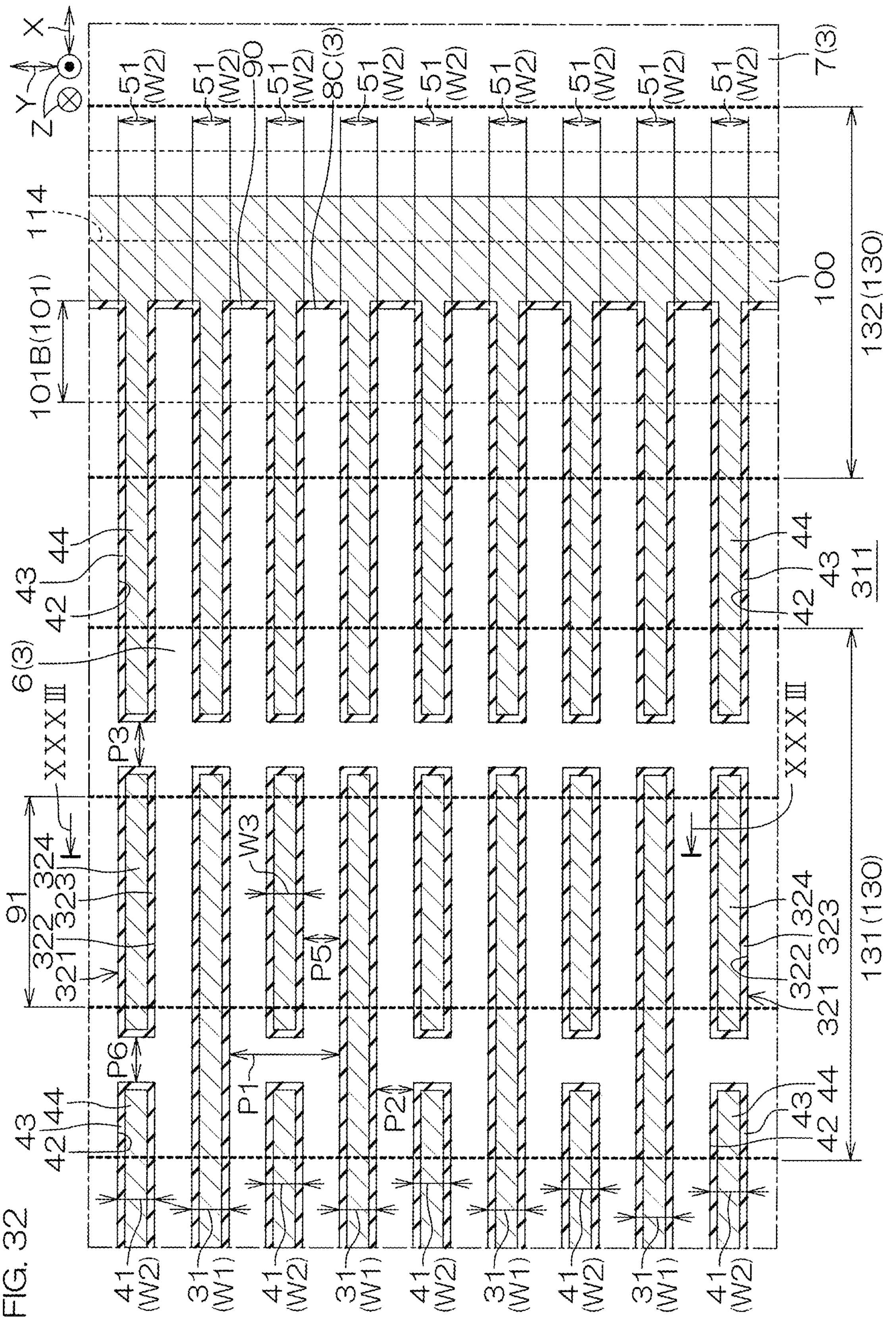
FIG. 32 corresponds to FIG. 6, and is a plan view showing a SiC semiconductor device according to a second reference preferred embodiment.
Figure 33:
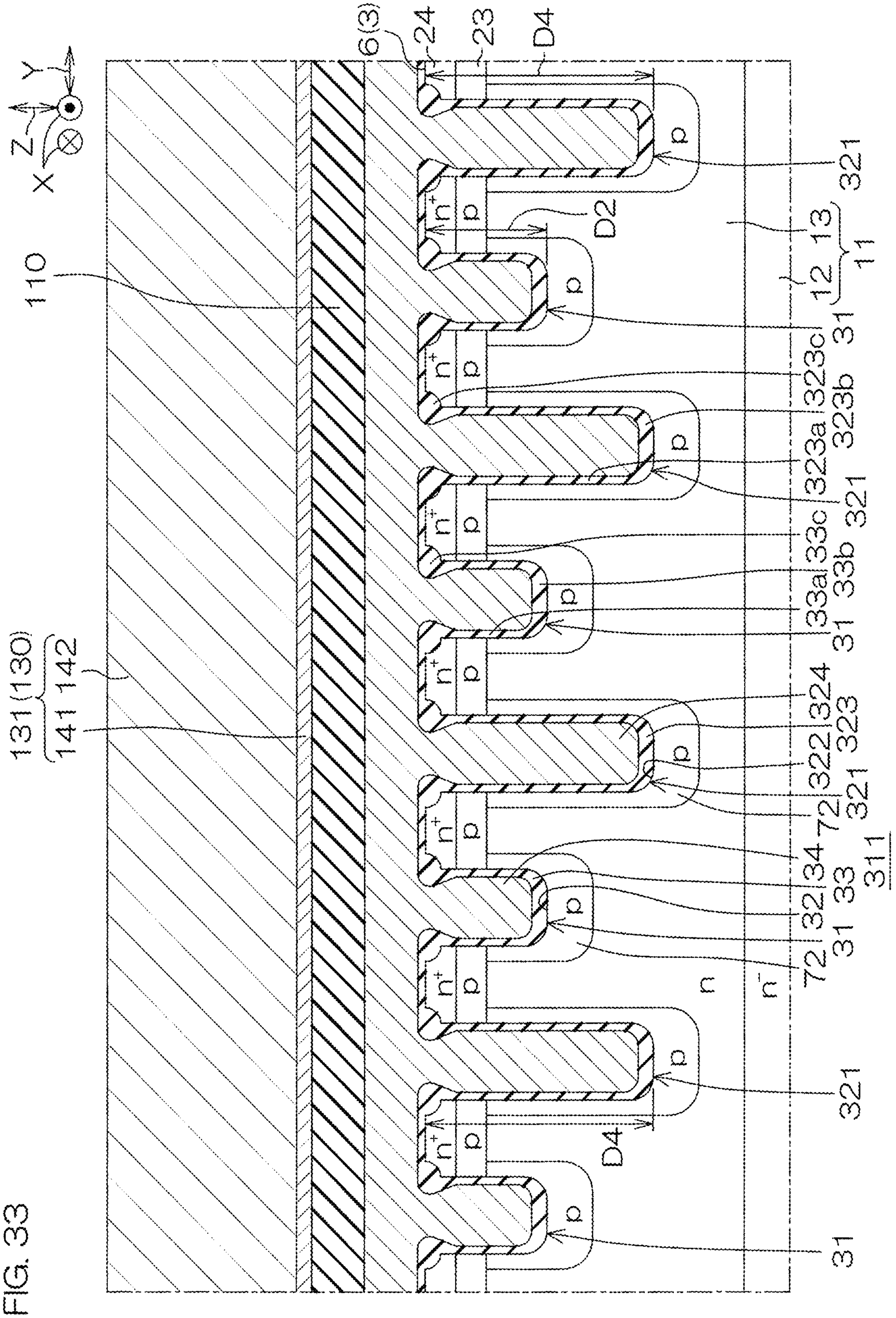
FIG. 33 is a cross-sectional view along line XXXIII-XXXIII shown in FIG. 32.

FIG. 32 corresponds to FIG. 6, and is a plan view showing a SiC semiconductor device 311 according to a second reference preferred embodiment. FIG. 33 is a cross-sectional view along line XXXIII-XXIII shown in FIG. 32. The same reference sign is hereinafter given to a structure corresponding to the structure described with respect to the SiC semiconductor device 1, and a description of this structure is omitted.

In the SiC semiconductor device 311 according to the second reference preferred embodiment, the first trench source structures 41 are formed at a distance from the first to fourth connecting surfaces 8A to 8D at the inward portion of the active surface 6 in plan view. The first trench source structures 41 do not cross the end portion of each of the trench gate structures 31 from the second-direction-Y side in the first direction X in plan view. In this embodiment, each of the first trench source structures 41 has a length substantially equal to the length of each of the trench gate structures 31 regarding the first direction X.

The transistor structure 30 according to the Sic semiconductor device 311 includes a plurality of second trench gate structures 321 formed at the active surface 6. The gate potential is given to the second trench gate structures 321.

The second trench gate structures 321 are each formed in the active surface 6 at a distance from the first to fourth connecting surfaces 8A to 8D such as to adjoin the first trench source structures 41 in the first direction X and such as to adjoin the trench gate structures 31 in the second direction Y. In detail, the second trench gate structures 321 are each formed at a distance from each of the trench gate structures 31 in a region between two adjacent trench gate structures 31 in the active surface 6, and adjoin the first trench source structures 41, respectively, in the first direction X.

In more detail, the second trench gate structures 321 are each formed in a belt shape extending in the first direction X in plan view, and are formed with intervals therebetween in the second direction Y in a manner in which the single trench gate structure 31 is interposed therebetween. The second trench gate structures 321 are formed in a stripe shape extending in the first direction X in plan view.

Each of the second trench gate structures 321 has a third width W3. The third width W3 is a width in a direction (i.e., second direction Y) perpendicular to a direction in which each of the second trench gate structures 321 extends (i.e., second direction Y). The third width W3 may be not less than 0.1 μm and not more than 3 μm, Preferably, the third width W3 is not less than 0.5 μm and not more than 1.5 μm. The third width W3 may exceed the first width W1 (W1<W3), or may be equal to or less than the first width W1 (W1≥W3). In this embodiment, the third width W3 is substantially equal to the first width W1 (W1≈W3). Preferably, the third width W3 has a value falling within ±10% of the value of the first width W1.

Each of the second trench gate structures 321 has a fourth depth D4. The fourth depth D4 exceeds the second depth D2 of the trench gate structure 31 (D2<D4). Preferably, the fourth depth D4 is not less than 1.5 times and not more than 3 times as long as the second depth D2. In this embodiment, the fourth depth D4 is substantially equal to the first depth D1 of the outer surface 7 (D1>D4). Also, the fourth depth D4 is substantially equal to the third depth D3 of the first trench source structure 41 (D3≈D4). Preferably, the fourth depth D4 has a value falling within ±10% of the value of the third depth D3.

The fourth depth D4 may be not less than 0.5 μm and not more than 10 μm. Preferably, the fourth depth D4 is 5 μm or less. Particularly preferably, the fourth depth D4 is 2.5 μm or less. Preferably, an aspect ratio D4/W3 of each of the second trench gate structures 321 is not less than 1 and not more than 5. The aspect ratio D4/W3 is a ratio of the fourth depth D4 to the third width W3. Particularly preferably, the aspect ratio D4/W3 is 2 or more.

The second trench gate structures 321 are arranged with fifth intervals P5 between the trench gate structures 31 and the second trench gate structures 321, respectively, in the second direction Y. The fifth interval P5 is a distance between the single trench gate structure 31 and the single second trench gate structure 321 that are adjacent to each other in the second direction Y. Preferably, the fifth interval P5 is not less than ¼ of the first interval P1 of the trench gate structures 31 and not more than the first interval P1 (¼×P1≤P5<P1). Preferably, the fifth interval P5 is equal to or less than ½ of the first interval P1 (P5≤½×P1).

The fifth interval P5 may be not less than 0.1 μm and not more than 2.5 μm. Preferably, the fifth interval P5 is not less than 0.5 μm and not more than 1.5 μm. Preferably, the fifth interval P5 is substantially equal to the second interval P2 between the trench gate structure 31 and the first trench source structure 41 (P2>P5). Preferably, the fifth interval P5 has a value falling within #10% of the value of the second interval P2.

The second trench gate structures 321 are arranged with sixth intervals P6 between the first trench source structures 41 and the second trench gate structures 321, respectively, in the first direction X. The sixth interval P6 is a distance between the single first trench source structure 41 and the single second trench gate structure 321 that are adjacent to each other in the first direction X. Preferably, the sixth interval P6 is not less than ¼ of the first interval P1 of the trench gate structures 31 and not more than the first interval P1 (¼×P1≤P6<P1). Preferably, the sixth interval P6 is equal to or less than ½ of the first interval P1 (P6≤½×P1).

The sixth interval P6 may be not less than 0.1 μm and not more than 2.5 μm. Preferably, the sixth interval P6 is not less than 0.5 μm and not more than 1.5 μm. Preferably, the sixth interval P6 is substantially equal to the second interval P2 between the trench gate structure 31 and the first trench source structure 41 (P2=P6). Preferably, the sixth interval P6 has a value falling within ±10% of the value of the second interval P2.

Each of the second trench gate structures 321 includes a sidewall and a bottom wall. The sidewall that forms a long side of each of the second trench gate structures 321 is formed by the a-plane of the SiC monocrystal. The sidewall that forms a short side of each of the second trench gate structures 321 is formed by the m-plane of the SiC monocrystal. The bottom wall of each of the second trench gate structures 321 is formed by the c-plane of the SiC monocrystal.

Each of the second trench gate structures 321 may be formed in a vertical shape having a substantially uniform opening width. Each of the second trench gate structures 321 may be formed in a tapered shape whose opening width becomes narrower toward the bottom wall. Preferably, the bottom wall of each of the second trench gate structures 321 is formed in a curved shape toward the second main surface 4. As a matter of course, the bottom wall of each of the second trench gate structures 321 may have a flat surface parallel to the active surface 6.

Each of the second trench gate structures 321 is formed at the active surface 6 such as to cross the body region 23 and the source region 24 and reach the second semiconductor region 11. In detail, each of the second trench gate structures 321 is formed at a distance from the bottom portion of the second semiconductor 11 toward region the active-surface-6 side, and faces the first semiconductor region 10 (third semiconductor region 14) with a part of the second semiconductor region 11 between the first semiconductor region 10 and each of the second trench gate structures 321. In this embodiment, each of the second trench gate structures 321 is formed in the second concentration region 13, and faces the first concentration region 12 with a part of the second concentration region 13 between the first concentration region 12 and each of the second trench gate structures 321.

The sidewall of each of the second trench gate structures 321 is in contact with the second semiconductor region 11, the body region 23, and the source region 24. The bottom wall of each of the second trench gate structures 321 is in contact with the second semiconductor region 11. In this embodiment, each of the second trench gate structures 321 is formed deeper than each of the trench gate structures 31. In other words, the bottom wall of each of the second trench gate structures 321 is positioned at the bottom-portion side of the second semiconductor region 11 (second concentration region 13) with respect to the bottom wall of each of the trench gate structures 31.

Each of the second trench gate structures 321 includes a second gate trench 322, a second gate insulating film 323, and a second gate electrode 324. The second gate trench 322 forms the sidewall and the bottom wall of the second trench gate structure 321. The sidewall and the bottom wall form a wall surface of the second gate trench 322 (inner wall and outer wall).

An opening edge portion of the second gate trench 322 is inclined obliquely downward from the active surface 6 toward the second gate trench 322. The opening edge portion is a connection portion between the active surface 6 and the sidewall of the second gate trench 322. In this embodiment, the opening edge portion is formed in a curved shape hollowed toward the SiC chip 2. The opening edge portion may be formed in a curved shape toward the inward side of the second gate trench 322.

The second gate insulating film 323 is formed in a film shape on the inner wall of the second gate trench 322, and defines a recessed space in the second gate trench 322. The second gate insulating film 323 covers the second semiconductor region 11, the body region 23, and the source region 24 in the inner wall of the second gate trench 322. The second gate insulating film 323 includes at least one among a silicon oxide film, a silicon nitride film, and a silicon oxynitride film. In this embodiment, the second gate insulating film 323 has a single layer structure constituted of a silicon oxide film.

The second gate insulating film 323 includes a first portion 323*a*, a second portion 323*b*, and a third portion 323*c*. The first portion 323*a* covers the sidewall of the second gate trench 322. In detail, the first portion 323*a* covers the sidewall of the second gate trench 322 and exposes the surface layer portion of the first main surface 3 from an opening end of the second gate trench 322 at a distance from the opening end of the second gate trench 322 toward the bottom-wall side at the inward-portion side of the active surface 6. The first portion 323*a* covers the whole area of the sidewall of the second gate trench 322 at the peripheral-edge-portion side of the active surface 6.

The second portion 323*b* covers the bottom wall of the second gate trench 322. The third portion 323*c* is formed at the peripheral-edge-portion side of the active surface 6 at a distance from the inward portion of the active surface 6, and covers the opening edge portion of the second gate trench 322. In this embodiment, the third portion 323*c* bulges in a curved shape toward the inward side of the second gate trench 322 in the opening edge portion.

The thickness of the first portion 323*a* may be not less than 10 nm and not more than 100 nm. The second portion 323*b* may have a thickness exceeding the thickness of the first portion 323*a*. The thickness of the second portion 323*b* may be not less than 50 nm and not more than 200 nm. The third portion 323*c* has a thickness exceeding the thickness of the first portion 323*a*. The thickness of the third portion 323*c* may be not less than 50 nm and not more than 200 nm. As a matter of course, a second gate insulating film 323 having a uniform thickness may be formed.

The second gate electrode 324 is embedded in the second gate trench 322 with the second gate insulating film 323 between the second gate trench 322 and the second gate electrode 324. The second gate electrode 324 faces the second semiconductor region 11, the body region 23, and the source region 24 with the second gate insulating film 323 between these regions and the second gate electrode 324. The second gate electrode 324 has an electrode surface exposed from the second gate trench 322. The electrode surface of the second gate electrode 324 is formed in a curved shape hollowed toward the bottom wall of the second gate trench 322.

The electrode surface of the second gate electrode 324 is narrowed by the third portion 323*c* of the insulating film at the peripheral-edge-portion side of the active surface 6. The gate potential is applied to the second gate electrode 324. Preferably, the second gate electrode 324 is constituted of conductive polysilicon. The second gate electrode 324 may include n-type polysilicon that is doped with an n-type impurity and/or p-type polysilicon that is doped with a p-type impurity. Preferably, the second gate electrode 324 includes the same conductive material as the gate electrode 34.

As thus described, the second trench gate structure 321 having a structure corresponding to the first trench source structure 41 is formed at the active surface 6 in the SiC semiconductor device 311. The second trench gate structure 321 can be regarded also as a portion separated from the first trench source structure 41.

In the SiC semiconductor device 311, the second trench source structures 51 are formed with the third intervals P3 therebetween in the second direction Y such as to face the trench gate structures 31 and the second trench gate structures 321, respectively, in the first direction X in a one-to-one correspondence. In other words, the second trench source structures 51 sandwich the single trench gate structure 31 from both sides in the first direction X. Also, the second trench source structures 51 sandwich the second trench gate structures 321 with the first trench source structures 41 from both sides in the first direction X. Other structures of the second trench source structures 51 are the same as the second trench source structures 51 according to the SiC semiconductor device 1.

The contact regions 70 are not formed in a region along the second trench gate structures 321 in the surface layer portion of the first main surface 3. In this embodiment, the gate well regions 72 are formed also in a region along the second trench gate structures 321 in addition to the trench gate structures 31, respectively. The gate well regions 72 are formed in a one-to-one correspondence with the second trench gate structures 321, respectively.

Each of the gate well regions 72 is formed in a belt shape extending along each of the second trench gate structures 321 in plan view. Each of the gate well regions 72 is formed at a distance from the trench gate structure 31 and from the first trench source structure 41 toward the second-trench-gate-structure-321 side, and exposes the trench gate structure 31 and the first trench source structure 41. Each of the gate well regions 72 covers the bottom wall and the whole area of the sidewall of each of the second trench gate structures 321. Each of the gate well regions 72 is electrically connected to the body region 23 in the sidewall of each of the second trench gate structures 321.

The bottom portion of each of the gate well regions 72 covering each of the second trench gate structures 321 is positioned in a region at the bottom-portion side of the second semiconductor region 11 (second concentration region 13) with respect to the bottom portion of each of the gate well regions 72 covering each of the trench gate structures 31. The bottom portion of each of the gate well regions 72 covering each of the second trench gate structures 321 is formed at a depth substantially equal to that of the bottom portion of each of the well regions 71 covering each of the first trench source structures 41.

Each of the gate well regions 72 covering each of the second trench gate structures 321 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the gate well regions 72. In other words, each of the gate well regions 72 covering each of the second trench gate structures 321 is electrically connected to the second semiconductor region 11 (second concentration region 13).

Preferably, the thickness of a part, which covers the bottom wall of each of the second trench gate structures 321, of each of the gate well regions 72 exceeds the thickness of a part, which covers the sidewall of each of the second trench gate structures 321, of each of the gate well regions 72. The thickness of the part, which covers the sidewall of each of the second trench gate structures 321, of each of the gate well regions 72 is the thickness in the normal direction of the sidewall of each of the second trench gate structures 321. The thickness of the part, which covers the bottom wall of each of the second trench gate structures 321, of each of the gate well regions 72 is the thickness in the normal direction of the bottom wall of each of the second trench gate structures 321.

Preferably, the bottom portion of the gate well regions 72 is formed at a substantially uniform depth with respect to the bottom wall of the second trench gate structures 321. The gate well regions 72 form a pn-junction portion with the second semiconductor region 11 (second concentration region 13), and expand a depletion layer in the width and depth directions of the SiC chip 2. The gate well regions 72 bring the trench insulated-gate type MISFET close to the structure of a pn-junction diode, and relax an electric field in the SiC chip 2.

The SiC semiconductor device 311 includes the gate contact electrodes 91. The gate contact electrodes 91 include the gate contact electrode 91 at the third-connecting-surface-8C side and the gate contact electrode 91 at the fourth-connecting-surface-8D side. The gate contact electrode 91 at the third-connecting-surface-8C side will be hereinafter described. The gate contact electrode 91 covers the trench gate structures 31 and the second trench gate structures 321 at a distance from the first trench source structures 41 and from the second trench source structures 51.

The gate contact electrode 91 is connected to the gate electrode 34 of the trench gate structures 31 and to the second gate electrode 324 of the second trench gate structures 321. The gate contact electrode 91 is formed in a belt shape extending in the second direction Y such as to cross the end portion of the trench gate structures 31 and an inward portion of the second trench gate structures 321 in plan view.

The gate contact electrode 91 has the electrode surface 91*a* extending along the active surface 6. In this embodiment, the gate contact electrode 91 is formed in a tapered shape (quadrangular truncated conical shape) whose width becomes narrower from the active surface 6 toward the electrode surface 91*a*. The electrode surface 91*a* includes a portion facing the gate electrode 34 in the normal direction Z and a portion facing a region (i.e., main surface insulating film 90) outside the trench gate structure 31 in the normal direction Z.

Preferably, the gate contact electrode 91 is constituted of conductive polysilicon. The gate contact electrode 91 may include n-type polysilicon that is doped with an n-type impurity and/or p-type polysilicon that is doped with a p-type impurity. Preferably, the gate contact electrode 91 is constituted of the same conductive material as each of the gate electrodes 34.

In this embodiment, each of the gate contact electrodes 91 is formed of a lead-out portion that is led out from the gate electrode 34 and from the second gate electrode 324 to a space above the active surface 6. In other words, the gate contact electrodes 91 are led out from the gate electrode 34 onto the main surface insulating film 90 through the third portion 33*c* of the gate insulating film 33, and are led out from the second gate electrode 324 onto the main surface insulating film 90 through the third portion 323*c* of the second gate insulating film 323.

In this embodiment, the gate openings 112 are formed in a belt shape extending along the gate contact electrodes 91 such as to expose the gate contact electrodes 91, respectively. The gate wiring electrode 131 enters the gate openings 112 from above the first inorganic insulating film 110, and is electrically connected to the gate contact electrodes 91. Hence, the gate potential applied to the gate wiring electrode 131 is given to the trench gate structures 31 and to the second trench gate structures 321 through the gate wiring electrode 131.

The SiC semiconductor device 311 according to the second reference preferred embodiment includes the SiC chip 2, the trench gate structure 31, the second trench gate structure 321, the first inorganic insulating film 110, the gate main surface electrode 121, and the gate wiring electrode 131. The trench gate structure 31 is formed at the first main surface 3 at a second depth D2. The second trench gate structure 321 has a fourth depth D4 exceeding the second depth D2, and is formed at the first main surface 3 such as to adjoin the trench gate structure 31.

The first inorganic insulating film 110 covers the trench gate structure 31 and the second trench gate structure 321 above the first main surface 3. The gate main surface electrode 121 is formed on the first inorganic insulating film 110. The gate wiring electrode 131 is led out from the gate film 110, and is electrically connected to the trench gate structure 31 and to the second trench gate structure 321 through the first inorganic insulating film 110. According to this structure, it is possible to give the gate potential to the trench gate structure 31 while restraining a decrease in withstand voltage.

Preferably, the SiC semiconductor device 311 according to the second reference preferred embodiment includes the gate well region 72 formed in a region along the trench gate structure 31 in the surface layer portion of the SiC chip 2. According to this structure, it is possible to appropriately restrain a decrease in withstand voltage. Preferably, the SiC semiconductor device 311 further includes the second gate well region 72 formed in a region along the second trench gate structure 321 in the surface layer portion of the SiC chip 2. According to this structure, it is possible to more appropriately restrain a decrease in withstand voltage.

Preferably, the SiC semiconductor device 311 according to the second reference preferred embodiment further includes the gate contact electrode 91 covering the gate electrode 34 and the second gate electrode 324 above the first main surface 3. Preferably, in this case, the first inorganic insulating film 110 covers the gate contact electrode 91, and the gate wiring electrode 131 is electrically connected to the gate contact electrode 91 through the first inorganic insulating film 110.

According to this structure, it is possible to electrically and simultaneously connect the gate wiring electrode 131 to both the gate electrode 34 and the second gate electrode 324 through the gate contact electrode 91. Also, according to this structure, it is possible to lessen an alignment margin of the gate wiring electrode 131 with respect to the gate electrode 34 and the second gate electrode 324 by means of the gate contact electrode 91. In other words, it is possible to compensate a positional deviation of the gate wiring electrode 131 with respect to the gate electrode 34 and the second gate electrode 324 by means of the gate contact electrode 91.

Hence, it is possible to appropriately and electrically connect the gate wiring electrode 131 to the gate electrode 34 and to the second gate electrode 324. Preferably, in this structure, the gate contact electrode 91 partially covers the gate electrode 34 and the second gate electrode 324. Also, preferably, the gate main surface electrode 121 is formed on the first inorganic insulating film 110 at a distance from the gate contact electrode 91 in plan view.

In the SiC semiconductor device 311 according to the second reference preferred embodiment, the second trench gate structure 321 having the fourth depth D4 exceeding the second depth D2 of the trench gate structure 31 is formed in a region below the gate wiring electrode 131. Therefore, there is a case in which the thickness of the second gate insulating film 323 of the second trench gate structure 321 deviates from the thickness of the gate insulating film 33 of the trench gate structure 31 because of a process error. In this case, there is a possibility that the withstand voltage will decrease because of electric-field concentration on the second trench gate structure 321 if the gate potential is given to the second trench gate structure 321.

Therefore, referring to FIG. 1 to FIG. 28, the SiC semiconductor device 1, which includes the SiC chip 2, the trench gate structure 31, the first trench source structure 41, the first inorganic insulating film 110, the gate main surface electrode 121, and the gate wiring electrode 131, is employed in the first preferred embodiment. The trench gate structure 31 is formed at the first main surface 3. The first trench source structure 41 is formed at the first main surface 3 away from the trench gate structure 31 in one direction (second direction Y).

The first inorganic insulating film 110 covers the trench gate structure 31 and the first trench source structure 41 above the first main surface 3. The gate main surface electrode 121 is formed on the first inorganic insulating film 110. The gate wiring electrode 131 is led out from the gate film 110 such as to cross the trench gate structure 31 and the first trench source structure 41 in one direction (second direction Y), and is electrically connected to the trench gate structure 31 through the first inorganic insulating film 110, and faces the first trench source structure 41 with the first inorganic insulating film 110 between the first trench source structure 41 and the gate wiring electrode 131.

According to this structure, it is possible to avoid a decrease in withstand voltage caused when the second trench gate structure 321 deeper than the trench gate structure 31 is formed, and, on the other hand, it is possible to obtain a withstand-voltage reinforcing effect fulfilled by the first trench source structure 41 in a region below the gate wiring electrode 131. Therefore, it is possible to provide a SiC semiconductor device 1 capable of improving electrical characteristics, Preferably, in this structure, the trench gate structure 31 is formed at the first main surface 3 at the second depth D2, and the first trench source structure 41 is formed at the first main surface 3 at the third depth D3 exceeding the second depth D2 (D2<D3). According to this structure, it is possible to obtain a withstand-voltage reinforcing effect fulfilled by the deep first trench source structure 41.

Preferably, the SiC semiconductor device 1 includes the source main surface electrode 122 formed on the first inorganic insulating film 110 away from the gate main surface electrode 121 and from the gate wiring electrode 131. Preferably, the source main surface electrode 122 is electrically connected to the first trench source structure 41 through the first inorganic insulating film 110, and faces the trench gate structure 31 with the first inorganic insulating film 110 between the trench gate structure 31 and the source main surface electrode 122.

Preferably, the SiC semiconductor device 1 includes the source wiring electrode 132 led out from the source main surface electrode 122 onto the first inorganic insulating film 110. Preferably, the source wiring electrode 132 is electrically connected to the first trench source structure 41 through the first inorganic insulating film 110 at a position differing from the source main surface electrode 122. Preferably, in this case, the source wiring electrode 132 is formed at a distance from the trench gate structure 31 in plan view.

Preferably, the Sic semiconductor device 1 includes the second trench source structure 51 formed at the first main surface 3 at a distance from the trench gate structure 31 in an intersection direction (first direction X) intersecting one direction (second direction Y). According to this structure, it is possible to obtain a withstand-voltage reinforcing effect fulfilled by the second trench source structure 51. Preferably, the second trench source structure 51 faces the trench gate structure 31 in one direction (first direction X), and faces the first trench source structure 41 in an intersection direction (second direction Y).

Preferably, in this case, the source main surface electrode 122 is formed on the first inorganic insulating film 110 away from the second trench source structure 51, from the gate main surface electrode 121, and from the gate wiring electrode 131 in plan view. Also, preferably, the source main surface electrode 122 is electrically connected to the first trench source structure 41 through the first inorganic insulating film 110, and faces the trench gate structure 31 with the first inorganic insulating film 110 between the trench gate structure 31 and the source main surface electrode 122.

Preferably, in this case, the source wiring electrode 132 is led out from the source main surface electrode 122 onto the first inorganic insulating film 110, and is electrically connected to the second trench source structure 51 through the first inorganic insulating film 110. Particularly preferably, the source wiring electrode 132 is electrically connected to the first trench source structure 41 through the first inorganic insulating film 110 at a position differing from the source main surface electrode 122. Preferably, the source wiring electrode 132 is formed at a distance from the trench gate structure 31 in plan view.

Preferably, the SiC semiconductor device 1 includes a source-side pn-junction portion (well region 71) formed in a region along the first trench source structure 41 inside the SiC chip 2. According to this structure, it is possible to improve the withstand voltage of the SiC semiconductor device 1 by use of the first trench source structure 41. Preferably, in this structure, the gate wiring electrode 131 faces the source-side pn-junction portion (well region 71) at the first-trench-source-structure-41 side in plan view.

Preferably, the SiC semiconductor device 1 includes a source-side pn-junction portion (well region 71) formed in a region along the second trench source structure 51 inside the SiC chip 2. According to this structure, it is possible to improve the withstand voltage of the SiC semiconductor device 1 by use of the second trench source structure 51. Preferably, in this structure, the gate wiring electrode 131 faces the source-side pn-junction portion at the second-trench-source-structure-51 side (well region 71) in plan view.

Preferably, the SiC semiconductor device 1 includes at least a gate-side pn-junction portion (gate well region 72) formed in a region along the end portion of the trench gate structure 31 inside the SiC chip 2. According to this structure, it is possible to improve the withstand voltage of the SiC semiconductor device 1 by use of the trench gate structure 31. Preferably, in this structure, the gate wiring electrode 131 faces the gate-side pn-junction portion (gate well region 72) in plan view.

Preferably, the e SiC semiconductor device 1 includes the gate contact electrode 91 covering the gate electrode 34 above the first main surface 3. Preferably, in this case, the first inorganic insulating film 110 covers the gate contact electrode 91, and the gate wiring electrode 131 is electrically connected to the gate contact electrode 91 through the first inorganic insulating film 110. According to this structure, it is possible to lessen an alignment margin of the gate wiring electrode 131 with respect to the gate electrode 34 by means of the gate contact electrode 91.

In other words, it is possible to compensate a positional deviation of the gate wiring electrode 131 with respect to the gate electrode 34 by means of the gate contact electrode 91. Hence, it is possible to appropriately and electrically connect the gate wiring electrode 131 to the gate electrode 34. Preferably, in this structure, the gate contact electrode 91 partially covers the gate electrode 34. Also, preferably, the gate main surface electrode 121 is formed on the first inorganic insulating film 110 at a distance from the gate contact electrode 91 in plan view, The SiC semiconductor device 1 including the SiC chip 2, the trench gate structure 31, the second trench source structure 51, the first inorganic insulating film 110, the source wiring electrode 132, and the gate wiring electrode 131 may be employed. The trench gate structure 31 is formed at the first main surface 3, and extends in one direction (first direction X) in plan view. The second trench source structure 51 is formed at the first main surface 3 in one direction (first direction X) at a distance from the trench gate structure 31, and extends in one direction (first direction X) in plan view.

The first inorganic insulating film 110 covers the trench gate structure 31 and the second trench source structure 51. The gate wiring electrode 131 is formed on the first inorganic insulating film 110, and is electrically connected to the trench gate structure 31 through the first inorganic insulating film 110. The source wiring electrode 132 is formed on the first inorganic insulating film 110 at a distance from the gate wiring electrode 131, and is electrically connected to the second trench source structure 51 through the first inorganic insulating film 110. According to this structure, it is possible to obtain a withstand-voltage reinforcing effect fulfilled by the second trench source structure 51 below the gate wiring electrode 131.

Preferably, the trench gate structures 31 are arranged at the first main surface 3 with intervals therebetween in an intersection direction (second direction Y) intersecting one direction (first direction X). Preferably, in this case, the second trench source structures 51 are arranged with intervals therebetween in the intersection direction (second direction Y) such as to face the trench gate structures 31 in a one-to-one correspondence in one direction (first direction X). Also, preferably, in this structure, the source wiring electrode 132 is formed at a distance from the trench gate structure 31 in plan view.

Figure 34:
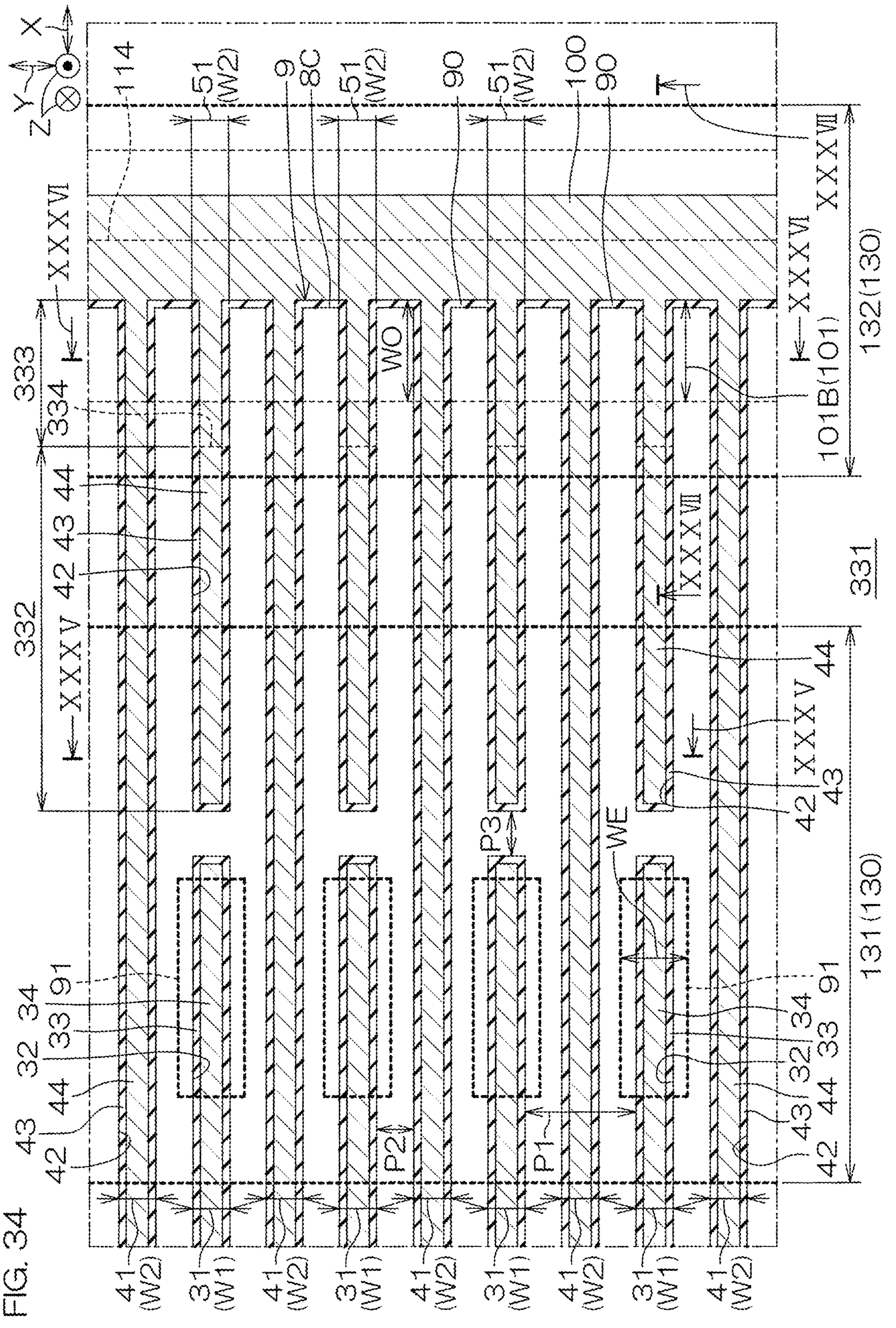
FIG. 34 corresponds to FIG. 6, and is a plan view showing a SiC semiconductor device according to a second preferred embodiment of the present invention.
Figure 35:
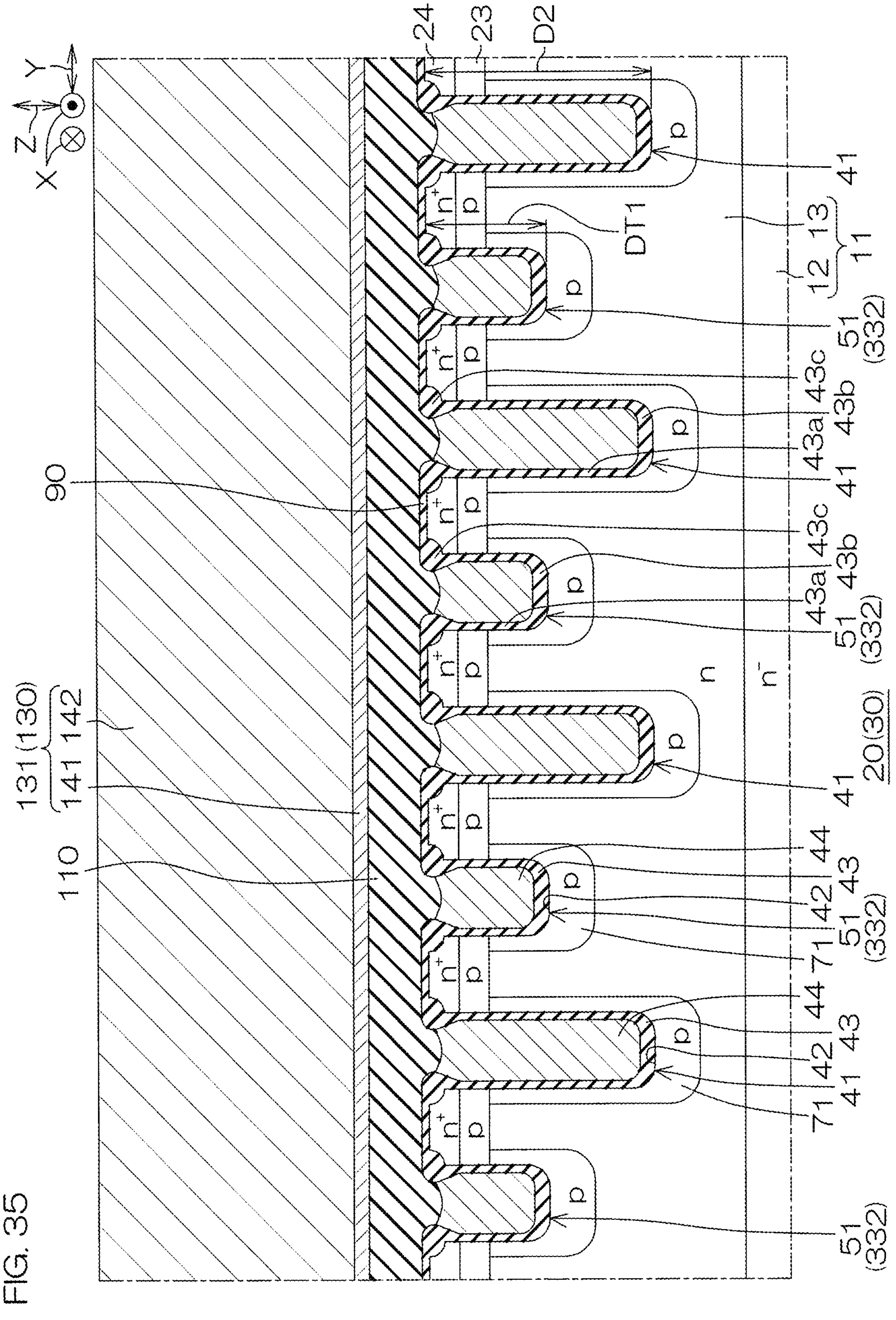
FIG. 35 is a cross-sectional view along line XXXV-XXXV shown in FIG. 34.
Figure 36:
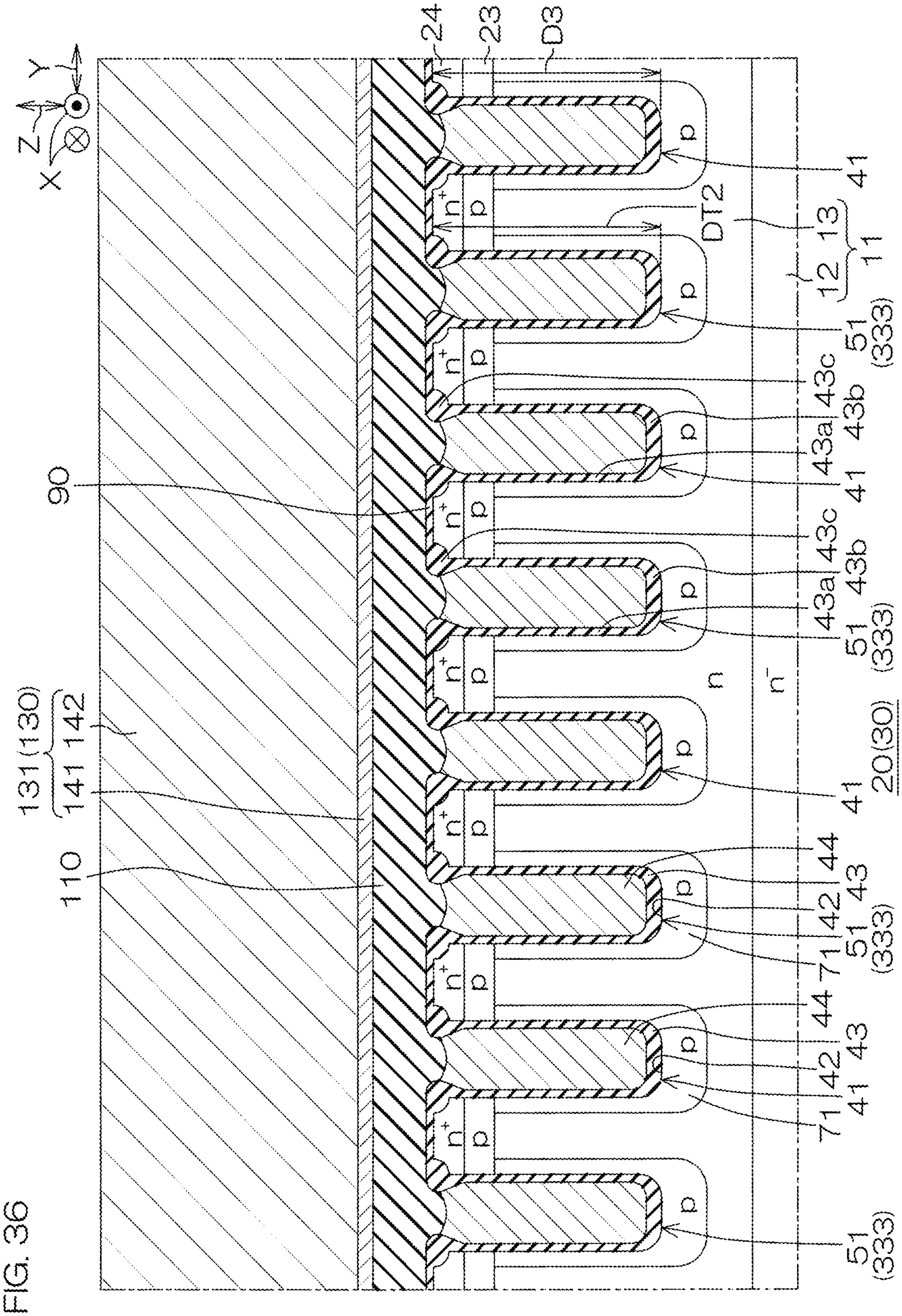
FIG. 36 is a cross-sectional view along line XXXVI-XXXVI shown in FIG. 34.
Figure 37:
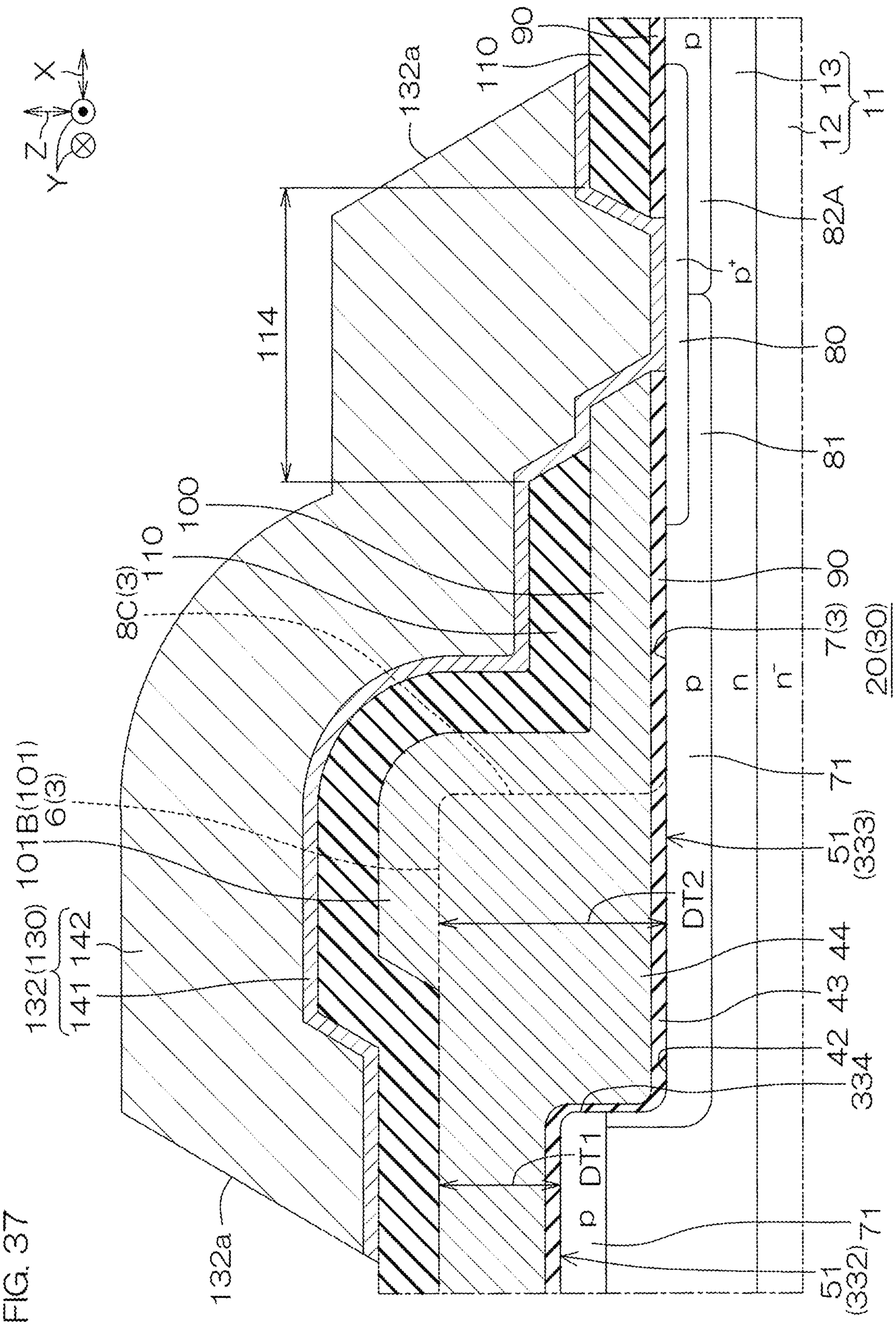
FIG. 37 is a cross-sectional view along line XXXVII-XXXVII shown in FIG. 34.

FIG. 34 corresponds to FIG. 6, and is a plan view showing a SiC semiconductor device 331 according to a second preferred embodiment of the present invention. FIG. 35 is a cross-sectional view along line XXXV-XXXV shown in FIG. 34. FIG. 36 is a cross-sectional view along line XXXVI-XXXVI shown in FIG. 34. FIG. 37 is a cross-sectional view along line XXXVII-XXXVII shown in FIG. 34.

The same reference sign is hereinafter given to a structure corresponding to the structure described with respect to the SiC semiconductor device 1, and a description of this structure is omitted. A structure at the fourth-connecting-surface-8D side is the same as a structure at the third-connecting-surface-8C side, and therefore the structure at the third-connecting-surface-8C side will be hereinafter described as an example. A detailed structure at the fourth-connecting-surface-8D side can be obtained by replacing the "third connecting surface 8C" with the "fourth connecting surface 8D" in the following description.

Referring to FIG. 34 to FIG. 37, in this embodiment, the second trench source structures 51 according to the SiC semiconductor device 331 include a first trench portion 332 in which the inward-portion side of the active surface 6 is shallow and a second trench portion 333 in which the peripheral-edge-portion side (third-connecting-surface-8C side) of the active surface 6 is deep regarding the first direction X. The second trench source structures 51 have a trench stepped portion 334 that is hollowed from the first trench portion 332 toward the second trench portion 333 between the first trench portion 332 and the second trench portion 333. The single second trench source structure 51 will be hereinafter described.

The first trench portion 332 is formed at the trench-gate-structure-31 side, and is formed in a belt shape extending in the first direction X in plan view. The first trench portion 332 is formed with the third interval P3 between the trench gate structure 31 and the first trench portion 332 in the first direction X, and faces the trench gate structure 31 in the first direction X. Also, the first trench portion 332 is formed with the second interval P2 between the first trench source structure 41 and the first trench portion 332 in the second direction Y, and faces the first trench source structure 41 in the second direction Y, The first trench portion 332 has a first trench depth DT1. The first trench depth DT1 is less than the first depth D1 of the outer surface 7 (DT1<D3). The first trench depth DT1 is less than the third depth D3 of the first trench source structure 41 (DT1<D3). Preferably, the first trench depth DT1 is substantially equal to the second depth D2 of the trench gate structure 31 (DT1=D2). Preferably, the first trench depth DT1 has a value falling within ±10% of the value of the second depth D2. The first trench portion 332 lessens a level difference with the active surface 6. Also, the first trench portion 332 brings the structure at the inward-portion side of the second trench source structure 51 close to the trench gate structure 31.

The first trench depth DT1 may be not less than 0.1 μm and not more than 3 μm. Preferably, the first trench depth DT1 is not less than 0.5 μm and not more than 2 μm. Preferably, an aspect ratio DT1/W2 of the first trench portion 332 is not less than 1 and not more than 5. The aspect ratio DT1/W2 is a ratio of the first trench depth DT1 to the second width W2. Particularly preferably, the aspect ratio DT1/W2 is 1.5 or more.

The first trench portion 332 includes a sidewall and a bottom wall. The sidewall that forms a long side of the first trench portion 332 is formed by the a-plane of the SiC monocrystal. The sidewall that forms a short side of the first trench portion 332 is formed by the m-plane of the SiC monocrystal. The bottom wall of the first trench portion 332 is formed by the c-plane of the SiC monocrystal.

The first trench portion 332 may be formed in a vertical shape having a substantially uniform opening width. The first trench portion 332 may be formed in a tapered shape whose opening width becomes narrower toward the bottom wall. Preferably, the bottom wall of the first trench portion 332 is formed in a curved shape toward the second main surface 4. As a matter of course, the bottom wall of the first trench portion 332 may have a flat surface parallel to the active surface 6.

The first trench portion 332 is formed at the active surface 6 such as to cross the body region 23 and the source region 24 and reach the second semiconductor region 11. In detail, the first trench portion 332 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and the first trench portion 332. In this embodiment, the first trench portion 332 is formed in the second concentration region 13, and faces the first concentration region 12 with a part of the second concentration region 13 between the first concentration region 12 and the first trench portion 332.

The sidewall of the first trench portion 332 is in contact with the second semiconductor region 11, the body region 23, and the source region 24. The bottom wall of the first trench portion 332 is in contact with the second semiconductor region 11. In this embodiment, the first trench portion 332 is formed shallower than the first trench source structure 41. In other words, the bottom wall of the first trench portion 332 is positioned at the active-surface-6 side with respect to the bottom wall of the first trench source structure 41.

The second trench portion 333 is formed between the first trench portion 332 and the third connecting surface 8C. The second trench portion 333 communicates with the first trench portion 332, and is formed in a belt shape extending in the first direction X such as to pass through the third connecting surface 8C. The second trench portion 333 is formed with the second interval P2 between the first trench source structure 41 and the second trench portion 333 in the second direction Y, and faces the first trench source structure 41 in the second direction Y.

The second trench portion 333 has a second trench depth DT2 exceeding the first trench depth DT1 (DT1<DT2). The second trench depth DT2 exceeds the second depth D2 of the trench gate structure 31 (D2<DT2). Preferably, the second trench depth DT2 is not less than 1.5 times and not more than 3 times as long as the first trench depth DT1.

In this embodiment, the second trench depth DT2 is substantially equal to the third depth D3 of the first trench source structure 41 (D3≈DT2), Also, the second trench depth DT2 is substantially equal to the first depth D1 of the outer surface 7 (D1=DT2). In other words, the second trench portion 333 communicates with the outer surface 7 and with the third connecting surface 8C. Preferably, the second trench depth DT2 has a value falling within ±10% of the value of the first depth D1 (third depth D3). The second trench portion 333 lessens a level difference between the first trench portion 332 and the outer surface 7.

The second trench depth DT2 may be not less than 0.5 μm and not more than 10 μm. Preferably, the second trench depth DT2 is 5 μm or less. Particularly preferably, the second trench depth DT2 is 2.5 μm or less. Preferably, an aspect ratio DT2/W2 of the second trench portion 333 is not less than 1 and not more than 5. The aspect ratio DT2/W2 is a ratio of the second trench depth DT2 to the second width W2. Particularly preferably, the aspect ratio DT2/W2 is 2 or more.

The second trench portion 333 includes a sidewall and a bottom wall. The sidewall that forms a long side of the second trench portion 333 is formed by the a-plane of the SiC monocrystal. The sidewall that forms the long side of the second trench portion 333 communicates with the sidewall of the first trench portion 332 and the third connecting surface 8C. The sidewall that forms a short side of the second trench portion 333 is formed by the m-plane of the Sic monocrystal. The sidewall that forms the short side of the second trench portion 333 communicates with the bottom wall of the first trench portion 332. Hence, the trench stepped portion 334 is formed between the first trench portion 332 and the second trench portion 333. The bottom wall of the second trench portion 333 is formed by the c-plane of the SiC monocrystal. The bottom wall of the second trench portion 333 communicates with the outer surface 7.

The second trench portion 333 may be formed in a vertical shape having a substantially uniform opening width. The second trench portion 333 may be formed in a tapered shape whose opening width becomes narrower toward the bottom wall. Preferably, the bottom wall of the second trench portion 333 is formed in a curved shape toward the second main surface 4. As a matter of course, the bottom wall of the second trench portion 333 may have a flat surface parallel to the active surface 6.

The second trench portion 333 is formed at the active surface 6 such as to cross the body region 23 and the source region 24 and reach the second semiconductor region 11. In detail, the second trench portion 333 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and the second trench portion 333. In this embodiment, the second trench portion 333 is formed in the second concentration region 13, and faces the first concentration region 12 with a part of the second concentration region 13 between the first concentration region 12 and the second trench portion 333.

The sidewall of the second trench portion 333 is in contact with the second semiconductor region 11, the body region 23, and the source region 24. The bottom wall of the second trench portion 333 is in contact with the second semiconductor region 11. In this embodiment, the second trench portion 333 is formed deeper than the first trench portion 332 (trench gate structure 31). In other words, the bottom wall of the second trench portion 333 is positioned at the bottom-portion side of the second semiconductor region 11 (second concentration region 13) with respect to the bottom wall of the first trench portion 332.

A percentage (length in the first direction X) of the second trench portion 333 in the second trench source structure 51 is arbitrary. The percentage of the second trench portion 333 in the second trench source structure 51 may be equal to or more than the percentage of the first trench portion 332 in the second trench source structure 51, or may be less than the percentage of the first trench portion 332 in the second trench source structure 51. From the viewpoint of obtaining a withstand-voltage structure due to the second trench source structure 51, it is preferable for the percentage of the second trench portion 333 in the second trench source structure 51 to exceed the percentage of the first trench portion 332 in the second trench source structure 51. In other words, preferably, the length in the first direction X of the second trench portion 333 exceeds the length in the first direction X of the first trench portion 332 regarding the first direction X.

Each of the second trench source structures 51 includes the source trench 42, the source insulating film 43, and the source electrode 44. The source trench 42 forms the sidewall and the bottom wall of the first trench portion 332 and the sidewall and the bottom wall of the second trench portion 333. The first portion 43*a* of the source insulating film 43 covers the whole area of the sidewall of the first trench portion 332 and the whole area of the sidewall of the second trench portion 333.

The second portion 43*b* of the source insulating film 43 covers the bottom wall of the first trench portion 332 and the bottom wall of the second trench portion 333. The third portion 43*c* of the source insulating film 43 covers the whole area of the opening edge portion of the source trench 42. The source electrode 44 is integrally embedded in a part, which forms the first trench portion 332, of the source trench 42 and in a part, which forms the second trench portion 333, of the source trench 42 with the source insulating film 43 between these parts and the source electrode 44.

Each of the well regions 71 covers the first trench portion 332 and the second trench portion 333 through the trench stepped portion 334. In other words, each of the well regions 71 covers the sidewall and the bottom wall of the first trench portion 332 and the sidewall and the bottom wall of the second trench portion 333. Each of the well regions 71 directly covers the first trench portion 332 and the second trench portion 333. Each of the well regions 71 is electrically connected to the body region 23 in the sidewall of the first trench portion 332 and in the sidewall of the second trench portion 333.

Preferably, the thickness of a part, which covers the bottom wall of each of the first trench portions 332, of each of the well regions 71 exceeds the thickness of a part, which covers the sidewall of each of the first trench portions 332, of each of the well regions 71. The thickness of the part, which covers the sidewall of each of the first trench portions 332, of each of the well regions 71 is the thickness in the normal direction of the sidewall of each of the first trench portions 332. The thickness of the part, which covers the bottom wall of each of the first trench portions 332, of each of the well regions 71 is the thickness in the normal direction of the bottom wall of each of the first trench portions 332.

Preferably, the thickness of a part, which covers the bottom wall of each of the second trench portions 333, of each of the well regions 71 exceeds the thickness of a part, which covers the sidewall (which includes the trench stepped portion 334) of each of the second trench portions 333, of each of the well regions 71. The thickness of the part, which covers the sidewall of each of the second trench portions 333, of each of the well regions 71 is the thickness in the normal direction of the sidewall of each of the second trench portions 333. The thickness of the part, which covers the bottom wall of each of the second trench portions 333, of each of the well regions 71 is the thickness in the normal direction of the bottom wall of each of the second trench portions 333.

The part, which covers the bottom wall of each of the second trench portions 333, of each of the well regions 71 is positioned at the bottom-portion side of the second semiconductor region 11 (second concentration region 13) with respect to the part, which covers the bottom wall of each of the first trench portions 332, of each of the well regions 71. The part, which covers the bottom wall of each of the second trench portions 333, of each of the well regions 71 is formed at substantially the same depth as the part, which covers the bottom wall of each of the first trench source structures 41, of each of the well regions 71.

In this embodiment, the part, which covers the bottom wall of each of the trench gate structures 31, of each of the gate well regions 72 is formed at substantially the same depth as the part, which covers the bottom wall of each of the 10 first trench portions 332, of each of the well regions 71.

Figure 38:
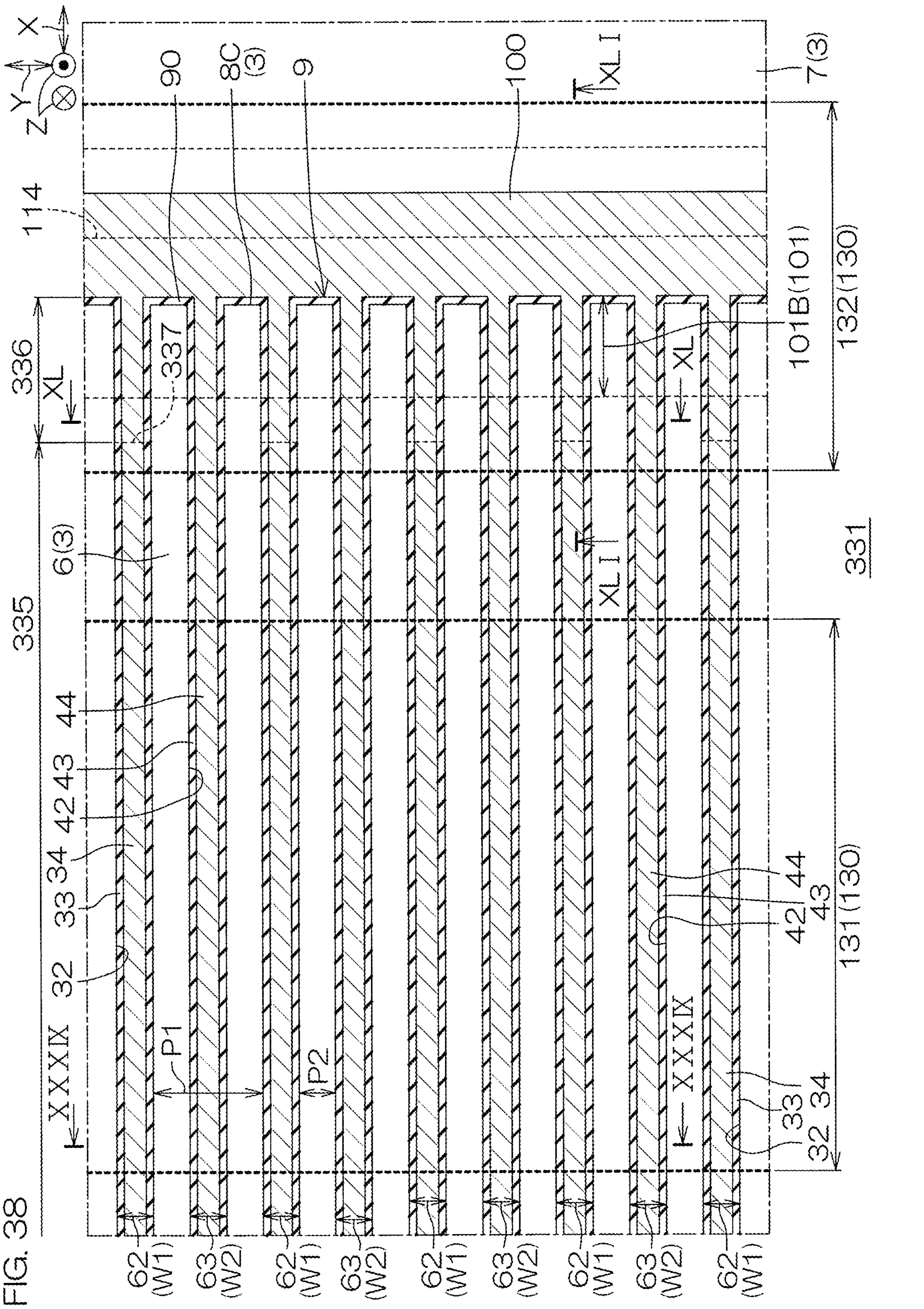
FIG. 38 corresponds to FIG. 16, and is a plan view of the SiC semiconductor device shown in FIG. 34.
Figure 39:
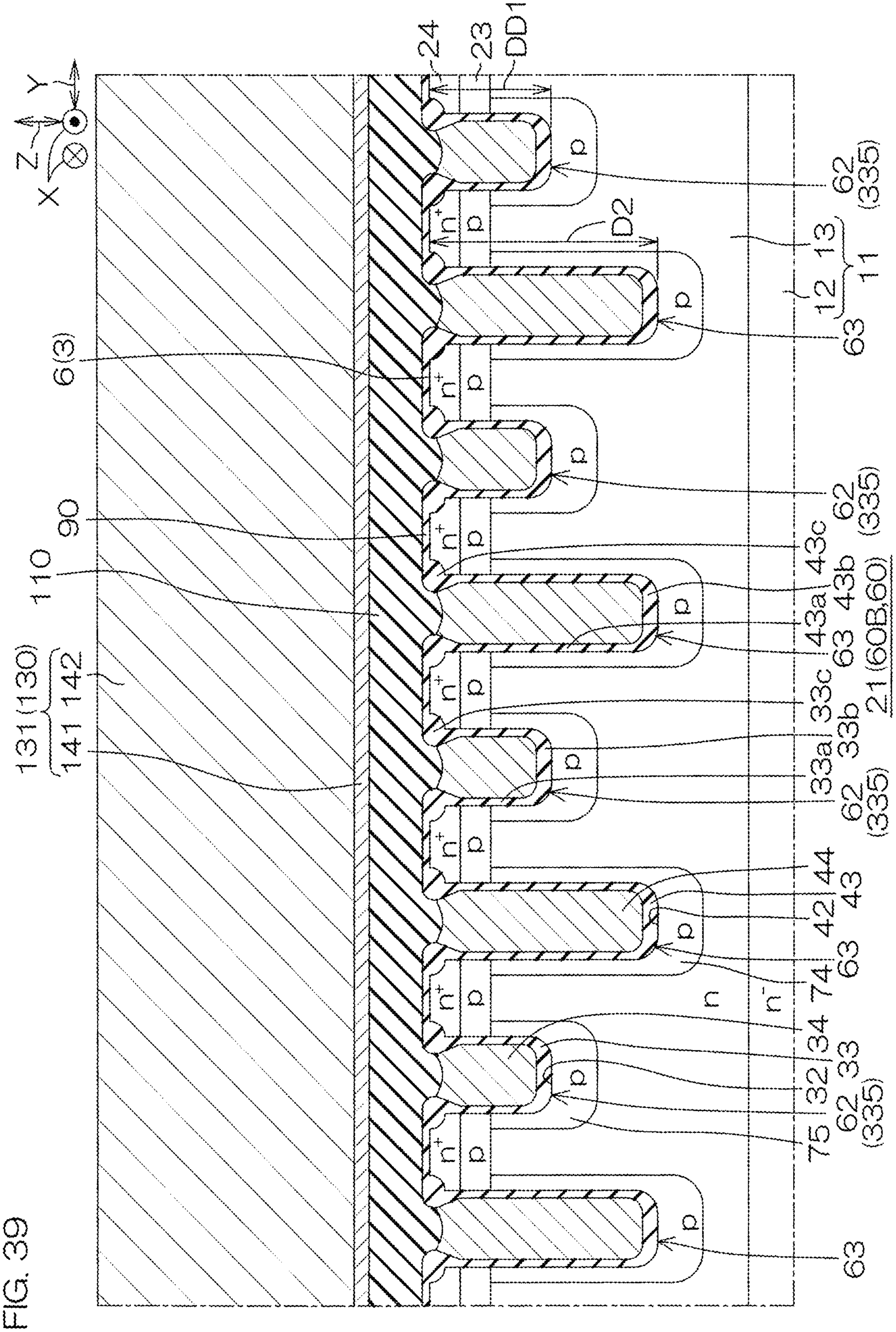
FIG. 39 is a cross-sectional view along line XXXIX-XXXIX shown in FIG. 38.
Figure 40:
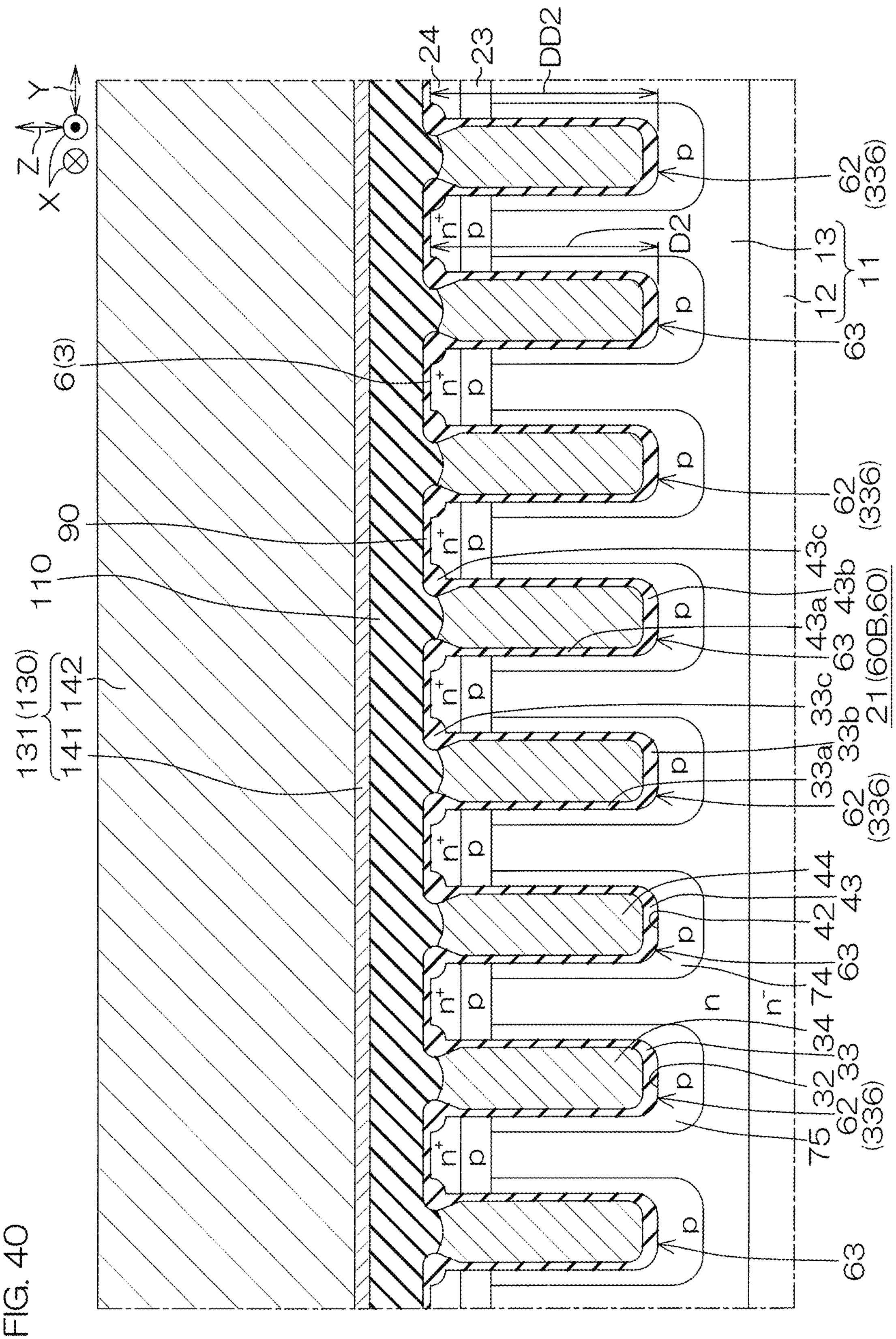
FIG. 40 is a cross-sectional view along line XL-XL shown in FIG. 38.
Figure 41:
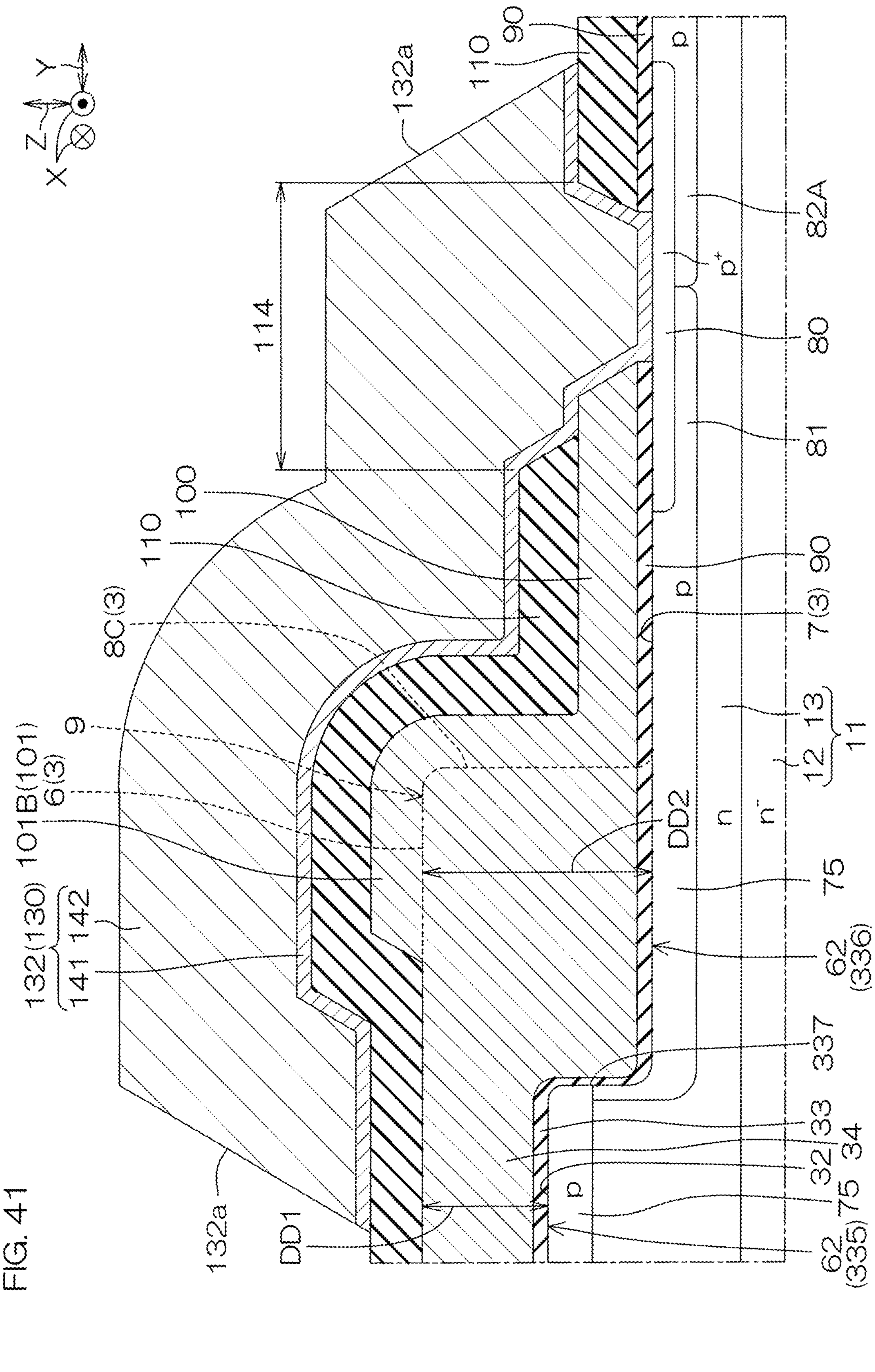
FIG. 41 is a cross-sectional view along line XLI-XLI shown in FIG. 38.

FIG. 38 corresponds to FIG. 16, and is a plan view of the SiC semiconductor device shown in FIG. 34. FIG. 39 is a cross-sectional view along line XXXIX-XXXIX shown in FIG. 38. FIG. 40 is a cross-sectional view along line XL-XL shown in FIG. 38. FIG. 41 is a cross-sectional view along line XLI-XLI shown in FIG. 38.

Referring to FIG. 38 to FIG. 41, in this embodiment, each of the dummy trench gate structures 62 according to the SiC semiconductor device 331 includes a first dummy trench portion 335 in which the inward-portion side of the active surface 6 is shallow and a second dummy trench portion 336 in which the peripheral-edge-portion side of the active surface 6 (third-connecting-surface-8C side) is deep regarding the first direction X. The dummy trench gate structures 62 have a dummy trench stepped portion 337 that is hollowed from the first dummy trench portion 335 toward the second dummy trench portion 336 between the first dummy trench portion 335 and the second dummy trench portion 336. The single dummy trench gate structure 62 will be hereinafter described.

The first dummy trench portion 335 is formed at the inward-portion side of the active surface 6, and is formed in a belt shape extending in the first direction X in plan view. The first dummy trench portion 335 is formed at least in a portion facing the trench gate structure 31 in the second direction Y. In this embodiment, the first dummy trench portion 335 crosses the end portion of each of the trench gate structures 31 from the second-direction-Y side in the first direction X in plan view. The first dummy trench portion 335 includes a portion facing the second direction Y in a region between the third connecting surface 8C and the end portion of each of the trench gate structures 31.

In other words, the first dummy trench portion 335 faces the trench gate structure 31, the first trench source structure 41, and the second trench source structure 51 in the second direction Y. The first dummy trench portion 335 faces the first trench portion 332 of the second trench source structure 51 at least in the second direction Y in a region between the third connecting surface 8C and the end portion of each of the trench gate structures 31. The first dummy trench portion 335 may face the second trench portion 333 of the second trench source structure 51 in the second direction Y.

The first dummy trench portion 335 has a first dummy trench depth DD1. The first dummy trench depth DD1 is less than the first depth D1 of the outer surface 7 (DD1<D1). The first dummy trench depth DD1 is less than the third depth D3 of the first trench source structure 41 (first dummy trench source structure 61) (DD1<D3). Preferably, the first dummy trench depth DD1 is substantially equal to the second depth D2 of the trench gate structure 31 (DD1≈D2). Preferably, the first dummy trench depth DD1 has a value falling within ±10% of the value of the second depth D2.

The first dummy trench depth DD1 may be not less than 0.1 μm and not more than 3 μm. Preferably, the first dummy trench depth DD1 is not less than 0.5 μm and not more than 2 μm. Preferably, an aspect ratio DD1/W2 of the first dummy trench portion 335 is not less than 1 and not more than 5. The aspect ratio DD1/W2 is a ratio of the first dummy trench depth DD1 to the second width W2. Particularly preferably, the aspect ratio DD1/W2 is 1.5 or more.

The first dummy trench portion 335 includes a sidewall and a bottom wall. The sidewall of the first dummy trench portion 335 is formed by the a-plane of the SiC monocrystal. The bottom wall of the first dummy trench portion 335 is formed by the c-plane of the SiC monocrystal.

The first dummy trench portion 335 may be formed in a vertical shape having a substantially uniform opening width. The first dummy trench portion 335 may be formed in a tapered shape whose opening width becomes narrower toward the bottom wall. Preferably, the bottom wall of the first dummy trench portion 335 is formed in a curved shape toward the second main surface 4. As a matter of course, the bottom wall of the first dummy trench portion 335 may have a flat surface parallel to the active surface 6, The first dummy trench portion 335 is formed at the active surface 6 such as to cross the body region 23 and the source region 24 and reach the second semiconductor region 11. In detail, the first dummy trench portion 335 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and the first dummy trench portion 335. In this embodiment, the first dummy trench portion 335 is formed in the second concentration region 13, and faces the first concentration region 12 with a part of the second concentration region 13 between the first concentration region 12 and the first dummy trench portion 335.

The sidewall of the first dummy trench portion 335 is in contact with the second semiconductor region 11, the body region 23, and the source region 24. The bottom wall of the first dummy trench portion 335 is in contact with the second semiconductor region 11. In this embodiment, the first dummy trench portion 335 is formed shallower than the first dummy trench source structure 61 (first trench source structure 41). In other words, the bottom wall of the first dummy trench portion 335 is positioned at the active-surface-6 side with respect to the bottom wall of the first dummy trench source structure 61.

The second dummy trench portion 336 is formed between the first dummy trench portion 335 and the third connecting surface 8C. The second dummy trench portion 336 communicates with the first dummy trench portion 335, and is formed in a belt shape extending in the first direction X such as to pass through the third connecting surface 8C. The second dummy trench portion 336 faces the second trench portion 333 of the second trench source structure 51 at least in the second direction Y in a region between the third connecting surface 8C and the end portion of each of the trench gate structures 31 in plan view. The second dummy trench portion 336 may face the first trench portion 332 of the second trench source structure 51 in the second direction Y.

The second dummy trench portion 336 has a second dummy trench depth DD2 exceeding the first dummy trench depth DD1 (DD1<DD2). The second dummy trench depth DD2 exceeds the second depth D2 of the trench gate structure 31 (D2<DD2). Preferably, the second dummy trench depth DD2 is not less than 1.5 times and not more than 3 times as long as the second depth D2. In this embodiment, the second dummy trench depth DD2 is substantially equal to the third depth D3 of the first trench source structure 41 (D3≈DD2).

Also; the second dummy trench depth DD2 is substantially equal to the first depth D1 of the outer surface 7 (D1≈DD2). In other words, the second dummy trench portion 336 communicates with the outer surface 7 and with the third connecting surface 8C. Preferably, the second dummy trench depth DD2 has a value falling within ±10% of the value of the first depth D1 (third depth D3). The second dummy trench portion 336 lessens a level difference between the first dummy trench portion 335 and the outer surface 7.

The second dummy trench depth DD2 may be not less than 0.5 μm and not more than 10 μm. Preferably, the second dummy trench depth DD2 is 5 μm or less. Particularly preferably, the second dummy trench depth DD2 is 2.5 μm or less. Preferably, an aspect ratio DD2/W2 of the second dummy trench portion 336 is not less than 1 and not more than 5. The aspect ratio DD2/W2 is a ratio of the second dummy trench depth DD2 to the second width W2. Particularly preferably, the aspect ratio DD2/W2 is 2 or more.

The second dummy trench portion 336 includes a sidewall and a bottom wall. The sidewall that forms a long side of the second dummy trench portion 336 is formed by the a-plane of the SiC monocrystal. The sidewall that forms the long side of the second dummy trench portion 336 communicates with the sidewall of the first dummy trench portion 335 and the third connecting surface 8C. The sidewall that forms a short side of the second dummy trench portion 336 is formed by the m-plane of the SiC monocrystal. The sidewall that forms the short side of the second dummy trench portion 336 communicates with the bottom wall of the first dummy trench portion 335. Hence, the dummy trench stepped portion 337 is formed between the first dummy trench portion 335 and the second dummy trench portion 336. The bottom wall of the second dummy trench portion 336 is formed by the c-plane of the SiC monocrystal. The bottom wall of the second dummy trench portion 336 communicates with the outer surface 7.

The second dummy trench portion 336 may be formed in a vertical shape having a substantially uniform opening width. The second dummy trench portion 336 may be formed in a tapered shape whose opening width becomes narrower toward the bottom wall. Preferably, the bottom wall of the second dummy trench portion 336 is formed in a curved shape toward the second main surface 4. As a matter of course, the bottom wall of the second dummy trench portion 336 may have a flat surface parallel to the active surface 6, The second dummy trench portion 336 is formed at the active surface 6 such as to cross the body region 23 and the source region 24 and reach the second semiconductor region 11. In detail, the second dummy trench portion 336 is formed at a distance from the bottom portion of the second semiconductor region 11 toward the active-surface-6 side, and faces the first semiconductor region 10 (third semiconductor region 14) with a part of the second semiconductor region 11 between the first semiconductor region 10 and the second dummy trench portion 336. In this embodiment, the second dummy trench portion 336 is formed in the second concentration region 13, and faces the first concentration region 12 with a part of the second concentration region 13 between the first concentration region 12 and the second dummy trench portion 336.

The sidewall of the second dummy trench portion 336 is in contact with the second semiconductor region 11, the body region 23, and the source region 24. The bottom wall of the second dummy trench portion 336 is in contact with the second semiconductor region 11. In this embodiment, the second dummy trench portion 336 is formed deeper than the first dummy trench portion 335 (trench gate structure 31). In other words, the bottom wall of the second dummy trench portion 336 is positioned at the bottom-portion side of the second semiconductor region 11 (second concentration region 13) with respect to the bottom wall of the first dummy trench portion 335, The percentage of the second dummy trench portion 336 in the dummy trench gate structure 62 (length in the first direction X) may be less than the percentage of the first dummy trench portion 335 in the dummy trench gate structure 62. In other words, the length in the first direction X of the second dummy trench portion 336 is less than the length in the first direction X of the first dummy trench portion 335 regarding the first direction X.

Each of the dummy trench gate structures 62 includes the gate trench 32, the gate insulating film 33, and the gate electrode 34. The gate trench 32 forms the sidewall and the bottom wall of the first dummy trench portion 335 and the sidewall and the bottom wall of the second dummy trench portion 336. The first portion 33*a* of the gate insulating film 33 covers the whole area of the sidewall of the first dummy trench portion 335 and the whole area of the sidewall of the second dummy trench portion 336.

The second portion 33*b* of the gate insulating film 33 covers the bottom wall of the first dummy trench portion 335 and the bottom wall of the second dummy trench portion 336. The third portion 33*c* of the gate insulating film 33 covers the whole area of the opening edge portion of the gate trench 32. The source electrode 44 is integrally embedded in a part, which forms the first dummy trench portion 335, of the gate trench 32 and in a part, which forms the second dummy trench portion 336, of the gate trench 32 with the gate insulating film 33 between these parts and the source electrode 44.

Each of the dummy gate well regions 75 covers the first dummy trench portion 335 and the second dummy trench portion 336 through the dummy trench stepped portion 337. In other words, each of the dummy gate well regions 75 covers the sidewall and the bottom wall of the first dummy trench portion 335 and the sidewall and the bottom wall of the second dummy trench portion 336. Each of the dummy gate well regions 75 directly covers the first dummy trench portion 335 and the second dummy trench portion 336. Each of the dummy gate well regions 75 is electrically connected to the body region 23 in the sidewall of the first dummy trench portion 335 and in the sidewall of the second dummy trench portion 336.

Preferably, the thickness of a part, which covers the bottom wall of each of the first dummy trench portions 335, of each of the dummy gate well regions 75 exceeds the thickness of a part, which covers the sidewall of each of the first dummy trench portions 335, of each of the dummy gate well regions 75. The thickness of the part, which covers the sidewall of each of the first dummy trench portions 335, of each of the dummy gate well regions 75 is the thickness in the normal direction of the sidewall of each of the first dummy trench portions 335. The thickness of the part, which covers the bottom wall of each of the first dummy trench portions 335, of each of the dummy gate well regions 75 is the thickness in the normal direction of the bottom wall of each of the first dummy trench portions 335.

Preferably, the thickness of a part, which covers the bottom wall of each of the second dummy trench portions 336, of each of the dummy gate well regions 75 exceeds the thickness of a part, which covers the sidewall (which includes the trench stepped portion 334) of each of the second dummy trench portions 336, of each of the dummy gate well regions 75. The thickness of the part, which covers the sidewall of each of the second dummy trench portions 336, of each of the dummy gate well regions 75 is the thickness in the normal direction of the sidewall of each of the second dummy trench portions 336. The thickness of the part, which covers the bottom wall of each of the second dummy trench portions 336, of each of the dummy gate well regions 75 is the thickness in the normal direction of the bottom wall of each of the second dummy trench portions 336.

The part, which covers the bottom wall of each of the second dummy trench portions 336, of each of the dummy gate well regions 75 is positioned at the bottom-portion side of the second semiconductor region 11 (second concentration region 13) with respect to the part, which covers the bottom wall of each of the first dummy trench portions 335, of each of the dummy gate well regions 75. The part, which covers the bottom wall of each of the first dummy trench portions 335, of each of the dummy gate well regions 75 is formed at substantially the same depth as the part, which covers the bottom wall of each of the trench gate structures 31, of each of the gate well regions 72.

The part, which covers the bottom wall of each of the second dummy trench portions 336, of each of the dummy gate well regions 75 is formed at substantially the same depth as the part, which covers the bottom wall (bottom wall of each of the second trench source structures 51) of each of the first trench source structures 41, of each of the well regions 71, and is formed at substantially the same depth as the part, which covers the bottom wall of each of the first dummy trench source structures 61, of each of the dummy well regions 74.

Each of the dummy gate well regions 75 is formed at a distance from the bottom portion of the second semiconductor region 11 (second concentration region 13) toward the active-surface-6 side, and faces the first semiconductor region 10 (third semiconductor region 14) with a part of the second semiconductor region 11 between the first semiconductor region 10 and each of the dummy gate well regions 75. In other words, each of the dummy gate well regions 75 is electrically connected to the second semiconductor region 11 (second concentration region 13).

The outer well region 81 is continuous with the well region 71 in a portion in which the bottom wall of the second trench portion 333 of the second trench source structure 51 communicates with the outer surface 7. In other words, the outer well region 81 is surfacewisely and continuously led out from a part, which covers the bottom wall of the second trench portion 333, of the well region 71 toward the outer surface 7.

The outer well region 81 is continuous with the dummy gate well region 75 in a portion in which the bottom wall of the second dummy trench portion 336 of the dummy trench gate structure 62 communicates with the outer surface 7. In other words, the outer well region 81 is surfacewisely and continuously led out from a part, which covers the bottom wall of the second dummy trench portion 336, of the dummy gate well region 75 toward the outer surface 7.

In this embodiment, the sidewall wiring 100 is electrically connected to the first trench source structure 41, the second trench portion 333 of the second trench source structure 51, the first dummy trench source structure 61, the second dummy trench portion 336 of the dummy trench gate structure 62, and the second dummy trench source structure 63 on the first to fourth connecting surfaces 8A to 8D. The sidewall wiring 100 is formed integrally with the source electrode 44 exposed from the second trench portion 333 of the second trench source structure 51 and with the gate electrode 34 exposed from the second dummy trench portion 336 of the dummy trench gate structure 62.

In this embodiment, the overlap portion 101 of the sidewall wiring 100 faces at least the second trench portion 333 of the second trench source structure 51 and the second dummy trench portion 336 of the dummy trench gate structure 62 in plan view. The overlap portion 101 may cross the trench stepped portion 334 and the dummy trench stepped portion 337 in plan view and be led out toward the inward side of the active surface 6. In this case, the overlap portion 101 may face the first trench portion 332 and the second trench portion 333 of the second trench source structure 51 and the first dummy trench portion 335 and the second dummy trench portion 336 of the dummy trench gate structure 62 in plan view.

In this embodiment, the gate wiring electrode 131 faces at least the first trench portion 332 of the second trench source structure 51 and the first dummy trench portion 335 of the dummy trench gate structure 62 in plan view. The gate wiring electrode 131 may cross the trench stepped portion 334 and the dummy trench stepped portion 337 in plan view and be led out toward the peripheral side of the active surface 6, In this case, the gate wiring electrode 131 may face the first trench portion 332 and the second trench portion 333 of the second trench source structure 51 and the first dummy trench portion 335 and the second dummy trench portion 336 of the dummy trench gate structure 62 in plan view.

In this embodiment, the source wiring electrode 132 faces at least the second trench portion 333 of the second trench source structure 51 and the second dummy trench portion 336 of the dummy trench gate structure 62 in plan view. The source wiring electrode 132 may cross the trench stepped portion 334 and the dummy trench stepped portion 337 and be led out toward the inward side of the active surface 6 in plan view in accordance with the layout (routing-around manner) of the gate wiring electrode 131. In this case, the source wiring electrode 132 may face the first trench portion 332 and the second trench portion 333 of the second trench source structure 51 and the first dummy trench portion 335 and the second dummy trench portion 336 of the dummy trench gate structure 62 in plan view.

As described above, it is possible to fulfill the same effect as the effect described with respect to the SiC semiconductor device 1 by means of the SiC semiconductor device 331. The second trench source structure 51 and the dummy trench gate structure 62 according to the SiC semiconductor device 331 are formed merely by changing the layout of the second resist mask 211 used in the manufacturing method of the SiC semiconductor device 1 (see FIG. 29F). The structure of the second trench source structure 51 of the SiC semiconductor device 331 and the structure of the dummy trench gate structure 62 are also applicable to the first and second reference preferred embodiments.

Preferred embodiments of the present invention can be carried out in other modes.

In each of the preferred embodiments, a WBG semiconductor chip composed of a WBG (Wide Band Gap) semiconductor other than SiC may be employed instead of the SiC chip 2. The WBG semiconductor is a semiconductor having a bandgap exceeding the bandgap of Si (silicon). GaN (gallium nitride) or diamond can be mentioned as an example of the WBG semiconductor. As a matter of course, a Si (silicon) chip may be employed in each of the preferred embodiments instead of the SiC chip 2.

As described in each of the preferred embodiments, the dummy contact regions 73 are not formed in a region along the first dummy trench source structures 61 of the first dummy structure 60A. However, the dummy contact regions 73 may be formed in a region along a part of or all of the first dummy trench source structures 61 of the first dummy structure 60A with the same arrangement pattern as the arrangement pattern formed at the second-dummy-structure-60B side.

In each of the preferred embodiments, a structure that does not have the gate contact electrodes 91 may be employed if the alignment margin of the gate wiring electrode 131 (gate opening 112) is not valued. In other words, the gate wiring electrode 131 may be connected directly to the gate electrode 34 through the gate opening 112. In this case, the gate wiring electrode 131 may be in contact with at least one of the gate insulating film 33 and the main surface insulating film 90.

In each of the preferred embodiments, a mode may be employed in which the sidewall wiring 100 is connected to the trench gate structures 31. In this case, the first trench source structures 41, the second trench source structures 51, the first dummy trench source structures 61, the dummy trench gate structures 62, and the second dummy trench source structures 63 are formed at a distance from the first to fourth connecting surfaces 8A to 8D toward the inward side of the active surface 6, and the trench gate structures 31 are allowed to communicate with at least one among the first to fourth connecting surfaces 8A to 8D (for example, communicate with the third and fourth connecting surfaces 8C and 8D), Also, in this case, the gate main surface electrode 121 and/or the gate wiring electrode 131, instead of the source wiring electrode 132, may be electrically connected to the sidewall wiring 100, The thus formed structure is also applicable to a SiC semiconductor device 1 that does not have the first dummy structure 60A and the second dummy structure 60B. Also, the thus formed structure is also applicable to a structure in which the trench gate structures 31 are provided and, on the other hand, at least one among the first trench source structures 41, the second trench source structures 51, the first dummy trench source structures 61, the dummy trench gate structures 62, and the second dummy trench source structures 63 is not provided.

As described in each of the preferred embodiments, the first direction X is the m-axis direction of the SiC monocrystal, and the second direction Y is the a-axis direction of the SiC monocrystal, and yet the first direction X may be the a-axis direction of the SiC monocrystal, and the second direction Y may be the m-axis direction of the Sic monocrystal. In other words, the first side surface 5A and the second side surface 5B may be formed by the m-plane of the SiC monocrystal, and the third side surface 5C and the fourth side surface 5D may be formed by the a-plane of the SiC monocrystal. In this case, the off direction may be the a-axis direction of the SiC monocrystal. A concrete configuration in this case can be obtained by replacing the m-axis direction according to the first direction X with the a-axis direction and by replacing the a-axis direction according to the second direction Y with the m-axis direction in the foregoing description and the accompanying drawings.

As described in each of the preferred embodiments, the first conductivity type is an n-type, and the second conductivity type is a p-type, and yet the first conductivity type may be a p-type, and the second conductivity type may be an n-type. A concrete configuration in this case can be obtained by replacing an n-type region with a p-type region and by replacing a p-type region with an n-type region in the foregoing description and the accompanying drawings.

Examples of features extracted from the present description and drawings are indicated below. The following [A1] to [A22] provide a semiconductor device capable of improving reliability.

[A1] A semiconductor device comprising: a semiconductor chip (2) having a main surface (3) that includes a first surface (6), a second surface (7) hollowed in a thickness direction at a first depth (D1) outside the first surface (6), and a connecting surface (8A to 8D) connecting the first surface (6) and the second surface (7), and in which a mesa (9) is defined by the first surface (6), the second surface (7) and the connecting surface (8A to 8D); a transistor structure (30) formed at an inward portion of the first surface (6), the transistor structure (30) including a trench gate structure (31) that has a second depth (D2) less than the first depth (D1) and a trench source structure (41) that has a third depth (D3) exceeding the second depth (D2) and that adjoins the trench gate structure (31) in one direction (Y); and a dummy structure (60, 60A) formed at a peripheral edge portion of the first surface (6), the dummy structure (60, 60A) including a plurality of dummy trench source structures (61) each of which has the third depth (D3) and that adjoin each other in the one direction (Y).

[A2] The semiconductor device according to A1, wherein the dummy trench source structures (61) are consecutively arranged with an interval between the dummy trench source structures (61) such as to adjoin each other.

[A3] The semiconductor device according to A1 or A2, wherein the dummy trench source structures (61) are arranged with an interval between the dummy trench source structures (61) without a trench structure having a depth less than the third depth (D3) between the dummy trench source structures (61).

[A4] The semiconductor device according to any one of A1 to A3, wherein a gate potential is given to the trench gate structure (31), a source potential is given to the trench source structure (41), and the source potential is given to the dummy trench source structures (61).

[A5] The semiconductor device according to any one of A1 to A4, wherein the transistor structure (30) includes the trench gate structures (31) arranged with an interval between the trench gate structures (31) in the one direction (Y) and the trench source structures (41) arranged alternately with the trench gate structures (31) in the one direction (Y) with intervals between the trench source structures (41) and the trench gate structures (31).

[A6] The semiconductor device according to any one of A1 to A5, wherein the dummy trench source structures (61) are exposed from the connecting surface (8A to 8D).

[A7] The semiconductor device according to any one of A1 to A6, wherein the trench source structure (41) is exposed from the connecting surface (8A to 8D),

[A8] The semiconductor device according to any one of A1 to A7, wherein the trench gate structure (31) is formed at a distance from the connecting surface (8A to 8D) toward an inward side of the first surface (6).

[A9] The semiconductor device according to A8, wherein the transistor structure (30) includes an intermediate trench source structure (51) that has the third depth (D3) and that adjoins the trench gate structure (31) in an intersection direction (X) that intersects the one direction (Y).

[A10] The semiconductor device according to A9, wherein the intermediate trench source structure (51) is formed in a region between the trench gate structure (31) and the connecting surface (8A to 8D) in the first surface (6).

[A11] The semiconductor device according A9 or A10, wherein the intermediate trench source structure (51) is exposed from the connecting surface (8A to 8D).

[A12] The semiconductor device according to any one of A1 to A11, further comprising: a second dummy structure (60, 60B) formed in a region between the transistor structure (30) and the dummy structure (60, 60A) in the peripheral edge portion of the first surface (6), the second dummy structure (60, 60B) including a dummy trench gate structure (62) having the second depth (D2) and a second dummy trench source structure (63) that has the third depth (D3) and that adjoins the dummy trench gate structure (62) in the one direction (Y).

[A13] The semiconductor device according to A12, wherein a source potential is given to the dummy trench gate structure (62), and the source potential is given to the second dummy trench source structure (63).

[A14] The semiconductor device according to any one of A1 to A13, further comprising: a sidewall structure (100) formed on the second surface (7) such as to cover the connecting surface (8A to 8D).

[A15] The semiconductor device according to any one of A1 to A14, further comprising: an insulating film (110) that covers the transistor structure (30) and the dummy structure (60, 60A) on the first surface (6); a gate main surface electrode (121) formed on the insulating film (110); and a gate wiring (131) that is led out from the gate main surface electrode (121) onto the insulating film (110), and that is electrically connected to the trench gate structure (31) through the insulating film (110), and that faces the trench source structure (41) with the insulating film (110) between the trench source structure (41) and the gate wiring (131).

[A16] The semiconductor device according to A15, further comprising: a source main surface electrode (122) that is formed on the insulating film (110) away from the gate main surface electrode (121) and from the gate wiring (131), and that is electrically connected to the trench source structure (41) through the insulating film (110), and that faces the trench gate structure (31) with the insulating film (110) between the trench gate structure (31) and the source main surface electrode (122).

[A17] The semiconductor device according to A16, wherein the source main surface electrode (122) is formed on the insulating film (110) away from the dummy structure (60, 60A) in plan view.

[A18] The semiconductor device according to A16 or A17, further comprising: a source wiring (132) that is led out from the source main surface electrode (122) onto the insulating film (110) and that is electrically connected to the trench source structure (41) through the insulating film (110) at a position differing from the source main surface electrode (122).

[A19] The semiconductor device according to A18, wherein the source wiring (132) is electrically connected to the dummy trench source structure (61) through the insulating film (110).

[A20] The semiconductor device according to any one of A1 to A19, wherein the semiconductor chip (2) is a wide bandgap semiconductor chip.

[A21] A semiconductor device comprising: a semiconductor chip (2) having a main surface (3) that includes a first surface (6), a second surface (7) hollowed in a thickness direction at a first depth (D1) outside the first surface (6), and a connecting surface (8A to 8D) connecting the first surface (6) and the second surface (7), and in which a mesa (9) is defined by the first surface (6), the second surface (7) and the connecting surface (8A to 8D); a transistor structure (30) formed at an inward portion of the first surface (6), the transistor structure (30) including a trench gate structure (31) that has a second depth (D2) less than the first depth (D1) and a trench source structure (41) that has a third depth (D3) exceeding the second depth (D2) and that adjoins the trench gate structure (31) in one direction (Y); and a dummy structure (60, 60A) formed at a peripheral edge portion of the first surface (6), the dummy structure (60, 60A) including a dummy trench gate structure (62) having the second depth (D2) and a dummy trench source structure (61) that has the third depth (D3) and that adjoins the dummy trench gate structure (62) in the one direction (Y).

[A22] The semiconductor device according to A21, wherein the semiconductor chip (2) is a wide bandgap semiconductor chip.

The following [B1] to [B22] and [C1] to [C10] provide a semiconductor device having a novel wiring structure. The following [B1] to [B22] and [C1] to [C10] particularly provide a semiconductor device having a wiring structure in which flexibility is given to design rules.

[B1] A semiconductor device comprising: a semiconductor chip (2) having a main surface that includes a first surface (6), a second surface (7) hollowed in a thickness direction outside the first surface (6), and a connecting surface (8A to 8D) connecting the first surface (6) and the second surface (7), and in which a mesa (9) is defined by the first surface (6), the second surface (7) and the connecting surface (8A to 8D); a trench structure (41) formed at the first surface (6) such as to be exposed from the connecting surface (8A to 8D); and a sidewall wiring (100) that is formed on the second surface (7) such as to cover the connecting surface (8A to 8D) and that is electrically connected to the trench structure (41),

[B2] The semiconductor device according to B1, Wherein a plurality of the trench structures (41) are formed at the first surface (6) with an interval between the trench structures (41), and the sidewall wiring (100) is electrically connected to the trench structures (41) at the connecting surface (8A to 8D).

[B3] The semiconductor device according to B1 or B2, wherein the trench structure (41) includes a trench (42) formed in the first surface (6), an insulating film (43) covering an inner wall of the trench (42), and an electrode (44) embedded in the trench (42) with the insulating film (43) between the trench (42) and the electrode (44), and the sidewall wiring (100) is electrically connected to the electrode (44).

[B4] The semiconductor device according to B3, further comprising: a main surface insulating film (90) that covers the second surface (7) and the connecting surface (8A to 8D) and that is continuous with the insulating film (43); wherein the sidewall wiring (100) is formed on the main surface insulating film (90).

[B5] The semiconductor device according to B4, further comprising: a pn-junction portion formed in a region along the connecting surface (8A to 8D) inside the semiconductor chip (2); wherein the sidewall wiring (100) faces the pn-junction portion with the main surface insulating film (90) between the pn-junction portion and the sidewall wiring (100) at the connecting surface (8A to 8D).

[B6] The semiconductor device according to any one of B3 to B5, wherein the sidewall wiring (100) is formed integrally with the electrode (44).

[B7] The semiconductor device according to any one of B1 to B6, wherein the trench structure (41) communicates with the second surface (7).

[B8] The semiconductor device according to any one of B1 to B7, wherein the sidewall wiring (100) includes an overlap portion (101) that covers a peripheral edge portion of the first surface (6).

[B9] The semiconductor device according to any one of B1 to B8, wherein the trench structure (41) extends in one direction (X) in plan view, and the sidewall wiring (100) extends in an intersection direction (Y) that intersects the one direction (X) in plan view.

[B10] The semiconductor device according to any one of B1 to B9, further comprising: an upper insulating film (110) that covers the sidewall wiring (100).

[B11] The semiconductor device according to B10, wherein the upper insulating film (110) crosses the sidewall wiring (100) and covers the first surface (6) and the second surface (7).

[B12] The semiconductor device according to any one of B1 to B11, wherein the semiconductor chip (2) is a wide bandgap semiconductor chip.

[B13] A semiconductor device comprising: a semiconductor chip (2) having a main surface that includes a first surface (6), a second surface (7) hollowed in a thickness direction outside the first surface (6), and a connecting surface (8A to 8D) connecting the first surface (6) and the second surface (7), and in which a mesa (9) is defined by the first surface (6), the second surface (7) and the connecting surface (8A to 8D); a trench gate structure (31) formed at the first surface (6) at a distance from the connecting surface (8A to 8D); a trench source structure (41) formed at the first surface (6) such as to be exposed from the connecting surface (8A to 8D); and a sidewall wiring (100) that is formed on the second surface (7) such as to cover the connecting surface (8A to 8D) and that is electrically connected to the trench source structure (41).

[B14] The semiconductor device according to B12, wherein the trench source structure (41) is formed deeper than the trench gate structure (31).

[B15] The semiconductor device according to B12 or B13, wherein a plurality of the trench gate structures (31) are formed at the first surface (6), a plurality of the trench source structures (41) are formed at the first surface (6) alternately with the trench gate structures (31), and the sidewall wiring (100) is electrically connected to the trench source structures (41).

[B16] The semiconductor device according to any one of B12 to B14, further comprising: an intermediate trench source structure (51) formed in a region between the connecting surface (8A to 8D) and the trench gate structure (31) in the first surface (6),

[B17] The semiconductor device according to B15, wherein the intermediate trench source structure (51) is exposed from the connecting surface (8A to 8D), and the sidewall wiring (100) is electrically connected to the intermediate trench source structure (51) and to the trench source structure (41).

[B18] The semiconductor device according to any one of B12 to B16, further comprising: an upper insulating film (110) that covers the trench gate structure (31), the trench source structure (41) and the sidewall wiring (100) above the main surface.

[B19] The semiconductor device according to B17, further comprising: a gate main surface electrode (121) formed on the upper insulating film (110); and a gate wiring (131) that is led out from the gate main surface electrode (121) onto the upper insulating film (110), that is electrically connected to the trench gate structure (31) through the upper insulating film (110), and that faces the trench source structure (41) with the upper insulating film (110) between the trench source structure (41) and the gate wiring (131).

[B20] The semiconductor device according to B17 or B18, further comprising: a source main surface electrode (122) that is formed on the upper insulating film (110), that is electrically connected to the trench source structure (41) through the upper insulating film (110), and that faces the trench gate structure (31) with the upper insulating film (110) between the trench gate structure (31) and the source main surface electrode (122); and a source wiring (132) that is led out from the source main surface electrode (122) onto the upper insulating film (110) and that is electrically connected to the sidewall wiring (100) through the upper insulating film (110).

[B21] The semiconductor device according to B19, wherein the source wiring (132) is electrically connected to the trench source structure (41) through the upper insulating film (110) at a position differing from the source main surface electrode (122).

[B22] The semiconductor device according to any one of B13 to B21, wherein the semiconductor chip (2) is a wide bandgap semiconductor chip.

[C1] A semiconductor device comprising: semiconductor chip (2) having a main surface that includes a first surface (6), a second surface (7) hollowed in a thickness direction outside the first surface (6), and a connecting surface (8A to 8D) connecting the first surface (6) and the second surface (7), and in which a mesa (9) is defined by the first surface (6), the second surface (7) and the connecting surface (8A to 8D); a trench gate structure (31) formed at the first surface (6) such as to be exposed from the connecting surface (8A to 8D); and a sidewall wiring (100) that is formed on the second surface (7) such as to cover the connecting surface (8A to 8D) and that is electrically connected to the trench gate structure (31).

[C2] The semiconductor device according to C1, wherein a plurality of the trench gate structures (31) are formed with an interval between the trench gate structures (31), and the sidewall wiring (100) is electrically connected to the trench gate structures (31) at the connecting surface (8A to 8D).

[C3] The semiconductor device according to C1 or C2, wherein the trench gate structure (31) includes a gate trench (32) formed in the first surface (6), an insulating film (33) covering an inner wall of the gate trench (32), and a gate electrode (34) embedded in the gate trench (32) with the insulating film (33) between the gate trench (32) and the gate electrode (34), and the sidewall wiring (100) is electrically connected to the gate electrode (34).

[C4] The semiconductor device according to C3, further comprising: a main surface insulating film (90) that covers the second surface (7) and the connecting surface (8A to 8D) and that is continuous with the insulating film (43); wherein the sidewall wiring (100) is formed on the main surface insulating film (90).

[C5] The semiconductor device according to C3 or C4, wherein the sidewall wiring (100) is formed integrally with the gate electrode (34).

[C6] The semiconductor device according to any one of C1 to C5, wherein the trench gate structure (31) extends in one direction (X) in plan view, and the sidewall wiring (100) extends in an intersection direction (Y) that intersects the one direction (X) in plan view.

[C7] The semiconductor device according to any one of C1 to C6, further comprising: an upper insulating film (110) that covers the sidewall wiring (100); and a gate main surface electrode (121) formed on the upper insulating film (110) and electrically connected to the gate electrode (34).

[C8] The semiconductor device according to any one of C1 to C7, the second surface (7) is formed in an annular shape surrounding the first surface (6) in plan view.

[C9] The semiconductor device according to any one of C1 to C8, wherein the semiconductor chip (2) is a wide bandgap semiconductor chip.

[C10] The semiconductor device according to any one of C1 to C9, wherein the semiconductor chip (2) is an SiC chip.

The following [D1] to [D22] provide a semiconductor device capable of improving reliability.

[D1] A semiconductor device comprising: a semiconductor chip (2) having a main surface (3); a trench gate structure (31) formed at the main surface (3); a trench source structure (41) formed at the main surface (3) away from the trench gate structure (31) in one direction (Y); an insulating film (110) covering the trench gate structure (31) and the trench source structure (41) above the main surface (3); a gate main surface electrode (121) formed on the insulating film (110); and a gate wiring (131) that is led out from the gate main surface electrode (121) onto the insulating film (110) such as to cross the trench gate structure (31) and the trench source structure (41) in the one direction (Y), and that is electrically connected to the trench gate structure (31) through the insulating film (110), and that faces the trench source structure (41) with the insulating film (110) between the trench source structure (41) and the gate wiring (131).

[D2] The semiconductor device according to D1, wherein the trench source structure (41) is formed deeper than the trench gate structure (31).

[D3] The semiconductor device according to D1 or D2, further comprising: a source main surface electrode (122) that is formed on the insulating film (110) away from the gate main surface electrode (121) and from the gate wiring (131), and that is electrically connected to the trench source structure (41) through the insulating film (110), and that faces the trench gate structure (31) with the insulating film (110) between the trench gate structure (31) and the source main surface electrode (122).

[D4] The semiconductor device according to D3, further comprising: a source wiring (132) that is led out from the source main surface electrode (122) onto the insulating film (110) and that is electrically connected to the trench source structure (41) through the insulating film (110) at a position differing from the source main surface electrode (122).

[D5] The semiconductor device according to D4, wherein the source wiring (132) is formed at a distance from the trench gate structure (31) in plan view.

[D6] The semiconductor device according to D1 or D2, further comprising: an intermediate trench source structure (51) formed at the main surface (3) at a distance from the trench gate structure (31) in an intersection direction (X) that intersects the one direction (Y); and a source main surface electrode (122) that is formed on the insulating film (110) away from the gate main surface electrode (121) and from the gate wiring (131) in plan view, and that is electrically connected to the trench source structure (41) through the insulating film (110), and that faces the trench gate structure (31) with the insulating film (110) between the trench gate structure (31) and the source main surface electrode (122).

[D7] The semiconductor device according to D6, wherein the source main surface electrode (122) is formed on the insulating film (110) away from the intermediate trench source structure (51) in plan view.

[D8] The semiconductor device according to D6 or D7, wherein the intermediate trench source structure (51) faces the trench gate structure (31) in the intersection direction (X), and faces the trench source structure (41) in the one direction (Y).

[D9] The semiconductor device according to any one of D6 to D8, further comprising: a source wiring (132) that is led out from the source main surface electrode (122) onto the insulating film (110) and that is electrically connected to the intermediate trench source structure (51) through the insulating film (110).

[D10] The semiconductor device according to D9, wherein the source wiring (132) is electrically connected to the trench source structure (41) through the insulating film (110) at a position differing from the source main surface electrode (122).

[D11] The semiconductor device according to D9 or D10, wherein the source wiring (132) is formed at a distance from the trench gate structure (31) in plan view.

[D12] The semiconductor device according to any one of D1 to D11, further comprising: a source-side pn-junction portion formed in a region along the trench source structure (41) inside the semiconductor chip (2); wherein the gate wiring (131) faces the source-side pn-junction portion in plan view.

[D13] The semiconductor device according to any one of D1 to D12, further comprising: a gate-side pn-junction portion formed in a region along the trench gate structure (31) inside the semiconductor chip (2); wherein the gate wiring (131) faces the gate-side pn-junction portion in plan view.

[D14] The semiconductor device according to any one of D1 to D13, wherein the trench gate structure (31) includes a gate trench (32) formed at the main surface (3), a gate insulating film (33) covering an inner wall of the gate trench (32), and a gate electrode (44) embedded in the gate trench (32) with the gate insulating film (33) between the gate trench (32) and the gate electrode (44), and the trench source structure (41) includes a source trench (42) formed at the main surface (3), a source insulating film (43) covering an inner wall of the source trench (42), and a source electrode (44) embedded in the source trench (42) with the source insulating film (43) between the source trench (42) and the source electrode (44).

[D15] The semiconductor device according to D14, further comprising: a gate contact electrode (91) covering the gate electrode (44) on the main surface (3); wherein the insulating film (110) covers the gate contact electrode (91), and the gate wiring (131) is electrically connected to the gate contact electrode (91) through the insulating film (110).

[D16] The semiconductor device according to D15, wherein the gate contact electrode (91) partially covers the gate electrode (44), and the gate main surface electrode (121) is formed on the insulating film (110) at a distance from the gate contact electrode (91) in plan view.

[D17] The semiconductor device according to any one of D1 to D16, wherein the semiconductor chip (2) is a wide bandgap semiconductor chip.

A [D18] semiconductor device comprising: a semiconductor chip (2) having a main surface (3); a trench gate structure (31) that is formed at the main surface (3) and that extends in one direction (X) in plan view; an intermediate trench source structure (51) that is formed at the main surface (3) at a distance from the trench gate structure (31) in the one direction (X) and that extends in the one direction (X) in plan view; an insulating film (110) covering the trench gate structure (31) and the intermediate trench source structure (51); a gate wiring (131) that is formed on the insulating film (110) and that is electrically connected to the trench gate structure (31) through the insulating film (110); and a source wiring (132) that is formed on the insulating film (110) at a distance from the gate wiring (131) and that is electrically connected to the intermediate trench source structure (51) through the insulating film (110).

[D19] The semiconductor device according to D18, wherein a plurality of the trench gate structures (31) are arranged at the main surface (3) with an interval between the trench gate structures (31) in an intersection direction (X) that intersects the one direction (X), and a plurality of the intermediate trench source structures (41) are arranged with an interval between the intermediate trench source structures (41) in the intersection direction (X) such as to face the trench gate structures (31) in the one direction (X) in a one-to-one correspondence.

[D20] The semiconductor device according to D18 or D19, further comprising: a pn-junction portion formed in a region along the intermediate trench source structure (51) inside the semiconductor chip (2); wherein the gate wiring (131) faces the pn-junction portion in plan view.

[D21] The semiconductor device according to any one of D18 to D20, further comprising: a gate-side pn-junction portion formed in a region along the trench gate structure (31) inside the semiconductor chip (2); wherein the gate wiring (131) faces the gate-side pn-junction portion in plan view.

[D22] The semiconductor device according to any one of D1 to D21, wherein the semiconductor chip (2) is a wide bandgap semiconductor chip.

The following [E1] to [E20] provide a semiconductor device having a novel wiring structure. The following [E1] to [E20] particularly provide a semiconductor device having a wiring structure in which flexibility is given to design rules.

[E1] A semiconductor device comprising: a semiconductor chip (2) having a main surface that includes a first surface (6), a second surface (7) hollowed in a thickness direction outside the first surface (6), and a connecting surface (8A to 8D) connecting the first surface (6) and the second surface (7), and in which a mesa (9) is defined by the first surface (6), the second surface (7) and the connecting surface (8A to 8D); a trench structure (51, 62) including a first trench portion (332, 335) formed in an inward-portion side of the first surface (6) with a first depth (DT1, DD1) and a second trench portion (333, 336) formed in a peripheral-edge-portion side of the first surface (6) with a second depth (DT2, DD2) exceeding the first depth (DT1, DD1) such as to be exposed from the connecting surface (8A to 8D); a sidewall wiring (100) that is formed on the second surface (7) such as to cover the connecting surface (8A to 8D) and that is electrically connected to the trench structure (51, 62).

[E2] The semiconductor device according to E1, wherein the first trench portion (332, 335) is formed at a distance toward the-first-surface (6) side with respect to the second surface (7).

[E3] The semiconductor device according to E1 or E2, wherein the trench structure (51, 62) having a trench step portion (334, 337) recessed toward a bottom wall of the second trench portion (333, 336) from a bottom wall of the first trench portion (332, 335) between the first trench portion (332, 335) and the second trench portion (333, 336).

[E4] The semiconductor device according to any one of E1 to E3, wherein a plurality of the trench structures (51, 62) are formed at the first surface (6) with an interval between the trench structures (51, 62), and the sidewall wiring (100) is electrically connected to the second trench portion (333, 336) of the trench structures (51, 62) at the connecting surface (8A to 8D).

[E5] The semiconductor device according to any one of E1 to E4, wherein the trench structure (51, 62) includes a trench (32, 42) formed in the first surface (6), an insulating film (33, 43) covering an inner wall of the gate trench (32, 42), and an electrode (34, 44) embedded in the trench (32, 42) with the insulating film (33, 43) between the trench (32, 42) and the electrode (34, 44), and the sidewall wiring (100) is electrically connected to the electrode (34, 44).

[E6] The semiconductor device according to E5, further comprising: a main surface insulating film (90) that covers the second surface (7) and the connecting surface (8A to 8D) and that is continuous with the insulating film (33, 43); wherein the sidewall wiring (100) is formed on the main surface insulating film (90).

[E7] The semiconductor device according to E6, further comprising: a pn-junction portion formed in a region along the connecting surface (8A to 8D) inside the semiconductor chip (2); wherein the sidewall wiring (100) faces the pn-junction portion with the main surface insulating film (90) between the pn-junction portion and the sidewall wiring (100) at the connecting surface (8A to 8D).

[E8] The semiconductor device according to any one of E5 to E7, wherein the sidewall wiring (100) is formed integrally with the electrode (34, 44).

[E9] The semiconductor device according to any one of E1 to E8, wherein the second trench portion (333, 336) communicates with the second surface (7).

[E10] The semiconductor device according to any one of E1 to E9, wherein the sidewall wiring (100) includes an overlap portion (101) that covers a peripheral edge portion of the first surface (6).

[E11] The semiconductor device according to E10, wherein the overlap portion (101) faces at least the second trench portion (333, 336) in plan view.

[E12] The semiconductor device according to any one of E1 to E11, wherein the trench structure (51, 62) extends in one direction (X) in plan view, and the sidewall wiring (100) extends in an intersection direction (Y) that intersects the one direction (X) in plan view.

[E13] The semiconductor device according to any one of E1 to E12, further comprising: an upper insulating film (110) that covers the sidewall wiring (100).

[E14] The semiconductor device according to E13, wherein the upper insulating film (110) crosses the sidewall wiring (100) and covers the first surface (6) and the second surface (7).

[E15] The semiconductor device according to E13 or E14, wherein a wiring electrode (132) formed on the upper insulating film (110) and faces the sidewall wiring with the upper insulating film (110) between the sidewall wiring and the wiring electrode (132).

[E16] The semiconductor device according to E15, wherein the wiring electrode (132) faces at least the second trench portion (333, 336) in plan view.

[E17] The semiconductor device according to E15 or E16, wherein the wiring electrode (132) is electrically connected to the sidewall wiring through the upper insulating film.

[E18] The semiconductor device according to any one of E15 to E17, wherein the wiring electrode includes a metal material.

[E19] The semiconductor device according to any one of E1 to E18, wherein the sidewall wiring includes a conductive polysilicon.

[E20] The semiconductor device according to any one of E1 to E19, wherein the semiconductor chip (2) is a wide bandgap semiconductor chip.

While preferred embodiments of the present invention were described in detail above, these are merely specific examples used to clarify the technical contents of the present invention and the present invention should not be interpreted as being limited to these specific examples and the scope of the present invention is limited only by the appended claims.

REFERENCE SIGNS LIST

1 SiC semiconductor device
2 SiC chip
3 first main surface
6 active surface
7 outer surface
8A first connecting surface
8B second connecting surface
8C third connecting surface
8D fourth connecting surface
9 active mesa
30 transistor structure
31 trench gate structure
32 gate trench
33 gate insulating film
34 gate electrode
41 first trench source structure
42 source trench
43 source insulating film
44 source electrode
51 second trench source structure
60A first dummy structure
60B second dummy structure
61 first dummy trench source structure
62 dummy trench gate structure
63 second dummy trench source structure
90 main surface insulating film
100 sidewall wiring
101 overlap portion
110 first inorganic insulating film
121 gate main surface electrode
122 source main surface electrode
131 gate wiring electrode
132 source wiring electrode
301 SiC semiconductor device
311 SiC semiconductor device
331 SiC semiconductor device
D1 first depth D2 second depth
D3 third depth
X first direction
Y second direction

The invention claimed is:

1. An SiC semiconductor device comprising:

an SiC chip having a main surface;

a trench gate structure formed at the main surface;

a trench source structure formed at the main surface away from the trench gate structure in one direction;

a gate contact electrode covering the trench gate structure on the main surface and electrically connected to the trench gate structure;

an insulating film covering the trench gate structure, the trench source structure, and the gate contact electrode above the main surface;

a gate main surface electrode formed on the insulating film; and a gate wiring that is led out from the gate main surface electrode onto the insulating film so as to cross the trench gate structure and the trench source structure in the one direction, and that is electrically connected to the trench gate structure via the gate contact electrode through the insulating film, and that faces the trench source structure with the insulating film between the trench source structure and the gate wiring, wherein the trench gate structure includes a gate trench formed at the main surface, a gate insulating film covering an inner wall of the gate trench, and a gate electrode embedded in the gate trench with the gate insulating film between the gate trench and the gate electrode, the trench source structure includes a source trench formed at the main surface, a source insulating film covering an inner wall of the source trench, and a source electrode embedded in the source trench with the source insulating film between the source trench and the source electrode, the gate contact electrode covers the gate electrode and is electrically connected to the gate electrode, and the gate wiring is electrically connected to the gate electrode via the gate contact electrode through the insulating film.

2. The SiC semiconductor device according to claim 1, wherein the trench source structure is formed deeper than the trench gate structure.

3. The SiC semiconductor device according to claim 1, further comprising:

a source main surface electrode that is formed on the insulating film away from the gate main surface electrode and from the gate wiring, and that is electrically connected to the trench source structure through the insulating film, and that faces the trench gate structure with the insulating film between the trench gate structure and the source main surface electrode.

4. The SiC semiconductor device according to claim 3, further comprising:

a source wiring that is led out from the source main surface electrode onto the insulating film and that is electrically connected to the trench source structure through the insulating film at a position differing from the source main surface electrode.

5. The SiC semiconductor device according to claim 4, wherein the source wiring is formed at a distance from the trench gate structure in plan view.

6. The SiC semiconductor device according to claim 1, further comprising:

a source-side pn-junction portion formed in a region along the trench source structure inside the SiC chip, wherein the gate wiring faces the source-side pn-junction portion in plan view.

7. The SiC semiconductor device according to claim 1, further comprising:

a gate-side pn-junction portion formed in a region along the trench gate structure inside the SiC chip, wherein the gate wiring faces the gate-side pn-junction portion in plan view.

8. The SiC semiconductor device according to claim 1, wherein the gate contact electrode partially covers the trench gate structure, and the gate main surface electrode is formed on the insulating film at a distance from the gate contact electrode in plan view.

9. The SiC semiconductor device according to claim 1, further comprising:

an intermediate trench source structure formed at the main surface at a distance from the trench gate structure in an intersection direction that intersects the one direction.

10. The SiC semiconductor device according to claim 1, further comprising:

a side wiring formed on the main surface at a distance from the trench gate structure toward a side surface of the chip, wherein the insulating film covers the side wiring.

11. The SiC semiconductor device according to claim 10, wherein the side wiring is electrically separated from the trench gate structure.

12. The SiC semiconductor device according to claim 10, wherein the main surface includes a first surface, a second surface hollowed in a thickness direction of the SiC chip outside the first surface, and a connecting surface connecting the first surface and the second surface, the trench gate structure is formed at the first surface, the trench source structure is formed at the first surface, and the side wiring is formed as a side wall wiring that is formed on the second surface so as to cover the connecting surface.

13. An SiC semiconductor device comprising:

an SiC chip having a main surface;

a trench gate structure formed at the main surface;

a trench source structure formed at the main surface away from the trench gate structure in one direction;

an intermediate trench source structure formed at the main surface at a distance from the trench gate structure in an intersection direction that intersects the one direction;

an insulating film covering the trench gate structure and the trench source structure above the main surface;

a gate main surface electrode formed on the insulating film;

a gate wiring that is led out from the gate main surface electrode onto the insulating film so as to cross the trench gate structure and the trench source structure in the one direction, and that is electrically connected to the trench gate structure through the insulating film, and that faces the trench source structure with the insulating film between the trench source structure and the gate wiring; and a source main surface electrode that is formed on the insulating film away from the gate main surface electrode and from the gate wiring in plan view, and that is electrically connected to the trench source structure through the insulating film, and that faces the trench gate structure with the insulating film between the trench gate structure and the source main surface electrode.

14. The SiC semiconductor device according to claim 13, wherein the source main surface electrode is formed on the insulating film away from the intermediate trench source structure in plan view.

15. The SiC semiconductor device according to claim 13, wherein the intermediate trench source structure faces the trench gate structure in the intersection direction, and faces the trench source structure in the one direction.

16. The SiC semiconductor device according to claim 13, further comprising:

a source wiring that is led out from the source main surface electrode onto the insulating film and that is electrically connected to the intermediate trench source structure through the insulating film.

17. The SiC semiconductor device according to claim 16, wherein the source wiring is electrically connected to the trench source structure through the insulating film at a position differing from the source main surface electrode.

18. The SiC semiconductor device according to claim 16, wherein the source wiring is formed at a distance from the trench gate structure in plan view.

19. An SiC semiconductor device comprising:

an SiC chip having a main surface and a side surface, the main surface including a first surface, a second surface hollowed in a thickness direction of the SiC chip outside the first surface, and a connecting surface connecting the first surface and the second surface;

a trench gate structure that is formed at the first surface of the main surface and that extends in one direction in plan view;

an intermediate trench source structure that is formed at the first surface of the main surface at a distance from the trench gate structure in the one direction and that extends in the one direction in plan view;

a dummy trench source structure that is formed at a peripheral edge portion of the first surface of the main surface;

a side wall wiring formed on the second surface of the main surface so as to cover the connecting surface of the main surface, formed at a distance from the trench gate structure toward the side surface of the chip so as to be electrically separated from the trench gate structure, and electrically connected to the intermediate trench source structure and the dummy trench source structure;

an insulating film covering the trench gate structure, the intermediate trench source structure, the dummy trench source structure, and the side wall wiring;

a gate wiring that is formed on the insulating film and that is electrically connected to the trench gate structure through the insulating film; and a source wiring that is formed on the insulating film so as to extend as a belt shape at a distance from the gate wiring, that is electrically connected to the side wall wiring through the insulating film, and that is electrically connected to the intermediate trench source structure and the dummy trench source structure via the side wall wiring.

20. The SiC semiconductor device according to claim 19, wherein a plurality of the trench gate structures are arranged at the main surface with an interval between the trench gate structures in an intersection direction that intersects the one direction, and a plurality of the intermediate trench source structures are arranged with an interval between the intermediate trench source structures in the intersection direction so as to face the trench gate structures in the one direction in a one-to-one correspondence.

21. The SiC semiconductor device according to claim 19, further comprising:

a pn-junction portion formed in a region along the intermediate trench source structure inside the SiC chip, wherein the gate wiring faces the pn-junction portion in plan view.

22. The SiC semiconductor device according to claim 19, further comprising:

a gate-side pn-junction portion formed in a region along the trench gate structure inside the SiC chip, wherein the gate wiring faces the gate-side pn-junction portion in plan view.

23. The SiC semiconductor device according to claim 19, further comprising:

a body region that is formed in a surface layer portion of the first surface of the main surface, wherein the trench gate structure penetrates through the body region, the intermediate trench source structure penetrates through the body region, and the dummy trench source structure penetrates through the body region.

24. The SiC semiconductor device according to claim 19, further comprising:

an outer pn-junction portion that is formed in a surface layer portion of the second surface of the main surface, wherein the source wiring is electrically connected to the outer pn-junction portion.

* * * * *